US011165441B2

(12) United States Patent
Myung et al.

(10) Patent No.: US 11,165,441 B2
(45) Date of Patent: *Nov. 2, 2021

(54) TRANSMITTING APPARATUS AND INTERLEAVING METHOD THEREOF

(71) Applicant: SAMSUNG ELECTRONICS CO., LTD., Suwon-si (KR)

(72) Inventors: Se-ho Myung, Yongin-si (KR); Hong-sil Jeong, Suwon-si (KR); Kyung-joong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/402,844

(22) Filed: May 3, 2019

(65) Prior Publication Data

US 2019/0260396 A1 Aug. 22, 2019

Related U.S. Application Data

(63) Continuation of application No. 15/656,931, filed on Jul. 21, 2017, now Pat. No. 10,312,941, which is a continuation of application No. 14/716,340, filed on May 19, 2015, now Pat. No. 9,729,174.

(51) Int. Cl.

| | |
|---|---|
| ***H03M 13/27*** | (2006.01) |
| ***H03M 13/00*** | (2006.01) |
| ***H03M 13/11*** | (2006.01) |
| ***H03M 13/29*** | (2006.01) |
| ***H03M 13/25*** | (2006.01) |
| ***H04L 1/00*** | (2006.01) |
| *H03M 13/15* | (2006.01) |

(52) U.S. Cl.

CPC ... *H03M 13/2792* (2013.01); *H03M 13/1102* (2013.01); *H03M 13/255* (2013.01); *H03M 13/271* (2013.01); *H03M 13/2707* (2013.01); *H03M 13/2732* (2013.01); *H03M 13/2778* (2013.01); *H03M 13/2906* (2013.01); *H03M 13/616* (2013.01); *H04L 1/0041* (2013.01); *H04L 1/0058* (2013.01); *H04L 1/0071* (2013.01); *H03M 13/1165* (2013.01); *H03M 13/152* (2013.01); *H04L 2001/0093* (2013.01)

(58) Field of Classification Search

None

See application file for complete search history.

(56) References Cited

U.S. PATENT DOCUMENTS

| | | | |
|---|---|---|---|
| 8,369,448 | B2 | 2/2013 | Zhang et al. |
| 8,677,219 | B2 | 3/2014 | Lei et al. |
| 9,537,509 | B2 | 1/2017 | Jeong et al. |
| 9,595,978 | B2 | 3/2017 | Myung et al. |

(Continued)

*Primary Examiner* — Phung M Chung

(74) *Attorney, Agent, or Firm* — Sughrue Mion, PLLC

(57) ABSTRACT

A transmitting apparatus is provided. The transmitting apparatus includes: an encoder configured to generate a low-density parity check (LDPC) codeword by LDPC encoding based on a parity check matrix; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

5 Claims, 47 Drawing Sheets

(56) References Cited

U.S. PATENT DOCUMENTS

| | | | | |
|---|---|---|---|---|
| 9,634,692 | B2 | 4/2017 | Kim et al. | |
| 9,680,505 | B2 | 6/2017 | Jeong et al. | |
| 9,692,453 | B2 | 6/2017 | Jeong et al. | |
| 9,729,174 | B2 * | 8/2017 | Myung | H03M 13/2732 |
| 9,748,975 | B2 | 8/2017 | Jeong et al. | |
| 9,762,264 | B2 | 9/2017 | Myung et al. | |
| 9,847,794 | B2 | 12/2017 | Kim et al. | |
| 10,312,941 | B2 * | 6/2019 | Myung | H03M 13/255 |
| 10,439,646 | B2 * | 10/2019 | Kim | H03M 13/2732 |
| 10,873,343 | B2 * | 12/2020 | Myung | H03M 13/1157 |
| 2009/0125780 | A1 | 5/2009 | Taylor et al. | |
| 2015/0100845 | A1 | 4/2015 | Myung et al. | |
| 2015/0121176 | A1 | 4/2015 | Myung et al. | |
| 2015/0128005 | A1 | 5/2015 | Jeong et al. | |
| 2015/0236721 | A1 | 8/2015 | Kim et al. | |
| 2015/0236816 | A1 | 8/2015 | Myung et al. | |
| 2015/0270853 | A1 | 9/2015 | Jeong et al. | |
| 2015/0341052 | A1 | 11/2015 | Jeong et al. | |
| 2015/0341054 | A1 | 11/2015 | Myung et al. | |
| 2019/0386684 | A1 * | 12/2019 | Kim | H04L 1/0041 |

* cited by examiner

23000

TRANSMITTING APPARATUS AND INTERLEAVING METHOD THEREOF

CROSS-REFERENCE TO RELATED PATENT APPLICATION

This application is a Continuation of U.S. application Ser. No. 15/656,931 filed Jul. 21, 2017, which is a Continuation of U.S. application Ser. No. 14/716,340 filed May 19, 2015, issued as U.S. Pat. No. 9,729,174 on Aug. 8, 2017, the disclosures of which are incorporated herein by reference in their entireties.

BACKGROUND

1. Field

Apparatuses and methods consistent with exemplary embodiments relate to a transmitting apparatus and an interleaving method thereof, and more particularly, to a transmitting apparatus which processes and transmits data, and an interleaving method thereof.

2. Description of the Related Art

In the 21st century information-oriented society, broadcasting communication services are moving into the era of digitalization, multi-channel, wideband, and high quality. In particular, as high quality digital televisions, portable multimedia players and portable broadcasting equipment are increasingly used in recent years, there is an increasing demand for methods for supporting various receiving methods of digital broadcasting services.

In order to meet such demand, standard groups are establishing various standards and are providing a variety of services to satisfy users' needs. Therefore, there is a need for a method for providing improved services to users with high decoding and receiving performance.

SUMMARY

Exemplary embodiments of the inventive concept may overcome the above disadvantages and other disadvantages not described above. However, it is understood that the exemplary embodiment are not required to overcome the disadvantages described above, and may not overcome any of the problems described above.

The exemplary embodiments provide a transmitting apparatus which can map a bit included in a predetermined bit group from among a plurality of bit groups of a low density parity check (LDPC) codeword onto a predetermined bit of a modulation symbol, and transmit the bit, and an interleaving method thereof.

According to an aspect of an exemplary embodiment, there is provided a transmitting apparatus including: an encoder configured to generate an LDPC codeword by LDPC encoding based on a parity check matrix; an interleaver configured to interleave the LDPC codeword; and a modulator configured to map the interleaved LDPC codeword onto a modulation symbol, wherein the modulator is further configured to map a bit included in a predetermined bit group from among a plurality of bit groups constituting the LDPC codeword onto a predetermined bit of the modulation symbol.

Each of the plurality of bit groups may be formed of M number of bits. M may be a common divisor of $N_{ldpc}$ and $K_{ldpc}$ and may be determined to satisfy $Q_{ldpc}=(N_{ldpc}-K_{ldpc})/M$. In this case, $Q_{ldpc}$ may be a cyclic shift parameter value regarding columns in a column group of an information word submatrix of the parity check matrix, $N_{ldpc}$ may be a length of the LDPC codeword, and $K_{ldpc}$ may be a length of information word bits of the LDPC codeword.

The interleaver may include: a parity interleaver configured to interleave parity bits of the LDPC codeword; a group interleaver configured to divide the parity-interleaved LDPC codeword by the plurality of bit groups and rearrange an order of the plurality of bit groups in bit group wise; and a block interleaver configured to interleave the plurality of bit groups the order of which is rearranged.

The group interleaver may be configured to rearrange the order of the plurality of bit groups in bit group wise by using the following equation:

$$Y_j=X_{\pi(j)}\ (0\le j<N_{group})$$

where $X_j$ is a $j^{th}$ bit group before the plurality of bit groups are interleaved, $Y_j$ is a $j^{th}$ bit group after the plurality of bit groups are interleaved, $N_{group}$ is a total number of the plurality of bit groups, and $\pi(j)$ is a parameter indicating an interleaving order.

Here, $\pi(j)$ may be determined based on at least one of a length of the LDPC codeword, a modulation method, and a code rate.

When the LDPC codeword has a length of 64800, the modulation method is 16-QAM, and the code rate is 10/15, $\pi(j)$ may be defined as in table 14.

The block interleaver may be configured to interleave by writing the plurality of bit groups in each of a plurality of columns in bit group wise in a column direction, and reading each row of the plurality of columns in which the plurality of bit groups are written in bit group wise in a row direction.

The block interleaver may be configured to serially write, in the plurality of columns, at least some bit groups which are writable in the plurality of columns in bit group wise from among the plurality of bit groups, and then divide and write the other bit groups in an area which remains after the at least some bit groups are written in the plurality of columns in bit group wise.

According to an aspect of another exemplary embodiment, there is provided an interleaving method of a transmitting apparatus, including: generating an LDPC codeword by LDPC encoding based on a parity check matrix; interleaving the LDPC codeword; and mapping the interleaved LDPC codeword onto a modulation symbol, wherein the mapping comprises mapping a bit included in a predetermined bit group from among a plurality of bit groups constituting the LDPC codeword onto a predetermined bit of the modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/M$. In this case, $Q_{ldpc}$ may be a cyclic shift parameter value regarding columns in a column group of an information word submatrix of the parity check matrix, $N_{ldpc}$ may be a length of the LDPC codeword, and $K_{ldpc}$ may be a length of information word bits of the LDPC codeword.

The interleaving may include: interleaving parity bits of the LDPC codeword; dividing the parity-interleaved LDPC codeword by the plurality of bit groups and rearranging an order of the plurality of bit groups in bit group wise; and interleaving the plurality of bit groups the order of which is rearranged.

The rearranging in bit group wise may include rearranging the order of the plurality of bit groups in bit group wise by using the following equation:

$$Y_j=X_{\pi(j)}\ (0\le j<N_{group})$$

where $X_j$ is a $j^{th}$ bit group before the plurality of bit groups are interleaved, $Y_j$ is a $j^{th}$ bit group after the plurality of bit groups are interleaved, $N_{group}$ is a total number of the plurality of bit groups, and π(j) is a parameter indicating an interleaving order.

Here, π(j) may be determined based on at least one of a length of the LDPC codeword, a modulation method, and a code rate.

When the LDPC codeword has a length of 64800, the modulation method is 16-QAM, and the code rate is 10/15, π(j) may be defined as in table 14.

The interleaving the plurality of bit groups may include interleaving by writing the plurality of bit groups in each of a plurality of columns in bit group wise in a column direction, and reading each row of the plurality of columns in which the plurality of bit groups are written in bit group wise in a row direction.

The interleaving the plurality of bit groups may include serially writing, in the plurality of columns, at least some bit groups which are writable in the plurality of columns in bit group wise from among the plurality of bit groups, and then dividing and writing the other bit groups in an area which remains after the at least some bit groups are written in the plurality of columns in bit group wise.

According to various exemplary embodiments, improved decoding and receiving performance can be provided.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1A:
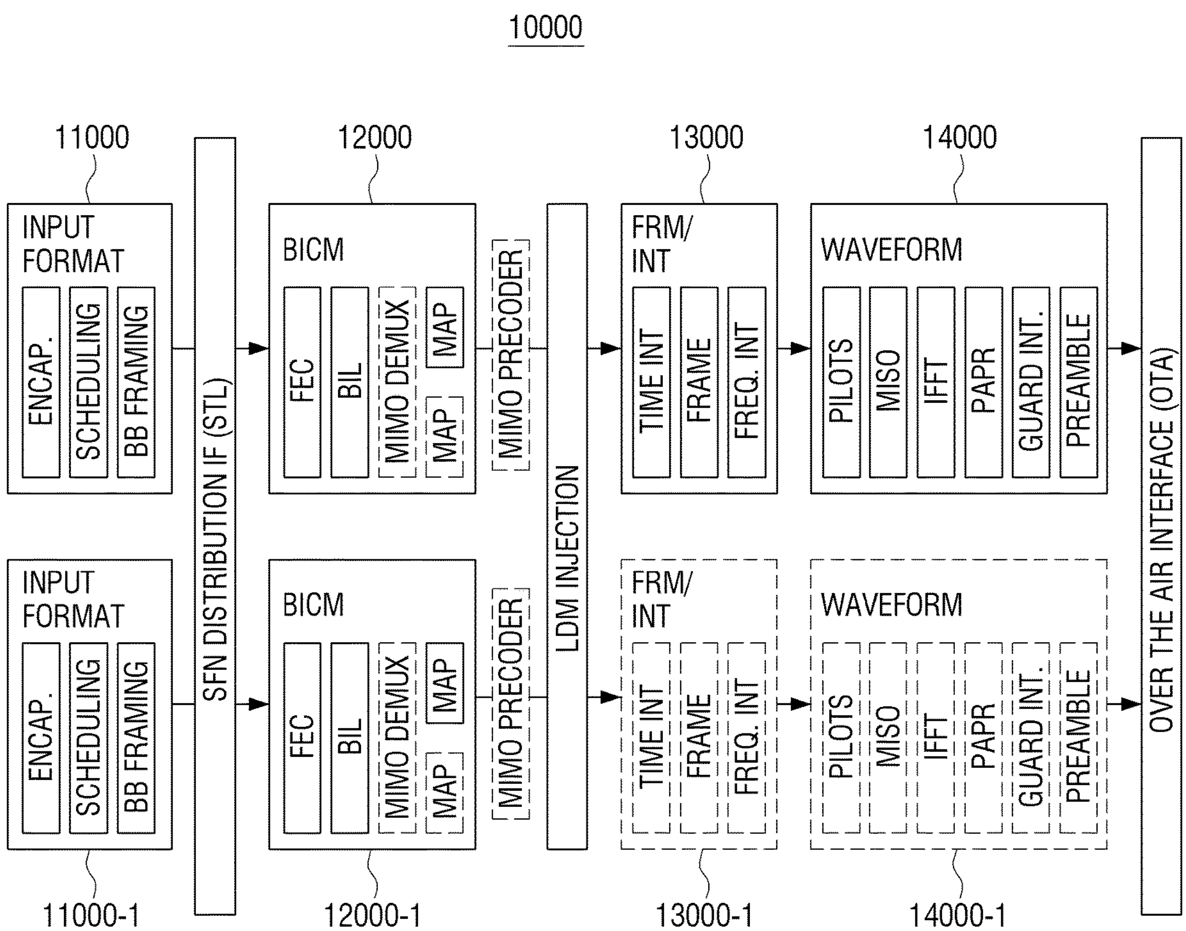
FIGS. 1A to 12 are views to illustrate a transmitting apparatus according to exemplary embodiments.

Hereinafter, various exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. Thus, it is apparent that the exemplary embodiments can be carried out without those specifically defined matters. Also, functions or elements known in the related art are not described in detail since they would obscure the exemplary embodiments with unnecessary detail.

FIG. 1A is provided to explain transmitting apparatus according to an exemplary embodiment.

According to FIG. 1A, a transmitting apparatus 10000 according to an exemplary embodiment may include an Input Formatting Block (or part) 11000, 11000-1, a BIT Interleaved and Coded Modulation (BICM) block 12000, 12000-1, a Framing/Interleaving block 13000, 13000-1 and a Waveform Generation block 14000, 14000-1.

The transmitting apparatus 10000 according to an exemplary embodiment illustrated in FIG. 1A includes normative blocks shown by solid lines and informative blocks shown by dotted lines. Here, the blocks shown by solid lines are normal blocks, and the blocks shown by dotted lines are blocks which may be used when implementing an informative MIMO.

The Input Formatting block 11000, 11000-1 generates a baseband frame (BBFRAME) from an input stream of data to be serviced. Herein, the input stream may be a transport stream (TS), Internet protocol (IP) stream, a generic stream (GS), a generic stream encapsulation (GSE), etc.

The BICM block 12000, 12000-1 determines a forward error correction (FEC) coding rate and a constellation order depending on a region where the data to be serviced will be transmitted (e.g., a fixed PHY frame or mobile PHY frame), and then, performs encoding. Signaling information on the data to be serviced may be encoded through a separate BICM encoder (not illustrated) or encoded by sharing the BICM encoder 12000, 12000-1 with the data to be serviced, depending on a system implementation.

The Framing/Interleaving block 13000, 13000-1 combines time interleaved data with signaling information to generate a transmission frame.

The Waveform Generation block 14000, 14000-1 generates an OFDM signal in the time domain on the generated transmission frame, modulates the generated OFDM signal to a radio frequency (RF) signal and transmits the modulated RF signal to a receiver.

Figure 1B:
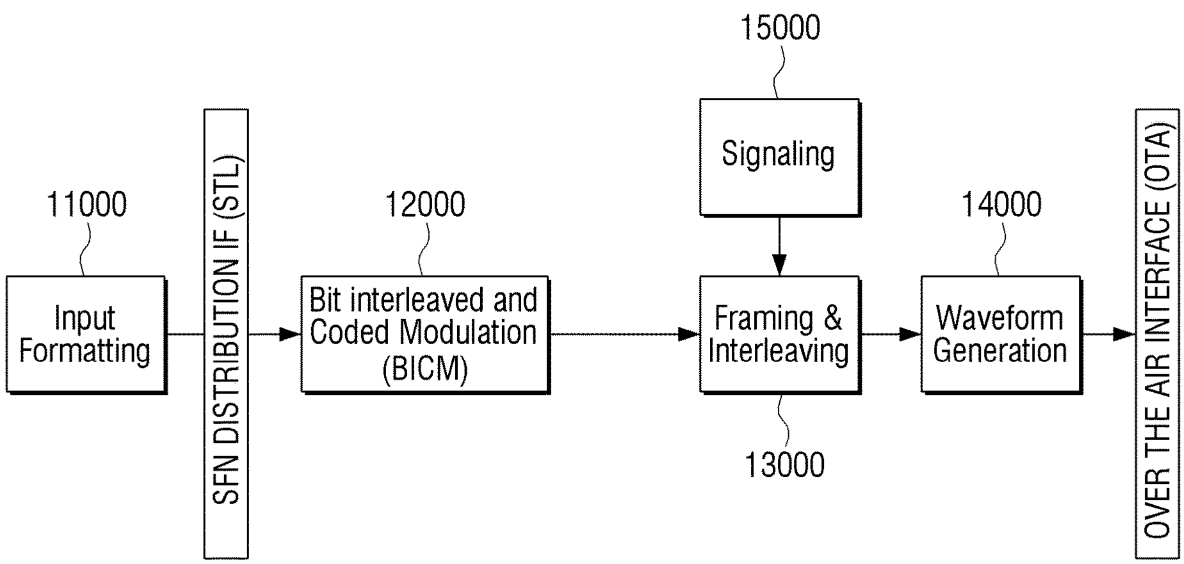
Figure 1C:
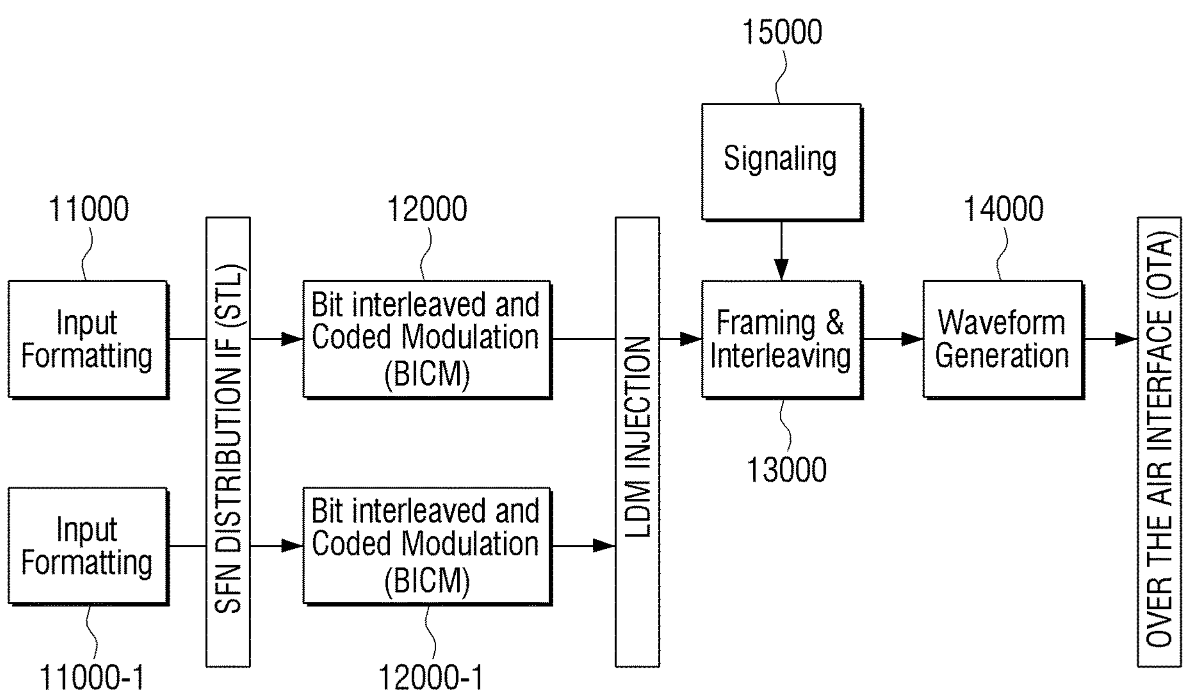

FIGS. 1B and 1C are provided to explain methods of multiplexing according to an exemplary embodiment.

FIG. 1B illustrates a block diagram to implement a Time Division Multiplexing according to an exemplary embodiment.

In the TDM system architecture, there are four main blocks (or parts): the Input Formatting block 11000, the BICM block 12000, the Framing/Interleaving block 13000, and the Waveform Generation block 14000.

Data is input and formatted in the Input Formatting block, and forward error correction applied and mapped to constellations in the BICM block 12000. Interleaving, both time and frequency, and frame creation done in the Framing/Interleaving block 13000. Subsequently, the output waveform is created in the Waveform Generation block 14000.

FIG. 2B illustrates a block diagram to implement a Layered Division Multiplexing (LDM) according to another exemplary embodiment.

In the LDM system architecture, there are several different blocks compared with the TDM system architecture. Specifically, there are two separate Input Formatting blocks 11000, 11000-1 and BICM blocks 12000, 12000-1, one for each of the layers in LDM. These are combined before the Framing/Interleaving block 13000 in the LDM Injection block. The Waveform Generation block 14000 is similar to TDM.

Figure 2:
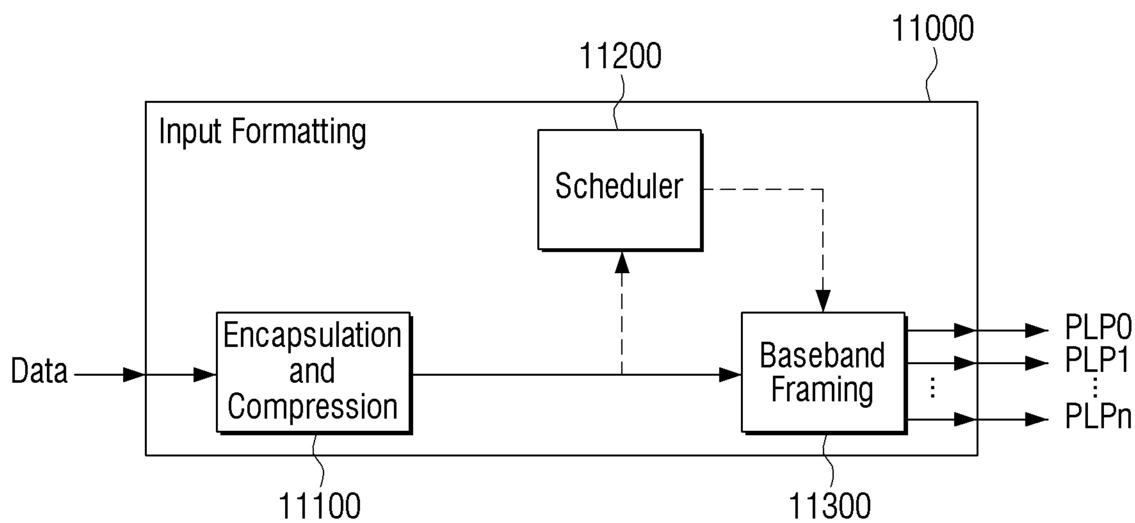

FIG. 2 is a block diagram which illustrates detailed configuration of the Input Formatting block illustrated in FIG. 1A.

As illustrated in FIG. 2, the Input Formatting block 11000 consists of three blocks which control packets distributed into PLPs. Specifically, the Input Formatting block 11000 includes a packet encapsulation and compression block 11100, a baseband framing block 11200 and a scheduler block 11300.

Input data packets input to the Input Formatting block 11000 can consist of various types, but at the encapsulation operation these different types of packets become generic packets which configure baseband frames. Here, the format of generic packets is variable. It is possible to easily extract the length of the generic packet from the packet itself without additional information. The maximum length of the generic packet is 64 kB. The maximum length of the generic packet, including header, is four bytes. Generic packets must be of integer byte length.

The scheduler 11200 receives an input stream of encapsulated generic packets and forms them into physical layer pipes (PLPs), in the form of baseband frames. In the above-mentioned TDM system there may be only one PLP, called single PLP or S-PLP, or there may be multiple PLPs, called M-PLP. One service cannot use more than four PLPs. In the case of an LDM system consisting of two layers, two PLPs are used, one for each layer.

The scheduler 11200 receives encapsulated input packet streams and directs how these packets are allocated to physical layer resources. Specifically, the scheduler 11200 directs how the baseband framing block will output baseband frames.

The functional assets of the Scheduler 11200 are defined by data size(s) and time(s). The physical layer can deliver portions of data at these discrete times. The scheduler 11200 uses the inputs and information including encapsulated data packets, quality of service metadata for the encapsulated data packets, a system buffer model, constraints and configuration from system management, and creates a conforming solution in terms of configuration of the physical layer parameters. The corresponding solution is subject to the configuration and control parameters and the aggregate spectrum available.

Meanwhile, the operation of the Scheduler 11200 is constrained by combination of dynamic, quasi-static, and static configurations. The definition of these constraints is left to implementation.

Figure 3A:
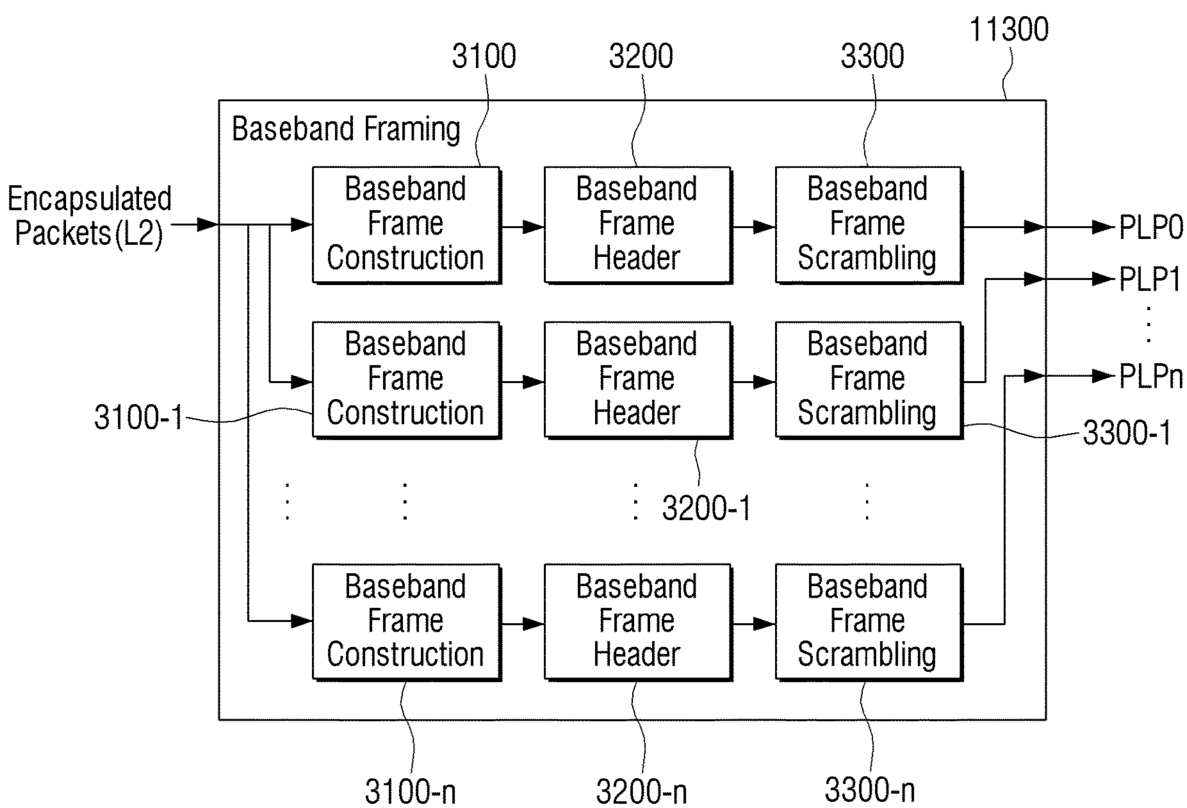

In addition, for each service a maximum of four PLPs shall be used. Multiple services consisting of multiple time interleaving blocks may be constructed, up to a total maximum of 64 PLPs for bandwidths of 6, 7 or 8 MHz. The baseband framing block 11300, as illustrated in FIG. 3A, consists of three blocks, baseband frame construction 3100, 3100-1, . . . 3100-*n*, baseband frame header construction block 3200, 3200-1, . . . 3200-*n*, and the baseband frame scrambling block 3300, 3300-1, . . . 3300-*n*. In a M-PLP operation, the baseband framing block creates multiple PLPs as necessary.

Figure 3B:
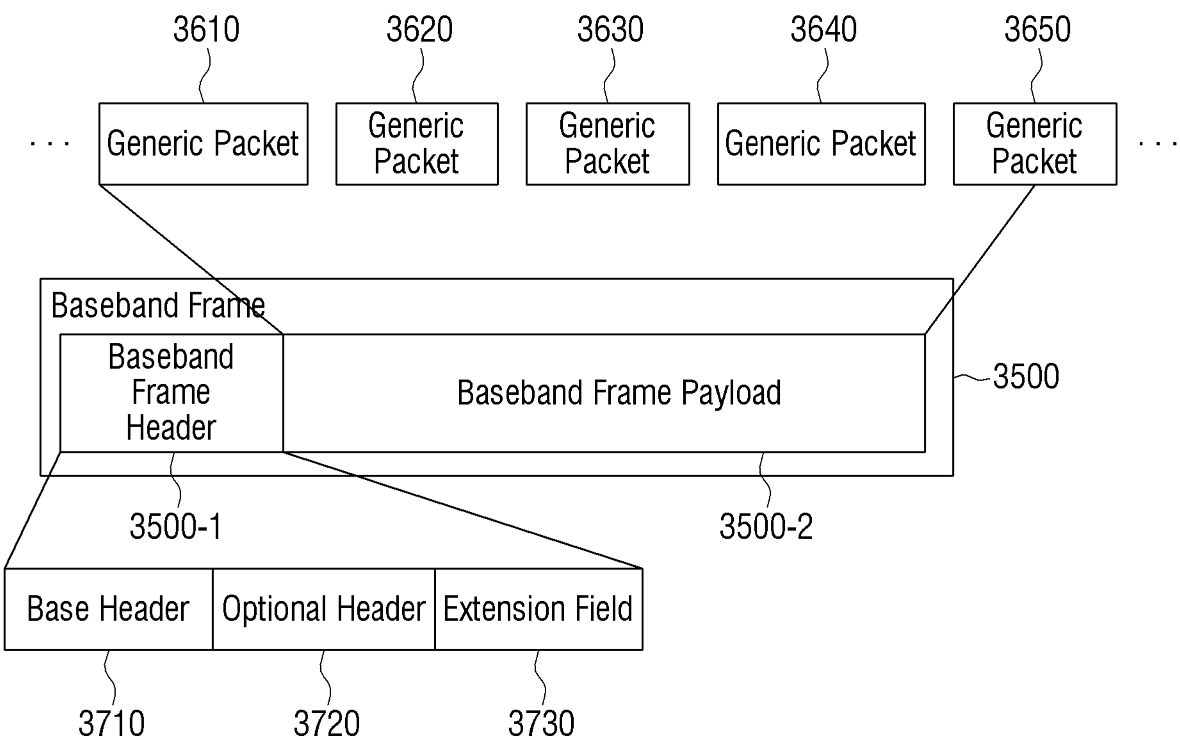

A baseband frame 3500, as illustrated in FIG. 3B, consists of a baseband frame header 3500-1 and payload 3500-2 consisting of generic packets. Baseband frames have fixed length $K_{payload}$. Generic packets 3610-3650 shall be mapped to baseband frames 3500 in order. If generic packets 3610-3650 do not completely fit within a baseband frame, packets are split between the current baseband frame and the next baseband frame. Packet splits shall be in byte units only.

The baseband frame header construction block 3200, 3200-1, . . . 3200-*n* configures the baseband frame header. The baseband frame header 3500-1, as illustrated in FIG. 3B, is composed of three parts, including the base header 3710, the optional header (or option field 3720) and the extension field 3730. Here, the base header 3710 appears in every baseband frame, and the optional header 3720 and the extension field 3730 may not be present in every time.

The main feature of the base header 3710 is to provide a pointer including an offset value in bytes as an initiation of the next generic packet within the baseband frame. When the generic packet initiates the baseband frame, the pointer value becomes zero. If there is no generic packet which is initiated within the baseband frame, the pointer value is 8191, and a 2-byte base header may be used.

The extension field (or extension header) 3730 may be used later, for example, for the baseband frame packet counter, baseband frame time stamping, and additional signaling, etc.

The baseband frame scrambling block 3300, 3300-1, . . . 3300-*n* scrambles the baseband frame.

In order to ensure that the payload data when mapped to constellations does not always map to the same point, such as when the payload mapped to constellations consists of a repetitive sequence, the payload data shall always be scrambled before forward error correction encoding.

The scrambling sequences shall be generated by a 16-bit shift register that has 9 feedback taps. Eight of the shift register outputs are selected as a fixed randomizing byte, where each bit from t his byte is used to individually XOR the corresponding input data. The data bits are XORed MSB to MSB and so on until LSB to LSB. The generator polynomial is $G(x)=1+X+X^3+X^6\pm X^7\pm X^{11}\pm X^{12}\pm X^{13}\pm X^{16}$.

Figure 4:
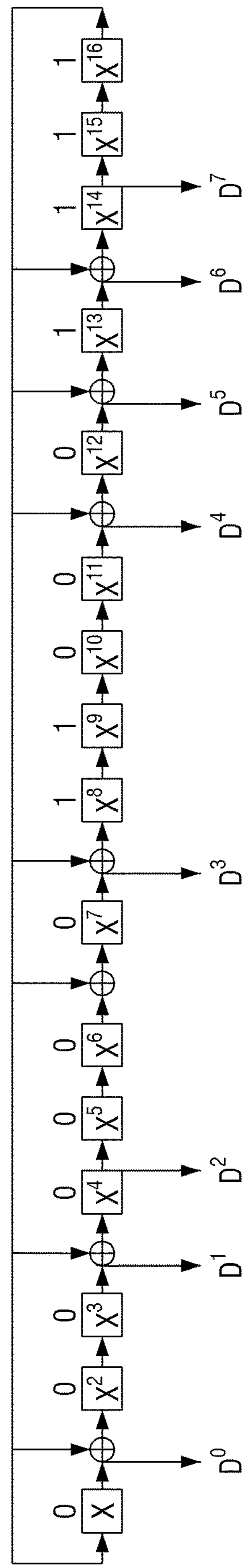

FIG. 4 illustrates a shift register of a PRBS encoder for scrambling a baseband according to an exemplary embodiment, wherein loading of the sequence into the PRBS register, as illustrated in FIG. 4 and shall be initiated at the start of every baseband frame.

Figure 5:
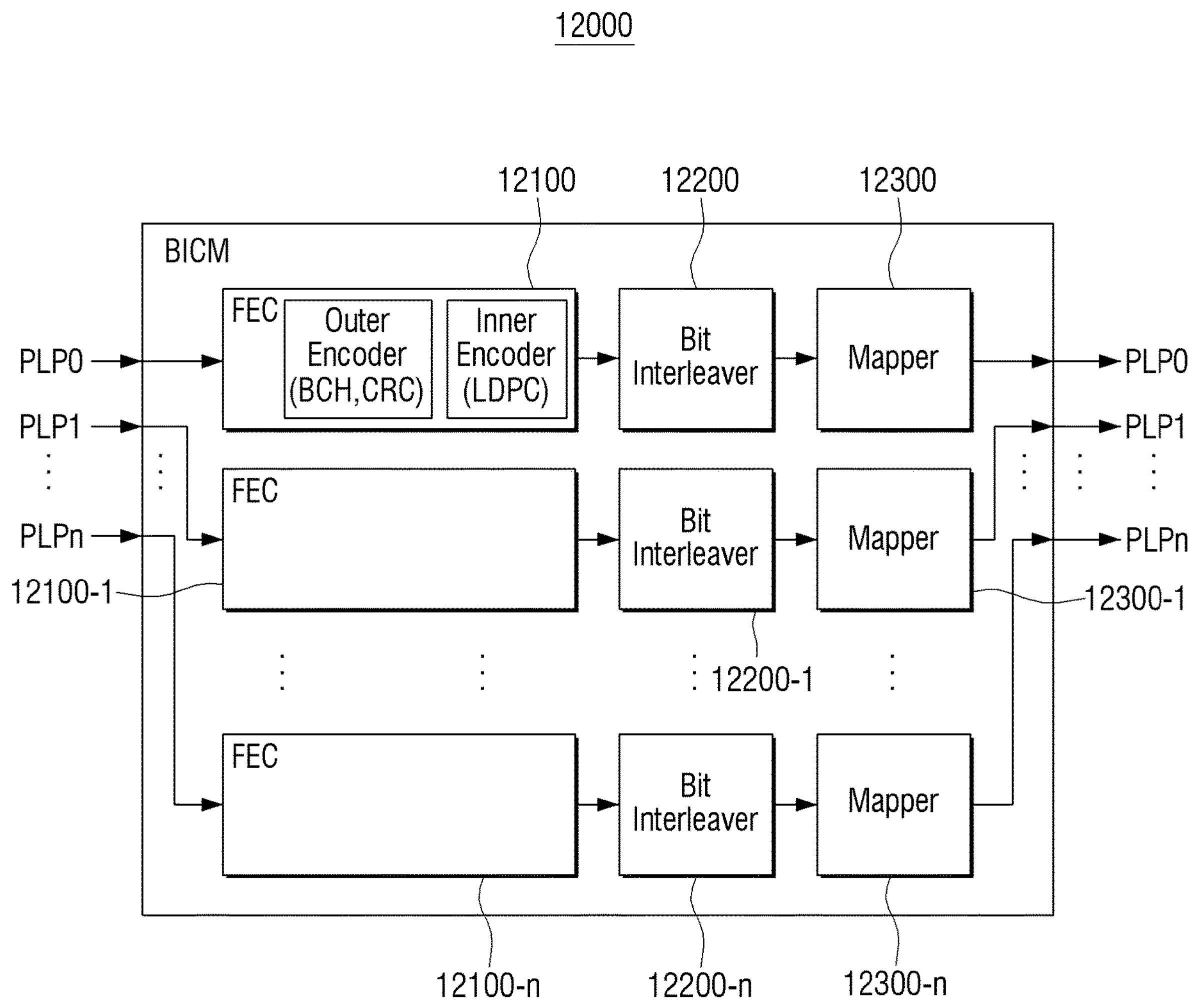

FIG. 5 is a block diagram provided to explain detailed configuration of the BICM block illustrated in FIG. 1A.

As illustrated in FIG. 5, the BICM block includes the FEC block 14100, 14100-1, . . . , 14100-*n*, Bit Interleaver block 14200, 14200-1, . . . , 14200-*n* and Mapper blocks 14300, 14300-1, . . . , 14300-*n*.

Figure 6A:
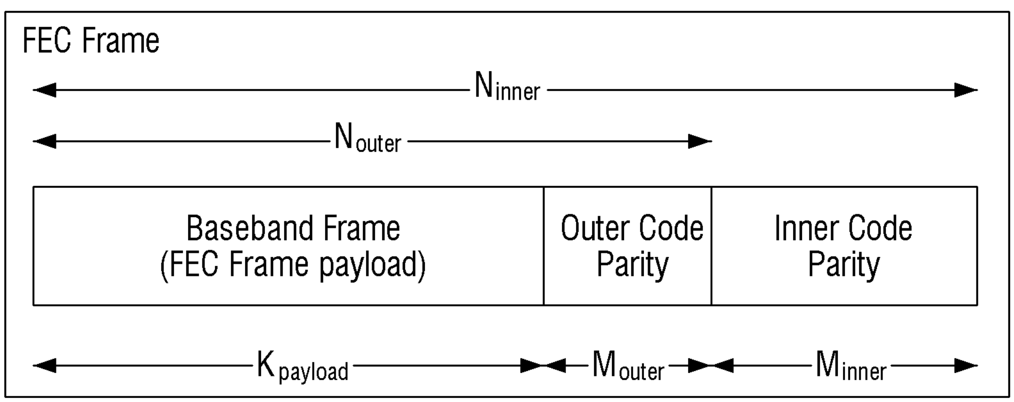

The input to the FEC block 1400, 14100-1, . . . , 14100-*n* is a Baseband frame, of length $K_{payload}$, and the output from the FEC block is a FEC frame. The FEC block 14100, 14100-1, . . . , 14100-*n* is implemented by concatenation of an outer code and an inner code with the information part. The FEC frame has length $N_{inner}$ There are two different lengths of LDPC code defined: $N_{inner}$=64800 bits and $N_{inner}$=16200 bits The outer code is realized as one of either Bose, Ray-Chaudhuri and Hocquenghem (BCH) outer code, a Cyclic Redundancy Check (CRC) or other code. The inner code is realized as a Low Density Parity Check (LDPC) code. Both BCH and LDPC FEC codes are systematic codes where the information part I contained within the codeword. The resulting codeword is thus a concatenation of information or payload part, BCH or CRC parities and LDPC parities, as shown in FIG. 6A.

The use of LDPC code is mandatory and is used to provide the redundancy needed for the code detection. There are two different LDPC structures that are defined, these are called Type A and Type B. Type A has a code structure that shows better performance at low code rates while Type B code structure shows better performance at high code rates. In general $N_{inner}$=64800 bit codes are expected to be employed. However, for applications where latency is critical, or a simpler encoder/decoder structure is preferred, $N_{inner}$=16200 bit codes may also be used.

Figure 6B:
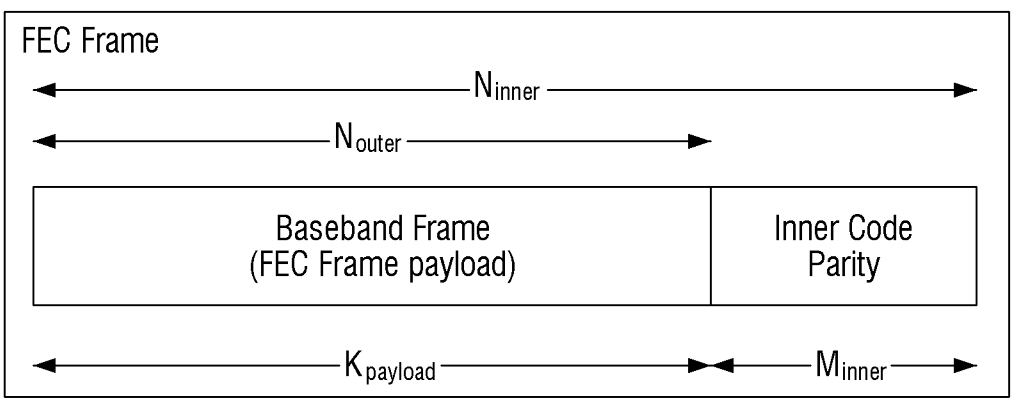

The outer code and CRC consist of adding M outer bits to the input baseband frame. The outer BCH code is used to lower the inherent LDPC error floor by correcting a predefined number of bit errors. When using BCH codes the length of $M_{outer}$ is 192 bits ($N_{inner}$=64800 bit codes) and 168 bits (for $N_{inner}$=16200 bit codes). When using CRC the length of $M_{outer}$ 32 bits. When neither BCH nor CRC are used the length of $M_{outer}$ is zero. The outer code may be omitted if it is determined that the error correcting capability of the inner code is sufficient for the application. When there is no outer code the structure of the FEC frame is as shown in FIG. 6B.

Figure 7:
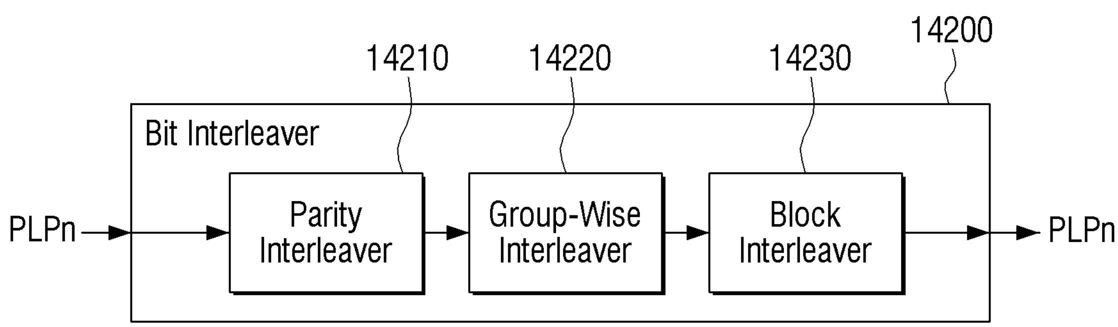

FIG. 7 is a block diagram provided to explain detailed configuration of the Bit Interleaver block illustrated in FIG. 6.

The LDPC codeword of the LDPC encoder, i.e., a FEC Frame, shall be bit interleaved by a Bit Interleaver block 14200. The Bit Interleaver block 14200 includes a parity interleaver 14210, a group-wise interleaver 14220 and a block interleaver 14230. Here, the parity interleaver is not used for Type A and is only used for Type B codes.

The parity interleaver 14210 converts the staircase structure of the parity-part of the LDPC parity-check matrix into a quasi-cyclic structure similar to the information-part of the matrix.

Meanwhile, the parity interleaved LDPC coded bits are split into $N_{group}=N_{inner}/360$ bit groups, and the group-wise interleaver 14220 rearranges the bit groups.

The block interleaver 14230 block interleaves the group-wise interleaved LDPC codeword.

Specifically, the block interleaver 14230 divides a plurality of columns into part 1 and part 2 based on the number of columns of the block interleaver 14230 and the number of bits of the bit groups. In addition, the block interleaver 14230 writes the bits into each column configuring part 1 column wise, and subsequently writes the bits into each column configuring part 2 column wise, and then reads out row wise the bits written in each column.

In this case, the bits constituting the bit groups in the part 1 may be written into the same column, and the bits constituting the bit groups in the part 2 may be written into at least two columns.

Back to FIG. 5, the Mapper block 14300, 14300-1, . . . , 14300-*n* maps FEC encoded and bit interleaved bits to complex valued quadrature amplitude modulation (QAM) constellation points. For the highest robustness level, quaternary phase shift keying (QPSK) is used. For higher order constellations (16-QAM up to 4096-QAM), non-uniform constellations are defined and the constellations are customized for each code rate.

Each FEC frame shall be mapped to a FEC block by first de-multiplexing the input bits into parallel data cell words and then mapping these cell words into constellation values.

Figure 8:
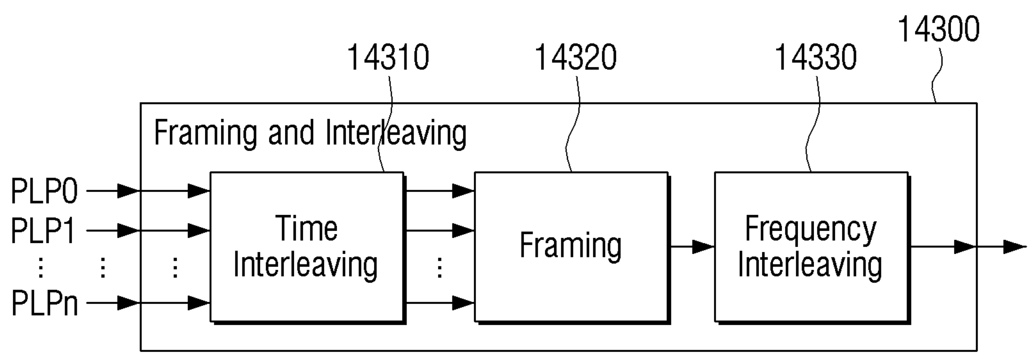

FIG. 8 is a block diagram provided to explain detailed configuration of a Framing/Interleaving block illustrated in FIG. 1A.

As illustrated in FIG. 8, the Framing/Interleaving block 14300 includes a time interleaving block 14310, a framing block 14320 and a frequency interleaving block 14330.

The input to the time interleaving block 14310 and the framing block 14320 may consist of M-PLPs however the output of the framing block 14320 is OFDM symbols, which are arranged in frames. The frequency interleaver included in the frequency interleaving block 14330 operates an OFDM symbols.

The time interleaver (TI) configuration included in the time interleaving block 14310 depends on the number of PLPs used. When there is only a single PLP or when LDM is used, a sheer convolutional interleaver is used, while for multiple PLP a hybrid interleaver consisting of a cell interleaver, a block interleaver and a convolutional interleaver is used. The input to the time interleaving block 14310 is a stream of cells output from the mapper block (FIG. 5, 14300, 14300-1, . . . , 14300-*n*), and the output of the time interleaving block 14310 is also a stream of time-interleaved cells.

Figure 9A:
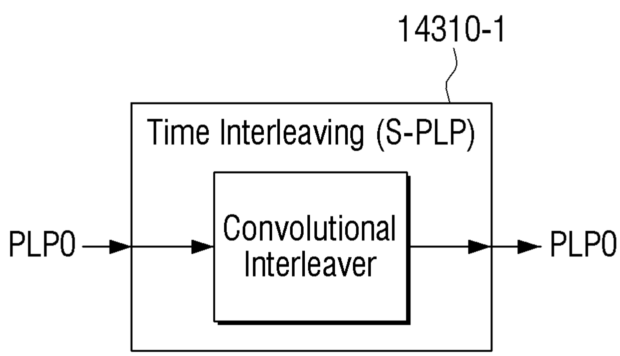

FIG. 9A illustrates the time interleaving block for a single PLP (S-PLP), and it consists of a convolutional interleaver only.

Figure 9B:
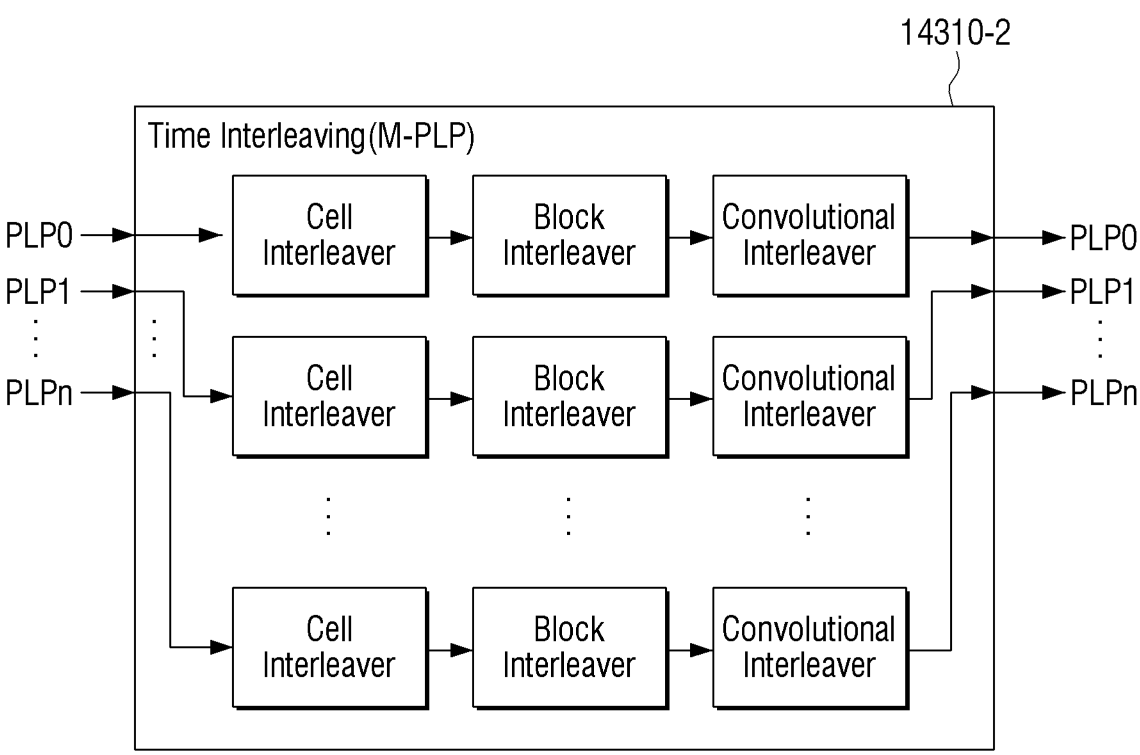

FIG. 9B illustrates the time interleaving block for a plurality of PLPs (M-PLP), and it can be divided in several sub-blocks as illustrated.

The framing block 14320 maps the interleaved frames onto at least one transmitter frame. The framing block 14320, specifically, receives inputs (e.g. data cell) from at least one physical layer pipes and outputs symbols.

In addition, the framing block 14320 creates at least one special symbol known as preamble symbols. These symbols undergo the same processing in the waveform block mentioned later.

Figure 10:
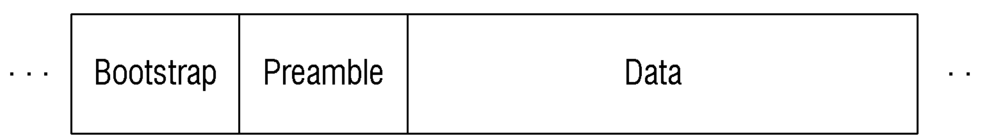

FIG. 10 is a view illustrating an example of a transmission frame according to an exemplary embodiment.

As illustrated in FIG. 10, the transmission frame consists of three parts, the bootstrap, preamble and data payload. Each of the three parts consists of at least one symbol.

Meanwhile, the purpose of the frequency interleaving block 14330 is to ensure that sustained interference in one part of the spectrum will not degrade the performance of a particular PLP disproportionately compared to other PLPs. The frequency interleaver 14330, operating on the all the data cells of one OFDM symbol, maps the data cells from the framing block 14320 onto the N data carriers.

Figure 11:
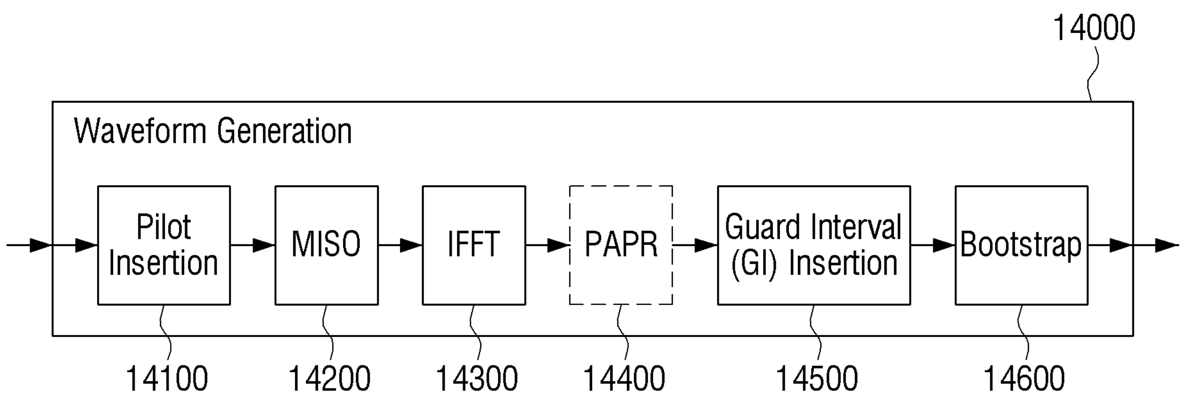

FIG. 11 is a block diagram provided to explain detailed configuration of a Waveform Generation block illustrated in FIG. 1A.

As illustrated in FIG. 11, the Waveform Generation block 14000 includes a pilot inserting block 14100, a MISO block 14200, an IFFT block 14300, a PAPR block 14400, a GI inserting block 14500 and a bootstrap block 14600.

The pilot inserting block 14100 inserts a pilot to various cells within the OFDM frame.

Various cells within the OFDM frame are modulated with reference information whose transmitted value is known to the receiver.

Cells containing the reference information are transmitted at a boosted power level. The cells are called scattered, continual, edge, preamble or frame-closing pilot cells. The value of the pilot information is derived from a reference sequence, which is a series of values, one for each transmitted carrier on any given symbol.

The pilots can be used for frame synchronization, frequency synchronization, time synchronization, channel estimation, transmission mode identification and can also be used to follow the phase noise.

The pilots are modulated according to reference information, and the reference sequence is applied to all the pilots (e.g. scattered, continual edge, preamble and frame closing pilots) in every symbol including preamble and the frame-closing symbol of the frame.

The reference information, taken from the reference sequence, is transmitted in scattered pilot cells in every symbol except the preamble and the frame-closing symbol of the frame.

In addition to the scattered pilots described above, a number of continual pilots are inserted in every symbol of the frame except for Preamble and the frame-closing symbol. The number and location of continual pilots depends on both the FFT size and scattered pilot pattern in use.

The MISO block 14200 applies a MISO processing.

The Transmit Diversity Code Filter Set is a MISO pre-distortion technique that artificially decorrelates signals from multiple transmitters in a Single Frequency Network in order to minimize potential destructive interference. Linear frequency domain filters are used so that the compensation in the receiver can be implemented as part of the equalizer process. The filter design is based on creating all-pass filters with minimized cross-correlation over all filter pairs under the constraints of the number of transmitters $M \in \{2, 3, 4\}$ and the time domain span of the filters $N \in \{64, 256\}$. The longer time domain span filters will increase the decorrelation level, but the effective guard interval length will be decreased by the filter time domain span and this should be taken into consideration when choosing a filter set for a particular network topology.

The IFFT block 14300 specifies the OFDM structure to use for each transmission mode. The transmitted signal is organized in frames. Each frame has a duration of $T_F$, and consists of $L_F$ OFDM symbols. N frames constitute one super-frame. Each symbol is constituted by a set of $K_{total}$ carriers transmitted with a duration $T_S$. Each symbol is composed of a useful part with duration $T_U$ and a guard interval with a duration A. The guard interval consists of a cyclic continuation of the useful part, $T_U$, and is inserted before it.

The PAPR block 14400 applies the Peak to Average Power Reduction technique.

The GI inserting block 14500 inserts the guard interval into each frame.

The bootstrap block 14600 prefixes the bootstrap signal to the front of each frame.

Figure 12:
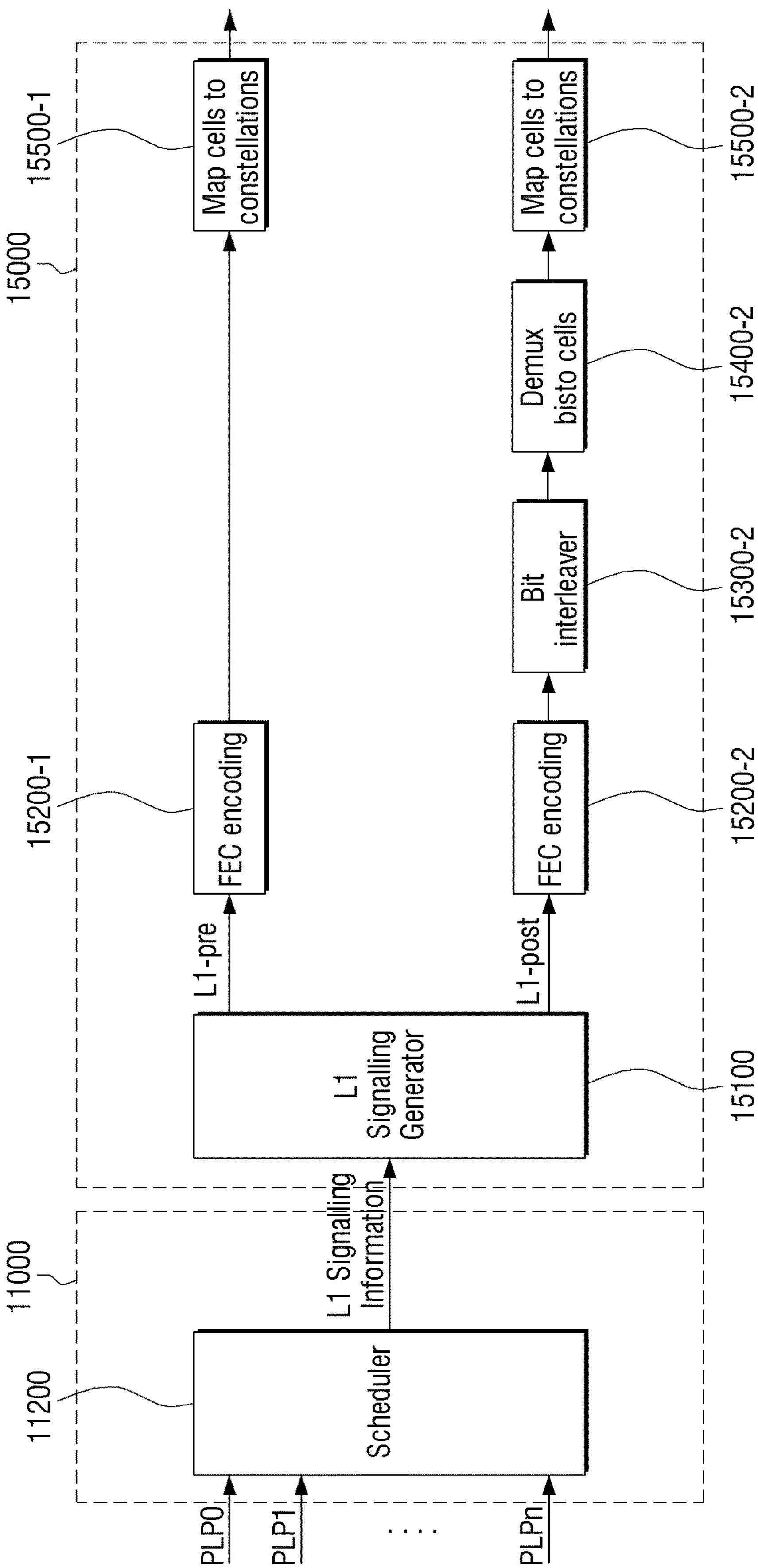

FIG. 12 is a block diagram provided to explain a configuration of signaling information according to an exemplary embodiment.

The input processing block 11000 includes a scheduler 11200. The BICM block 15000 includes an L1 signaling generator 15100, an FEC encoder 15200-1 and 15200-2, a bit interleaver 15300-2, a demux 15400-2, constellation mappers 15500-1 and 15500-2. The L1 signaling generator 15100 may be included in the input processing block 11000, according to an exemplary embodiment.

An n number of service data are mapped to a PLP0 to a PLPn respectively. The scheduler 11200 determines a position, modulation and coding rate for each PLP in order to map a plurality of PLPs to a physical layer of T2. In other words, the scheduler 11200 generates L1 signaling information. The scheduler 11200 may output dynamic field information among L1 post signaling information of a current frame, using the framing/Interleaving block 13000 (FIG. 1) which may be referred to as a frame builder. Further, the scheduler 11200 may transmit the L1 signaling information to the BICM block 15000. The L1 signaling information includes L1 pre signaling information and L1 post signaling information.

The L1 signaling generator 15100 may differentiate the L1 pre signaling information from the L1 post signaling information to output them. The FEC encoders 15200-1 and 15200-2 perform respective encoding operations which include shortening and puncturing for the L1 pre signaling information and the L1 post signaling information. The bit interleaver 15300-2 performs interleaving by bit for the encoded L1 post signaling information. The demux 15400-2 controls robustness of bits by modifying an order of bits constituting cells and outputs the cells which include bits. Two constellation mappers 15500-1 and 15500-2 map the L1 pre signaling information and the L1 post signaling information to constellations, respectively. The L1 pre signaling information and the L1 post signaling information processed through the above described processes are output to be included in each frame by the Framing/Interleaving block 13000 (FIG. 1).

Figure 13:
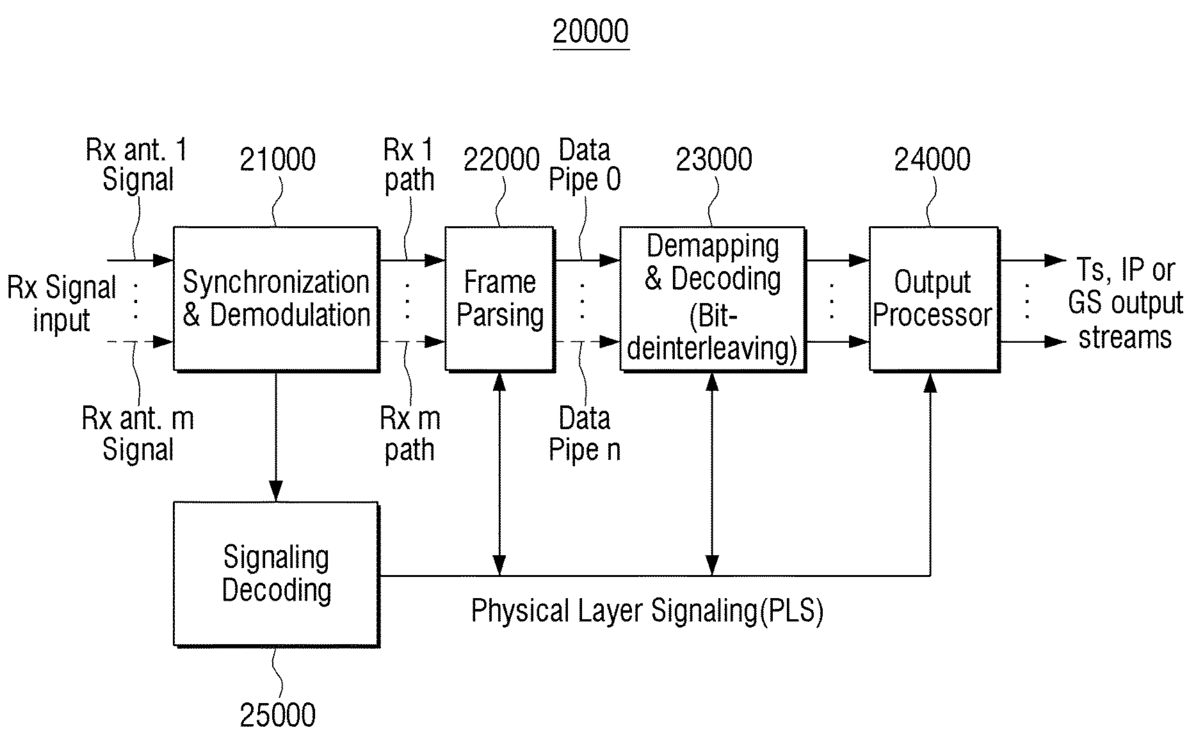
FIGS. 13 to 18 are views to illustrate a receiving apparatus according to exemplary embodiments.

FIG. 13 illustrates a structure of an receiving apparatus according to an embodiment of the present invention.

The apparatus 20000 for receiving broadcast signals according to an embodiment of the present invention can correspond to the apparatus 10000 for transmitting broadcast signals, described with reference to FIG. 1. The apparatus 20000 for receiving broadcast signals according to an embodiment of the present invention can include a synchronization & demodulation module 21000, a frame parsing module 22000, a demapping & decoding module 23000, an output processor 24000 and a signaling decoding module 25000. A description will be given of operation of each module of the apparatus 20000 for receiving broadcast signals.

The synchronization & demodulation module 21000 can receive input signals through m Rx antennas, perform signal detection and synchronization with respect to a system corresponding to the apparatus 20000 for receiving broadcast signals and carry out demodulation corresponding to a reverse procedure of the procedure performed by the apparatus 10000 for transmitting broadcast signals.

The frame parsing module 22000 can parse input signal frames and extract data through which a service selected by a user is transmitted. If the apparatus 10000 for transmitting broadcast signals performs interleaving, the frame parsing module 22000 can carry out deinterleaving corresponding to a reverse procedure of interleaving. In this case, the positions of a signal and data that need to be extracted can be obtained by decoding data output from the signaling decoding module 25200 to restore scheduling information generated by the apparatus 10000 for transmitting broadcast signals.

The demapping & decoding module 23000 can convert the input signals into bit domain data and then deinterleave the same as necessary. The demapping & decoding module 23000 can perform demapping for mapping applied for transmission efficiency and correct an error generated on a transmission channel through decoding. In this case, the demapping & decoding module 23000 can obtain transmission parameters necessary for demapping and decoding by decoding the data output from the signaling decoding module 25000.

The output processor 24000 can perform reverse procedures of various compression/signal processing procedures which are applied by the apparatus 10000 for transmitting broadcast signals to improve transmission efficiency. In this case, the output processor 24000 can acquire necessary control information from data output from the signaling decoding module 25000. The output of the output processor 24000 corresponds to a signal input to the apparatus 10000 for transmitting broadcast signals and may be MPEG-TSs, IP streams (v4 or v6) and generic streams.

The signaling decoding module 25000 can obtain PLS information from the signal demodulated by the synchronization & demodulation module 21000. As described above, the frame parsing module 22000, demapping & decoding module 23000 and output processor 24000 can execute functions thereof using the data output from the signaling decoding module 25000.

Figure 14:
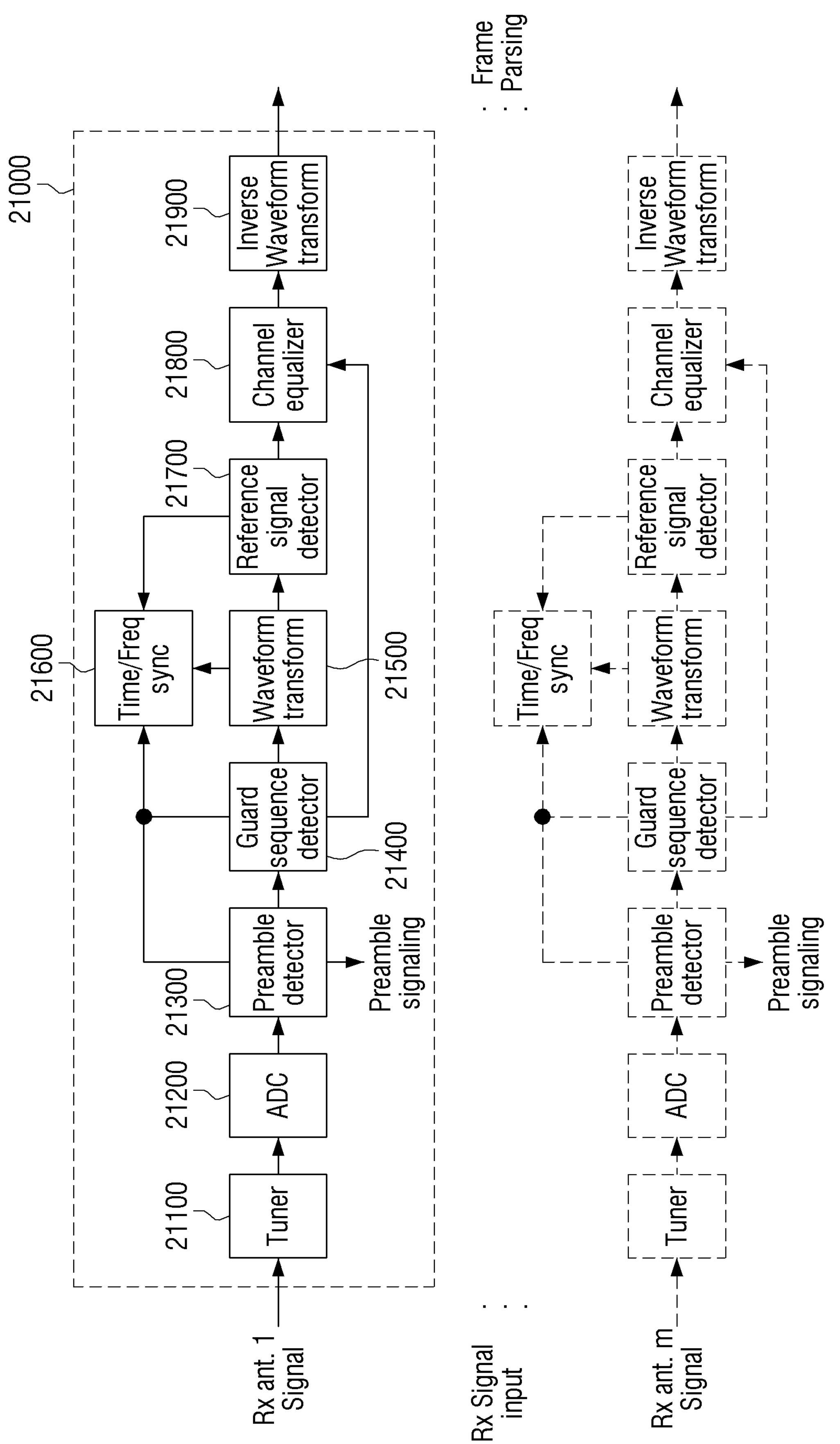

FIG. 14 illustrates a synchronization & demodulation module according to an embodiment of the present invention.

As shown in FIG. 14, the synchronization & demodulation module 21000 according to an embodiment of the present invention corresponds to a synchronization & demodulation module of an apparatus 20000 for receiving broadcast signals using m Rx antennas and can include m processing blocks for demodulating signals respectively input through m paths. The m processing blocks can perform the same processing procedure. A description will be given of operation of the first processing block 21000 from among the m processing blocks.

The first processing block 21000 can include a tuner 21100, an ADC block 21200, a preamble detector 21300, a guard sequence detector 21400, a waveform transform block 21500, a time/frequency synchronization block 21600, a reference signal detector 21700, a channel equalizer 21800 and an inverse waveform transform block 21900.

The tuner 21100 can select a desired frequency band, compensate for the magnitude of a received signal and output the compensated signal to the ADC block 21200.

The ADC block 21200 can convert the signal output from the tuner 21100 into a digital signal.

The preamble detector 21300 can detect a preamble (or preamble signal or preamble symbol) in order to check whether or not the digital signal is a signal of the system corresponding to the apparatus 20000 for receiving broadcast signals. In this case, the preamble detector 21300 can decode basic transmission parameters received through the preamble.

The guard sequence detector 21400 can detect a guard sequence in the digital signal. The time/frequency synchronization block 21600 can perform time/frequency synchronization using the detected guard sequence and the channel equalizer 21800 can estimate a channel through a received/restored sequence using the detected guard sequence.

The waveform transform block 21500 can perform a reverse operation of inverse waveform transform when the apparatus 10000 for transmitting broadcast signals has performed inverse waveform transform. When the broadcast transmission/reception system according to one embodiment of the present invention is a multi-carrier system, the waveform transform block 21500 can perform FFT. Furthermore, when the broadcast transmission/reception system according to an embodiment of the present invention is a single carrier system, the waveform transform block 21500 may not be used if a received time domain signal is processed in the frequency domain or processed in the time domain.

The time/frequency synchronization block 21600 can receive output data of the preamble detector 21300, guard sequence detector 21400 and reference signal detector 21700 and perform time synchronization and carrier frequency synchronization including guard sequence detection and block window positioning on a detected signal. Here, the time/frequency synchronization block 21600 can feed back the output signal of the waveform transform block 21500 for frequency synchronization.

The reference signal detector 21700 can detect a received reference signal. Accordingly, the apparatus 20000 for receiving broadcast signals according to an embodiment of the present invention can perform synchronization or channel estimation.

The channel equalizer 21800 can estimate a transmission channel from each Tx antenna to each Rx antenna from the guard sequence or reference signal and perform channel equalization for received data using the estimated channel.

The inverse waveform transform block 21900 may restore the original received data domain when the waveform transform block 21500 performs waveform transform for efficient synchronization and channel estimation/equalization. If the broadcast transmission/reception system according to an embodiment of the present invention is a single carrier system, the waveform transform block 21500 can perform FFT in order to carry out synchronization/channel estimation/equalization in the frequency domain and the inverse waveform transform block 21900 can perform IFFT on the channel-equalized signal to restore transmitted data symbols. If the broadcast transmission/reception system according to an embodiment of the present invention is a multi-carrier system, the inverse waveform transform block 21900 may not be used.

The above-described blocks may be omitted or replaced by blocks having similar or identical functions according to design.

Figure 15:
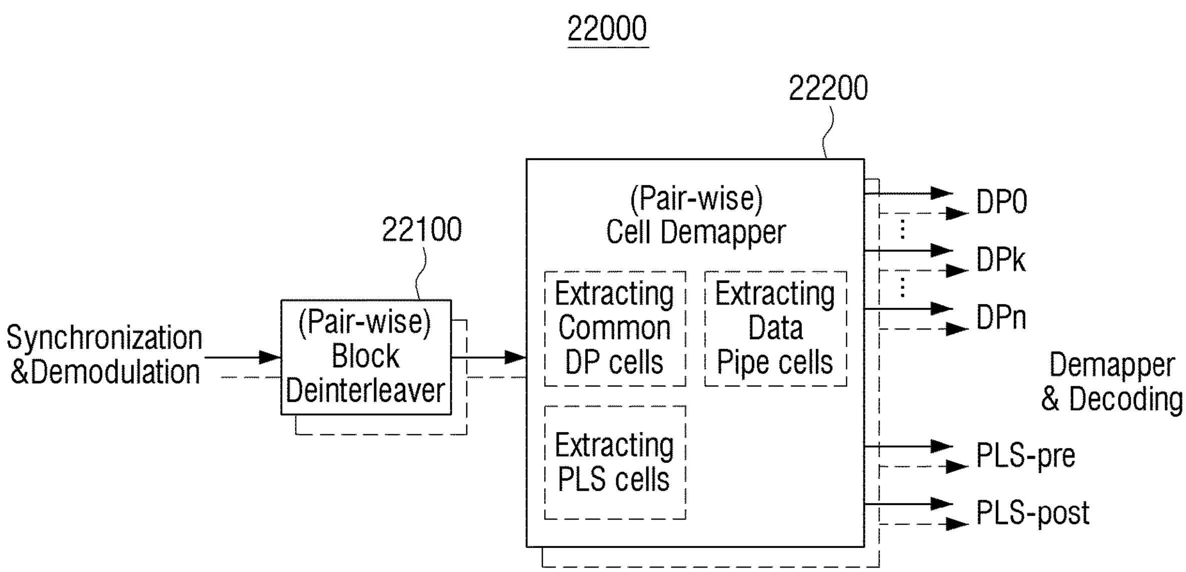

FIG. 15 illustrates a frame parsing module according to an embodiment of the present invention.

As shown in FIG. 15, the frame parsing module 22000 according to an embodiment of the present invention can include at least one block interleaver 22100 and at least one cell demapper 22200.

The block interleaver 22100 can deinterleave data input through data paths of the m Rx antennas and processed by the synchronization & demodulation module 21000 on a signal block basis. In this case, if the apparatus 10000 for transmitting broadcast signals performs pair-wise interleaving, the block interleaver 22100 can process two consecutive pieces of data as a pair for each input path. Accordingly, the block interleaver 22100 can output two consecutive pieces of data even when deinterleaving has been performed. Furthermore, the block interleaver 22100 can perform a reverse operation of the interleaving operation performed by the apparatus 10000 for transmitting broadcast signals to output data in the original order.

The cell demapper 22200 can extract cells corresponding to common data, cells corresponding to data pipes and cells corresponding to PLS data from received signal frames. The cell demapper 22200 can merge data distributed and transmitted and output the same as a stream as necessary. When two consecutive pieces of cell input data are processed as a pair and mapped in the apparatus 10000 for transmitting broadcast signals, the cell demapper 22200 can perform pair-wise cell demapping for processing two consecutive input cells as one unit as a reverse procedure of the mapping operation of the apparatus 10000 for transmitting broadcast signals.

In addition, the cell demapper 22200 can extract PLS signaling data received through the current frame as PLS-pre & PLS-post data and output the PLS-pre & PLS-post data.

The above-described blocks may be omitted or replaced by blocks having similar or identical functions according to design.

Figure 16:
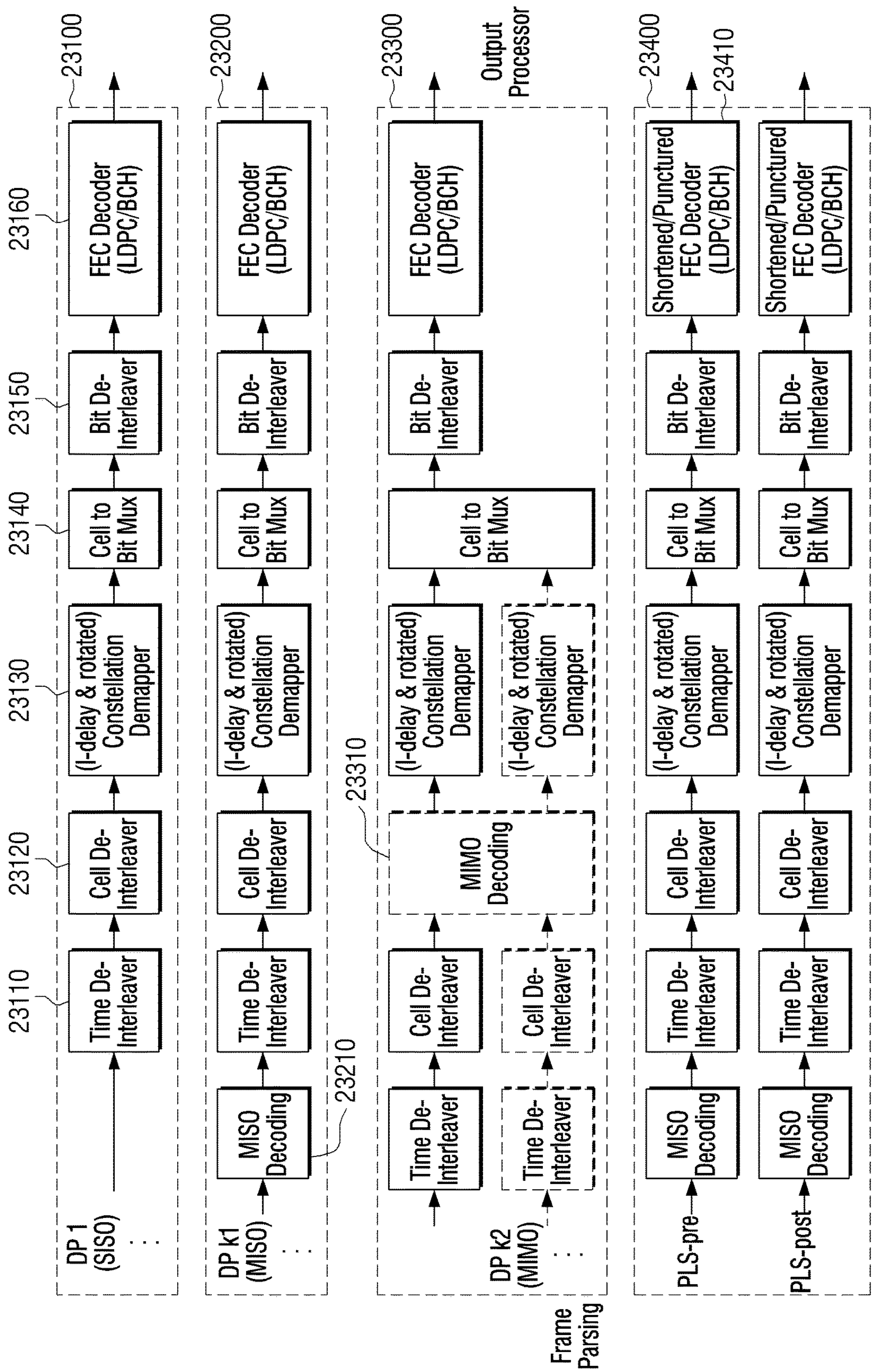

FIG. 16 illustrates a demapping & decoding module according to an embodiment of the present invention.

The demapping & decoding module 23000 shown in FIG. 16 can perform a reverse operation of the operation of the bit interleaved and coded & modulation module illustrated in FIG. 1.

The bit interleaved and coded & modulation module of the apparatus 10000 for transmitting broadcast signals according to an embodiment of the present invention can process input data pipes by independently applying SISO, MISO and MIMO thereto for respective paths, as described above. Accordingly, the demapping & decoding module 23000 illustrated in FIG. 16 can include blocks for processing data output from the frame parsing module according to SISO, MISO and MIMO in response to the apparatus 10000 for transmitting broadcast signals.

As shown in FIG. 16, the demapping & decoding module 23000 according to an embodiment of the present invention can include a first block 23100 for SISO, a second block 23200 for MISO, a third block 23300 for MIMO and a fourth block 23400 for processing the PLS-pre/PLS-post information. The demapping & decoding module 23000 shown in FIG. 16 is exemplary and may include only the first block 23100 and the fourth block 23400, only the second block 23200 and the fourth block 23400 or only the third block 23300 and the fourth block 23400 according to design. That is, the demapping & decoding module 23000 can include blocks for processing data pipes equally or differently according to design.

A description will be given of each block of the demapping & decoding module 23000.

The first block 23100 processes an input data pipe according to SISO and can include a time deinterleaver block 23110, a cell deinterleaver block 23120, a constellation demapper block 23130, a cell-to-bit mux block 23140, a bit deinterleaver block 23150 and an FEC decoder block 23160.

The time deinterleaver block 23110 can perform a reverse process of the process performed by the time interleaving block 14310 illustrated in FIG. 8. That is, the time deinterleaver block 23110 can deinterleave input symbols interleaved in the time domain into original positions thereof.

The cell deinterleaver block 23120 can perform a reverse process of the process performed by the cell interleaver block illustrated in FIG. 9*a*. That is, the cell deinterleaver block 23120 can deinterleave positions of cells spread in one FEC block into original positions thereof. The cell deinterleaver block 23120 may be omitted.

The constellation demapper block 23130 can perform a reverse process of the process performed by the mapper 12300 illustrated in FIG. 5. That is, the constellation demapper block 23130 can demap a symbol domain input signal to bit domain data. In addition, the constellation demapper block 23130 may perform hard decision and output decided bit data. Furthermore, the constellation demapper block 23130 may output a log-likelihood ratio (LLR) of each bit, which corresponds to a soft decision value or probability value. If the apparatus 10000 for transmitting broadcast signals applies a rotated constellation in order to obtain additional diversity gain, the constellation demapper block 23130 can perform 2-dimensional LLR demapping corresponding to the rotated constellation. Here, the constellation demapper block 23130 can calculate the LLR such that a delay applied by the apparatus 10000 for transmitting broadcast signals to the I or Q component can be compensated.

The cell-to-bit mux block 23140 can perform a reverse process of the process performed by the mapper 12300 illustrated in FIG. 5. That is, the cell-to-bit mux block 23140 can restore bit data mapped to the original bit streams.

The bit deinterleaver block 23150 can perform a reverse process of the process performed by the bit interleaver 12200 illustrated in FIG. 5. That is, the bit deinterleaver block 23150 can deinterleave the bit streams output from the cell-to-bit mux block 23140 in the original order.

The FEC decoder block 23460 can perform a reverse process of the process performed by the FEC encoder 12100 illustrated in FIG. 5. That is, the FEC decoder block 23460 can correct an error generated on a transmission channel by performing LDPC decoding and BCH decoding.

The second block 23200 processes an input data pipe according to MISO and can include the time deinterleaver block, cell deinterleaver block, constellation demapper block, cell-to-bit mux block, bit deinterleaver block and FEC decoder block in the same manner as the first block 23100, as shown in FIG. 16. However, the second block 23200 is distinguished from the first block 23100 in that the second block 23200 further includes a MISO decoding block 23210. The second block 23200 performs the same procedure including time deinterleaving operation to outputting operation as the first block 23100 and thus description of the corresponding blocks is omitted.

The MISO decoding block 11110 can perform a reverse operation of the operation of the MISO processing in the apparatus 10000 for transmitting broadcast signals. If the broadcast transmission/reception system according to an embodiment of the present invention uses STBC, the MISO decoding block 11110 can perform Alamouti decoding.

The third block 23300 processes an input data pipe according to MIMO and can include the time deinterleaver block, cell deinterleaver block, constellation demapper block, cell-to-bit mux block, bit deinterleaver block and FEC decoder block in the same manner as the second block 23200, as shown in FIG. 16. However, the third block 23300 is distinguished from the second block 23200 in that the third block 23300 further includes a MIMO decoding block 23310. The basic roles of the time deinterleaver block, cell deinterleaver block, constellation demapper block, cell-to-bit mux block and bit deinterleaver block included in the third block 23300 are identical to those of the corresponding blocks included in the first and second blocks 23100 and 23200 although functions thereof may be different from the first and second blocks 23100 and 23200.

The MIMO decoding block 23310 can receive output data of the cell deinterleaver for input signals of the m Rx antennas and perform MIMO decoding as a reverse operation of the operation of the MIMO processing in the apparatus 10000 for transmitting broadcast signals. The MIMO decoding block 23310 can perform maximum likelihood decoding to obtain optimal decoding performance or carry out sphere decoding with reduced complexity. Otherwise, the MIMO decoding block 23310 can achieve improved decoding performance by performing MMSE detection or carrying out iterative decoding with MMSE detection.

The fourth block 23400 processes the PLS-pre/PLS-post information and can perform SISO or MISO decoding.

The basic roles of the time deinterleaver block, cell deinterleaver block, constellation demapper block, cell-to-bit mux block and bit deinterleaver block included in the fourth block 23400 are identical to those of the corresponding blocks of the first, second and third blocks 23100, 23200 and 23300 although functions thereof may be different from the first, second and third blocks 23100, 23200 and 23300.

The shortened/punctured FEC decoder 23410 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 16.

Figure 17:
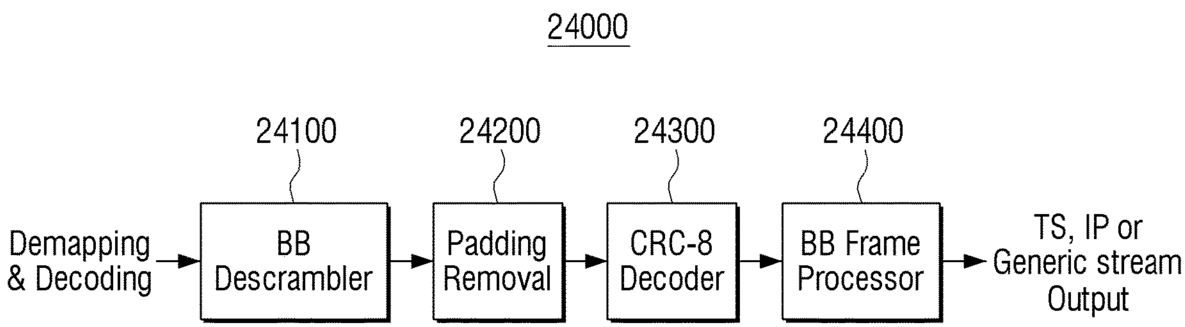
Figure 18:
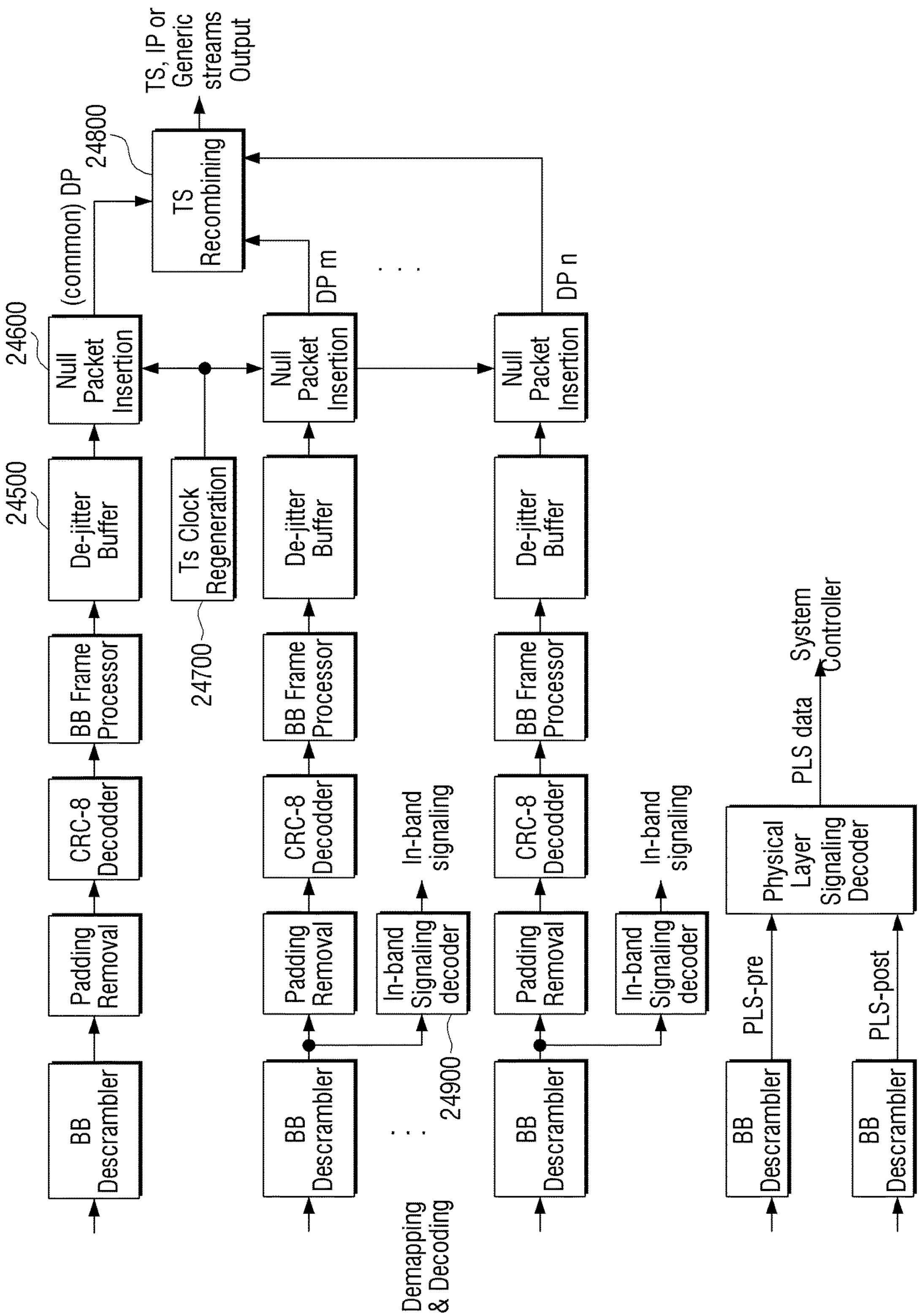

FIGS. 17 and 18 illustrate output processors according to embodiments of the present invention.

FIG. 17 illustrates an output processor 24000 according to an embodiment of the present invention. The output processor 24000 illustrated in FIG. 17 receives a single data pipe output from the demapping & decoding module and outputs a single output stream.

The output processor 24000 shown in FIG. 17 can include a BB scrambler block 24100, a padding removal block 24200, a CRC-8 decoder block 24300 and a BB frame processor block 24400.

The BB scrambler block 24100 can descramble an input bit stream by generating the same PRBS as that used in the apparatus for transmitting broadcast signals for the input bit stream and carrying out an XOR operation on the PRBS and the bit stream.

The padding removal block 24200 can remove padding bits inserted by the apparatus for transmitting broadcast signals as necessary.

The CRC-8 decoder block 24300 can check a block error by performing CRC decoding on the bit stream received from the padding removal block 24200.

The BB frame processor block 24400 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 18 illustrates an output processor according to another embodiment of the present invention. The output processor 24000 shown in FIG. 18 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor 24000 shown in FIG. 18 can include a BB descrambler block, a padding removal block, a CRC-8 decoder block and a BB frame processor block as the output processor illustrated in FIG. 17. The basic roles of these blocks correspond to those of the blocks described with reference to FIG. 17 although operations thereof may differ from those of the blocks illustrated in FIG. 17.

A de-jitter buffer block 24500 included in the output processor shown in FIG. 18 can compensate for a delay, inserted by the apparatus for transmitting broadcast signals for synchronization of multiple data pipes, according to a restored TTO (time to output) parameter.

A null packet insertion block 24600 can restore a null packet removed from a stream with reference to a restored DNP (deleted null packet) and output common data.

A TS clock regeneration block 24700 can restore time synchronization of output packets based on ISCR (input stream time reference) information.

A TS recombining block 24800 can recombine the common data and data pipes related thereto, output from the null packet insertion block 24600, to restore the original MPEG-TS s, IP streams (v4 or v6) or generic streams. The TTO, DNT and ISCR information can be obtained through the BB frame header.

An in-band signaling decoding block 24900 can decode and output in-band physical layer signaling information transmitted through a padding bit field in each FEC frame of a data pipe.

The output processor shown in FIG. 18 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 19:
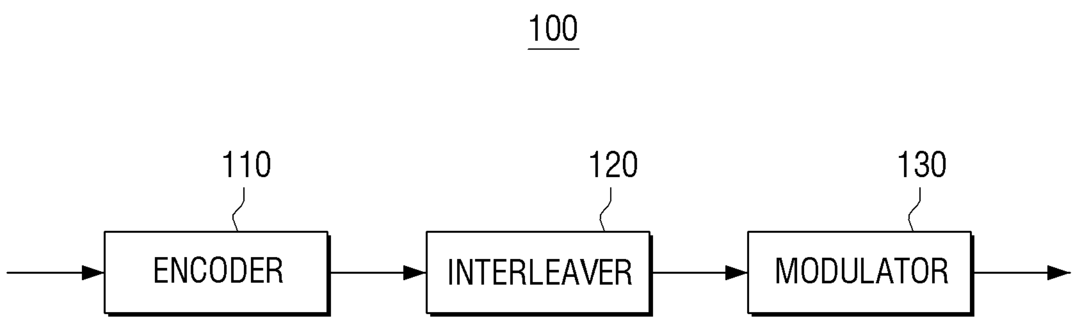
FIG. 19 is a block diagram to illustrate a configuration of a transmitting apparatus, according to an exemplary embodiment.

FIG. 19 is a block diagram to illustrate a configuration of a transmitting apparatus according to an exemplary embodiment. Referring to FIG. 19, the transmitting apparatus 100 includes an encoder 110, an interleaver 120, and a modulator 130 (or a constellation mapper).

The encoder 110 generates a low density parity check (LDPC) codeword by performing LDPC encoding based on a parity check matrix. To achieve this, the encoder 110 may include an LDPC encoder (not shown) to perform the LDPC encoding.

Specifically, the encoder 110 LDPC-encodes information word (or information) bits to generate the LDPC codeword which is formed of information word bits and parity bits (that is, LDPC parity bits). Here, bits input to the encoder 110 may be used as the information word bits. Also, since an LDPC code is a systematic code, the information word bits may be included in the LDPC codeword as they are.

The LDPC codeword is formed of the information word bits and the parity bits. For example, the LDPC codeword is formed of $N_{ldpc}$ number of bits, and includes $K_{ldpc}$ number of information word bits and $N_{parity}=N_{ldpc}-K_{ldpc}$ number of parity bits.

In this case, the encoder 110 may generate the LDPC codeword by performing the LDPC encoding based on the parity check matrix. That is, since the LDPC encoding is a process for generating an LDPC codeword to satisfy $H \cdot C^T=0$, the encoder 110 may use the parity check matrix when performing the LDPC encoding. Herein, H is a parity check matrix and C is an LDPC codeword.

For the LDPC encoding, the transmitting apparatus 100 may include a memory and may pre-store parity check matrices of various formats.

For example, the transmitting apparatus 100 may pre-store parity check matrices which are defined in Digital Video Broadcasting-Cable version 2 (DVB-C2), Digital Video Broadcasting-Satellite-Second Generation (DVB-S2), Digital Video Broadcasting-Second Generation Terrestrial (DVB-T2), etc., or may pre-store parity check matrices which are defined in the North America digital broadcasting standard system Advanced Television System Committee (ATSC) 3.0 standards, which are currently being established. However, this is merely an example and the transmitting apparatus 100 may pre-store parity check matrices of other formats in addition to these parity check matrices.

Hereinafter, a parity check matrix according to various exemplary embodiments will be explained in detail with reference to the drawings. In the parity check matrix, elements other than elements having 1 have 0.

Figure 20:
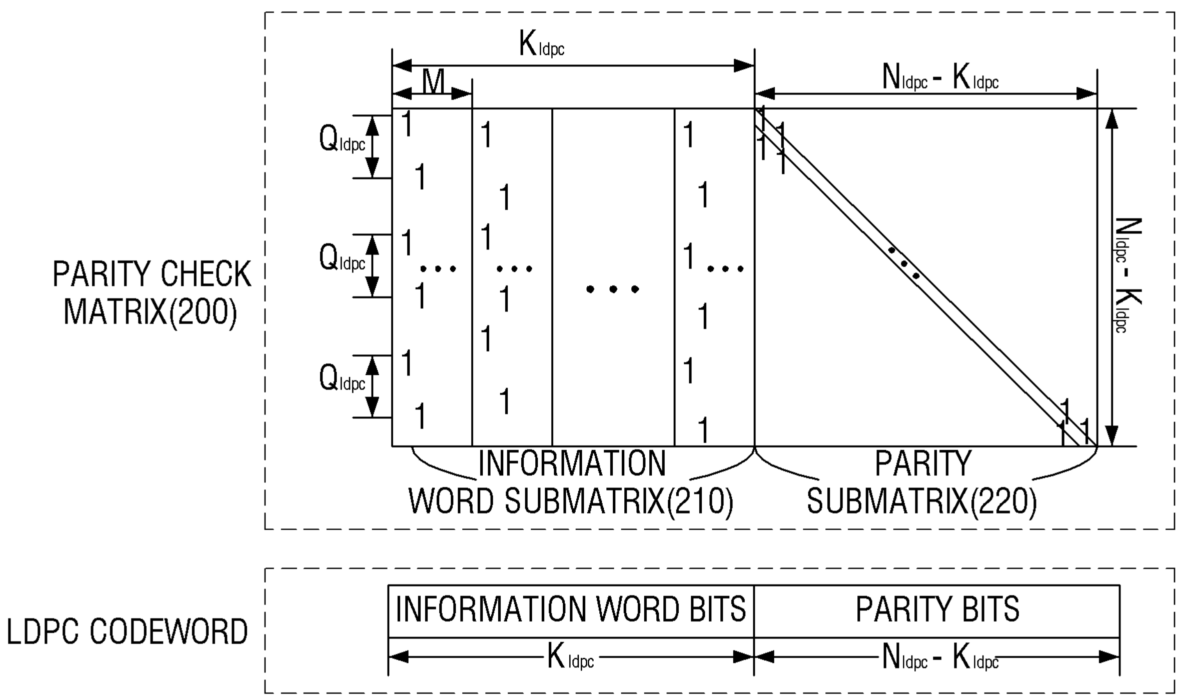
FIGS. 20 to 22 are views to illustrate a configuration of a parity check matrix, according to exemplary embodiments.

For example, the parity check matrix according to an exemplary embodiment may have a configuration of FIG. 20.

Referring to FIG. 20, a parity check matrix 200 is formed of an information word submatrix (or an information submatrix) 210 corresponding to information word bits, and a parity submatrix 220 corresponding to parity bits.

The information word submatrix 210 includes $K_{ldpc}$ number of columns and the parity submatrix 220 includes $N_{parity}=N_{ldpc}-K_{ldpc}$ number of columns. The number of rows of the parity check matrix 200 is identical to the number of columns of the parity submatrix 220, $N_{parity}=N_{ldpc}-K_{ldpc}$.

In addition, in the parity check matrix 200, $N_{ldpc}$ is a length of an LDPC codeword, $K_{ldpc}$ is a length of information word bits, and $N_{parity}=N_{ldpc}-K_{ldpc}$ is a length of parity bits. The length of the LDPC codeword, the information word bits, and the parity bits mean the number of bits included in each of the LDPC codeword, the information word bits, and the parity bits.

Hereinafter, the configuration of the information word submatrix 210 and the parity submatrix 220 will be explained in detail.

The information word submatrix 210 includes $K_{ldpc}$ number of columns (that is, $0^{th}$ column to $(K_{ldpc}-1)^{th}$ column), and follows the following rules:

First, M number of columns from among $K_{up}$, number of columns of the information word submatrix 210 belong to the same group, and $K_{ldpc}$ number of columns is divided into $K_{ldpc}/M$ number of column groups. In each column group, a column is cyclic-shifted from an immediately previous column by $Q_{ldpc}$. That is, $Q_{ldpc}$ may be a cyclic shift parameter value regarding columns in a column group of the information word submatrix 210 of the parity check matrix 200.

Herein, M is an interval at which a pattern of a column group, which includes a plurality of columns, is repeated in the information word submatrix 210 (e.g., M=360), and $Q_{ldpc}$ is a size by which one column is cyclic-shifted from an immediately previous column in a same column group in the information word submatrix 210. Also, M is a common divisor of $N_{ldpc}$ and $K_{ldpc}$ and is determined to satisfy $Q_{ldpc}=(N_{ldpc}-K_{ldpc})/M$. Here, M and $Q_{ldpc}$ are integers and $K_{ldpc}/M$ is also an integer. M and $Q_{ldpc}$ may have various values according to a length of the LDPC codeword and a code rate (CR)(or, coding rate).

For example, when M=360 and the length of the LDPC codeword, $N_{ldpc}$, is 64800, $Q_{ldpc}$ may be defined as in table 1 presented below, and, when M=360 and the length $N_{ldpc}$ of the LDPC codeword is 16200, $Q_{ldpc}$ may be defined as in table 2 presented below.

TABLE 1

| Code Rate | $N_{ldpc}$ | M | $Q_{ldpc}$ |
|---|---|---|---|
| 5/15 | 64800 | 360 | 120 |
| 6/15 | 64800 | 360 | 108 |
| 7/15 | 64800 | 360 | 96 |
| 8/15 | 64800 | 360 | 84 |
| 9/15 | 64800 | 360 | 72 |
| 10/15 | 64800 | 360 | 60 |
| 11/15 | 64800 | 360 | 48 |
| 12/15 | 64800 | 360 | 36 |
| 13/15 | 64800 | 360 | 24 |

TABLE 2

| Code Rate | $N_{ldpc}$ | M | $Q_{ldpc}$ |
|---|---|---|---|
| 5/15 | 16200 | 360 | 30 |
| 6/15 | 16200 | 360 | 27 |
| 7/15 | 16200 | 360 | 24 |
| 8/15 | 16200 | 360 | 21 |
| 9/15 | 16200 | 360 | 18 |
| 10/15 | 16200 | 360 | 15 |
| 11/15 | 16200 | 360 | 12 |
| 12/15 | 16200 | 360 | 9 |
| 13/15 | 16200 | 360 | 6 |

Second, when the degree of the $0^{th}$ column of the $i^{th}$ column group ($i=0, 1, \ldots, K_{ldpc}/M-1$) is $D_i$ (herein, the degree is the number of value 1 existing in each column and all columns belonging to the same column group have the same degree), and a position (or an index) of each row where 1 exists in the $0^{th}$ column of the $i^{th}$ column group is $R_{i,0}^{(0)}, R_{i,0}^{(1)}, \ldots, R_{i,0}^{(D_i-1)}$, an index $R_{i,j}^{(k)}$ of a row where $k^{th}$ 1 is located in the $j^{th}$ column in the $i^{th}$ column group is determined by following Equation 1:

$$R_{i,j}^{(k)}=R_{i,(j-1)}^{(k)}+Q_{ldpc} \bmod (N_{ldpc}-K_{ldpc}) \tag{1}$$

where $k=0, 1, 2, \ldots D_1-1$; $i=0, 1, \ldots, K_{ldpc}/M-1$; and $j=1, 2, \ldots, M-1$.

Equation 1 can be expressed as following Equation 2:

$$R_{i,j}^{(k)}=\{R_{i,0}^{(k)}+(j \bmod M)\times Q_{ldpc}\} \bmod (N_{ldpc}-K_{ldpc}) \tag{2}$$

where $k=0, 1, 2, \ldots D_1-1$; $i=0, 1, \ldots, K_{ldpc}/M-1$; and $j=1, 2, \ldots, M-1$. Since $j=1, 2, \ldots, M-1$, ($j \bmod M$) of Equation 2 may be regarded as j.

In the above equations, $R_{i,j}^{(k)}$ is an index of a row where $k^{th}$ 1 is located in the $j^{th}$ column in the $i^{th}$ column group, $N_{ldpc}$ is a length of an LDPC codeword, $K_{up}$, is a length of information word bits, $D_i$ is a degree of columns belonging to the $i^{th}$ column group, M is the number of columns belonging to a single column group, and $Q_{ldpc}$ is a size by which each column in the column group is cyclic-shifted.

As a result, referring to these equations, when only $R_{i,0}^{(k)}$ is known, the index $R_{i,j}^{(k)}$ of the row where the $k^{th}$ 1 is located in the $j^{th}$ column in the $i^{th}$ column group can be known. Therefore, when the index value of the row where the $k^{th}$ 1 is located in the $0^{th}$ column of each column group is stored, a position of column and row where 1 is located in the parity check matrix 200 having the configuration of FIG. 20 (that is, in the information word submatrix 210 of the parity check matrix 200) can be known.

According to the above-described rules, all of the columns belonging to the $i^{th}$ column group have the same degree $D_i$. Accordingly, the LDPC codeword which stores information on the parity check matrix according to the above-described rules may be briefly expressed as follows.

For example, when $N_{ldpc}$ is 30, $K_{ldpc}$ is 15, and $Q_{ldpc}$ is 3, position information of the row where 1 is located in the $0^{th}$ column of the three column groups may be expressed by a sequence of Equations 3 and may be referred to as "weight-1 position sequence".

$$R_{1,0}^{(1)}=1,\ R_{1,0}^{(2)}=2,\ R_{1,0}^{(3)}=8,\ R_{1,0}^{(4)}=10,$$

$$R_{2,0}^{(1)}=0,\ R_{2,0}^{(2)}=9,\ R_{2,0}^{(3)}=13,$$

$$R_{3,0}^{(1)}=0,\ R_{3,0}^{(2)}=14. \qquad (3),$$

where $R_{i,j}^{(k)}$ is an index of a row where $k^{th}$ 1 is located in the $j^{th}$ column in the $i^{th}$ column group.

The weight-1 position sequence like Equation 3 which expresses an index of a row where 1 is located in the $0^{th}$ column of each column group may be briefly expressed as in Table 3 presented below:

TABLE 3

| |
|---|
| 1 2 8 10 |
| 0 9 13 |
| 0 14 |

Table 3 shows positions of elements having value 1 in the parity check matrix, and the $i^{th}$ weight-1 position sequence is expressed by indexes of rows where 1 is located in the $0^{th}$ column belonging to the $i^{th}$ column group.

The information word submatrix 210 of the parity check matrix according to an exemplary embodiment may be defined as in Tables 4 to 8 presented below, based on the above descriptions.

Specifically, Tables 4 to 8 show indexes of rows where 1 is located in the $0^{th}$ column of the $i^{th}$ column group of the information word submatrix 210. That is, the information word submatrix 210 is formed of a plurality of column groups each including M number of columns, and positions of 1 in the $0^{th}$ column of each of the plurality of column groups may be defined by Tables 4 to 8.

Herein, the indexes of the rows where 1 is located in the $0^{th}$ column of the $i^{th}$ column group mean "addresses of parity bit accumulators". The "addresses of parity bit accumulators" have the same meaning as defined in the DVB-C2/S2/T2 standards or the ATSC 3.0 standards which are currently being established, and thus, a detailed explanation thereof is omitted.

For example, when the length $N_{ldpc}$ of the LDPC codeword is 64800, the code rate is 6/15, and M is 360, the indexes of the rows where 1 is located in the $0^{th}$ column of the $i^{th}$ column group of the information word submatrix 210 are as shown in Table 4 presented below:

TABLE 4

| i | Index of row where 1 is located in the 0th column of the ith column group |
|---|---|
| 0 | 1606 3402 4961 6751 7132 11516 12300 12482 12592 13342 13764 14123 21576 23946 24533 25376 25667 26836 31799 34173 35462 36153 36740 37085 37152 37468 37658 |
| 1 | 4621 5007 6910 8732 9757 11508 13099 15513 16335 18052 19512 21319 23663 25628 27208 31333 32219 33003 33239 33447 36200 36473 36938 37201 37283 37495 38642 |
| 2 | 16 1094 2020 3080 4194 5098 5631 6877 7889 8237 9804 10067 11017 11366 13136 13354 15379 18934 20199 24522 26172 28666 30386 32714 36390 37015 37162 |
| 3 | 700 897 1708 6017 6490 7372 7825 9546 10398 16605 18561 18745 21625 22137 23693 24340 24966 25015 26995 28586 28895 29687 33938 34520 34858 37056 38297 |
| 4 | 159 2010 2573 3617 4452 4958 5556 5832 6481 8227 9924 10836 14954 15594 16623 18065 19249 22394 22677 23408 23731 24076 24776 27007 28222 30343 38371 |
| 5 | 3118 3545 4768 4992 5227 6732 8170 9397 10522 11508 15536 20218 21921 28599 29445 29758 29968 31014 32027 33685 34378 35867 36323 36728 36870 38335 38623 |
| 6 | 1264 4254 6936 9165 9486 9950 10861 11653 13697 13961 15164 15665 18444 19470 20313 21189 24371 26431 26999 28086 28251 29261 31981 34015 35850 36129 37186 |
| 7 | 111 1307 1628 2041 2524 5358 7988 8191 10322 11905 12919 14127 15515 15711 17061 19024 21195 22902 23727 24401 24608 25111 25228 27338 35398 37794 38196 |
| 8 | 961 3035 7174 7948 13355 13607 14971 18189 18339 18665 18875 19142 20615 21136 21309 21758 23366 24745 25849 25982 27583 30006 31118 32106 36469 36583 37920 |
| 9 | 2990 3549 4273 4808 5707 6021 6509 7456 8240 10044 12262 12660 13085 14750 15680 16049 21587 23997 25803 28343 28693 34393 34860 35490 36021 37737 38296 |
| 10 | 955 4323 5145 6885 8123 9730 11840 12216 19194 20313 23056 24248 24830 25268 26617 26801 28557 29753 30745 31450 31973 32839 33025 33296 35710 37366 37509 |
| 11 | 264 605 4181 4483 5156 7238 8863 10939 11251 12964 16254 17511 20017 22395 22818 23261 23422 24064 26329 27723 28186 30434 31956 33971 34372 36764 38123 |
| 12 | 520 2562 2794 3528 3860 4402 5676 6963 8655 9018 9783 11933 16336 17193 17320 19035 20606 23579 23769 24123 24966 27866 32457 34011 34499 36620 37526 |
| 13 | 10106 10637 10906 34242 |
| 14 | 1856 15100 19378 21848 |
| 15 | 943 11191 27806 29411 |
| 16 | 4575 6359 13629 19383 |
| 17 | 4476 4953 18782 24313 |
| 18 | 5441 6381 21840 35943 |
| 19 | 9638 9763 12546 30120 |
| 20 | 9587 10626 11047 25700 |
| 21 | 4088 15298 28768 35047 |
| 22 | 2332 6363 8782 28863 |
| 23 | 4625 4933 28298 30289 |
| 24 | 3541 4918 18257 31746 |
| 25 | 1221 25233 26757 34892 |
| 26 | 8150 16677 27934 30021 |
| 27 | 8500 25016 33043 38070 |
| 28 | 7374 10207 16189 35811 |
| 29 | 611 18480 20064 38261 |
| 30 | 25416 27352 36089 38469 |
| 31 | 1667 17614 25839 32776 |
| 32 | 4118 12481 21912 37945 |
| 33 | 5573 13222 23619 31271 |
| 34 | 18271 26251 27182 30587 |
| 35 | 14690 26430 26799 34355 |
| 36 | 13688 16040 20716 34558 |
| 37 | 2740 14957 23436 32540 |
| 38 | 3491 14365 14681 36858 |
| 39 | 4796 6238 25203 27854 |
| 40 | 1731 12816 17344 26025 |
| 41 | 19182 21662 23742 27872 |
| 42 | 6502 13641 17509 34713 |
| 43 | 12246 12372 16746 27452 |
| 44 | 1589 21528 30621 34003 |
| 45 | 12328 20515 30651 31432 |
| 46 | 3415 22656 23427 36395 |
| 47 | 632 5209 25958 31085 |
| 48 | 619 3690 19648 37778 |
| 49 | 9528 13581 26965 36447 |
| 50 | 2147 26249 26968 28776 |

TABLE 4-continued

| i | Index of row where 1 is located in the 0th column of the ith column group |
|---|---|
| 51 | 15698 18209 30683 |
| 52 | 1132 19888 34111 |
| 53 | 4608 25513 38874 |
| 54 | 475 1729 34100 |
| 55 | 7348 32277 38587 |
| 56 | 182 16473 33082 |
| 57 | 3865 9678 21265 |
| 58 | 4447 20151 27618 |
| 59 | 6335 14371 38711 |
| 60 | 704 9695 28858 |
| 61 | 4856 9757 30546 |
| 62 | 1993 19361 30732 |
| 63 | 756 28000 29138 |
| 64 | 3821 24076 31813 |
| 65 | 4611 12326 32291 |
| 66 | 7628 21515 34995 |
| 67 | 1246 13294 30068 |
| 68 | 6466 33233 35865 |
| 69 | 14484 23274 38150 |
| 70 | 21269 36411 37450 |
| 71 | 23129 26195 37653 |

In another example, when the length $N_{ldpc}$ of the LDPC codeword is 64800, the code rate is 8/15, and M is 360, the indexes of the rows where 1 is located in the $0^{th}$ column of the $i^{th}$ column group of the information word submatrix 210 are as shown in Table 5 presented below:

TABLE 5

| i | Index of row where 1 is located in the 0th column of the ith column group |
|---|---|
| 0 | 2768 3039 4059 5856 6245 7013 8157 9341 9802 10470 11521 12083 16610 18361 20321 24601 27420 28206 29788 |
| 1 | 2739 8244 8891 9157 12624 12973 15534 16622 16919 18402 18780 19854 20220 20543 22306 25540 27478 27678 28053 |
| 2 | 1727 2268 6246 7815 9010 9556 10134 10472 11389 14599 15719 16204 17342 17666 18850 22058 25579 25860 29207 |
| 3 | 28 1346 3721 5565 7019 9240 12355 13109 14800 16040 16839 17369 17631 19357 19473 19891 20381 23911 29683 |
| 4 | 869 2450 4386 5316 6160 7107 10362 11132 11271 13149 16397 16532 17113 19894 22043 22784 27383 28615 28804 |
| 5 | 508 4292 5831 8559 10044 10412 11283 14810 15888 17243 17538 19903 20528 22090 22652 27235 27384 28208 28485 |
| 6 | 389 2248 5840 6043 7000 9054 11075 11760 12217 12565 13587 15403 19422 19528 21493 25142 27777 28566 28702 |
| 7 | 1015 2002 5764 6777 9346 9629 11039 11153 12690 13068 13990 16841 17702 20021 24106 26300 29332 30081 30196 |
| 8 | 1480 3084 3467 4401 4798 5187 7851 11368 12323 14325 14546 16360 17158 18010 21333 25612 26556 26906 27005 |
| 9 | 6925 8876 12392 14529 15253 15437 19226 19950 20321 23021 23651 24393 24653 26668 27205 28269 28529 29041 29292 |
| 10 | 2547 3404 3538 4666 5126 5468 7695 8799 14732 15072 15881 17410 18971 19609 19717 22150 24941 27908 29018 |
| 11 | 888 1581 2311 5511 7218 9107 10454 12252 13662 15714 15894 17025 18671 24304 25316 25556 28489 28977 29212 |
| 12 | 1047 1494 1718 4645 5030 6811 7868 8146 10611 15767 17682 18391 22614 23021 23763 25478 26491 29088 29757 |
| 13 | 59 1781 1900 3814 4121 8044 8906 9175 11156 14841 15789 16033 16755 17292 18550 19310 22505 29567 29850 |
| 14 | 1952 3057 4399 9476 10171 10769 11335 11569 15002 19501 20621 22642 23452 24360 25109 25290 25828 28505 29122 |
| 15 | 2895 3070 3437 4764 4905 6670 9244 11845 13352 13573 13975 14600 15871 17996 19672 20079 20579 25327 27958 |
| 16 | 612 1528 2004 4244 4599 4926 5843 7684 10122 10443 12267 14368 18413 19058 22985 24257 26202 26596 27899 |
| 17 | 1361 2195 4146 6708 7158 7538 9138 9998 14862 15359 16076 18925 21401 21573 22503 24146 24247 27778 29312 |
| 18 | 5229 6235 7134 7655 9139 13527 15408 16058 16705 18320 19909 20901 22238 22437 23654 25131 27550 28247 29903 |
| 19 | 697 2035 4887 5275 6909 9166 11805 15338 16381 18403 20425 20688 21547 24590 25171 26726 28848 29224 29412 |
| 20 | 5379 17329 22659 23062 |

TABLE 5-continued

| i | Index of row where 1 is located in the 0th column of the ith column group |
|---|---|
| 21 | 11814 14759 22329 22936 |
| 22 | 2423 2811 10296 12727 |
| 23 | 8460 15260 16769 17290 |
| 24 | 14191 14608 29536 30187 |
| 25 | 7103 10069 20111 22850 |
| 26 | 4285 15413 26448 29069 |
| 27 | 548 2137 9189 10928 |
| 28 | 4581 7077 23382 23949 |
| 29 | 3942 17248 19486 27922 |
| 30 | 8668 10230 16922 26678 |
| 31 | 6158 9980 13788 28198 |
| 32 | 12422 16076 24206 29887 |
| 33 | 8778 10649 18747 22111 |
| 34 | 21029 22677 27150 28980 |
| 35 | 7918 15423 27672 27803 |
| 36 | 5927 18086 23525 |
| 37 | 3397 15058 30224 |
| 38 | 24016 25880 26268 |
| 39 | 1096 4775 7912 |
| 40 | 3259 17301 20802 |
| 41 | 129 8396 15132 |
| 42 | 17825 28119 28676 |
| 43 | 2343 8382 28840 |
| 44 | 3907 18374 20939 |
| 45 | 1132 1290 8786 |
| 46 | 1481 4710 28846 |
| 47 | 2185 3705 26834 |
| 48 | 5496 15681 21854 |
| 49 | 12697 13407 22178 |
| 50 | 12788 21227 22894 |
| 51 | 629 2854 6232 |
| 52 | 2289 18227 27458 |
| 53 | 7593 21935 23001 |
| 54 | 3836 7081 12282 |
| 55 | 7925 18440 23135 |
| 56 | 497 6342 9717 |
| 57 | 11199 22046 30067 |
| 58 | 12572 28045 28990 |
| 59 | 1240 2023 10933 |
| 60 | 19566 20629 25186 |
| 61 | 6442 13303 28813 |
| 62 | 4765 10572 16180 |
| 63 | 552 19301 24286 |
| 64 | 6782 18480 21383 |
| 65 | 11267 12288 15758 |
| 66 | 771 5652 15531 |
| 67 | 16131 20047 25649 |
| 68 | 13227 23035 24450 |
| 69 | 4839 13467 27488 |
| 70 | 2852 4677 22993 |
| 71 | 2504 28116 29524 |
| 72 | 12518 17374 24267 |
| 73 | 1222 11859 27922 |
| 74 | 9660 17286 18261 |
| 75 | 232 11296 29978 |
| 76 | 9750 11165 16295 |
| 77 | 4894 9505 23622 |
| 78 | 10861 11980 14110 |
| 79 | 2128 15883 22836 |
| 80 | 6274 17243 21989 |
| 81 | 10866 13202 22517 |
| 82 | 11159 16111 21608 |
| 83 | 3719 18787 22100 |
| 84 | 1756 2020 23901 |
| 85 | 20913 29473 30103 |
| 86 | 2729 15091 26976 |
| 87 | 4410 8217 12963 |
| 88 | 5395 24564 28235 |
| 89 | 3859 17909 23051 |
| 90 | 5733 26005 29797 |
| 91 | 1935 3492 29773 |
| 92 | 11903 21380 29914 |
| 93 | 6091 10469 29997 |
| 94 | 2895 8930 15594 |
| 95 | 1827 10028 20070 |

In another example, when the length $N_{ldpc}$ of the LDPC codeword is 64800, the code rate is 10/15, and M is 360, the indexes of rows where 1 exists in the $0^{th}$ column of the $i^{th}$ column group of the information word submatrix 210 are defined as shown in Table 6 below.

TABLE 6

| i | Index of row where 1 is located in the 0th column of the ith column group |
|---|---|
| 0 | 979 1423 4166 4609 6341 8258 10334 10548 14098 14514 17051 17333 17653 17830 17990 |
| 1 | 2559 4025 6344 6510 9167 9728 11312 14856 17104 17721 18600 18791 19079 19697 19840 |
| 2 | 3243 6894 7950 10539 12042 13233 13938 14752 16449 16727 17025 18297 18796 19400 21577 |
| 3 | 3272 3574 6341 6722 9191 10807 10957 12531 14036 15580 16651 17007 17309 19415 19845 |
| 4 | 155 4598 10201 10975 11086 11296 12713 15364 15978 16395 17542 18164 18451 18612 20617 |
| 5 | 1128 1999 3926 4069 5558 6085 6337 8386 10693 12450 15438 16223 16370 17308 18634 |
| 6 | 2408 2929 3630 4357 5852 7329 8536 8695 10603 11003 14304 14937 15767 18402 21502 |
| 7 | 199 3066 6446 6849 8973 9536 10452 12857 13675 15913 16717 17654 19802 20115 21579 |
| 8 | 312 870 2095 2586 5517 6196 6757 7311 7368 13046 15384 18576 20349 21424 21587 |
| 9 | 985 1591 3248 3509 3706 3847 6174 6276 7864 9033 13618 15675 16446 18355 18843 |
| 10 | 975 3774 4083 5825 6166 7218 7633 9657 10103 13052 14240 17320 18126 19544 20208 |
| 11 | 1795 2005 2544 3418 6148 8051 9066 9725 10676 10752 11512 15171 17523 20481 21059 |
| 12 | 167 315 1824 2325 2640 2868 6070 6597 7016 8109 9815 11608 16142 17912 19625 |
| 13 | 1298 1896 3039 4303 4690 8787 12241 13600 14478 15492 16602 17115 17913 19466 20597 |
| 14 | 568 3695 6045 6624 8131 8404 8590 9059 9246 11570 14336 18657 18941 19218 21506 |
| 15 | 228 1889 1967 2299 3011 5074 7044 7596 7689 9534 10244 10697 11691 17902 21410 |
| 16 | 1330 1579 1739 2234 3701 3865 5713 6677 7263 11172 12143 12765 17121 20011 21436 |
| 17 | 303 1668 2501 4925 5778 5985 9635 10140 10820 11779 11849 12058 15650 20426 20527 |
| 18 | 698 2484 3071 3219 4054 4125 5663 5939 6928 7086 8054 12173 16280 17945 19302 |
| 19 | 232 1619 3040 4901 7438 8135 9117 9233 10131 13321 17347 17436 18193 18586 19929 |
| 20 | 12 3721 6254 6609 7880 8139 10437 12262 13928 14065 14149 15032 15694 16264 18883 |
| 21 | 482 915 1548 1637 6687 9338 10163 11768 11970 15524 15695 17386 18787 19210 19340 |
| 22 | 1291 2500 4109 4511 5099 5194 10014 13165 13256 13972 15409 16113 16214 18584 20998 |
| 23 | 1761 4778 7444 7740 8129 8341 8931 9136 9207 10003 10678 13959 17673 18194 20990 |
| 24 | 3060 3522 5361 5692 6833 8342 8792 11023 11211 11548 11914 13987 15442 15541 19707 |
| 25 | 1322 2348 2970 5632 6349 7577 8782 9113 9267 9376 12042 12943 16680 16970 21321 |
| 26 | 6785 11960 21455 |
| 27 | 1223 15672 19550 |
| 28 | 5976 11335 20385 |
| 29 | 2818 9387 15317 |
| 30 | 2763 3554 18102 |
| 31 | 5230 11489 18997 |
| 32 | 5809 15779 20674 |
| 33 | 2620 17838 18533 |
| 34 | 3025 9342 9931 |
| 35 | 3728 5337 12142 |
| 36 | 2520 6666 9164 |
| 37 | 12892 15307 20912 |
| 38 | 10736 12393 16539 |
| 39 | 1075 2407 12853 |
| 40 | 4921 5411 18206 |
| 41 | 5955 15647 16838 |
| 42 | 6384 10336 19266 |
| 43 | 429 10421 17266 |

TABLE 6-continued

| i | Index of row where 1 is located in the 0th column of the ith column group |
|---|---|
| 44 | 4880 10431 12208 |
| 45 | 2910 11895 12442 |
| 46 | 7366 18362 18772 |
| 47 | 4341 7903 14994 |
| 48 | 4564 6714 7378 |
| 49 | 4639 8652 18871 |
| 50 | 15787 18048 20246 |
| 51 | 3241 11079 13640 |
| 52 | 1559 2936 15881 |
| 53 | 2737 6349 10881 |
| 54 | 10394 16107 17073 |
| 55 | 8207 9043 12874 |
| 56 | 7805 16058 17905 |
| 57 | 11189 15767 17764 |
| 58 | 5823 12923 14316 |
| 59 | 11080 20390 20924 |
| 60 | 568 8263 17411 |
| 61 | 1845 3557 6562 |
| 62 | 2890 10936 14756 |
| 63 | 9031 14220 21517 |
| 64 | 3529 12955 15902 |
| 65 | 413 6750 8735 |
| 66 | 6784 12092 16421 |
| 67 | 12019 13794 15308 |
| 68 | 12588 15378 17676 |
| 69 | 8067 14589 19304 |
| 70 | 1244 5877 6085 |
| 71 | 15897 19349 19993 |
| 72 | 1426 2394 12264 |
| 73 | 3456 8931 12075 |
| 74 | 13342 15273 20351 |
| 75 | 9138 13352 20798 |
| 76 | 7031 7626 14081 |
| 77 | 4280 4507 15617 |
| 78 | 4170 10569 14335 |
| 79 | 3839 7514 16578 |
| 80 | 4688 12815 18782 |
| 81 | 4861 7858 9435 |
| 82 | 605 5445 12912 |
| 83 | 2280 4734 7311 |
| 84 | 6668 8128 12638 |
| 85 | 3733 10621 19534 |
| 86 | 13933 18316 19341 |
| 87 | 1786 3037 21566 |
| 88 | 2202 13239 16432 |
| 89 | 4882 5808 9300 |
| 90 | 4580 8484 16754 |
| 91 | 14630 17502 18269 |
| 92 | 6889 11119 12447 |
| 93 | 8162 9078 16330 |
| 94 | 6538 17851 18100 |
| 95 | 17763 19793 20816 |
| 96 | 2183 11907 17567 |
| 97 | 6640 14428 15175 |
| 98 | 877 12035 14081 |
| 99 | 1336 6468 12328 |
| 100 | 5948 9146 12003 |
| 101 | 3782 5699 12445 |
| 102 | 1770 7946 8244 |
| 103 | 7384 12639 14989 |
| 104 | 1469 11586 20959 |
| 105 | 7943 10450 15907 |
| 106 | 5005 8153 10035 |
| 107 | 17750 18826 21513 |
| 108 | 4725 8041 10112 |
| 109 | 3837 16266 17376 |
| 110 | 11340 17361 17512 |
| 111 | 1269 4611 4774 |
| 112 | 2322 10813 16157 |
| 113 | 16752 16843 18959 |
| 114 | 70 4325 18753 |
| 115 | 3165 8153 15384 |
| 116 | 160 8045 16823 |
| 117 | 14112 16724 16792 |
| 118 | 4291 7667 18176 |
| 119 | 5943 19879 20721 |

In another example, when the length $N_{ldpc}$ of the LDPC codeword is 64800, the code rate is 10/15, and M is 360, the indexes of rows where 1 exists in the $0^{th}$ column of the $i^{th}$ column group of the information word submatrix 210 are defined as shown in Table 7 below.

TABLE 7

| i | Index of row where 1 is located in the 0th column of the ith column group |
|---|---|
| 0 | 316 1271 3692 9495 12147 12849 14928 16671 16938 17864 19108 20502 21097 21115 |
| 1 | 2341 2559 2643 2816 2865 5137 5331 7000 7523 8023 10439 10797 13208 15041 |
| 2 | 5556 6858 7677 10162 10207 11349 12321 12398 14787 15743 15859 15952 19313 20879 |
| 3 | 349 573 910 2702 3654 6214 9246 9353 10638 11772 14447 14953 16620 19888 |
| 4 | 204 1390 2887 3835 6230 6533 7443 7876 9299 10291 10896 13960 18287 20086 |
| 5 | 541 2429 2838 7144 8523 8637 10490 10585 11074 12074 15762 16812 17900 18548 |
| 6 | 733 1659 3838 5323 5805 7882 9429 10682 13697 16909 18846 19587 19592 20904 |
| 7 | 1134 21316 4631 4653 4718 5197 10410 11666 14996 15305 16048 17417 1 960 20303 |
| 8 | 734 1001 1283 4959 10016 10176 10973 11578 12051 15550 15915 19022 19430 20121 |
| 9 | 745 4057 5855 9885 10594 10989 13156 13219 13351 13631 13685 14577 17713 20386 |
| 10 | 968 1446 2130 2502 3092 3787 5323 8104 8418 9998 11681 13972 17747 17929 |
| 11 | 3020 3857 5275 5786 6319 8608 11943 14062 17144 17752 18001 18453 19311 21414 |
| 12 | 709 747 1038 2181 5320 8292 10584 10859 13964 15009 15277 16953 20675 21509 |
| 13 | 1663 3247 5003 5760 7186 7360 10346 14211 14717 14792 15155 16128 17355 17970 |
| 14 | 516 578 1914 6147 9419 11148 11434 13289 13325 13332 19106 19257 20962 21556 |
| 15 | 5009 5632 6531 9430 9886 10621 11765 13969 16178 16413 18110 18249 20616 20759 |
| 16 | 457 2686 3318 4608 5620 5858 6480 7430 9602 12691 14664 18777 20152 20848 |
| 17 | 33 2877 5334 6851 7907 8654 10688 15401 16123 17942 17969 18747 18931 20224 |
| 18 | 87 897 7636 8663 11425 12288 12672 14199 16435 17615 17950 18953 19667 20281 |
| 19 | 1042 1832 2545 2719 2947 3672 3700 6249 6398 6833 11114 14283 17694 20477 |
| 20 | 326 488 2662 2880 3009 5357 6587 8882 11604 14374 18781 19051 19057 20508 |
| 21 | 854 1294 2436 2852 4903 6466 7761 9072 9564 10321 13638 15658 16946 19119 |
| 22 | 194 899 1711 2408 2786 5391 7108 8079 8716 11453 17303 19484 20989 21389 |
| 23 | 1631 3121 3994 5005 7810 8850 10315 10589 13407 17162 18624 18758 19311 20301 |
| 24 | 736 2424 4792 5600 6370 10061 16053 16775 18600 |
| 25 | 1254 8163 8876 9157 12141 14587 16545 17175 18191 |
| 26 | 388 6641 8974 10607 10716 14477 16825 17191 18400 |
| 27 | 5578 6082 6824 7360 7745 8655 11402 11665 12428 |
| 28 | 3603 8729 13463 14698 15210 19112 19550 20727 21052 |
| 29 | 48 1732 3805 5158 15442 16909 19854 21071 21579 |
| 30 | 11707 14014 21531 |
| 31 | 1542 4133 4925 |
| 32 | 10083 13505 21198 |
| 33 | 14300 15765 16752 |
| 34 | 778 1237 11215 |
| 35 | 1325 3199 14534 |
| 36 | 2007 14510 20599 |
| 37 | 1996 5881 16429 |
| 38 | 5111 15018 15980 |
| 39 | 4989 10681 12810 |
| 40 | 3763 10715 16515 |
| 41 | 2259 10080 15642 |
| 42 | 9032 11319 21305 |
| 43 | 3915 15213 20884 |
| 44 | 11150 15022 20201 |
| 45 | 1147 6749 19625 |

TABLE 7-continued

| i | Index of row where 1 is located in the 0th column of the ith column group |
|---|---|
| 46 | 12139 12939 18870 |
| 47 | 3840 4634 10244 |
| 48 | 1018 10231 17720 |
| 49 | 2708 13056 13393 |
| 50 | 5781 11588 18888 |
| 51 | 1345 2036 5252 |
| 52 | 5908 8143 15141 |
| 53 | 1804 13693 18640 |
| 54 | 10433 13965 16950 |
| 55 | 9568 10122 15945 |
| 56 | 547 6722 14015 |
| 57 | 321 12844 14095 |
| 58 | 2632 10513 14936 |
| 59 | 6369 11995 20321 |
| 60 | 9920 19136 21529 |
| 61 | 2990 2726 10183 |
| 62 | 5763 12118 15467 |
| 63 | 503 10006 19564 |
| 64 | 9839 11942 19472 |
| 65 | 11205 13552 15389 |
| 66 | 8841 13797 19697 |
| 67 | 124 6053 18224 |
| 68 | 6477 14406 21146 |
| 69 | 1224 8027 16011 |
| 70 | 3046 4422 17717 |
| 71 | 739 12308 17760 |
| 72 | 4014 4130 7835 |
| 73 | 2266 5652 11981 |
| 74 | 2711 7970 18317 |
| 75 | 2196 15229 17217 |
| 76 | 8636 13302 16764 |
| 77 | 5612 15010 16657 |
| 78 | 615 1249 4639 |
| 79 | 3821 12073 18506 |
| 80 | 1066 16522 2 536 |
| 81 | 11807 18363 19740 |
| 82 | 3240 8560 10391 |
| 83 | 3124 11424 20779 |
| 84 | 1604 8861 17394 |
| 85 | 2083 7400 8093 |
| 86 | 3218 7454 9155 |
| 87 | 9855 15998 20533 |
| 88 | 316 2850 20652 |
| 89 | 5583 9768 10333 |
| 90 | 7147 7713 18339 |
| 91 | 12607 17428 21418 |
| 92 | 14216 16954 18164 |
| 93 | 8477 15970 18488 |
| 94 | 1632 8032 9751 |
| 95 | 4573 9080 13507 |
| 96 | 11747 12441 13876 |
| 97 | 1183 15605 16675 |
| 98 | 4408 10264 17109 |
| 99 | 5495 7882 12150 |
| 100 | 1010 3763 5065 |
| 101 | 9828 18054 21599 |
| 102 | 6342 7353 15358 |
| 103 | 6362 9462 19999 |
| 104 | 7184 13693 17622 |
| 105 | 4343 4654 10995 |
| 106 | 7099 8466 18520 |
| 107 | 11505 14395 15138 |
| 108 | 6779 16691 18726 |
| 109 | 7146 12644 20196 |
| 110 | 5865 16728 19634 |
| 111 | 4657 8714 21246 |
| 112 | 4580 5279 18750 |
| 113 | 3767 6620 18905 |
| 114 | 9209 13093 17575 |
| 115 | 12486 15875 19791 |
| 116 | 8046 14636 17491 |
| 117 | 2120 4643 13206 |
| 118 | 6186 9675 12601 |
| 119 | 784 5770 21585 |

In another example, when the length $N_{ldpc}$ of the LDPC codeword is 64800, the code rate is 12/15, and M is 360, the indexes of rows where 1 exists in the $0^{th}$ column of the $i^{th}$ column group of the information word submatrix 210 are defined as shown in Table 8 below.

TABLE 8

| i | Index of row where 1 is located in the 0th column of the ith column group |
|---|---|
| 0 | 584 1472 1621 1867 3338 3568 3723 4185 5126 5889 7737 8632 8940 9725 |
| 1 | 221 445 590 3779 3835 6939 7743 8280 8448 8491 9367 10042 11242 12917 |
| 2 | 4662 4837 4900 5029 6449 6687 6751 8684 9936 11681 11811 11886 12089 12909 |
| 3 | 2418 3018 3647 4210 4473 7447 7502 9490 10067 11092 11139 11256 12201 12383 |
| 4 | 2591 2947 3349 3406 4417 4519 5176 6672 8498 8863 9201 11294 11376 12184 |
| 5 | 27 101 197 290 871 1727 3911 5411 6676 8701 9350 10310 10798 12439 |
| 6 | 1765 1897 2923 3584 3901 4048 6963 7054 7132 9165 10184 10824 11278 12669 |
| 7 | 2183 3740 4808 5217 5660 6375 6787 8219 8466 9037 10353 10583 11118 12762 |
| 8 | 73 1594 2146 2715 3501 3572 3639 3725 6959 7187 8406 10120 10507 10691 |
| 9 | 240 732 1215 2185 2788 2830 3499 3881 4197 4991 6425 7061 9756 10491 |
| 10 | 831 1568 1828 3424 4319 4516 4639 6018 9702 10203 10417 11240 11518 12458 |
| 11 | 2024 2970 3048 3638 3676 4152 5284 5779 5926 9426 9945 10873 11787 11837 |
| 12 | 1049 1218 1651 2328 3493 4363 5750 6483 7613 8782 9738 9803 11744 11937 |
| 13 | 1193 2060 2289 2964 3478 4592 4756 6709 7162 8231 8326 11140 11908 12243 |
| 14 | 978 2120 2439 3338 3850 4589 6567 8745 9656 9708 10161 10542 10711 12639 |
| 15 | 2403 2938 3117 3247 3711 5593 5844 5932 7801 10152 10226 11498 12162 12941 |
| 16 | 1781 2229 2276 2533 3582 3951 5279 5774 7930 9824 10920 11038 12340 12440 |
| 17 | 289 384 1980 2230 3464 3873 5958 8656 8942 9006 10175 11425 11745 12530 |
| 18 | 155 354 1090 1330 2002 2236 3559 3705 4922 5958 6576 8564 9972 12760 |
| 19 | 303 876 2059 2142 5244 5330 6644 7576 8614 9598 10410 10718 11033 12957 |
| 20 | 3449 3617 4408 4602 4727 6182 8835 8928 9372 9644 10237 10747 11655 12747 |
| 21 | 811 2565 2820 8677 8974 9632 11069 11548 11839 12107 12411 12695 12812 12890 |
| 22 | 972 4123 4943 6385 6449 7339 7477 8379 9177 9359 10074 11709 12552 12831 |
| 23 | 842 973 1541 2262 2905 5276 6758 7099 7894 8128 8325 8663 8875 10050 |
| 24 | 474 791 968 3902 4924 4965 5085 5908 6109 6329 7931 9038 9401 10568 |
| 25 | 1397 4461 4658 5911 6037 7127 7318 8678 8924 9000 9473 9602 10446 12692 |
| 26 | 1334 7571 12881 |
| 27 | 1393 1447 7972 |
| 28 | 633 1257 10597 |
| 29 | 4843 5102 11056 |
| 30 | 3294 8015 10513 |
| 31 | 1108 10374 10546 |
| 32 | 5353 7824 10111 |
| 33 | 3398 7674 8569 |
| 34 | 7719 9478 10503 |
| 35 | 2997 9418 9581 |
| 36 | 5777 6519 11229 |
| 37 | 1966 5214 9899 |
| 38 | 6 4088 5827 |
| 39 | 836 9248 9612 |
| 40 | 483 7229 7548 |
| 41 | 7865 8289 9804 |
| 42 | 2915 11098 11900 |
| 43 | 6180 7096 9481 |
| 44 | 1431 6786 8924 |
| 45 | 748 6757 8625 |

TABLE 8-continued

| i | Index of row where 1 is located in the 0th column of the ith column group |
|---|---|
| 46 | 3312 4475 7204 |
| 47 | 1852 8958 11020 |
| 48 | 1915 2903 4006 |
| 49 | 6776 10886 12531 |
| 50 | 2594 9998 12742 |
| 51 | 159 2002 12079 |
| 52 | 853 3281 3762 |
| 53 | 5201 5798 6413 |
| 54 | 3882 6062 12047 |
| 55 | 4133 6775 9657 |
| 56 | 228 6874 11183 |
| 57 | 7433 10728 10864 |
| 58 | 7735 8073 12734 |
| 59 | 2844 4621 11779 |
| 60 | 3909 7103 12804 |
| 61 | 6002 9704 11060 |
| 62 | 5864 6856 7681 |
| 63 | 3652 5869 7605 |
| 64 | 2546 2657 4461 |
| 65 | 2423 4203 9111 |
| 66 | 244 1855 4691 |
| 67 | 1106 2178 6371 |
| 68 | 391 1617 10126 |
| 69 | 250 9259 10603 |
| 70 | 3435 4614 6924 |
| 71 | 1742 8045 9529 |
| 72 | 7667 8875 11451 |
| 73 | 4023 6108 6911 |
| 74 | 8621 10184 11650 |
| 75 | 6726 10861 12348 |
| 76 | 3228 6302 7388 |
| 77 | 1 1137 5358 |
| 78 | 381 2424 8537 |
| 79 | 3256 7508 10044 |
| 80 | 1980 2219 4569 |
| 81 | 2468 5699 10319 |
| 82 | 2803 3314 12808 |
| 83 | 8578 9642 11533 |
| 84 | 829 4585 7923 |
| 85 | 59 329 5575 |
| 86 | 1067 5709 6867 |
| 87 | 1175 4744 12219 |
| 88 | 109 2518 6756 |
| 89 | 2105 10626 11153 |
| 90 | 5192 10696 10749 |
| 91 | 6260 7641 8233 |
| 92 | 2998 3094 11214 |
| 93 | 3398 6466 11494 |
| 94 | 6574 10448 12160 |
| 95 | 2734 10755 12780 |
| 96 | 1028 7958 10825 |
| 97 | 8545 8602 10793 |
| 98 | 392 3398 11417 |
| 99 | 6639 9291 12571 |
| 100 | 1067 7919 8934 |
| 101 | 1064 2848 12753 |
| 102 | 6076 8656 12690 |
| 103 | 5504 6193 10171 |
| 104 | 1951 7156 7356 |
| 105 | 4389 4780 7889 |
| 106 | 526 4804 9141 |
| 107 | 1238 3648 10464 |
| 108 | 2587 5624 12557 |
| 109 | 5560 5903 11963 |
| 110 | 1134 2570 3297 |
| 111 | 10041 11583 12157 |
| 112 | 1263 9585 12912 |
| 113 | 3744 7898 10646 |
| 114 | 45 9074 10315 |
| 115 | 1051 6188 10038 |
| 116 | 2242 8394 12712 |
| 117 | 3598 9025 12651 |
| 118 | 2295 3540 5610 |
| 119 | 1914 4378 12423 |
| 120 | 1766 3635 12759 |
| 121 | 5177 9586 11143 |
| 122 | 943 3590 11649 |

TABLE 8-continued

| i | Index of row where 1 is located in the 0th column of the ith column group |
|---|---|
| 123 | 4864 6905 10454 |
| 124 | 5852 6042 10421 |
| 125 | 6095 8285 12349 |
| 126 | 2070 7171 8563 |
| 127 | 718 12234 12716 |
| 128 | 512 10667 11353 |
| 129 | 3629 6485 7040 |
| 130 | 2880 8865 11466 |
| 131 | 4490 10220 11796 |
| 132 | 5440 8819 9103 |
| 133 | 5262 7543 12411 |
| 134 | 516 7779 10940 |
| 135 | 2515 5843 9202 |
| 136 | 4684 5994 10586 |
| 137 | 573 2270 3324 |
| 138 | 7870 8317 10322 |
| 139 | 6856 7638 12909 |
| 140 | 1583 7669 10781 |
| 141 | 8141 9085 12555 |
| 142 | 3903 5485 9992 |
| 143 | 4467 11998 12904 |

In the above-described examples, the length of the LDPC codeword is 64800 and the code rate is 6/15, 8/15, 10/15, and 12/15. However, this is merely an example and the position of 1 in the information word submatrix 210 may be defined variously when the length of the LDPC codeword is 16200 or the code rate has different values.

According to an exemplary embodiment, even when the order of numbers in a sequence corresponding to the $i^{th}$ column group of the parity check matrix 200 as shown in the above-described Tables 4 to 8 is changed, the changed parity check matrix is a parity check matrix used for the same code. Therefore, a case in which the order of numbers in the sequence corresponding to the $i^{th}$ column group in Tables 4 to 8 is changed is covered by the inventive concept.

According to an exemplary embodiment, even when the arrangement order of sequences corresponding to each column group is changed in Tables 4 to 8, cycle characteristics on a graph of a code and algebraic characteristics such as degree distribution are not changed. Therefore, a case in which the arrangement order of the sequences shown in Tables 4 to 8 is changed is also covered by the inventive concept.

In addition, even when a multiple of $Q_{ldpc}$ is equally added to all sequences corresponding to a certain column group in Tables 4 to 8, the cycle characteristics on the graph of the code or the algebraic characteristics such as degree distribution are not changed. Therefore, a result of equally adding a multiple of $Q_{ldpc}$ to the sequences shown in Tables 4 to 8 is also covered by the inventive concept. However, it should be noted that, when the resulting value obtained by adding the multiple of $Q_{ldpc}$ to a given sequence is greater than or equal to $(N_{ldpc}-K_{ldpc})$, a value obtained by applying a modulo operation for $(N_{ldpc}-K_{ldpc})$ to the resulting value should be applied instead.

Once positions of the rows where 1 exists in the $0^{th}$ column of the $i^{th}$ column group of the information word submatrix 210 are defined as shown in Tables 4 to 8, positions of rows where 1 exists in another column of each column group may be defined since the positions of the rows where 1 exists in the $0^{th}$ column are cyclic-shifted by $Q_{ldpc}$ in the next column.

For example, in the case of Table 4, in the $0^{th}$ column of the $0^{th}$ column group of the information word submatrix 210, 1 exists in the $1606^{th}$ row, $3402^{nd}$ row, $4961^{st}$ row, . . . .

In this case, since $Q_{ldpc}=(N_{ldpc}-K_{ldpc})/M=(64800-25920)/360=108$, the indexes of the rows where 1 is located in the 1st column of the 0th column group may be 1714 (=1606+108), 3510(=3402+108), 5069(=4961+108), . . . , and the indexes of the rows where 1 is located in the $2^{nd}$ column of the $0^{th}$ column group may be 1822(=1714+108), 3618(=3510+108), 5177(=5069+108), . . . .

In the above-described method, the indexes of the rows where 1 is located in all rows of each column group may be defined.

The parity submatrix 220 of the parity check matrix 200 shown in FIG. 20 may be defined as follows:

The parity submatrix 220 includes $N_{ldpc}-K_{ldpc}$ number of columns (that is, $K_{ldpc}{}^{th}$ column to $(N_{ldpc}-1)^{th}$ column), and has a dual diagonal or staircase configuration. Accordingly, the degree of columns except the last column (that is, $(N_{ldpc}-1)^{th}$ column) from among the columns included in the parity submatrix 220 is 2, and the degree of the last column is 1.

As a result, the information word submatrix 210 of the parity check matrix 200 may be defined by Tables 4 to 8, and the parity submatrix 220 of the parity check matrix 200 may have a dual diagonal configuration.

Figure 21:
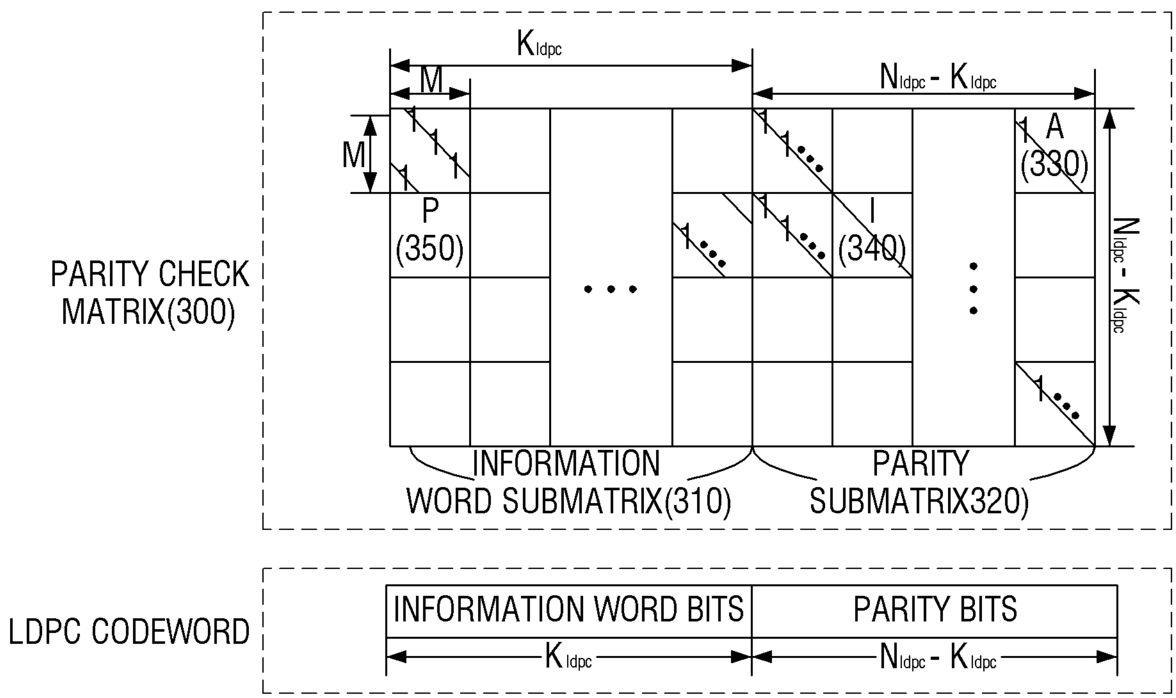

When the columns and rows of the parity check matrix 200 shown in FIG. 20 are permutated based on Equation 4 and Equation 5, the parity check matrix shown in FIG. 20 may be changed to a parity check matrix 300 shown in FIG. 21.

$$Q_{ldpc}\cdot i+j \Rightarrow M\cdot j+i\ (0\le i<M, 0\le j<Q_{ldpc}) \tag{4}$$

$$K_{ldpc}+Q_{ldpc}\cdot k+l \Rightarrow K_{ldpc}+M\cdot l+k\ (0\le k<M, 0\le l<Q_{ldpc}) \tag{5}$$

The method for permutating based on Equation 4 and Equation 5 will be explained below. Since row permutation and column permutation apply the same principle, the row permutation will be explained by the way of an example.

In the case of the row permutation, regarding the $X^{th}$ row, i and j satisfying $X=Q_{ldpc}\times i+j$ are calculated and the $X^{th}$ row is permutated by assigning the calculated i and j to $M\times j+i$. For example, regarding the $7^{th}$ row, i and j satisfying $7=2\times i+j$ are 3 and 1, respectively. Therefore, the $7^{th}$ row is permutated to the $13^{th}$ row ($10\times 1+3=13$).

When the row permutation and the column permutation are performed in the above-described method, the parity check matrix of FIG. 20 may be converted into the parity check matrix of FIG. 21.

Referring to FIG. 21, the parity check matrix 300 is divided into a plurality of partial blocks, and a quasi-cyclic matrix of M×M corresponds to each partial block.

Accordingly, the parity check matrix 300 having the configuration of FIG. 21 is formed of matrix units of M×M. That is, the submatrices of M×M are arranged in the plurality of partial blocks, constituting the parity check matrix 300.

Since the parity check matrix 300 is formed of the quasi-cyclic matrices of M×M, M number of columns may be referred to as a column block and M number of rows may be referred to as a row block. Accordingly, the parity check matrix 300 having the configuration of FIG. 21 is formed of $N_{qc\_column}=N_{ldpc}/M$ number of column blocks and $N_{qc\_row}=N_{parity}/M$ number of row blocks.

Hereinafter, the submatrix of M×M will be explained.

First, the $(N_{qc\_column}-1)$ column block of the $0^{th}$ row block has a form shown in Equation 6 presented below:

$$A = \begin{bmatrix} 0 & 0 & \ldots & 0 & 0 \\ 1 & 0 & \ldots & 0 & 0 \\ 0 & 1 & \ldots & 0 & 0 \\ \vdots & \vdots & \vdots & \vdots & \vdots \\ 0 & 0 & \ldots & 1 & 0 \end{bmatrix} \quad (6)$$

As described above, A 330 is an M×M matrix, values of the $0^{th}$ row and the $(M-1)^{th}$ column are all "0", and, regarding $0 \le i \le (M-2)$, the $(i+1)^{th}$ row of the $i^{th}$ column is "1" and the other values are "0".

Second, regarding $0 \le i \le (N_{ldpc}-K_{ldpc})/M-1$ in the parity submatrix 320, the $i^{th}$ row block of the $(K_{ldpc}/M+i)^{th}$ column block is configured by a unit matrix $I_{M\times M}$ 340. In addition, regarding $0 \le i \le (N_{ldpc}-K_{ldpc})/M-2$, the $(i+1)^{th}$ row block of the $(K_{ldpc}/M+i)^{th}$ column block is configured by a unit matrix $M_{M\times M}$ 340.

Third, a block 350 constituting the information word submatrix 310 may have a cyclic-shifted format of a cyclic matrix P, $P^{a_{ij}}$, or an added format of the cyclic-shifted matrix $P^{a_{ij}}$ of the cyclic matrix P (or an overlapping format).

For example, a format in which the cyclic matrix P is cyclic-shifted to the right by 1 may be expressed by Equation 7 presented below:

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \quad (7)$$

The cyclic matrix P is a square matrix having an M×M size and is a matrix in which a weight of each of M number of rows is 1 and a weight of each of M number of columns is 1. When $a_{ij}$ is 0, the cyclic matrix P, that is, $P^0$ indicates a unit matrix $I_{M\times M}$, and when $a_{ij}$ is ∞, $P^\infty$ is a zero matrix.

A submatrix existing where the $i^{th}$ row block and the $j^{th}$ column block intersect in the parity check matrix 300 of FIG. 21 may be $P^{a_{ij}}$. Accordingly, i and j indicate the number of row blocks and the number of column blocks in the partial blocks corresponding to the information word. Accordingly, in the parity check matrix 300, the total number of columns is $N_{ldpc}=M\times N_{qc\_column}$, and the total number of rows is $N_{parity}=M\times N_{qc\_row}$. That is, the parity check matrix 300 is formed of $N_{qc\_column}$ number of "column blocks" and $N_{qc\_row}$ number of "row blocks".

Hereinafter, a method for performing LDPC encoding based on the parity check matrix 200 as shown in FIG. 20 will be explained. An LDPC encoding process when the parity check matrix 200 is defined as shown in Table 4 by way of an example will be explained for the convenience of explanation.

First, when information word bits having a length of $K_{ldpc}$ are $[i_0, i_1, i_2, \ldots, i_{K_{ldpc}-1}]$, and parity bits having a length of $N_{ldpc}-K_{ldpc}$ are $[p_0, p_1, p_2, \ldots p_{N_{ldpc}-K_{ldpc}-1}]$, the LDPC encoding is performed by the following process.

Step 1) Parity bits are initialized as '0'. That is, $p_0=p_1=p_2=\ldots=p_{N_{ldpc}-K_{ldpc}-1}=0$.

Step 2) The $0^{th}$ information word bit $i_0$ is accumulated in a parity bit having the address of the parity bit defined in the first row (that is, the row of i=0) of table 4 as the index of the parity bit. This may be expressed by Equation 8 presented below:

$$\begin{aligned}
&p_{1606} = p_{1606} \oplus i_0 && p_{24533} = p_{24533} \oplus i_0 && (8)\\
&p_{3402} = p_{3402} \oplus i_0 && p_{25376} = p_{25376} \oplus i_0\\
&p_{4961} = p_{4961} \oplus i_0 && p_{25667} = p_{25667} \oplus i_0\\
&p_{6751} = p_{6751} \oplus i_0 && p_{26836} = p_{26836} \oplus i_0\\
&p_{7132} = p_{7132} \oplus i_0 && p_{31799} = p_{31799} \oplus i_0\\
&p_{11516} = p_{11516} \oplus i_0 && p_{34173} = p_{34173} \oplus i_0\\
&p_{12300} = p_{12300} \oplus i_0 && p_{35462} = p_{35462} \oplus i_0\\
&p_{12482} = p_{12482} \oplus i_0 && p_{36153} = p_{36153} \oplus i_0\\
&p_{12592} = p_{12592} \oplus i_0 && p_{36740} = p_{36740} \oplus i_0\\
&p_{13342} = p_{13342} \oplus i_0 && p_{37085} = p_{37085} \oplus i_0\\
&p_{13764} = p_{13764} \oplus i_0 && p_{37152} = p_{37152} \oplus i_0\\
&p_{14123} = p_{14123} \oplus i_0 && p_{37468} = p_{37468} \oplus i_0\\
&p_{21576} = p_{21576} \oplus i_0 && p_{37658} = p_{37658} \oplus i_0\\
&p_{23946} = p_{23946} \oplus i_0
\end{aligned}$$

Herein, $i_0$ is a $0^{th}$ information word bit, $p_i$ is an ith parity bit, and ⊕ is a binary operation. According to the binary operation, 1⊕1 equals 0, 1⊕0 equals 1, 0⊕1 equals 1, 0⊕0 equals 0.

Step 3) The other 359 information word bits $i_m$ (m=1, 2, . . . , 359) are accumulated in the parity bit. The other information word bits may belong to the same column group as that of $i_0$. In this case, the address of the parity bit may be determined based on Equation 9 presented below:

$$(x+(m \bmod 360)\times Q_{ldpc}) \bmod (N_{ldpc}-K_{ldpc}) \quad (9)$$

Herein, x is an address of a parity bit accumulator corresponding to the information word bit $i_0$, and $Q_{ldpc}$ is a size by which each column is cyclic-shifted in the information word submatrix, and may be 108 in the case of table 4. In addition, since m=1, 2, . . . , 359, (m mod 360) in Equation 9 may be regarded as m.

As a result, information word bits $i_m$ (m=1, 2, . . . , 359) are accumulated in the parity bits having the address of the parity bit calculated based on Equation 9 as the index. For example, an operation as shown in Equation 10 presented below may be performed for the information word bit $i_1$:

$$\begin{aligned}
&p_{1714} = p_{1714} \oplus i_1 && p_{24641} = p_{24641} \oplus i_1 && (10)\\
&p_{3510} = p_{3510} \oplus i_1 && p_{25484} = p_{25484} \oplus i_1\\
&p_{5069} = p_{5069} \oplus i_1 && p_{25775} = p_{25775} \oplus i_1\\
&p_{6859} = p_{6859} \oplus i_1 && p_{26944} = p_{26944} \oplus i_1\\
&p_{7240} = p_{7240} \oplus i_1 && p_{31907} = p_{31907} \oplus i_1\\
&p_{11624} = p_{11624} \oplus i_1 && p_{34281} = p_{34281} \oplus i_1\\
&p_{12408} = p_{12408} \oplus i_1 && p_{35570} = p_{35570} \oplus i_1\\
&p_{12590} = p_{12590} \oplus i_1 && p_{36261} = p_{36261} \oplus i_1\\
&p_{12700} = p_{12700} \oplus i_1 && p_{36848} = p_{36848} \oplus i_1\\
&p_{13450} = p_{13450} \oplus i_1 && p_{37193} = p_{37193} \oplus i_1\\
&p_{13872} = p_{13872} \oplus i_1 && p_{37260} = p_{37260} \oplus i_1\\
&p_{14231} = p_{14231} \oplus i_1 && p_{37576} = p_{37576} \oplus i_1\\
&p_{21684} = p_{21684} \oplus i_1 && p_{37766} = p_{37766} \oplus i_1\\
&p_{24054} = p_{24054} \oplus i_1
\end{aligned}$$

Herein, $i_1$ is a $1^{st}$ information word bit, $p_i$ is an ith parity bit, and ⊕ is a binary operation. According to the binary operation, 1⊕1 equals 0, 1⊕0 equals 1, 0⊕1 equals 1, 0⊕0 equals 0.

Step 4) The $360^{th}$ information word bits $i_{360}$ is accumulated in a parity bit having the address of the parity bit defined in the $2^{nd}$ row (that is, the row of i=1) of table 4 as the index of the parity bit.

Step 5) The other 359 information word bits belonging to the same group as that of the information word bit $i_{360}$ are accumulated in the parity bit. In this case, the address of the parity bit may be determined based on Equation 9. However, in this case, x is the address of the parity bit accumulator corresponding to the information word bit $i_{360}$.

Step 6) Steps 4 and 5 described above are repeated for all of the column groups of table 4.

Step 7) As a result, a parity bit $p_i$ is calculated based on Equation 11 presented below. In this case, i is initialized as 1.

$$p_i = p_i \oplus p_{i-1} \quad i=1,2, \ldots, N_{ldpc}-K_{ldpc}-1 \tag{11}$$

In Equation 11, $p_i$ is an ith parity bit, $N_{ldpc}$ is a length of an LDPC codeword, $K_{ldpc}$ is a length of an information word of the LDPC codeword, and ⊕ is a binary operation.

As a result, the encoder 110 may calculate the parity bits according to the above-described method.

Figure 22:
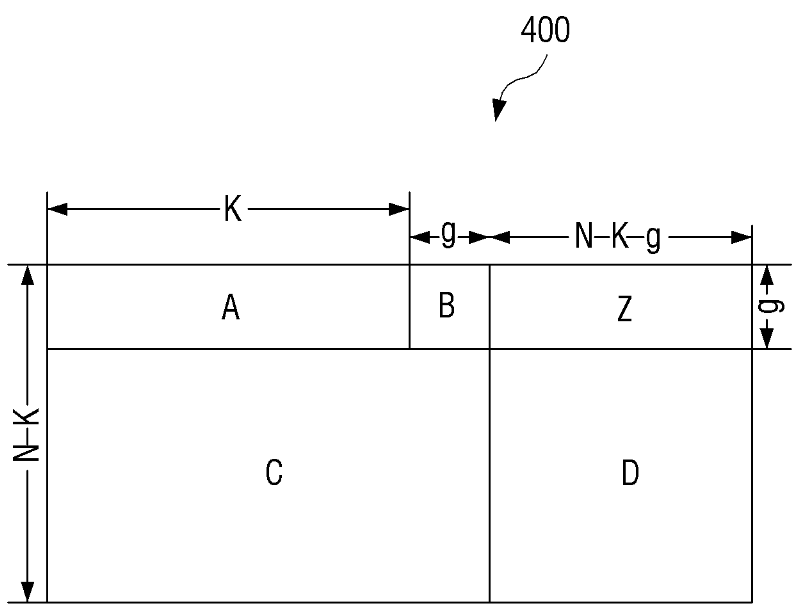

In another example, a parity check matrix according to an exemplary embodiment may have a configuration as shown in FIG. 22.

Referring to FIG. 22, the parity check matrix 400 may be formed of 5 matrices A, B, C, Z, and D. Hereinafter, the configuration of each matrix will be explained to explain the configuration of the parity check matrix 400.

First, $M_1$, $M_2$, $Q_1$, and $Q_2$, which are parameter values related to the parity check matrix 400 as shown in FIG. 22, may be defined as shown in table 9 presented below according to the length and the code rate of the LDPC codeword.

TABLE 9

| | | Sizes | | | |
|---|---|---|---|---|---|
| Rate | Length | $M_1$ | $M_2$ | $Q_1$ | $Q_2$ |
| 1/15 | 16200 | 2520 | 12600 | 7 | 35 |
| | 64800 | 1080 | 59400 | 3 | 165 |
| 2/15 | 16200 | 3240 | 10800 | 9 | 30 |
| | 64800 | 1800 | 54360 | 5 | 151 |
| 3/15 | 16200 | 1080 | 11880 | 3 | 33 |
| | 64800 | 1800 | 50040 | 5 | 139 |
| 4/15 | 16200 | 1080 | 10800 | 3 | 30 |
| | 64800 | 1800 | 45720 | 5 | 127 |
| 5/15 | 16200 | 720 | 10080 | 2 | 28 |
| | 64800 | 1440 | 41760 | 4 | 116 |
| 6/15 | 16200 | 1080 | 8640 | 3 | 24 |
| | 64800 | 1080 | 37800 | 3 | 105 |

The matrix A is formed of K number of columns and g number of rows, and the matrix C is formed of K+g number of columns and N−K−g number of rows. Herein, K is a length of information word bits, and N is a length of the LDPC codeword.

Indexes of rows where 1 is located in the $0^{th}$ column of the ith column group in the matrix A and the matrix C may be defined based on table 10 according to the length and the code rate of the LDPC codeword. In this case, an interval at which a pattern of a column is repeated in each of the matrix A and the matrix C, that is, the number of column is repeated in each of the matrix A and the matrix C, that is, the number of columns belonging to the same group, may be 360.

For example, when the length N of the LDPC codeword is 64800 and the code rate is 6/15, the indexes of rows where 1 is located in the $0^{th}$ column of the ith column group in the matrix A and the matrix C are defined as shown in table 10 presented below:

TABLE 10

| i | Index of row where 1 is located in the 0th column of the ith column group |
|---|---|
| 0 | 71 276 856 6867 12964 17373 18159 26420 28460 28477 |
| 1 | 257 322 672 2533 5316 6578 9037 10231 13845 36497 |
| 2 | 233 765 904 1366 3875 13145 15409 18620 23910 30825 |
| 3 | 100 224 405 12776 13868 14787 16781 23886 29099 31419 |
| 4 | 23 496 891 2512 12589 14074 19392 20339 27658 28684 |
| 5 | 473 712 759 1283 4374 9898 12551 13814 24242 32728 |
| 6 | 511 567 815 11823 17106 17900 19338 22315 24396 26448 |
| 7 | 45 733 836 1923 3727 17468 25746 33806 35995 36657 |
| 8 | 17 487 675 2670 3922 5145 18009 23993 31073 36624 |
| 9 | 72 751 773 1937 17324 28512 30666 30934 31016 31849 |
| 10 | 257 343 594 14041 19141 24914 26864 28809 32055 34753 |
| 11 | 99 241 491 2650 9670 17433 17785 18988 22235 30742 |
| 12 | 198 299 655 6737 8304 10917 16092 19387 20755 37690 |
| 13 | 351 916 926 18151 21708 23216 30321 33578 34052 37949 |
| 14 | 54 332 373 2010 3332 5623 16301 34337 36451 37861 |
| 15 | 139 257 1068 11090 20289 29694 29732 32640 35133 36404 |
| 16 | 457 885 968 2115 4956 5422 5949 17570 26673 32387 |
| 17 | 137 570 619 5006 6099 7979 14429 16650 25443 32789 |
| 18 | 46 282 287 10258 18383 20258 27186 27494 28429 38266 |
| 19 | 445 486 1058 1868 9976 11294 20364 23695 30826 35330 |
| 20 | 134 900 931 12518 14544 17715 19623 21111 33868 34570 |
| 21 | 62 66 586 8020 20270 23831 31041 31965 32224 35189 |
| 22 | 174 290 784 6740 14673 17642 26286 27382 33447 34879 |
| 23 | 332 675 1033 1838 12004 15439 20765 31721 34225 38863 |
| 24 | 527 558 832 3867 6318 8317 10883 13466 18427 25377 |
| 25 | 431 780 1021 1112 2873 7675 13059 17793 20570 20771 |
| 26 | 339 536 1015 5725 6916 10846 14487 21156 28123 32614 |
| 27 | 456 830 1078 7511 11801 12362 12705 17401 28867 34032 |
| 28 | 222 538 989 5593 6022 8302 14008 23445 25127 29022 |
| 29 | 37 393 788 3025 7768 11367 22276 22761 28232 30394 |
| 30 | 234 257 1045 1307 2908 6337 26530 28142 34129 35997 |
| 31 | 35 46 978 9912 9978 12567 17843 24194 34887 35206 |
| 32 | 39 959 967 5027 10847 14657 18859 28075 28214 36325 |
| 33 | 275 477 823 11376 18073 28997 30521 31661 31941 32116 |
| 34 | 185 580 966 11733 12013 12760 13358 19372 32534 35504 |
| 35 | 760 891 1046 11150 20358 21638 29930 31014 33050 34840 |
| 36 | 360 389 1057 5316 5938 14186 16404 32445 34021 35722 |
| 37 | 306 344 679 5224 6674 10305 18753 25583 30585 36943 |
| 38 | 103 171 1016 8780 11741 12144 19470 20955 22495 27377 |
| 39 | 818 832 894 3883 14279 14497 22505 28129 28719 31246 |
| 40 | 215 411 760 5886 25612 28556 32213 32704 35901 36130 |
| 41 | 229 489 1067 2385 8587 20565 23431 28102 30147 32859 |
| 42 | 288 664 980 8138 8531 21676 23787 26708 28798 34490 |
| 43 | 89 552 847 6656 9889 23949 26226 27080 31236 35823 |
| 44 | 66 142 443 3339 3813 7977 14944 15464 19186 25983 |
| 45 | 605 876 931 16682 17669 25800 28220 33432 35738 37382 |
| 46 | 346 423 806 5669 7668 8789 9928 19724 24039 27893 |
| 47 | 48 460 1055 3512 7389 7549 20216 22180 28221 35437 |
| 48 | 187 636 824 1678 4508 13588 19683 21750 30311 33480 |
| 49 | 25 768 935 2856 8187 9052 21850 29941 33217 34293 |
| 50 | 349 624 716 2698 6395 6435 8974 10649 15932 17378 |
| 51 | 336 410 871 3582 9830 10885 13892 18027 19203 36659 |
| 52 | 176 849 1078 17302 19379 27964 28164 28720 32557 35495 |
| 53 | 234 890 1075 9431 9605 9700 10113 11332 12679 24268 |
| 54 | 516 638 733 8851 19871 22740 25791 30152 32659 35568 |
| 55 | 253 830 879 2086 16885 22952 23765 25389 34656 37293 |
| 56 | 94 954 998 2003 3369 6870 7321 29856 31373 34888 |
| 57 | 79 350 933 4853 6252 11932 12058 21631 24552 24876 |
| 58 | 246 647 778 4036 10391 10656 13194 32335 32360 34179 |
| 59 | 149 339 436 6971 8356 8715 11577 22376 28684 31249 |
| 60 | 36 149 220 6936 18408 19192 19288 23063 28411 35312 |
| 61 | 273 683 1042 6327 10011 18041 21704 29097 30791 31425 |
| 62 | 46 138 722 2701 10984 13002 19930 26625 28458 28965 |
| 63 | 12 1009 1040 1990 2930 5302 21215 22625 23011 29288 |
| 64 | 125 241 819 2245 3199 8415 21133 26786 27226 38838 |
| 65 | 45 476 1075 7393 15141 20414 31244 33336 35004 38391 |
| 66 | 432 578 667 1343 10466 11314 11507 23314 27720 34465 |
| 67 | 248 291 556 1971 3989 8992 18000 19998 23932 34652 |
| 68 | 68 694 837 2246 7472 7873 11078 12868 20937 35591 |
| 69 | 272 924 949 2030 4360 6203 9737 19705 19902 38039 |

TABLE 10-continued

| i | Index of row where 1 is located in the 0th column of the ith column group |
|---|---|
| 70 | 21 314 979 2311 2632 4109 19527 21920 31413 34277 |
| 71 | 197 253 804 1249 4315 10021 14358 20559 27099 30525 |
| 72 | 9802 16164 17499 22378 22403 22704 26742 29908 |
| 73 | 9064 10904 12305 14057 16156 26000 32613 34536 |
| 74 | 5178 6319 10239 19343 25628 30577 31110 32291 |

In the above-described example, the length of the LDPC codeword is 64800 and the code rate 6/15. However, this is merely an example and the indexes of rows where 1 is located in the $0^{th}$ column of the ith column group in the matrix A and the matrix C may be defined variously when the length of the LDPC codeword is 16200 or the code rate has different values.

Hereinafter, positions of rows where 1 exists in the matrix A and the matrix C will be explained with reference to table 10 by way of an example.

Since the length N of the LDPC codeword is 64800 and the code rate is 6/15 in table 10, $M_1$=1080, $M_2$=37800, $Q_1$=3, and $Q_2$=105 in the parity check matrix 400 defined by table 10 with reference to table 9.

Herein, $Q_1$ is a size by which columns of the same column group are cyclic-shifted in the matrix A, and $Q_2$ is a size by which columns of the same column group are cyclic-shifted in the matrix C.

In addition, $Q_1=M_1/L$, $Q_2=M_2/L$, $M_1=g$, and $M_2=N-K-g$, and L is an interval at which a pattern of a column is repeated in the matrix A and the matrix C, and for example, may be 360.

The index of the row where 1 is located in the matrix A and the matrix C may be determined based on the $M_1$ value.

For example, since $M_1$=1080 in the case of table 10, the positions of the rows where 1 exists in the $0^{th}$ column of the ith column group in the matrix A may be determined based on values smaller than 1080 from among the index values of table 10, and the positions of the rows where 1 exists in the $0^{th}$ column of the ith column group in the matrix C may be determined based on values greater than or equal to 1080 from among the index values of table 10.

Specifically, in table 10, the sequence corresponding to the $0^{th}$ column group is "71, 276, 856, 6867, 12964, 17373, 18159, 26420, 28460, 28477". Accordingly, in the case of the $0^{th}$ column of the $0^{th}$ column group of the matrix A, 1 may be located in the $71^{st}$ row, 276th row, and $856^{th}$ row, and, in the case of the $0^{th}$ column of the $0^{th}$ column group of the matrix C, 1 may be located in the $6867^{th}$ row, $12964^{th}$ row, $17373^{rd}$ row, $18159^{th}$ row, $26420^{th}$ row, $28460^{th}$ row, and 28477 row.

Once positions of 1 in the $0^{th}$ column of each column group of the matrix A are defined, positions of rows where 1 exists in another column of each column group may be defined by cyclic-shifting from the previous column by $Q_1$. Once positions of 1 in the $0^{th}$ column of each column group of the matrix C are defined, position of rows where 1 exists in another column of each column group may be defined by cyclic-shifting from the previous column by $Q_2$.

In the above-described example, in the case of the $0^{th}$ column of the $0^{th}$ column group of the matrix A, 1 exists in the 71st row, $276^{th}$ row, and $856^{th}$ row. In this case, since $Q_1$=3, the indexes of rows where 1 exists in the $1^{st}$ column of the $0^{th}$ column group are 74(=71+3), 279(=276+3), and 859(=856+3), and the index of rows where 1 exists in the $2^{nd}$ column of the 0th column group are 77(=74+3), 282 (=279+3), and 862(=859+3).

In the case of the $0^{th}$ column of the $0^{th}$ column group of the matrix C, 1 exists in the $6867^{th}$ row, $12964^{th}$ row, $17373^{rd}$ row, $18159^{th}$ row, $26420^{th}$ row, $28460^{th}$ row, and $28477^{th}$ row. In this case, since $Q_2$=105, the index of rows where 1 exists in the $1^{st}$ column of the 0th column group are 6972(=6867+105), 13069(=12964+105), 17478(=17373+105), 18264(=18159+105), 26525(=26420+105), 28565 (=28460+105), 28582(=28477+105), and the indexes of rows where 1 exists in the $2^{nd}$ column of the $0^{th}$ column group are 7077(=6972+105), 13174(=13069+105), 17583 (=17478+105), 18369(=18264+105), 26630(=26525+105), 28670(=28565+105), 28687(=28582+105).

In this method, the positions of rows where 1 exists in all column groups of the matrix A and the matrix C are defined.

The matrix B may have a dual diagonal configuration, the matrix D may have a diagonal configuration (that is, the matrix D is an identity matrix), and the matrix Z may be a zero matrix.

As a result, the parity check matrix 400 shown in FIG. 22 may be defined by the matrices A, B, C, D, and Z having the above-described configurations.

Hereinafter, a method for performing LDPC encoding based on the parity check matrix 400 shown in FIG. 22 will be explained. An LDPC encoding process when the parity check matrix 400 is defined as shown in Table 10 by way of an example will be explained for the convenience of explanation.

For example, when an information word block $S=(s_0, s_1, \ldots, s_{K-1})$ is LDPC-encoded, an LDPC codeword $A=(\lambda_0, \lambda_1, \ldots, \lambda_{N-1})=(s_0, s_1, \ldots, S_{K-1}, p_0, p_1, \ldots, P_{M_1+M_2-1})$ including a parity bit $P=(p_0, p_1, \ldots, P_{M_1+M_2-1})$ may be generated.

$M_1$ and $M_2$ indicate the size of the matrix B having the dual diagonal configuration and the size of the matrix C having the diagonal configuration, respectively, and $M_1=g$, $M_2=N-K-g$.

A process of calculating a parity bit is as follows. In the following explanation, the parity check matrix 400 is defined as shown in table 10 by way of an example, for the convenience of explanation.

Step 1) λ and p are initialized as $\lambda_i=s_i$ (i=0, 1, . . . , K−1), $p_j=0$ (j=0, 1, . . . , $M_1+M_2-1$).

Step 2) The $0^{th}$ information word bit $\lambda_0$ is accumulated in the address of the parity bit defined in the first row (that is, the row of i=0) of table 10. This may be expressed by Equation 12 presented below:

$$
\begin{aligned}
P_{71} &= P_{71}\oplus\lambda_0 & P_{17373} &= P_{17373}\oplus\lambda_0\\
P_{276} &= P_{276}\oplus\lambda_0 & P_{18159} &= P_{18159}\oplus\lambda_0\\
P_{856} &= P_{856}\oplus\lambda_0 & P_{26420} &= P_{26420}\oplus\lambda_0\\
P_{6867} &= P_{6867}\oplus\lambda_0 & P_{28460} &= P_{28460}\oplus\lambda_0\\
P_{12964} &= P_{12964}\oplus\lambda_0 & P_{28477} &= P_{28477}\oplus\lambda_0
\end{aligned} \tag{12}
$$

Step 3) Regarding the next L−1 number of information word bits n, (m=1, 2, . . . , L−1), $a_m$ is accumulated in the parity bit address calculated based on Equation 13 presented below:

$$(\chi+m\times Q_1)\bmod M_1 \text{ (if } \chi<M_1)$$

$$M_1+\{(\chi-M_1+m\times Q_2)\bmod M_2\} \text{ (if } \chi\geq M_1) \tag{13}$$

Herein, x is an address of a parity bit accumulator corresponding to the $0^{th}$ information word bit $\lambda_0$.

In addition, $Q_1=M_1/L$ and $Q_2=M_2/L$. In addition, since the length N of the LDPC codeword is 64800 and the code rate is 6/15 in table 10, $M_1=1080$, $M_2=37800$, $Q_1=3$, $Q_2=105$, and L=360 with reference to table 9.

Accordingly, an operation as shown in Equation 14 presented below may be performed for the 1st information word bit $\lambda_1$:

$$\begin{aligned} p_{74} &= p_{74} \oplus \lambda_1 & p_{17478} &= p_{17478} \oplus \lambda_1 \\ p_{279} &= p_{279} \oplus \lambda_1 & p_{18264} &= p_{18264} \oplus \lambda_1 \\ p_{859} &= p_{859} \oplus \lambda_1 & p_{26525} &= p_{26525} \oplus \lambda_1 \\ p_{6972} &= p_{6972} \oplus \lambda_1 & p_{28565} &= p_{28565} \oplus \lambda_1 \\ p_{13069} &= p_{13069} \oplus \lambda_1 & p_{28582} &= p_{28582} \oplus \lambda_1 \end{aligned} \quad (14)$$

Step 4) Since the same address of the parity bit as in the second row (that is the row of i=1) of table 10 is given to the Lth information word bit $\lambda_L$, in a similar method to the above-described method, the address of the parity bit regarding the next L−1 number of information word bits $\lambda_m$ (m=L+1, L+2, . . . , 2L−1) is calculated based on Equation 13. In this case, x is the address of the parity bit accumulator corresponding to the information word bit $X_L$, and may be obtained based on the second row of table 10.

Step 5) The above-described processes are repeated for L number of new information word bits of each group by considering new rows of table 10 as the address of the parity bit accumulator.

Step 6) After the above-described processes are repeated for the codeword bits $\lambda_0$ to $\lambda_{K-1}$, values regarding Equation 15 presented below are calculated in sequence from i=1:

$$P_i=P_i \oplus P_{i-1} \; (i=1,2, \ldots, M_1-1) \quad (15)$$

Step 7) Parity bits $\lambda_K$ to $\lambda_{K+M_1-1}$ corresponding to the matrix B having the dual diagonal configuration are calculated based on Equation 16 presented below:

$$\lambda_{K+L\times t+s}=p_{Q_1\times s+t} \; (0\leq s<L, 0\leq t<Q_1) \quad (16)$$

Step 8) The address of the parity bit accumulator regarding L number of new codeword bits $\lambda_K$ to $\lambda_{K+M_1-1}$ of each group is calculated based on table 10 and Equation 13.

Step 9) After the codeword bits $\lambda_K$ to $\lambda_{K+M_1-1}$ are calculated, parity bits $\lambda_{K+M_1}$ to $\lambda_{K+M_1+M_2-1}$ corresponding to the matrix C having the diagonal configuration are calculated based on Equation 17 presented below:

$$\lambda_{K+M_1+L\times t+s}=p_{M_1+Q_2\times s+t} \; (0\leq s<L, 0\leq t<Q_2) \quad (17)$$

As a result, the parity bits may be calculated in the above-described method.

Referring back to FIG. 19, the encoder 110 may perform the LDPC encoding by using various code rates such as 3/15, 4/15, 5/15, 6/15, 7/15, 8/15, 9/15, 10/15, 11/15, 12/15, 13/15, etc. In addition, the encoder 110 may generate an LDPC codeword having various lengths such as 16200, 64800, etc., based on the length of the information word bits and the code rate.

In this case, the encoder 110 may perform the LDPC encoding by using the parity check matrix, and the parity check matrix is configured as shown in FIGS. 20 to 22.

In addition, the encoder 110 may perform Bose, Chaudhuri, Hocquenghem (BCH) encoding as well as LDPC encoding. To achieve this, the encoder 110 may further include a BCH encoder (not shown) to perform BCH encoding.

In this case, the encoder 110 may perform encoding in an order of BCH encoding and LDPC encoding. Specifically, the encoder 110 may add BCH parity bits to input bits by performing BCH encoding and LDPC-encodes the information word bits including the input bits and the BCH parity bits, thereby generating the LDPC codeword.

The interleaver 120 interleaves the LDPC codeword. That is, the interleaver 120 receives the LDPC codeword from the encoder 110, and interleaves the LDPC codeword based on various interleaving rules.

In particular, the interleaver 120 may interleave the LDPC codeword such that a bit included in a predetermined bit group from among a plurality of bit groups constituting the LDPC codeword (that is, a plurality of groups or a plurality of blocks) is mapped onto a predetermined bit of a modulation symbol. Accordingly, the modulator 130 may map a bit included in a predetermined group from among the plurality of groups of the LDPC codeword onto a predetermined bit of the modulation symbol.

Figure 23:
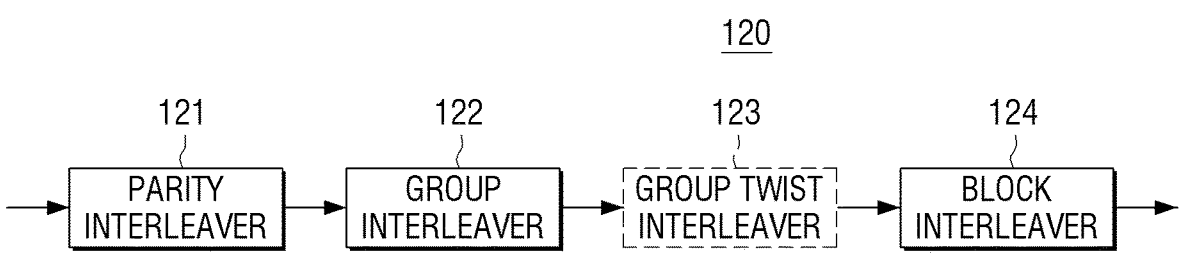
FIG. 23 is a block diagram to illustrate a configuration of an interleaver, according to an exemplary embodiment.

To achieve this, as shown in FIG. 23, the interleaver 120 may include a parity interleaver 121, a group interleaver (or a group-wise interleaver 122), a group twist interleaver 123 and a block interleaver 124.

The parity interleaver 121 interleaves the parity bits constituting the LDPC codeword.

Specifically, when the LDPC codeword is generated based on the parity check matrix 200 having the configuration of FIG. 20, the parity interleaver 121 may interleave only the parity bits of the LDPC codeword by using Equations 18 presented below:

$$u_i=c_i \text{ for } 0\leq i<K_{ldpc}, \text{ and}$$

$$u_{K_{ldpc}+M\cdot t+s}=c_{K_{ldpc}+Q_{lpdc}\cdot s+t} \text{ for } 0\leq s<M, 0\leq t<Q_{ldpc} \quad (18),$$

where M is an interval at which a pattern of a column group is repeated in the information word submatrix 210, that is, the number of columns included in a column group (for example, M=360), and $Q_{ldpc}$ is a size by which each column is cyclic-shifted in the information word submatrix 210. That is, the parity interleaver 121 performs parity interleaving with respect to the LDPC codeword $c=(c_0, c_1, \ldots, c_{N_{ldpc}-1})$, and outputs $U=(u_0, u_1, \ldots, u_{N_{lpdc}-1})$.

The LDPC codeword parity-interleaved in the above-described method may be configured such that a predetermined number of continuous bits of the LDPC codeword have similar decoding characteristics (cycle distribution, a degree of a column, etc.).

For example, the LDPC codeword may have the same characteristics on the basis of M number of continuous bits. Herein, M is an interval at which a pattern of a column group is repeated in the information word submatrix 210 and, for example, may be 360.

Specifically, a product of the LDPC codeword bits and the parity check matrix should be “0”. This means that a sum of products of the ith LDPC codeword bit, $c_i$ (i=0, 1, . . . , $N_{ldpc}-1$) and the $i^{th}$ column of the parity check matrix should be a “0” vector. Accordingly, the $i^{th}$ LDPC codeword bit may be regarded as corresponding to the ith column of the parity check matrix.

In the case of the parity check matrix 200 of FIG. 20, M number of columns in the information word submatrix 210 belong to the same group and the information word submatrix 210 has the same characteristics on the basis of a column group (for example, the columns belonging to the same column group have the same degree distribution and the same cycle characteristic).

In this case, since M number of continuous bits in the information word bits correspond to the same column group of the information word submatrix 210, the information word bits may be formed of M number of continuous bits having the same codeword characteristics. When the parity bits of the LDPC codeword are interleaved by the parity interleaver 121, the parity bits of the LDPC codeword may be formed of M number of continuous bits having the same codeword characteristics.

However, regarding the LDPC codeword encoded based on the parity check matrix 300 of FIG. 21 and the parity check matrix 400 of FIG. 22, parity interleaving may not be performed. In this case, the parity interleaver 121 may be omitted.

The group interleaver 122 may divide the parity-interleaved LDPC codeword into a plurality of bit groups and rearrange the order of the plurality of bit groups in bit group wise (or bit group unit). That is, the group interleaver 122 may interleave the plurality of bit groups in bit group wise.

To achieve this, the group interleaver 122 divides the parity-interleaved LDPC codeword into a plurality of bit groups by using Equation 19 or Equation 20 presented below.

$$\backslash X_j = \left\{u_k \mid j = \left\lfloor \frac{k}{360} \right\rfloor, 0 \le k < N_{ldpc}\right\} \quad \text{for } 0 \le j < N_{group} \tag{19}$$

$$X_j = \{u_k \mid 360 \times j \le k < 360 \times (j+1), 0 \le k < N_{ldpc}\} \quad \text{for } 0 \le j < N_{group} \tag{20}$$

where $N_{group}$ is the total number of bit groups, $X_j$ is the $j^{th}$ bit group, and $u_k$ is the $k^{th}$ LDPC codeword bit input to the group interleaver 122. In addition, $$\left\lfloor \frac{k}{360} \right\rfloor$$

is the largest integer below k/360.

Since 360 in these equations indicates an example of the interval M at which the pattern of a column group is repeated in the information word submatrix, 360 in these equations can be changed to M.

Figure 24:
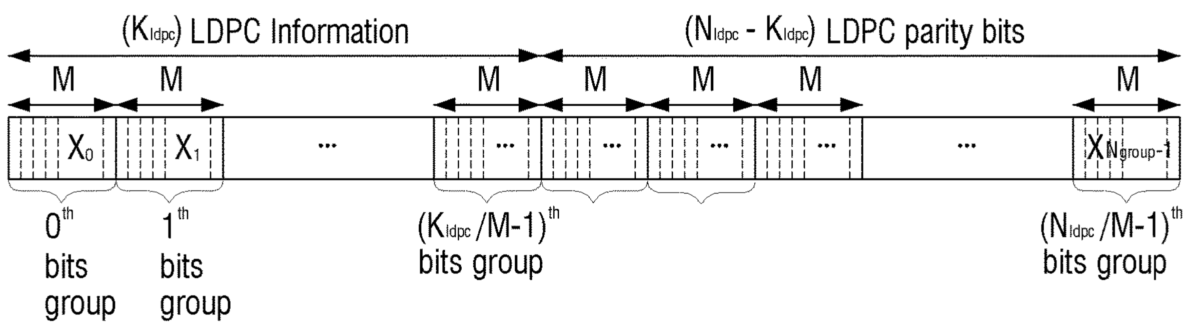
FIGS. 24 to 26 are views to illustrate an interleaving method, according to exemplary embodiments.

The LDPC codeword which is divided into the plurality of bit groups may be as shown in FIG. 24.

Referring to FIG. 24, the LDPC codeword is divided into the plurality of bit groups and each bit group is formed of M number of continuous bits. When M is 360, each of the plurality of bit groups may be formed of 360 bits. Accordingly, the bit groups may be formed of bits corresponding to the column groups of the parity check matrix.

Specifically, since the LDPC codeword is divided by M number of continuous bits, $K_{ldpc}$ number of information word bits are divided into ($K_{ldpc}$/M) number of bit groups and $N_{ldpc}-K_{ldpc}$ number of parity bits are divided into ($N_{ldpc}-K_{ldpc}$)/M number of bit groups. Accordingly, the LDPC codeword may be divided into ($N_{ldpc}$/M) number of bit groups in total.

For example, when M=360 and the length $N_{ldpc}$ of the LDPC codeword is 16200, the number of groups $N_{groups}$ constituting the LDPC codeword is 45(=16200/360), and, when M=360 and the length $N_{ldpc}$ of the LDPC codeword is 64800, the number of bit groups $N_{group}$ constituting the LDPC codeword is 180(=64800/360).

As described above, the group interleaver 122 divides the LDPC codeword such that M number of continuous bits are included in a same group since the LDPC codeword has the same codeword characteristics on the basis of M number of continuous bits. Accordingly, when the LDPC codeword is grouped by M number of continuous bits, the bits having the same codeword characteristics belong to the same group.

In the above-described example, the number of bits constituting each bit group is M. However, this is merely an example and the number of bits constituting each bit group is variable.

For example, the number of bits constituting each bit group may be an aliquot part of M. That is, the number of bits constituting each bit group may be an aliquot part of the number of columns constituting a column group of the information word submatrix of the parity check matrix. In this case, each bit group may be formed of aliquot part of M number of bits. For example, when the number of columns constituting a column group of the information word submatrix is 360, that is, M=360, the group interleaver 122 may divide the LDPC codeword into a plurality of bit groups such that the number of bits constituting each bit group is one of the aliquot parts of 360.

In the following explanation, the number of bits constituting a bit group is M by way of an example, for the convenience of explanation.

Thereafter, the group interleaver 122 interleaves the LDPC codeword in bit group wise. Specifically, the group interleaver 122 may group the LDPC codeword into the plurality of bit groups and rearrange the plurality of bit groups in bit group wise. That is, the group interleaver 122 changes positions of the plurality of bit groups constituting the LDPC codeword and rearranges the order of the plurality of bit groups constituting the LDPC codeword in bit group wise.

Herein, the group interleaver 122 may rearrange the order of the plurality of bit groups in bit group wise such that bit groups including bits mapped onto the same modulation symbol from among the plurality of bit groups are spaced apart from one another at predetermined intervals.

In this case, the group interleaver 122 may rearrange the order of the plurality of bit groups in bit group wise by considering at least one of the number of rows and columns of the block interleaver 124, the number of bit groups of the LDPC codeword, and the number of bits included in each bit group, such that bit groups including bits mapped onto the same modulation symbol are spaced apart from one another at predetermined intervals.

To achieve this, the group interleaver 122 may rearrange the order of the plurality of groups in bit group wise by using Equation 21 presented below:

$$Y_j = X_{\pi(j)} \ (0 \le j < N_{group}) \tag{21},$$

where $X_j$ is the $j^{th}$ bit group before group interleaving, and $Y_j$ is the $j^{th}$ bit group after group interleaving. In addition, π(j) is a parameter indicating an interleaving order and is determined by at least one of a length of an LDPC codeword, a modulation method, and a code rate. That is, π(j) denotes a permutation order for group wise interleaving.

Accordingly, $X_{\pi(j)}$ is a $\pi(j)^{th}$ bit group before group interleaving, and Equation 21 means that the pre-interleaving $\pi(j)^{th}$ bit group is interleaved into the $j^{th}$ bit group.

According to an exemplary embodiment, an example of π(j) may be defined as in Tables 11 to 22 presented below.

In this case, π(j) is defined according to a length of an LPDC codeword and a code rate, and a parity check matrix is also defined according to a length of an LDPC codeword and a code rate. Accordingly, when LDPC encoding is performed based on a specific parity check matrix according to a length of an LDPC codeword and a code rate, the LDPC codeword may be interleaved in bit group wise based on π(j) satisfying the corresponding length of the LDPC codeword and code rate.

For example, when the encoder 110 performs LDPC encoding at a code rate of 6/15 to generate an LDPC codeword of a length of 64800, the group interleaver 122 may perform interleaving by using π(j) which is defined according to the length of the LDPC codeword of 16200 and the code rate of 6/15 in tables 11 to 22 presented below.

For example, when the length of the LDPC codeword is 64800, the code rate is 6/15, and the modulation method (or modulation format) is 16-Quadrature Amplitude Modulation (QAM), π(j) may be defined as in table 11 presented below. In particular, table 11 may be applied when LDPC encoding is performed based on the parity check matrix defined by table 4.

TABLE 11

| | Order of bit groups to be block interleaved π(j) (0 ≤ j < 180) | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 55 | 146 | 83 | 52 | 62 | 176 | 160 | 68 | 53 | 56 | 81 | 97 |
| group-wise | 144 | 57 | 67 | 116 | 59 | 70 | 156 | 172 | 65 | 149 | 155 | 82 |
| interleaver | 14 | 37 | 54 | 44 | 63 | 43 | 18 | 47 | 7 | 25 | 34 | 29 |
| input | 27 | 38 | 48 | 33 | 22 | 49 | 51 | 60 | 46 | 21 | 4 | 3 |
| | 127 | 101 | 94 | 115 | 105 | 31 | 19 | 177 | 74 | 10 | 145 | 162 |
| | 78 | 171 | 8 | 142 | 178 | 154 | 85 | 107 | 75 | 12 | 9 | 151 |
| | 150 | 110 | 175 | 166 | 131 | 119 | 103 | 139 | 148 | 157 | 114 | 147 |
| | 11 | 92 | 165 | 84 | 168 | 124 | 169 | 2 | 130 | 167 | 153 | 137 |

| | Order of bit groups to be block interleaved π(j) (0 ≤ j < 180) | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 79 | 113 | 163 | 61 | 58 | 69 | 133 | 108 | 66 | 71 | 86 |
| group-wise | 138 | 136 | 141 | 111 | 96 | 170 | 90 | 140 | 64 | 159 | 15 |
| interleaver | 30 | 26 | 39 | 16 | 41 | 45 | 36 | 0 | 23 | 32 | 28 |
| input | 20 | 13 | 50 | 35 | 24 | 40 | 17 | 42 | 6 | 112 | 93 |
| | 102 | 120 | 126 | 95 | 73 | 152 | 129 | 174 | 125 | 72 | 128 |
| | 77 | 117 | 109 | 80 | 106 | 134 | 98 | 1 | 122 | 173 | 161 |
| | 87 | 158 | 121 | 164 | 104 | 89 | 179 | 123 | 118 | 99 | 88 |
| | 143 | 91 | 100 | 5 | 76 | 132 | 135 | | | | |

In the case of Table 11, Equation 21 may be expressed as $Y_0=X_{\pi(0)}=X_{55}$, $Y_1=X_{\pi(1)}=X_{146}$, $Y_2=X_{\pi(2)}=X_{83}$, . . . , $Y_{178}=X_{\pi(178)}=X_{132}$, and $Y_{179}=X_{\pi(179)}=X_{135}$. Accordingly, the group interleaver 122 may rearrange the order of the plurality of bit groups in bit group wise by changing the $55^{th}$ bit group to the $0^{th}$ bit group, the $146^{th}$ bit group to the $1^{st}$ bit group, the $83^{rd}$ bit group to the $2^{nd}$ bit group, . . . , the $132^{nd}$ bit group to the $178^{th}$ bit group, and the $135^{th}$ bit group to the $179^{th}$ bit group. Herein, the changing the Ath bit group to the Bth bit group means rearranging the order of bit groups so that the Ath bit group is to be the Bth bit group In another example, when the length of the LDPC codeword is 64800, the code rate is 8/15, and the modulation method is 16-QAM, π(j) may be defined as in table 12 presented below. In particular, table 12 may be applied when LDPC encoding is performed based on the parity check matrix defined by table 5.

TABLE 12

| | Order of bit groups to be block interleaved π(j) (0 ≤ j < 180) | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |

TABLE 12-continued

| | | | | | | | | | | | | |
|---|---|---|---|---|---|---|---|---|---|---|---|---|
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 58 | 55 | 111 | 73 | 150 | 87 | 110 | 71 | 172 | 45 | 41 | 113 |
| group-wise | 118 | 38 | 89 | 99 | 85 | 79 | 75 | 83 | 68 | 63 | 40 | 77 |
| interleaver | 92 | 17 | 65 | 60 | 25 | 29 | 23 | 28 | 61 | 59 | 74 | 57 |
| input | 33 | 24 | 91 | 47 | 10 | 52 | 50 | 20 | 31 | 48 | 0 | 39 |
| | 7 | 5 | 11 | 136 | 35 | 165 | 8 | 3 | 106 | 159 | 138 | 19 |
| | 100 | 142 | 96 | 34 | 161 | 170 | 134 | 156 | 12 | 154 | 174 | 2 |
| | 116 | 130 | 177 | 160 | 129 | 108 | 125 | 147 | 97 | 148 | 162 | 173 |
| | 105 | 126 | 109 | 119 | 101 | 121 | 107 | 131 | 152 | 164 | 175 | 151 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 115 | 69 | 120 | 95 | 88 | 178 | 123 | 80 | 66 | 53 | 82 |
| group-wise | 117 | 70 | 81 | 112 | 43 | 94 | 37 | 72 | 46 | 67 | 51 |
| interleaver | 49 | 62 | 78 | 86 | 30 | 93 | 42 | 44 | 90 | 22 | 26 |
| input | 27 | 54 | 15 | 32 | 76 | 21 | 36 | 56 | 84 | 18 | 169 |
| | 4 | 128 | 168 | 166 | 144 | 149 | 1 | 179 | 141 | 6 | 13 |
| | 9 | 145 | 146 | 14 | 124 | 16 | 102 | 133 | 176 | 132 | 135 |
| | 163 | 122 | 104 | 64 | 143 | 167 | 103 | 140 | 158 | 139 | 98 |
| | 127 | 114 | 137 | 157 | 153 | 171 | 155 | | | | |

In the case of Table 12, Equation 21 may be expressed as $Y_0=X_{\pi(0)}=X_{58}$, $Y_1=X_{\pi(1)}=X_{55}$, $Y_2=X_{\pi(2)}=X_{111}$, . . . , $Y_{178}=X_{\pi(178)}=X_{171}$, and $Y_{179}=X_{\pi(179)}=X_{55}$. Accordingly, the group interleaver 122 may rearrange the order of the plurality of bit groups in bit group wise by changing the $58^{th}$ bit group to the $0^{th}$ bit group, the $55^{th}$ bit group to the $1^{st}$ bit group, the $111^{th}$ bit group to the $2^{nd}$ bit group, . . . , the $171^{st}$ bit group to the $178^{th}$ bit group, and the $155^{th}$ bit group to the $179^{th}$ bit group.

In another example, when the length of the LDPC codeword is 64800, the code rate is 10/15, and the modulation method is 16-QAM, π(j) may be defined as in table 13 presented below. In particular, table 13 may be applied when LDPC encoding is performed based on the parity check matrix defined by table 6.

TABLE 13

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 74 | 53 | 84 | 109 | 28 | 103 | 99 | 1 | 65 | 41 | 50 | 12 |
| group-wise | 34 | 77 | 81 | 58 | 113 | 44 | 49 | 45 | 33 | 40 | 91 | 17 |
| interleaver | 107 | 86 | 38 | 72 | 31 | 83 | 76 | 61 | 54 | 73 | 102 | 42 |
| input | 56 | 105 | 4 | 119 | 39 | 32 | 70 | 7 | 101 | 114 | 52 | 47 |
| | 160 | 78 | 18 | 59 | 23 | 64 | 19 | 79 | 134 | 63 | 24 | 20 |
| | 147 | 11 | 161 | 162 | 123 | 138 | 173 | 177 | 100 | 22 | 87 | 137 |
| | 146 | 144 | 139 | 176 | 164 | 155 | 175 | 170 | 125 | 171 | 152 | 154 |
| | 165 | 149 | 136 | 145 | 130 | 120 | 150 | 167 | 126 | 178 | 140 | 133 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 95 | 115 | 29 | 48 | 25 | 35 | 89 | 62 | 80 | 71 | 8 |
| group-wise | 94 | 82 | 16 | 46 | 93 | 104 | 36 | 92 | 111 | 57 | 116 |
| interleaver | 108 | 85 | 110 | 97 | 14 | 30 | 60 | 27 | 66 | 118 | 69 |
| input | 15 | 117 | 13 | 55 | 37 | 96 | 88 | 112 | 68 | 106 | 5 |

TABLE 13-continued

| | | | | | | | | | | |
|---|---|---|---|---|---|---|---|---|---|---|
| 156 | 3 | 90 | 2 | 10 | 75 | 21 | 98 | 26 | 9 | 128 |
| 132 | 6 | 169 | 158 | 0 | 43 | 51 | 67 | 168 | 143 | 131 |
| 157 | 127 | 124 | 129 | 142 | 135 | 172 | 151 | 153 | 122 | 166 |
| 121 | 174 | 141 | 148 | 179 | 159 | 163 | | | | |

In the case of Table 13, Equation 21 may be expressed as $Y_0=X_{\pi(0)}=X_{74}$, $Y_1=X_{\pi(1)}=X_{53}$, $Y_2=X_{\pi(2)}=X_{84}$, . . . , $Y_{178}=X_{\pi(178)}=X_{159}$, and $Y_{179}=X_{\pi(179)}=X_{163}$. Accordingly, the group interleaver 122 may rearrange the order of the plurality of bit groups in bit group wise by changing the $74^{th}$ bit group to the $0^{th}$ bit group, the $53^{rd}$ bit group to the $1^{st}$ bit group, the $84^{th}$ bit group to the $2^{nd}$ bit group, . . . , the $159^{th}$ bit group to the $178^{th}$ bit group, and the $163^{rd}$ bit group to the $179^{th}$ bit group.

In another example, when the length of the LDPC codeword is 64800, the code rate is 10/15, and the modulation method is 16-QAM, π(j) may be defined as in table 14 presented below. In particular, table 14 may be applied when LDPC encoding is performed based on the parity check matrix defined by table 7.

TABLE 14

| | Order of bit groups to be block interleaved π(j) (0 ≤ j < 180) | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 68 | 71 | 54 | 19 | 25 | 21 | 102 | 32 | 105 | 29 | 16 | 79 |
| group-wise | 57 | 28 | 76 | 31 | 26 | 96 | 65 | 119 | 114 | 109 | 9 | 125 |
| interleaver | 38 | 77 | 115 | 56 | 87 | 113 | 100 | 75 | 72 | 60 | 47 | 92 |
| input | 104 | 8 | 34 | 0 | 84 | 111 | 35 | 30 | 64 | 55 | 80 | 40 |
| | 50 | 33 | 7 | 175 | 51 | 131 | 106 | 134 | 88 | 140 | 117 | 132 |
| | 41 | 158 | 5 | 120 | 12 | 52 | 99 | 146 | 144 | 78 | 155 | 128 |
| | 11 | 27 | 160 | 178 | 133 | 142 | 121 | 168 | 173 | 123 | 13 | 15 |
| | 152 | 177 | 137 | 149 | 167 | 1 | 14 | 169 | 124 | 148 | 164 | 130 |

| | Order of bit groups to be block interleaved π(j) (0 ≤ j < 180) | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 53 | 82 | 107 | 91 | 67 | 94 | 85 | 48 | 83 | 58 | 42 |
| group-wise | 81 | 43 | 103 | 93 | 70 | 46 | 89 | 112 | 61 | 45 | 66 |
| interleaver | 36 | 98 | 4 | 59 | 6 | 44 | 20 | 86 | 3 | 73 | 95 |
| input | 97 | 101 | 2 | 69 | 63 | 74 | 62 | 118 | 110 | 159 | 18 |
| | 147 | 153 | 116 | 161 | 10 | 39 | 126 | 136 | 90 | 37 | 174 |
| | 165 | 141 | 179 | 150 | 157 | 171 | 143 | 108 | 170 | 22 | 49 |
| | 154 | 127 | 139 | 151 | 163 | 172 | 138 | 176 | 145 | 129 | 162 |
| | 17 | 156 | 122 | 23 | 166 | 135 | 24 | | | | |

In the case of Table 14, Equation 21 may be expressed as $Y_0=X_{\pi(0)}=X_{68}$, $Y_1=X_{\pi(1)}=X_{71}$, $Y_2=X_{\pi(2)}=X_{54}$, . . . , $Y_{178}=X_{\pi(178)}=X_{135}$, and $Y_{179}=X_{\pi(179)}=X_{24}$. Accordingly, the group interleaver 122 may rearrange the order of the plurality of bit groups in bit group wise by changing the $68^{th}$ bit group to the $0^{th}$ bit group, the $71^{st}$ bit group to the $1^{st}$ bit group, the $54^{th}$ bit group to the $2^{nd}$ bit group, . . . , the $135^{th}$ bit group to the $178^{th}$ bit group, and the $24^{th}$ bit group to the $179^{th}$ bit group.

In another example, when the length of the LDPC codeword is 64800, the code rate is 12/15, and the modulation method is 16-QAM, π(j) may be defined as in table 15 presented below. In particular, table 15 may be applied when LDPC encoding is performed based on the parity check matrix defined by table 8.

TABLE 15

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 120 | 32 | 38 | 113 | 71 | 31 | 65 | 109 | 36 | 106 | 134 | 66 |
| group-wise | 125 | 107 | 44 | 99 | 75 | 64 | 78 | 51 | 95 | 88 | 49 | 60 |
| interleaver | 67 | 92 | 98 | 42 | 77 | 28 | 121 | 87 | 18 | 21 | 93 | 72 |
| input | 85 | 104 | 124 | 52 | 20 | 118 | 34 | 5 | 94 | 41 | 68 | 80 |
| | 173 | 165 | 175 | 166 | 169 | 174 | 159 | 148 | 158 | 155 | 145 | 178 |
| | 163 | 152 | 146 | 177 | 103 | 160 | 147 | 76 | 172 | 144 | 150 | 132 |
| | 119 | 114 | 117 | 115 | 84 | 57 | 62 | 13 | 47 | 24 | 0 | 7 |
| | 102 | 15 | 55 | 23 | 25 | 11 | 56 | 45 | 58 | 128 | 43 | 135 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 29 | 86 | 136 | 108 | 83 | 70 | 79 | 81 | 105 | 48 | 30 |
| group-wise | 54 | 122 | 140 | 137 | 89 | 74 | 129 | 82 | 164 | 59 | 3 |
| interleaver | 2 | 142 | 112 | 9 | 50 | 8 | 90 | 139 | 14 | 97 | 63 |
| input | 110 | 12 | 133 | 131 | 53 | 116 | 123 | 96 | 61 | 111 | 33 |
| | 126 | 100 | 154 | 156 | 179 | 157 | 46 | 149 | 171 | 37 | 153 |
| | 176 | 168 | 167 | 162 | 170 | 138 | 151 | 161 | 40 | 26 | 130 |
| | 10 | 69 | 19 | 127 | 17 | 16 | 27 | 91 | 4 | 73 | 35 |
| | 1 | 143 | 141 | 6 | 22 | 101 | 39 | | | | |

In the case of Table 15, Equation 21 may be expressed as $Y_0=X_{\pi(0)}=X_{120}$, $Y_1=X_{\pi(1)}=X_{32}$, $Y_2=X_{\pi(2)}=X_{38}$, . . . , $Y_{178}=X_{\pi(178)}=X_{101}$, and $Y_{179}=X_{\pi(179)}=X_{39}$. Accordingly, the group interleaver 122 may rearrange the order of the plurality of bit groups in bit group wise by changing the $120^{th}$ bit group to the $0^{th}$ bit group, the $32^{nd}$ bit group to the $1^{st}$ bit group, the $38^{th}$ bit group to the $2^{nd}$ bit group, . . . , the $101^{st}$ bit group to the $178^{th}$ bit group, and the $39^{th}$ bit group to the $179^{th}$ bit group.

In another example, when the length of the LDPC codeword is 64800, the code rate is 6/15, and the modulation method is 16-QAM, π(j) may be defined as in table 16 presented below. In particular, table 16 may be applied when LDPC encoding is performed based on the parity check matrix defined by table 10.

TABLE 16

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 163 | 160 | 138 | 143 | 85 | 108 | 128 | 121 | 91 | 147 | 140 | 142 |
| group-wise | 81 | 168 | 157 | 167 | 90 | 103 | 80 | 150 | 125 | 105 | 129 | 146 |
| interleaver | 44 | 64 | 19 | 6 | 8 | 113 | 45 | 116 | 11 | 5 | 63 | 66 |
| input | 33 | 57 | 59 | 3 | 16 | 18 | 155 | 21 | 56 | 36 | 29 | 48 |
| | 145 | 1 | 38 | 2 | 28 | 112 | 31 | 60 | 179 | 13 | 30 | 50 |
| | 46 | 4 | 166 | 47 | 161 | 174 | 49 | 23 | 41 | 139 | 68 | 52 |
| | 117 | 159 | 93 | 100 | 82 | 151 | 171 | 67 | 94 | 136 | 72 | 73 |
| | 178 | 77 | 175 | 120 | 165 | 53 | 172 | 133 | 176 | 65 | 83 | 124 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |

TABLE 16-continued

| | | | | | | | | | | | |
|---|---|---|---|---|---|---|---|---|---|---|---|
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 131 | 79 | 109 | 126 | 111 | 162 | 144 | 75 | 110 | 118 | 97 |
| group-wise | 141 | 152 | 164 | 130 | 114 | 123 | 134 | 107 | 96 | 173 | 20 |
| interleaver | 84 | 39 | 10 | 69 | 88 | 135 | 25 | 55 | 54 | 58 | 61 |
| input | 62 | 154 | 43 | 51 | 34 | 0 | 27 | 12 | 24 | 17 | 42 |
| | 95 | 14 | 15 | 9 | 26 | 71 | 132 | 40 | 104 | 89 | 106 |
| | 99 | 149 | 115 | 101 | 127 | 22 | 158 | 7 | 169 | 153 | 122 |
| | 74 | 70 | 86 | 76 | 137 | 35 | 37 | 32 | 177 | 87 | 170 |
| | 92 | 78 | 119 | 102 | 156 | 148 | 98 | | | | |

In the case of Table 16, Equation 21 may be expressed as $Y_0=X_{\pi(0)}=X_{163}$, $Y_1=X_{\pi(1)}=X_{160}$, $Y_2=X_{\pi(2)}=X_{138}$, . . . , $Y_{178}=X_{\pi(178)}=X_{148}$, and $Y_{179}=X_{\pi(179)}=X_{98}$. Accordingly, the group interleaver 122 may rearrange the order of the plurality of bit groups in bit group wise by changing the $163^{rd}$ bit group to the $0^{th}$ bit group, the $160^{th}$ bit group to the $1^{st}$ bit group, the $138^{th}$ bit group to the $2^{nd}$ bit group, . . . , the $148^{th}$ bit group to the $178^{th}$ bit group, and the $98^{th}$ bit group to the $179^{th}$ bit group.

In another example, when the length of the LDPC codeword is 64800, the code rate is 6/15, and the modulation method is 64-QAM, π(j) may be defined as in table 17 presented below. In particular, table 17 may be applied when LDPC encoding is performed based on the parity check matrix defined by table 4.

TABLE 17

| | Order of bit groups to be block interleaved π(j) (0 ≤ j < 180) | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 29 | 17 | 38 | 37 | 27 | 43 | 31 | 35 | 16 | 46 | 44 | 9 |
| group-wise | 24 | 56 | 49 | 26 | 42 | 69 | 47 | 59 | 61 | 66 | 52 | 64 |
| interleaver | 160 | 7 | 13 | 55 | 62 | 53 | 63 | 58 | 3 | 167 | 71 | 57 |
| input | 113 | 48 | 88 | 2 | 129 | 137 | 20 | 73 | 166 | 75 | 77 | 142 |
| | 82 | 176 | 152 | 134 | 139 | 148 | 164 | 99 | 173 | 104 | 83 | 106 |
| | 110 | 118 | 127 | 84 | 79 | 108 | 126 | 131 | 93 | 111 | 91 | 4 |
| | 12 | 146 | 96 | 81 | 165 | 8 | 89 | 138 | 105 | 141 | 103 | 6 |
| | 87 | 33 | 130 | 124 | 175 | 120 | 90 | 102 | 10 | 114 | 159 | 76 |

| | Order of bit groups to be block interleaved π(j) (0 ≤ j < 180) | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 23 | 1 | 34 | 45 | 14 | 18 | 156 | 19 | 22 | 40 | 50 |
| group-wise | 65 | 67 | 54 | 170 | 68 | 132 | 51 | 70 | 41 | 21 | 5 |
| interleaver | 151 | 60 | 36 | 25 | 74 | 39 | 32 | 72 | 85 | 86 | 107 |
| input | 174 | 15 | 149 | 28 | 145 | 92 | 169 | 30 | 133 | 163 | 119 |
| | 112 | 135 | 153 | 0 | 128 | 144 | 98 | 171 | 94 | 97 | 143 |
| | 125 | 162 | 157 | 158 | 109 | 140 | 123 | 154 | 150 | 80 | 11 |
| | 100 | 161 | 172 | 78 | 101 | 115 | 179 | 147 | 116 | 136 | 122 |
| | 177 | 178 | 121 | 168 | 95 | 117 | 155 | | | | |

In the case of Table 17, Equation 21 may be expressed as $Y_0=X_{\pi(0)}=X_{29}$, $Y_1=X_{\pi(1)}=X_{17}$, $Y_2=X_{\pi(2)}=X_{38}$, . . . , $Y_{178}=X_{\pi(178)}=X_{117}$, and $Y_{179}=X_{\pi(179)}=X_{155}$. Accordingly, the group interleaver 122 may rearrange the order of the plurality of bit groups in bit group wise by changing the $29^{th}$ bit group to the $0^{th}$ bit group, the $17^{th}$ bit group to the $1^{st}$ bit group, the $38^{th}$ bit group to the $2^{nd}$ bit group, . . . , the $117^{th}$ bit group to the $178^{th}$ bit group, and the $155^{th}$ bit group to the $179^{th}$ bit group.

In another example, when the length of the LDPC codeword is 64800, the code rate is 8/15, and the modulation method is 64-QAM, π(j) may be defined as in table 18 presented below. In particular, table 18 may be applied when LDPC encoding is performed based on the parity check matrix defined by table 5.

TABLE 18

| Order of bit groups to be block interleaved π(j) (0 ≤ j < 180) | | | | | | | | | | | | |
|---|---|---|---|---|---|---|---|---|---|---|---|---|
| j-th block of group-wise interleaver output | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of group-wise interleaver input | 86 | 71 | 51 | 48 | 89 | 94 | 46 | 81 | 67 | 49 | 80 | 37 |
| | 42 | 91 | 62 | 50 | 90 | 40 | 78 | 53 | 58 | 47 | 85 | 70 |
| | 77 | 95 | 66 | 59 | 83 | 73 | 17 | 87 | 3 | 75 | 65 | 88 |
| | 9 | 121 | 108 | 139 | 142 | 24 | 34 | 20 | 157 | 159 | 138 | 143 |
| | 27 | 26 | 16 | 98 | 102 | 103 | 133 | 161 | 21 | 25 | 107 | 153 |
| | 68 | 134 | 41 | 74 | 179 | 2 | 129 | 169 | 101 | 99 | 109 | 127 |
| | 13 | 39 | 7 | 164 | 106 | 172 | 154 | 149 | 10 | 173 | 131 | 167 |
| | 104 | 124 | 177 | 97 | 130 | 118 | 137 | 111 | 126 | 120 | 105 | 115 |

| Order of bit groups to be block interleaved π(j) (0 ≤ j < 180) | | | | | | | | | | | |
|---|---|---|---|---|---|---|---|---|---|---|---|
| j-th block of group-wise interleaver output | 12 | 13 | 14 | 15 | 16 | 17 | 18 | 19 | 20 | 21 | 22 |
| | 35 | 36 | 37 | 38 | 39 | 40 | 41 | 42 | 43 | 44 | 45 |
| | 58 | 59 | 60 | 61 | 62 | 63 | 64 | 65 | 66 | 67 | 68 |
| | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of group-wise interleaver input | 55 | 61 | 36 | 57 | 52 | 92 | 60 | 82 | 76 | 72 | 44 |
| | 4 | 69 | 43 | 54 | 84 | 93 | 38 | 8 | 64 | 6 | 18 |
| | 79 | 14 | 151 | 117 | 32 | 22 | 123 | 30 | 33 | 162 | 144 |
| | 29 | 140 | 163 | 150 | 175 | 114 | 31 | 12 | 35 | 145 | 28 |
| | 45 | 156 | 23 | 125 | 141 | 56 | 166 | 5 | 1 | 170 | 119 |
| | 168 | 176 | 11 | 0 | 122 | 110 | 113 | 146 | 132 | 165 | 19 |
| | 63 | 147 | 155 | 100 | 171 | 158 | 160 | 15 | 178 | 148 | 152 |
| | 136 | 112 | 96 | 135 | 116 | 174 | 128 | | | | |

In the case of Table 18, Equation 21 may be expressed as $Y_0=X_{\pi(0)}=X_{86}$, $Y_1=X_{\pi(1)}=X_{71}$, $Y_2=X_{\pi(2)}=X_{51}$, . . . , $Y_{178}=X_{\pi(178)}=X_{174}$, and $Y_{179}=X_{\pi(179)}=X_{128}$. Accordingly, the group interleaver 122 may rearrange the order of the plurality of bit groups in bit group wise by changing the $86^{th}$ bit group to the $0^{th}$ bit group, the $71^{st}$ bit group to the $1^{st}$ bit group, the $51^{st}$ bit group to the $2^{nd}$ bit group, . . . , the 174th bit group to the $178^{th}$ bit group, and the $128^{th}$ bit group to the $179^{th}$ bit group.

In another example, when the length of the LDPC codeword is 64800, the code rate is 10/15, and the modulation method is 64-QAM, π(j) may be defined as in table 19 presented below. In particular, table 19 may be applied when LDPC encoding is performed based on the parity check matrix defined by table 6.

TABLE 19

| Order of bit groups to be block interleaved π(j) (0 ≤ j < 180) | | | | | | | | | | | | |
|---|---|---|---|---|---|---|---|---|---|---|---|---|
| j-th block of group-wise interleaver output | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of group-wise interleaver input | 73 | 36 | 21 | 53 | 37 | 78 | 102 | 119 | 82 | 75 | 40 | 77 |
| | 79 | 1 | 97 | 66 | 33 | 115 | 112 | 99 | 107 | 26 | 39 | 23 |
| | 28 | 88 | 52 | 69 | 74 | 113 | 84 | 109 | 65 | 101 | 8 | 111 |
| | 54 | 7 | 87 | 38 | 31 | 85 | 63 | 117 | 67 | 110 | 72 | 94 |
| | 156 | 24 | 12 | 42 | 56 | 4 | 170 | 172 | 5 | 16 | 34 | 152 |
| | 0 | 154 | 81 | 169 | 71 | 171 | 162 | 139 | 175 | 129 | 25 | 167 |
| | 3 | 15 | 143 | 173 | 176 | 22 | 161 | 153 | 2 | 19 | 151 | 150 |
| | 127 | 138 | 103 | 100 | 120 | 146 | 168 | 166 | 148 | 13 | 125 | 177 |

| Order of bit groups to be block interleaved π(j) (0 ≤ j < 180) | | | | | | | | | | | |
|---|---|---|---|---|---|---|---|---|---|---|---|
| j-th block of group-wise interleaver output | 12 | 13 | 14 | 15 | 16 | 17 | 18 | 19 | 20 | 21 | 22 |
| | 35 | 36 | 37 | 38 | 39 | 40 | 41 | 42 | 43 | 44 | 45 |
| | 58 | 59 | 60 | 61 | 62 | 63 | 64 | 65 | 66 | 67 | 68 |
| | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |

TABLE 19-continued

| | | | | | | | | | | | |
|---|---|---|---|---|---|---|---|---|---|---|---|
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 104 | 59 | 58 | 41 | 18 | 46 | 45 | 93 | 30 | 49 | 114 |
| group-wise | 70 | 89 | 116 | 62 | 55 | 50 | 96 | 108 | 57 | 51 | 86 |
| interleaver | 61 | 44 | 105 | 83 | 35 | 130 | 27 | 106 | 90 | 92 | 6 |
| input | 32 | 118 | 47 | 48 | 68 | 76 | 60 | 91 | 64 | 17 | 142 |
| | 29 | 11 | 20 | 136 | 158 | 134 | 43 | 98 | 141 | 160 | 95 |
| | 9 | 131 | 123 | 165 | 140 | 124 | 178 | 10 | 14 | 145 | 164 |
| | 174 | 144 | 157 | 163 | 122 | 147 | 132 | 137 | 128 | 159 | 155 |
| | 133 | 126 | 121 | 179 | 80 | 149 | 135 | | | | |

In the case of Table 19, Equation 21 may be expressed as $Y_0=X_{\pi(0)}=X_{73}$, $Y_1=X_{\pi(1)}=X_{36}$, $Y_2=X_{\pi(2)}=X_{21}$, . . . , $Y_{178}=X_{\pi(178)}=X_{149}$, and $Y_{179}=X_{\pi(179)}=X_{135}$. Accordingly, the group interleaver 122 may rearrange the order of the plurality of bit groups in bit group wise by changing the $73^{rd}$ bit group to the $0^{th}$ bit group, the $36^{th}$ bit group to the $1^{st}$ bit group, the $21^{st}$ bit group to the $2^{nd}$ bit group, . . . , the $149^{th}$ bit group to the $178^{th}$ bit group, and the $135^{th}$ bit group to the $179^{th}$ bit group.

In another example, when the length of the LDPC codeword is 64800, the code rate is 10/15, and the modulation method is 64-QAM, π(j) may be defined as in table 20 presented below. In particular, table 20 may be applied when LDPC encoding is performed ‘based on the parity check matrix defined by table 7.

TABLE 20

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 113 | 115 | 47 | 111 | 35 | 84 | 34 | 83 | 31 | 88 | 109 | 86 |
| group-wise | 43 | 66 | 55 | 56 | 49 | 72 | 118 | 78 | 27 | 39 | 97 | 40 |
| interleaver | 65 | 114 | 69 | 1 | 116 | 7 | 30 | 101 | 50 | 14 | 38 | 99 |
| input | 48 | 129 | 67 | 37 | 94 | 89 | 53 | 100 | 54 | 91 | 173 | 169 |
| | 19 | 24 | 0 | 36 | 22 | 58 | 62 | 33 | 64 | 42 | 28 | 8 |
| | 106 | 25 | 81 | 90 | 11 | 3 | 168 | 121 | 153 | 140 | 152 | 135 |
| | 2 | 161 | 120 | 133 | 155 | 123 | 158 | 167 | 154 | 148 | 137 | 160 |
| | 131 | 41 | 179 | 132 | 136 | 32 | 175 | 163 | 165 | 141 | 138 | 122 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 46 | 177 | 103 | 57 | 77 | 73 | 95 | 150 | 52 | 107 | 98 |
| group-wise | 6 | 75 | 79 | 68 | 93 | 59 | 119 | 20 | 10 | 51 | 108 |
| interleaver | 71 | 96 | 128 | 82 | 92 | 166 | 60 | 178 | 117 | 45 | 157 |
| input | 63 | 149 | 104 | 70 | 61 | 102 | 110 | 124 | 80 | 29 | 18 |
| | 26 | 112 | 85 | 74 | 13 | 21 | 105 | 44 | 5 | 87 | 76 |
| | 174 | 23 | 139 | 12 | 16 | 9 | 146 | 164 | 142 | 15 | 147 |
| | 145 | 159 | 4 | 17 | 126 | 143 | 151 | 162 | 156 | 172 | 171 |
| | 127 | 125 | 144 | 170 | 134 | 130 | 176 | | | | |

In the case of Table 20, Equation 21 may be expressed as $Y_0=X_{\pi(0)}=X_{113}$, $Y_1=X_{\pi(1)}=X_{115}$, $Y_2=X_{\pi(2)}=X_{47}$, . . . , $Y_{178}=X_{\pi(178)}=X_{130}$, and $Y_{179}=X_{\pi(179)}=X_{176}$. Accordingly, the group interleaver 122 may rearrange the order of the plurality of bit groups in bit group wise by changing the $113^{th}$ bit group to the $0^{th}$ bit group, the $115^{th}$ bit group to the $1^{st}$ bit group, the $47^{th}$ bit group to the $2^{nd}$ bit group, . . . , the $130^{th}$ bit group to the $178^{th}$ bit group, and the $176^{th}$ bit group to the $179^{th}$ bit group.

In another example, when the length of the LDPC codeword is 64800, the code rate is 12/15, and the modulation method is 64-QAM, π(j) may be defined as in table 21 presented below. In particular, table 21 may be applied when LDPC encoding is performed based on the parity check matrix defined by table 8.

TABLE 21

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 83 | 93 | 94 | 47 | 55 | 40 | 38 | 77 | 110 | 124 | 87 | 61 |
| group-wise | 37 | 10 | 95 | 139 | 131 | 44 | 57 | 97 | 53 | 142 | 0 | 136 |
| interleaver | 101 | 79 | 22 | 68 | 73 | 23 | 18 | 81 | 98 | 112 | 8 | 128 |
| input | 82 | 113 | 134 | 52 | 105 | 78 | 27 | 135 | 96 | 56 | 140 | 64 |
| | 29 | 133 | 106 | 117 | 127 | 32 | 42 | 58 | 71 | 118 | 51 | 84 |
| | 116 | 123 | 114 | 70 | 107 | 178 | 145 | 173 | 36 | 144 | 130 | 176 |
| | 165 | 161 | 151 | 119 | 122 | 152 | 157 | 4 | 137 | 148 | 153 | 170 |
| | 147 | 146 | 1 | 149 | 158 | 179 | 12 | 5 | 160 | 177 | 60 | 24 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 102 | 76 | 33 | 35 | 92 | 59 | 74 | 11 | 138 | 72 | 67 |
| group-wise | 9 | 143 | 86 | 100 | 21 | 15 | 75 | 62 | 19 | 65 | 129 |
| interleaver | 103 | 25 | 43 | 126 | 54 | 90 | 28 | 109 | 46 | 91 | 41 |
| input | 66 | 89 | 34 | 120 | 108 | 63 | 45 | 69 | 121 | 88 | 39 |
| | 85 | 80 | 104 | 132 | 111 | 30 | 26 | 48 | 50 | 31 | 141 |
| | 171 | 175 | 125 | 99 | 162 | 159 | 20 | 164 | 115 | 169 | 172 |
| | 154 | 166 | 13 | 150 | 16 | 167 | 174 | 163 | 49 | 6 | 168 |
| | 156 | 7 | 155 | 17 | 3 | 2 | 14 | | | | |

In the case of Table 21, Equation 21 may be expressed as $Y_0=X_{\pi(0)}=X_{83}$, $Y_1=X_{\pi(1)}=X_{93}$, $Y_2=X_{\pi(2)}=X_{94}$, . . . , $Y_{178}=X_{\pi(178)}=X_2$, and $Y_{179}=X_{\pi(179)}=X_{14}$. Accordingly, the group interleaver 122 may rearrange the order of the plurality of bit groups in bit group wise by changing the $83^{rd}$ bit group to the $0^{th}$ bit group, the $93^{rd}$ bit group to the $1^{st}$ bit group, the $94^{th}$ bit group to the $2^{nd}$ bit group, . . . , the $2^{nd}$ bit group to the $178^{th}$ bit group, and the $14^{th}$ bit group to the $179^{th}$ bit group.

In another example, when the length of the LDPC codeword is 64800, the code rate is 6/15, and the modulation method is 64-QAM, π(j) may be defined as in table 22 presented below. In particular, table 22 may be applied when LDPC encoding is performed based on the parity check matrix defined by table 10.

TABLE 22

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 175 | 177 | 173 | 125 | 89 | 37 | 165 | 85 | 82 | 34 | 17 | 162 |
| group-wise | 152 | 76 | 143 | 98 | 139 | 20 | 150 | 13 | 52 | 50 | 25 | 24 |
| interleaver | 46 | 164 | 155 | 81 | 102 | 53 | 11 | 21 | 47 | 61 | 7 | 126 |
| input | 178 | 121 | 118 | 96 | 80 | 99 | 68 | 167 | 90 | 62 | 147 | 36 |
| | 29 | 71 | 107 | 77 | 111 | 42 | 35 | 38 | 23 | 100 | 45 | 69 |
| | 108 | 94 | 79 | 12 | 19 | 106 | 60 | 39 | 104 | 28 | 2 | 73 |
| | 151 | 70 | 63 | 48 | 128 | 114 | 41 | 174 | 116 | 9 | 86 | 6 |
| | 110 | 32 | 160 | 135 | 132 | 134 | 14 | 146 | 74 | 120 | 158 | 138 |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |

TABLE 22-continued

| | | | | | | | | | | | |
|---|---|---|---|---|---|---|---|---|---|---|---|
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 92 | 161 | 88 | 137 | 149 | 115 | 113 | 172 | 123 | 43 | 4 |
| group-wise | 153 | 133 | 122 | 55 | 10 | 83 | 18 | 27 | 51 | 15 | 8 |
| interleaver | 1 | 57 | 26 | 148 | 56 | 171 | 22 | 166 | 101 | 67 | 119 |
| input | 140 | 103 | 5 | 87 | 157 | 176 | 59 | 66 | 3 | 64 | 91 |
| | 40 | 129 | 33 | 163 | 49 | 112 | 145 | 54 | 105 | 117 | 0 |
| | 97 | 75 | 154 | 84 | 58 | 144 | 95 | 136 | 16 | 170 | 44 |
| | 141 | 109 | 78 | 127 | 142 | 159 | 65 | 130 | 124 | 93 | 30 |
| | 179 | 169 | 156 | 131 | 168 | 31 | 72 | | | | |

In the case of Table 22, Equation 21 may be expressed as $Y_0=X_{\pi(0)}=X_{175}$, $Y_1=X_{\pi(1)}=X_{177}$, $Y_2-X_{\pi(2)}=X_{173}$, . . . , $Y_{178}=X_{\pi(178)}=X_{31}$, and $Y_{179}=X_{\pi(179)}=X_{72}$. Accordingly, the group interleaver 122 may rearrange the order of the plurality of bit groups in bit group wise by changing the $175^{th}$ bit group to the $0^{th}$ bit group, the $177^{th}$ bit group to the $1^{st}$ bit group, the $173^{rd}$ bit group to the $2^{nd}$ bit group, . . . , the 31st bit group to the $178^{th}$ bit group, and the $72^{nd}$ bit group to the $179^{th}$ bit group.

In the above-described examples, the length of the LDPC codeword is 64800 and the code rate is 6/15, 8/15, 10/15, and 12/15. However, this is merely an example and the interleaving pattern may be defined variously when the length of the LDPC codeword is 16200 or the code rate has different values.

As described above, the group interleaver 122 may rearrange the order of the plurality of bit groups in bit group wise by using Equation 21 and Tables 11 to 22.

"j-th block of Group-wise Interleaver output" in tables 11 to 22 indicates the j-th bit group output from the group interleaver 122 after interleaving, and "π(j)-th block of Group-wise Interleaver input" indicates the π(j)-th bit group input to the group interleaver 122.

In addition, since the order of the bit groups constituting the LDPC codeword is rearranged by the group interleaver 122 in bit group wise, and then the bit groups are block-interleaved by the block interleaver 124, which will be described below, "Order of bit groups to be block interleaved" is set forth in Tables 11 to 22 in relation to π(j).

Figure 25:
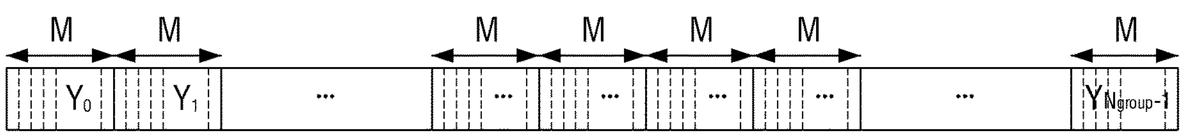

The LDPC codeword which is group-interleaved in the above-described method is illustrated in FIG. 25. Comparing the LDPC codeword of FIG. 25 and the LDPC codeword of FIG. 24 before group interleaving, it can be seen that the order of the plurality of bit groups constituting the LDPC codeword is rearranged.

That is, as shown in FIGS. 24 and 25, the groups of the LDPC codeword are arranged in order of bit group $X_0$, bit group $X_1$, . . . , bit group $X_{Ngroup-1}$ before being group-interleaved, and are arranged in an order of bit group $Y_0$, bit group $Y_1$, . . . , bit group $Y_{Ngroup-1}$ after being group-interleaved. In this case, the order of arranging the bit groups by the group interleaving may be determined based on Tables 11 to 22.

The group twist interleaver 123 interleaves bits in a same group. That is, the group twist interleaver 123 may rearrange the order of the bits in the same bit group by changing the order of the bits in the same bit group.

In this case, the group twist interleaver 123 may rearrange the order of the bits in the same bit group by cyclic-shifting a predetermined number of bits from among the bits in the same bit group.

Figure 26:
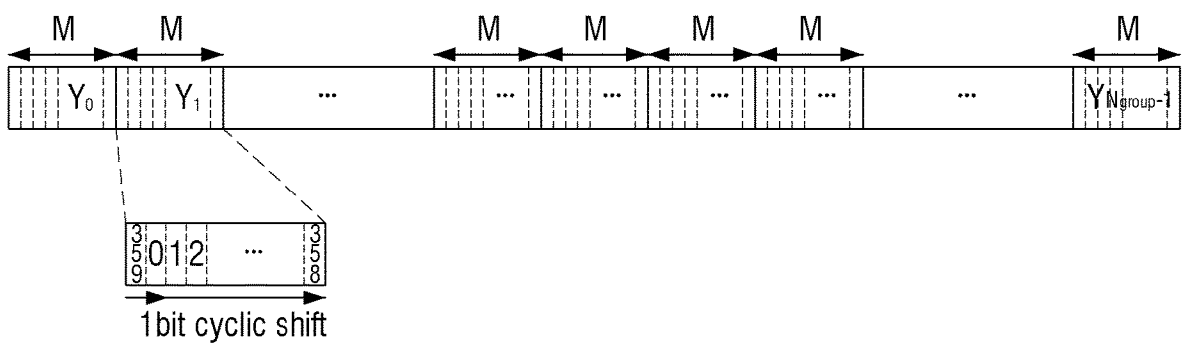

For example, as shown in FIG. 26, the group twist interleaver 123 may cyclic-shift bits included in the bit group $Y_1$ to the right by 1 bit. In this case, the bits located in the $0^{th}$ position, the $1^{st}$ position, the $2^{nd}$ position, . . . , the $358^{th}$ position, and the $359^{th}$ position in the bit group $Y_1$ as shown in FIG. 26 are cyclic-shifted to the right by 1 bit. As a result, the bit located in the $359^{th}$ position before being cyclic-shifted is located in the front of the bit group $Y_1$ and the bits located in the $0^{th}$ position, the $i^{st}$ position, the $2^{nd}$ position, . . . , the $358^{th}$ position before being cyclic-shifted are shifted to the right serially by 1 bit and located.

In addition, the group twist interleaver 123 may rearrange the order of bits in each bit group by cyclic-shifting a different number of bits in each bit group.

For example, the group twist interleaver 123 may cyclic-shift the bits included in the bit group $Y_1$ to the right by 1 bit, and may cyclic-shift the bits included in the bit group $Y_2$ to the right by 3 bits.

However, the above-described group twist interleaver 123 may be omitted according to circumstances.

In addition, the group twist interleaver 123 is placed after the group interleaver 122 in the above-described example. However, this is merely an example. That is, the group twist interleaver 123 changes only the order of bits in a certain bit group and does not change the order of the bit groups. Therefore, the group twist interleaver 123 may be placed before the group interleaver 122.

The block interleaver 124 interleaves the plurality of bit groups the order of which has been rearranged. Specifically, the block interleaver 124 may interleave the plurality of bit groups the order of which has been rearranged by the group interleaver 122 in bit group wise (or bits group unit). The block interleaver 124 is formed of a plurality of columns each including a plurality of rows and may interleave by dividing the plurality of rearranged bit groups based on a modulation order determined according to a modulation method.

In this case, the block interleaver 124 may interleave the plurality of bit groups the order of which has been rearranged by the group interleaver 122 in bit group wise. Specifically, the block interleaver 124 may interleave by dividing the plurality of rearranged bit groups according to a modulation order by using a first part and a second part.

Specifically, the block interleaver 124 interleaves by dividing each of the plurality of columns into a first part and a second part, writing the plurality of bit groups in the plurality of columns of the first part serially in bit group wise, dividing the bits of the other bit groups into groups (or sub bit groups) each including a predetermined number of bits based on the number of columns, and writing the sub bit groups in the plurality of columns of the second part serially.

Herein, the number of bit groups which are interleaved in bit group wise may be determined by at least one of the number of rows and columns constituting the block interleaver 124, the number of bit groups and the number of bits included in each bit group. In other words, the block interleaver 124 may determine the bit groups which are to be interleaved in bit group wise considering at least one of the number of rows and columns constituting the block interleaver 124, the number of bit groups and the number of bits included in each bit group, interleave the corresponding bit groups in bit group wise, and divide bits of the other bit groups into sub bit groups and interleave the sub bit groups. For example, the block interleaver 124 may interleave at least part of the plurality of bit groups in bit group wise using the first part, and divide bits of the other bit groups into sub bit groups and interleave the sub bit groups using the second part.

Meanwhile, interleaving bit groups in bit group wise means that the bits included in the same bit group are written in the same column. In other words, the block interleaver 124, in case of bit groups which are interleaved in bit group wise, may not divide the bits included in the same bit groups and write the bits in the same column, and in case of bit groups which are not interleaved in bit group wise, may divide the bits in the bit groups and write the bits in different columns.

Accordingly, the number of rows constituting the first part is a multiple of the number of bits included in one bit group (for example, 360), and the number of rows constituting the second part may be less than the number of bits included in one bit group.

In addition, in all bit groups interleaved by the first part, the bits included in the same bit group are written and interleaved in the same column of the first part, and in at least one group interleaved by the second part, the bits are divided and written in at least two columns of the second part.

The specific interleaving method will be described later.

Meanwhile, the group twist interleaver 123 changes only the order of bits in the bit group and does not change the order of bit groups by interleaving. Accordingly, the order of the bit groups to be block-interleaved by the block interleaver 124, that is, the order of the bit groups to be input to the block interleaver 124, may be determined by the group interleaver 122. Specifically, the order of the bit groups to be block-interleaved by the block interleaver 124 may be determined by $\pi(j)$ defined in Tables 11 to 22.

As described above, the block interleaver 124 may interleave the plurality of bit groups the order of which has been rearranged in bit group wise by using the plurality of columns each including the plurality of rows.

In this case, the block interleaver 124 may interleave the LDPC codeword by dividing the plurality of columns into at least two parts. For example, the block interleaver 124 may divide each of the plurality of columns into the first part and the second part and interleave the plurality of bit groups constituting the LDPC codeword.

In this case, the block interleaver 124 may divide each of the plurality of columns into N number of parts (N is an integer greater than or equal to 2) according to whether the number of bit groups constituting the LDPC codeword is an integer multiple of the number of columns constituting the block interleaver 124, and may perform interleaving.

When the number of bit groups constituting the LDPC codeword is an integer multiple of the number of columns constituting the block interleaver 124, the block interleaver 124 may interleave the plurality of bit groups constituting the LDPC codeword in bit group wise without dividing each of the plurality of columns into parts.

Specifically, the block interleaver 124 may interleave by writing the plurality of bit groups of the LDPC codeword on each of the columns in bit group wise in a column direction, and reading each row of the plurality of columns in which the plurality of bit groups are written in bit group wise in a row direction.

In this case, the block interleaver 124 may interleave by writing bits included in a predetermined number of bit groups, which corresponds to a quotient obtained by dividing the number of bit groups of the LDPC codeword by the number of columns of the block interleaver 124, on each of the plurality of columns serially in a column direction, and reading each row of the plurality of columns in which the bits are written in a row direction.

Hereinafter, the group located in the $j^{th}$ position after being interleaved by the group interleaver 122 will be referred to as group $Y_j$.

For example, it is assumed that the block interleaver 124 is formed of C number of columns each including $R_1$ number of rows. In addition, it is assumed that the LDPC codeword is formed of $N_{group}$ number of bit groups and the number of bit groups $N_{group}$ is a multiple of C.

In this case, when the quotient obtained by dividing $N_{group}$ number of bit groups constituting the LDPC codeword by C number of columns constituting the block interleaver 124 is A ($=N_{group}/C$) (A is an integer greater than 0), the block interleaver 124 may interleave by writing A ($=N_{group}/C$) number of bit groups on each column serially in a column direction and reading bits written on each column in a row direction.

Figure 27:
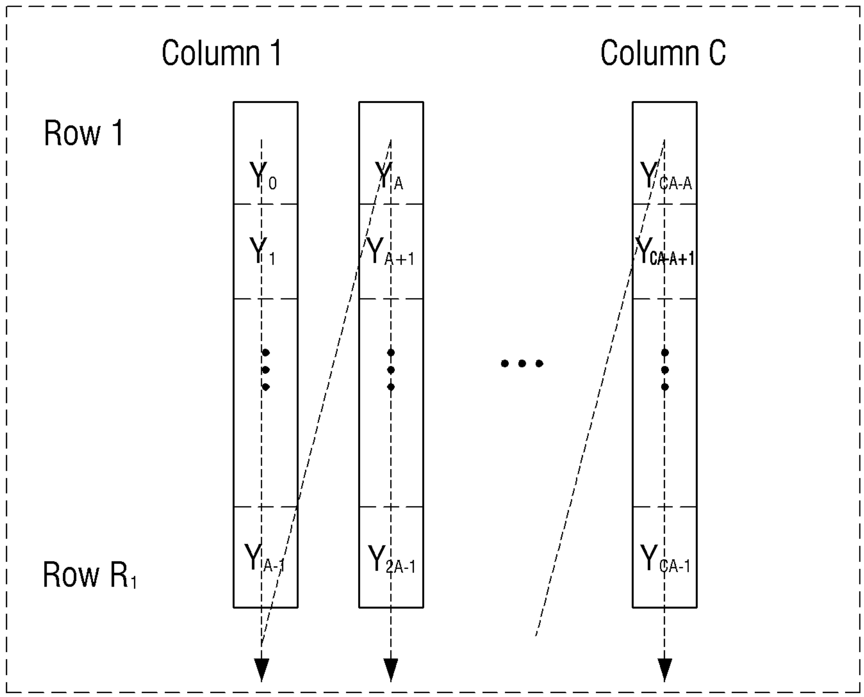
FIGS. 27 to 32 are views to illustrate an interleaving method of a block interleaver, according to exemplary embodiments.
Figure 27:
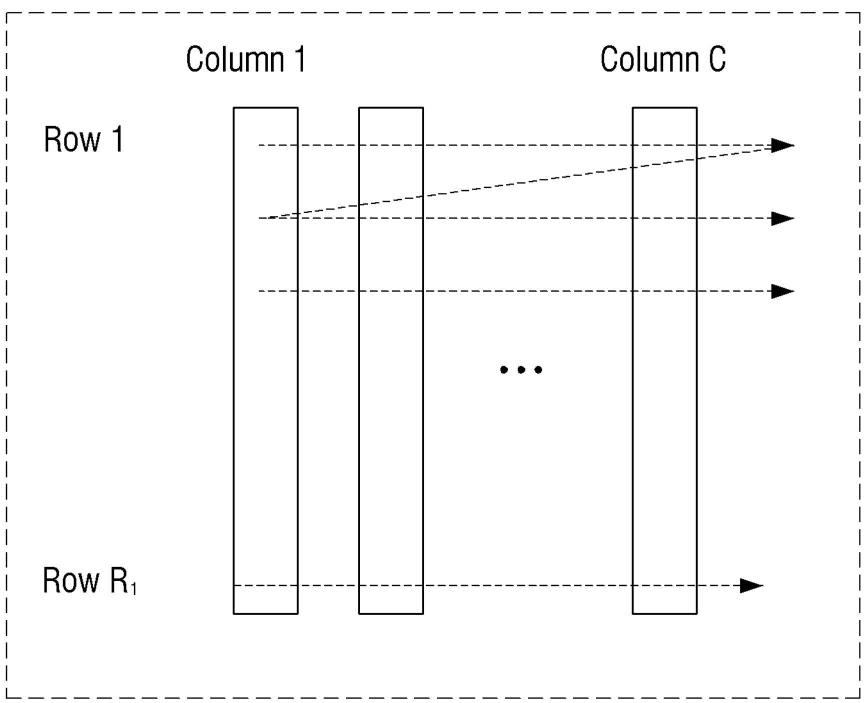

For example, as shown in FIG. 27, the block interleaver 124 writes bits included in bit group $Y_0$, bit group $Y_1$, . . . , bit group $Y_{A-1}$ in the $i^{st}$ column from the $i^{st}$ row to the $R_1^{th}$ row, writes bits included in bit group $Y_A$, bit group $Y_{A+1}$, . . . , bit group $Y_{2A-1}$ in the 2nd column from the $i^{st}$ row to the $R_1^{th}$ row, . . . , and writes bits included in bit group $Y_{CA-A}$, bit group $Y_{CA-A+1}$, . . . , bit group $Y_{CA-1}$ in the column C from the $1^{st}$ row to the $R_1^{th}$ row. The block interleaver 124 may read the bits written in each row of the plurality of columns in a row direction.

Accordingly, the block interleaver 124 interleaves all bit groups constituting the LDPC codeword in bit group wise.

However, when the number of bit groups of the LDPC codeword is not an integer multiple of the number of columns of the block interleaver 124, the block interleaver 124 may divide each column into 2 parts and interleave a part of the plurality of bit groups of the LDPC codeword in bit group wise, and divide bits of the other bit groups into sub bit groups and interleave the sub bit groups. In this case, the bits included in the other bit groups, that is, the bits included in the number of groups which correspond to the remainder when the number of bit groups constituting the LDPC codeword is divided by the number of columns are not interleaved in bit group wise, but interleaved by being divided according to the number of columns.

Specifically, the block interleaver 124 may interleave the LDPC codeword by dividing each of the plurality of columns into two parts.

In this case, the block interleaver 124 may divide the plurality of columns into the first part and the second part based on at least one of the number of columns of the block interleaver 124, the number of bit groups of the LDPC codeword, and the number of bits of bit groups.

Here, each of the plurality of bit groups may be formed of 360 bits. In addition, the number of bit groups of the LDPC codeword is determined based on the length of the LDPC codeword and the number of bits included in the bit group. For example, when an LDPC codeword in the length of 16200 is divided such that each bit group has 360 bits, the LDPC codeword is divided into 45 bit groups. Alternatively, when an LDPC codeword in the length of 64800 is divided such that each bit group has 360 bits, the LDPC codeword may be divided into 180 bit groups. Further, the number of columns constituting the block interleaver 124 may be determined according to a modulation method. This will be explained in detail below.

Accordingly, the number of rows constituting each of the first part and the second part may be determined based on the number of columns constituting the block interleaver 124, the number of bit groups constituting the LDPC codeword, and the number of bits constituting each of the plurality of bit groups.

Specifically, in each of the plurality of columns, the first part may be formed of as many rows as the number of bits included in at least one bit group which can be written in each column in bit group wise from among the plurality of bit groups of the LDPC codeword, according to the number of columns constituting the block interleaver 124, the number of bit groups constituting the LDPC codeword, and the number of bits constituting each bit group.

In each of the plurality of columns, the second part may be formed of rows excluding as many rows as the number of bits included in at least some bit groups which can be written in each of the plurality of columns in bit group wise. Specifically, the number rows of the second part may be the same value as a quotient when the number of bits included in all bit groups excluding bit groups corresponding to the first part is divided by the number of columns constituting the block interleaver 124. In other words, the number of rows of the second part may be the same value as a quotient when the number of bits included in the remaining bit groups which are not written in the first part from among bit groups constituting the LDPC codeword is divided by the number of columns.

That is, the block interleaver 124 may divide each of the plurality of columns into the first part including as many rows as the number of bits included in bit groups which can be written in each column in bit group wise, and the second part including the other rows.

Accordingly, the first part may be formed of as many rows as the number of bits included in bit groups, that is, as many rows as an integer multiple of M. However, since the number of codeword bits constituting each bit group may be an aliquot part of M as described above, the first part may be formed of as many rows as an integer multiple of the number of bits constituting each bit group.

In this case, the block interleaver 124 may interleave by writing and reading the LDPC codeword in the first part and the second part in the same method.

Specifically, the block interleaver 124 may interleave by writing the LDPC codeword in the plurality of columns constituting each of the first part and the second part in a column direction, and reading the plurality of columns constituting the first part and the second part in which the LDPC codeword is written in a row direction.

That is, the block interleaver 124 may interleave by writing the bits included in at least some bit groups which can be written in each of the plurality of columns in bit group wise in each of the plurality of columns of the first part serially, dividing the bits included in the other bit groups except the at least some bit groups and writing in each of the plurality of columns of the second part in a column direction, and reading the bits written in each of the plurality of columns constituting each of the first part and the second part in a row direction.

In this case, the block interleaver 124 may interleave by dividing the other bit groups except the at least some bit groups from among the plurality of bit groups based on the number of columns constituting the block interleaver 124.

Specifically, the block interleaver 124 may interleave by dividing the bits included in the other bit groups by the number of a plurality of columns, writing each of the divided bits in each of a plurality of columns constituting the second part in a column direction, and reading the plurality of columns constituting the second part, where the divided bits are written, in a row direction.

That is, the block interleaver 124 may divide the bits included in the other bit groups except the bit groups written in the first part from among the plurality of bit groups of the LDPC codeword, that is, the bits in the number of bit groups which correspond to the remainder when the number of bit groups constituting the LDPC codeword is divided by the number of columns, by the number of columns, and may write the divided bits in each column of the second part serially in a column direction.

For example, it is assumed that the block interleaver 124 is formed of C number of columns each including $R_1$ number of rows. In addition, it is assumed that the LDPC codeword is formed of $N_{group}$ number of bit groups, the number of bit groups $N_{group}$ is not a multiple of C, and $A\times C+1=N_{group}$ (A is an integer greater than 0). In other words, it is assumed that when the number of bit groups constituting the LDPC codeword is divided by the number of columns, the quotient is A and the remainder is 1.

Figure 28:
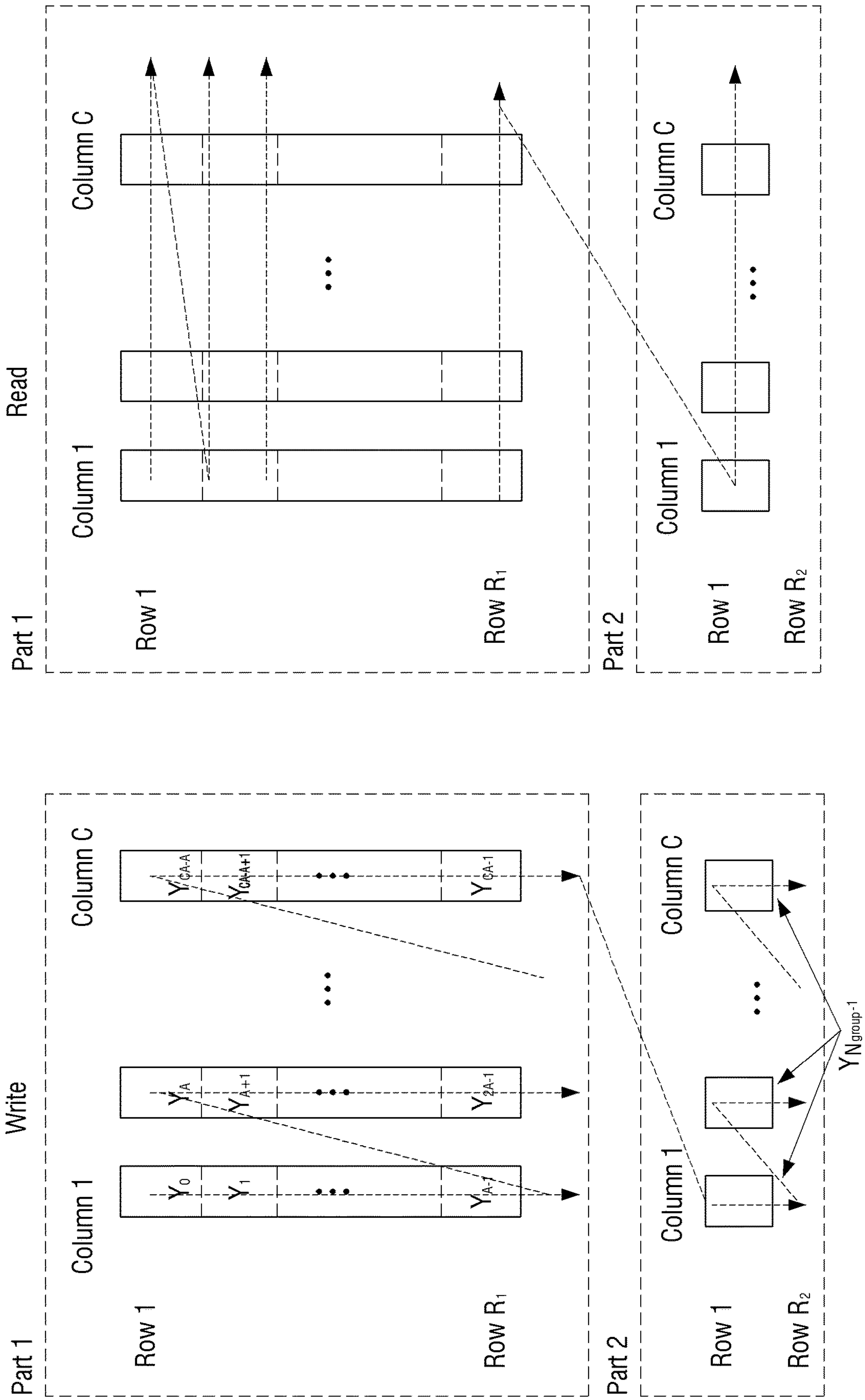
Figure 29:
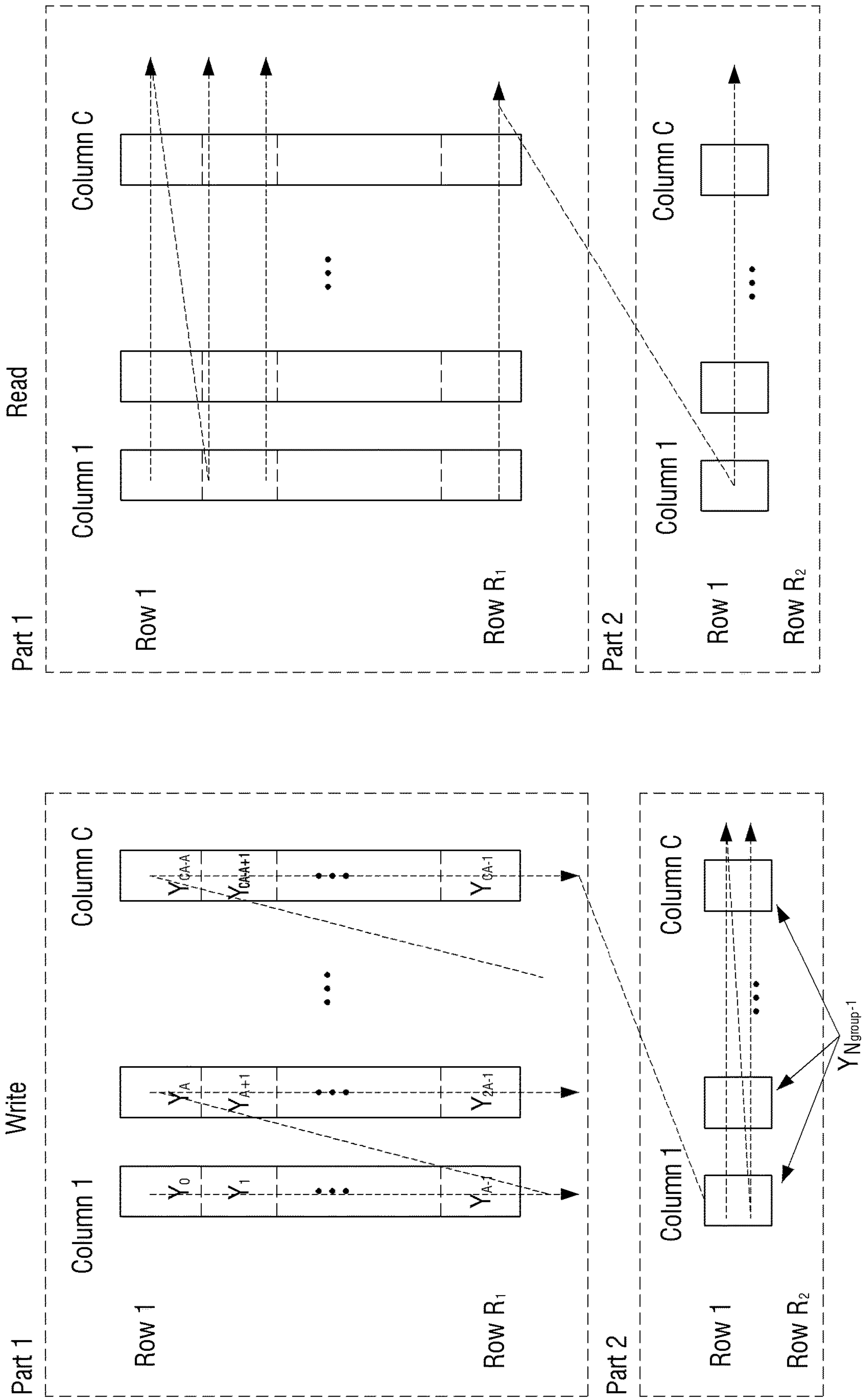

In this case, as shown in FIGS. 28 and 29, the block interleaver 124 may divide each column into a first part including $R_1$ number of rows and a second part including $R_2$ number of rows. In this case, $R_1$ may correspond to the number of bits included in bit groups which can be written in each column in bit group wise, and $R_2$ may be $R_1$ subtracted from the number of rows of each column.

That is, in the above-described example, the number of bit groups which can be written in each column in bit group wise is A, and the first part of each column may be formed of as many rows as the number of bits included in A number of bit groups, that is, may be formed of as many rows as A×M number.

In this case, the block interleaver 124 writes the bits included in the bit groups which can be written in each column in bit group wise, that is, A number of bit groups, in the first part of each column in the column direction.

That is, as shown in FIGS. 28 and 29, the block interleaver 124 writes the bits included in each of bit group $Y_0$, bit group $Y_1$, . . . , group $Y_{A-1}$ in the $1^{st}$ to $R_1^{th}$ rows of the first part of the $1^{st}$ column, writes bits included in each of bit group $Y_A$, bit group $Y_{A+1}$, . . . , bit group $Y_{2A-1}$ in the $1^{st}$ to $R_1^{th}$ rows of the first part of the $2^{nd}$ column, . . . , writes bits included in each of bit group $Y_{CA-A}$, bit group $Y_{CA-A+1}$, . . . , bit group $Y_{CA-1}$ in the $1^{st}$ to $R_1^{th}$ rows of the first part of the column C.

As described above, the block interleaver 124 writes the bits included in the bit groups which can be written in each column in bit group wise in the first part of each column.

In other words, in the above exemplary embodiment, the bits included in each of bit group ($Y_0$), bit group ($Y_1$), . . . , bit group ($Y_{A-1}$) may not be divided and all of the bits may be written in the first column, the bits included in each of bit group ($Y_A$), bit group ($Y_{A+1}$), . . . , bit group ($Y_{2A-1}$) may not be divided and all of the bits may be written in the second column, and the bits included in each of bit group ($Y_{CA-A}$), bit group ($Y_{CA-A+1}$), . . . , group ($Y_{CA-1}$) may not be divided and all of the bits may be written in the C column. As such, all bit groups interleaved by the first part are written in the same column of the first part.

Thereafter, the block interleaver 124 divides bits included in the other bit groups except the bit groups written in the first part of each column from among the plurality of bit groups, and writes the bits in the second part of each column in the column direction. In this case, the block interleaver 124 divides the bits included in the other bit groups except the bit groups written in the first part of each column by the number of columns, so that the same number of bits are written in the second part of each column, and writes the divided bits in the second part of each column in the column direction.

In the above-described example, since $A \times C+1=N_{group}$, when the bit groups constituting the LDPC codeword are written in the first part serially, the last bit group $Y_{Ngroup-1}$ of the LDPC codeword is not written in the first part and remains. Accordingly, the block interleaver 124 divides the bits included in the bit group $Y_{Ngroup-1}$ into C number of sub bit groups as shown in FIG. 28, and writes the divided bits (that is, the bits corresponding to the quotient when the bits included in the last group ($Y_{Ngroup-1}$) are divided by C) in the second part of each column serially.

The bits divided based on the number of columns may be referred to as sub bit groups. In this case, each of the sub bit groups may be written in each column of the second part. That is, the bits included in the bit groups may be divided and may form the sub bit groups.

That is, the block interleaver 124 writes the bits in the $1^{st}$ to $R_2^{th}$ rows of the second part of the $1^{st}$ column, writes the bits in the $1^{st}$ to $R_2^{th}$ rows of the second part of the $2^{nd}$ column, . . . , and writes the bits in the $1^{st}$ to $R_2^{th}$ rows of the second part of the column C. In this case, the block interleaver 124 may write the bits in the second part of each column in the column direction as shown in FIG. 28.

That is, in the second part, the bits constituting the bit group may not be written in the same column and may be written in the plurality of columns. In other words, in the above example, the last bit group ($Y_{Ngroup-1}$) is formed of M number of bits and thus, the bits included in the last bit group ($Y_{Ngroup-1}$) may be divided by M/C and written in each column. That is, the bits included in the last bit group ($Y_{Ngroup-1}$) are divided by M/C, forming M/C number of sub bit groups, and each of the sub bit groups may be written in each column of the second part.

Accordingly, in at least one bit group which is interleaved by the second part, the bits included in the at least one bit group are divided and written in at least two columns constituting the second part.

In the above-described example, the block interleaver 124 writes the bits in the second part in the column direction. However, this is merely an example. That is, the block interleaver 124 may write the bits in the plurality of columns of the second part in the row direction. In this case, the block interleaver 124 may write the bits in the first part in the same method as described above.

Specifically, referring to FIG. 29, the block interleaver 124 writes the bits from the $1^{st}$ row of the second part in the $1^{st}$ column to the $1^{st}$ row of the second part in the column C, writes the bits from the $2^{nd}$ row of the second part in the $1^{st}$ column to the $2^{nd}$ row of the second part in the column C, . . . , etc., and writes the bits from the $R_2^{th}$ row of the second part in the $i^{st}$ column to the $R_2^{th}$ row of the second part in the column C.

On the other hand, the block interleaver 124 reads the bits written in each row of each part serially in the row direction. That is, as shown in FIGS. 28 and 29, the block interleaver 124 reads the bits written in each row of the first part of the plurality of columns serially in the row direction, and reads the bits written in each row of the second part of the plurality of columns serially in the row direction.

Accordingly, the block interleaver 124 may interleave a part of the plurality of bit groups constituting the LDPC codeword in bit group wise, and divide and interleave some of the remaining bit groups. That is, the block interleaver 124 may interleave by writing the LDPC codeword constituting a predetermined number of bit groups from among the plurality of bit groups in the plurality of columns of the first part in bit group wise, dividing the bits of the other bit groups and writing the bits in each of the columns of the second part, and reading the plurality of columns of the first and second parts in the row direction.

As described above, the block interleaver 124 may interleave the plurality of bit groups in the methods described above with reference to FIGS. 27 to 29.

In particular, in the case of FIG. 28, the bits included in the bit group which does not belong to the first part are written in the second part in the column direction and read in the row direction. In view of this, the order of the bits included in the bit group which does not belong to the first part is rearranged. Since the bits included in the bit group which does not belong to the first part are interleaved as described above, bit error rate (BER)/frame error rate (FER) performance can be improved in comparison with a case in which such bits are not interleaved.

However, the bit group which does not belong to the first part may not be interleaved as shown in FIG. 29. That is, since the block interleaver 124 writes and reads the bits included in the group which does not belong to the first part in and from the second part in the row direction, the order of the bits included in the group which does not belong to the first part is not changed and the bits are output to the modulator 130 serially. In this case, the bits included in the group which does not belong to the first part may be output serially and mapped onto a modulation symbol.

In FIGS. 28 and 29, the last single bit group of the plurality of bit groups is written in the second part. However, this is merely an example. The number of bit groups written in the second part may vary according to the total number of bit groups of the LDPC codeword, the number of columns and rows, the number of transmission antennas, etc.

The block interleaver 124 may have a configuration as shown in tables 23 and 24 presented below:

TABLE 23

| | $N_{ldpc}$ = 64800 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 32400 | 16200 | 10800 | 7920 | 6480 | 5400 |
| $R_2$ | 0 | 0 | 0 | 180 | 0 | 0 |

TABLE 24

| | $N_{ldpc}$ = 16200 | | | | | |
|---|---|---|---|---|---|---|
| | QPSK | 16 QAM | 64 QAM | 256 QAM | 1024 QAM | 4096 QAM |
| C | 2 | 4 | 6 | 8 | 10 | 12 |
| $R_1$ | 7920 | 3960 | 2520 | 1800 | 1440 | 1080 |
| $R_2$ | 180 | 90 | 180 | 225 | 180 | 270 |

Herein, C (or $N_C$) is the number of columns of the block interleaver 124, $R_1$ is the number of rows constituting the first part in each column, and $R_2$ is the number of rows constituting the second part in each column.

Referring to Tables 23 and 24, the number of columns has the same value as a modulation order according to a modulation method, and each of a plurality of columns is formed of rows corresponding to the number of bits constituting the LDPC codeword divided by the number of a plurality of columns.

For example, when the length $N_{ldpc}$ of the LDPC codeword is 64800 and the modulation method is 16-QAM, the block interleaver 124 is formed of 4 columns as the modulation order is 4 in the case of 16-QAM, and each column is formed of rows as many as $R_1+R_2$=16200(=64800/4). In another example, when the length $N_{ldpc}$ of the LDPC codeword is 64800 and the modulation method is 64-QAM, the block interleaver 124 is formed of 6 columns as the modulation order is 6 in the case of 64-QAM, and each column is formed of rows as many as $R_1+R_2$=10800(=64800/6).

Meanwhile, referring to Tables 23 and 24, when the number of bit groups constituting an LDPC codeword is an integer multiple of the number of columns, the block interleaver 124 interleaves without dividing each column. Therefore, $R_1$ corresponds to the number of rows constituting each column, and $R_2$ is 0. In addition, when the number of bit groups constituting an LDPC codeword is not an integer multiple of the number of columns, the block interleaver 124 interleaves the groups by dividing each column into the first part formed of $R_1$ number of rows, and the second part formed of $R_2$ number of rows.

When the number of columns of the block interleaver 124 is equal to the number of bits constituting a modulation symbol, bits included in a same bit group are mapped onto a single bit of each modulation symbol as shown in Tables 23 and 24.

For example, when $N_{ldpc}$=64800 and the modulation method is 16-QAM, the block interleaver 124 may be formed of four (4) columns each including 16200 rows. In this case, the bits included in each of the plurality of bit groups are written in the four (4) columns and the bits written in the same row in each column are output serially. In this case, since four (4) bits constitute a single modulation symbol in the modulation method of 16-QAM, bits included in the same bit group, that is, bits output from a single column, may be mapped onto a single bit of each modulation symbol. For example, bits included in a bit group written in the $1^{st}$ column may be mapped onto the first bit of each modulation symbol.

In another example, when $N_{ldpc}$=64800 and the modulation method is 64-QAM, the block interleaver 124 may be formed of six (6) columns each including 10800 rows. In this case, the bits included in each of the plurality of bit groups are written in the six (6) columns and the bits written in the same row in each column are output serially. In this case, since six (6) bits constitute a single modulation symbol in the modulation method of 64-QAM, bits included in the same bit group, that is, bits output from a single column, may be mapped onto a single bit of each modulation symbol. For example, bits included in a bit group written in the $1^{st}$ column may be mapped onto the first bit of each modulation symbol.

Referring to Tables 23 and 24, the total number of rows of the block interleaver 124, that is, $R_1+R_2$, is $N_{ldpc}/C$.

In addition, the number of rows of the first part, $R_1$, is an integer multiple of the number of bits included in each group, M (e.g., M=360), and maybe expressed as $\lfloor N_{group}/C\rfloor\times M$, and the number of rows of the second part, $R_2$, may be $N_{ldpc}/C-R_1$. Herein, $\lfloor N_{group}/C\rfloor$ is the largest integer below $N_{group}/C$. Since $R_1$ is an integer multiple of the number of bits included in each group, M, bits may be written in $R_1$ in bit groups wise.

In addition, when the number of bit groups of the LDPC codeword is not a multiple of the number of columns, it can be seen from Tables 23 and 24 that the block interleaver 124 interleaves by dividing each column into two parts.

Specifically, the length of the LDPC codeword divided by the number of columns is the total number of rows included in the each column. In this case, when the number of bit groups of the LDPC codeword is a multiple of the number of columns, each column is not divided into two parts. However, when the number of bit groups of the LDPC codeword is not a multiple of the number of columns, each column is divided into two parts.

For example, it is assumed that the number of columns of the block interleaver 124 is identical to the number of bits constituting a modulation symbol, and an LDPC codeword is formed of 64800 bits as shown in Table 28. In this case, each bit group of the LDPC codeword is formed of 360 bits, and the LDPC codeword is formed of 64800/360(=180) bit groups.

When the modulation method is 16-QAM, the block interleaver 124 may be formed of four (4) columns and each column may have 64800/4(=16200) rows.

In this case, since the number of bit groups of the LDPC codeword divided by the number of columns is 180/4(=45), bits can be written in each column in bit group wise without dividing each column into two parts. That is, bits included in 45 bit groups which is the quotient when the number of bit groups constituting the LDPC codeword is divided by the number of columns, that is, 45×360(=16200) bits can be written in each column.

However, when the modulation method is 256-QAM, the block interleaver 124 may be formed of eight (8) columns and each column may have 64800/8(=8100) rows.

In this case, since the number of bit groups of the LDPC codeword divided by the number of columns is 180/8=22.5, the number of bit groups constituting the LDPC codeword is not an integer multiple of the number of columns. Accordingly, the block interleaver 124 divides each of the eight (8) columns into two parts to perform interleaving in bit group wise.

In this case, since the bits should be written in the first part of each column in bit group wise, the number of bit groups which can be written in the first part of each column in bit group wise is 22, which is the quotient when the number of bit groups constituting the LDPC codeword is divided by the number of columns, and accordingly, the first part of each column has 22×360(=7920) rows. Accordingly, 7920 bits included in 22 bit groups may be written in the first part of each column.

The second part of each column has rows which are the rows of the first part subtracted from the total rows of each column. Accordingly, the second part of each column includes 8100-7920(=180) rows.

In this case, the bits included in the other bit groups which have not been written in the first part are divided and written in the second part of each column.

Specifically, since 22×8(=176) bit groups are written in the first part, the number of bit groups to be written in the second part is 180−176 (=4) (for example, bit group $Y_{176}$, bit group $Y_{177}$, bit group $Y_{178}$, and bit group $Y_{179}$ from among bit group $Y_0$, bit group $Y_1$, bit group $Y_2$, . . . , bit group $Y_{178}$, and bit group $Y_{179}$ constituting the LDPC codeword).

Accordingly, the block interleaver 124 may write the four (4) bit groups which have not been written in the first part and remains from among the groups constituting the LDPC codeword in the second part of each column serially.

That is, the block interleaver 124 may write 180 bits of the 360 bits included in the bit group $Y_{176}$ in the $1^{st}$ row to the $180^{th}$ row of the second part of the $1^{st}$ column in the column direction, and may write the other 180 bits in the $1^{st}$ row to the $180^{th}$ row of the second part of the $2^{nd}$ column in the column direction. In addition, the block interleaver 124 may write 180 bits of the 360 bits included in the bit group $Y_{177}$ in the $1^{st}$ row to the $180^{th}$ row of the second part of the $3^{rd}$ column in the column direction, and may write the other 180 bits in the $1^{st}$ row to the $180^{th}$ row of the second part of the $4^{th}$ column in the column direction. In addition, the block interleaver 124 may write 180 bits of the 360 bits included in the bit group $Y_{178}$ in the $1^{st}$ row to the $180^{th}$ row of the second part of the $5^{th}$ column in the column direction, and may write the other 180 bits in the $1^{st}$ row to the $180^{th}$ row of the second part of the $6^{th}$ column in the column direction. In addition, the block interleaver 124 may write 180 bits of the 360 bits included in the bit group $Y_{179}$ in the $1^{st}$ row to the $180^{th}$ row of the second part of the $7^{th}$ column in the column direction, and may write the other 180 bits in the 1st row to the $180^{th}$ row of the second part of the $8^{th}$ column in the column direction.

Accordingly, the bits included in the bit group which has not been written in the first part and remains are not written in the same column in the second part and may be divided and written in the plurality of columns.

Hereinafter, the block interleaver 124 of FIG. 23 according to an exemplary embodiment will be explained in detail with reference to FIG. 30.

In a group-interleaved LDPC codeword $(v_0, v_1, \ldots, v_{N_{ldpc}-1})$, $Y_j$ is continuously arranged like $V=\{Y_0, Y_1, \ldots Y_{N_{group}-1}\}$.

Figure 30:
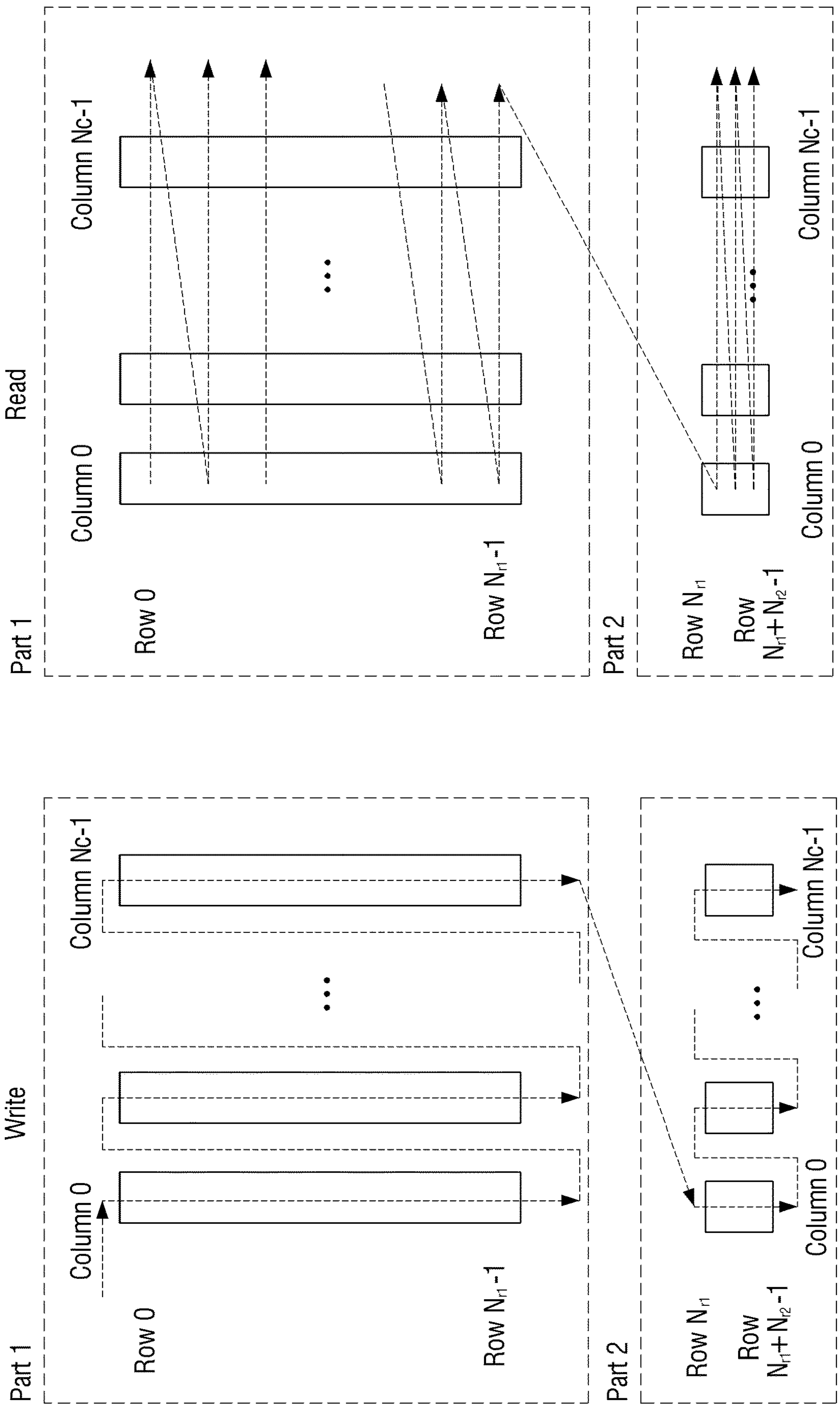

The LDPC codeword after group interleaving may be interleaved by the block interleaver 124 as shown in FIG. 30. In this case, the block interleaver 124 divide a plurality of columns into the first part (Part 1) and the second part (Part 2) based on the number of columns of the block interleaver 124 and the number of bits of bit groups. In this case, in the first part, the bits constituting the bit groups may be written in the same column, and in the second part, the bits constituting the bit groups may be written in a plurality of columns (i.e. the bits constituting the bit groups may be written in at least two columns).

Specifically, input bits vi are written serially from the first part to the second part column wise, and then read out serially from the first part to the second part row wise. That is, the data bits $v_i$ are written serially into the block interleaver column-wise starting in the first part and continuing column-wise finishing in the second part, and then read out serially row-wise from the first part and then row-wise from the second part. Accordingly, the bit included in the same bit group in the first part may be mapped onto a single bit of each modulation symbol.

In this case, the number of columns and the number of rows of the first part and the second part of the block interleaver 124 vary according to a modulation format and a length of the LDPC codeword as in Table 25 presented below. That is, the first part and the second part block interleaving configurations for each modulation format and code length are specified in Table 25 presented below. Herein, the number of columns of the block interleaver 124 may be equal to the number of bits constituting a modulation symbol. In addition, a sum of the number of rows of the first part, $N_{r1}$ and the number of rows of the second part, $N_{r2}$, is equal to $N_{ldpc}/N_C$ (herein, $N_C$ is the number of columns). In addition, since $N_{r1}(=\lfloor N_{group}/N_C \rfloor \times 360)$ is a multiple of 360, a multiple of bit groups may be written in the first part.

TABLE 25

| | Rows in Part 1 $N_{r1}$ | | Rows in Part 2 $N_{r2}$ | | |
|---|---|---|---|---|---|
| Modulation | $N_{ldpc}$ = 64800 | $N_{ldpc}$ = 16200 | $N_{ldpc}$ = 64800 | $N_{ldpc}$ = 16200 | Columns $N_c$ |
| QPSK | 32400 | 7920 | 0 | 180 | 2 |
| 16-QAM | 16200 | 3960 | 0 | 90 | 4 |
| 64-QAM | 10800 | 2520 | 0 | 180 | 6 |
| 256-QAM | 7920 | 1800 | 180 | 225 | 8 |
| 1024-QAM | 6480 | 1440 | 0 | 180 | 10 |
| 4096-QAM | 5400 | 1080 | 0 | 270 | 12 |

Hereinafter, an operation of the block interleaver 124 will be explained in detail.

Specifically, as shown in FIG. 30, the input bit $v_i$ $(0 \le i < N_C \times N_{r1})$ is written in $r_i$ row of $c_i$ column of the first part of the block interleaver 124. Herein, $c_i$ and $r_i$ are $$c_i = \left\lfloor \frac{i}{N_{r1}} \right\rfloor$$

and $r_i=(i \bmod N_{r1})$, respectively.

In addition, the input bit $v_i$ $(N_C \times N_{r1} \le i < N_{ldpc})$ is written in $r_i$ row of $c_i$ column of the second part of the block interleaver 124. Herein, $c_i$ and $r_i$ satisfy $$c_i = \left\lfloor \frac{(i - N_C \times N_{r1})}{N_{r2}} \right\rfloor$$

and $r_i=N_{r1}+\{(i-N_C \times N_{r1}) \bmod N_{r2}\}$, respectively.

An output bit $q_j (0 \le j < N_{ldpc})$ is read from $c_j$ column of $r_j$ row. Herein, $r_j$ and $c_j$ satisfy $$r_j = \left\lfloor \frac{j}{N_c} \right\rfloor$$

and $c_j=(j \bmod N_C)$, respectively.

For example, when the length $N_{ldpc}$ of an LDPC codeword is 64800 and the modulation method is 256-QAM, the order of bits output from the block interleaver 124 may be $(q_0, q_1, q_2, \ldots, q_{63357}, q_{63358}, q_{63359}, q_{63360}, q_{63361}, \ldots, q_{64799})=(v_0, v_{7920}, v_{15840}, \ldots, v_{47519}, v_{55439}, v_{63359}, v_{63360}, v_{63540}, \ldots, v_{64799})$. Herein, the indexes of the right side of the foregoing equation may be specifically expressed for the eight (8) columns as 0, 7920, 15840, 23760, 31680, 39600, 47520, 55440, 1, 7921, 15841, 23761, 31681, 39601, 47521, 55441, . . . , 7919, 15839, 23759, 31679, 39599, 47519, 55439, 63359, 63360, 63540, 63720, 63900, 64080, 64260, 64440, 64620, . . . , 63539, 63719, 63899, 64079, 64259, 64439, 64619, 64799.

Hereinafter, the interleaving operation of the block interleaver 124 will be explained in detail.

The block interleaver 124 may interleave by writing a plurality of bit groups in each column in bit group wise in a column direction, and reading each row of the plurality of columns in which the plurality of bit groups are written in bit group wise in a row direction.

In this case, the number of columns constituting the block interleaver 124 may vary according to a modulation method, and the number of rows may be the length of the LDPC codeword/the number of columns.

For example, when the modulation method is 16-QAM, the block interleaver 124 may be formed of 4 columns. In this case, when the length $N_{ldpc}$ of the LDPC codeword is 16200, the number of rows is 16200 (=64800/4). In another example, when the modulation method is 64-QAM, the block interleaver 124 may be formed of 6 columns. In this case, when the length $N_{ldpc}$ of the LDPC codeword is 64800, the number of rows is 10800 (=64800/6).

Hereinafter, the method for interleaving the plurality of bit groups in bit group wise by the block interleaver 124 will be explained in detail.

When the number of bit groups constituting the LDPC codeword is an integer multiple of the number of columns, the block interleaver 124 may interleave by writing the bit groups as many as the number of bit groups divided by the number of columns in each column serially in bit group wise.

For example, when the modulation method is 16-QAM and the length $N_{ldpc}$ of the LDPC codeword is 64800, the block interleaver 124 may be formed of four (4) columns each including 16200 rows. In this case, since the LDPC codeword is divided into (64800/360=180) number of bit groups when the length $N_{ldpc}$ of the LDPC codeword is 64800, the number of bit groups (=180) of the LDPC codeword may be an integer multiple of the number of columns (=4) when the modulation method is 16-QAM. That is, no remainder is generated when the number of bit groups of the LDPC codeword is divided by the number of columns.

Figure 31:
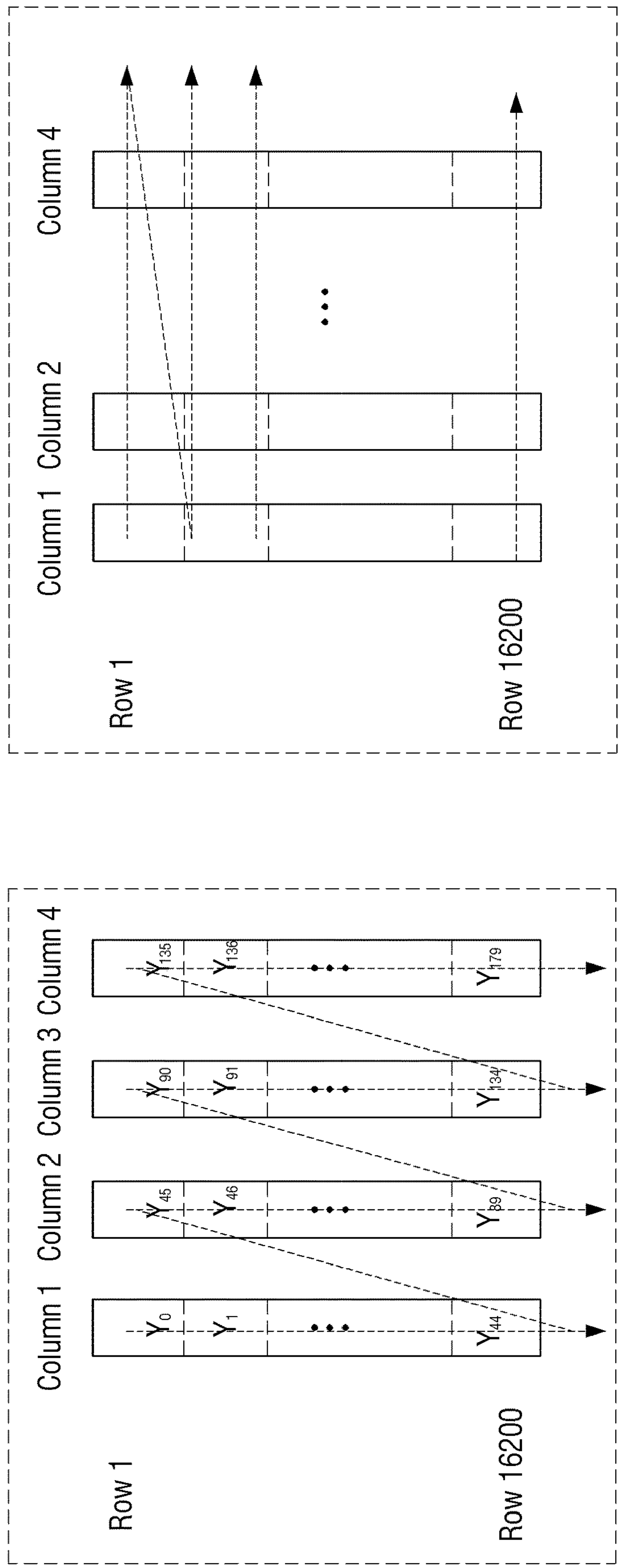

In this case, as shown in FIG. 31, the block interleaver 124 writes the bits included in each of the bit group $Y_0$, bit group $Y_1$, . . . , bit group $Y_{44}$ in the $1^{st}$ row to $16200^{th}$ row of the first column, writes the bits included in each of the bit group $Y_{45}$, the bit group $Y_{46}$, . . . , the bit group $Y_{89}$ in the $1^{st}$ row to $16200^{th}$ row of the second column, writes the bits included in each of the bit group $Y_{90}$, the bit group $Y_{91}$, . . . , the bit group $Y_{134}$ in the $1^{st}$ row to $16200^{th}$ row of the third column, and writes the bits included in each of the bit group $Y_{135}$, the bit group $Y_{136}$, . . . , the bit group $Y_{179}$ in the $1^{st}$ row to $16200^{th}$ row of the fourth column. In addition, the block interleaver 124 may read the bits written in each row of the two columns serially in the row direction.

In another, when the modulation method is 64-QAM and the length $N_{ldpc}$ of the LDPC codeword is 64800, the block interleaver 124 may be formed of six (6) columns each including 10800 rows. In this case, since the LDPC codeword is divided into (64800/360=180) number of bit groups when the length $N_{ldpc}$ of the LDPC codeword is 64800, the number of bit groups (=180) of the LDPC codeword may be an integer multiple of the number of columns (=4) when the modulation method is 64-QAM. That is, no remainder is generated when the number of bit groups of the LDPC codeword is divided by the number of columns.

Figure 32:
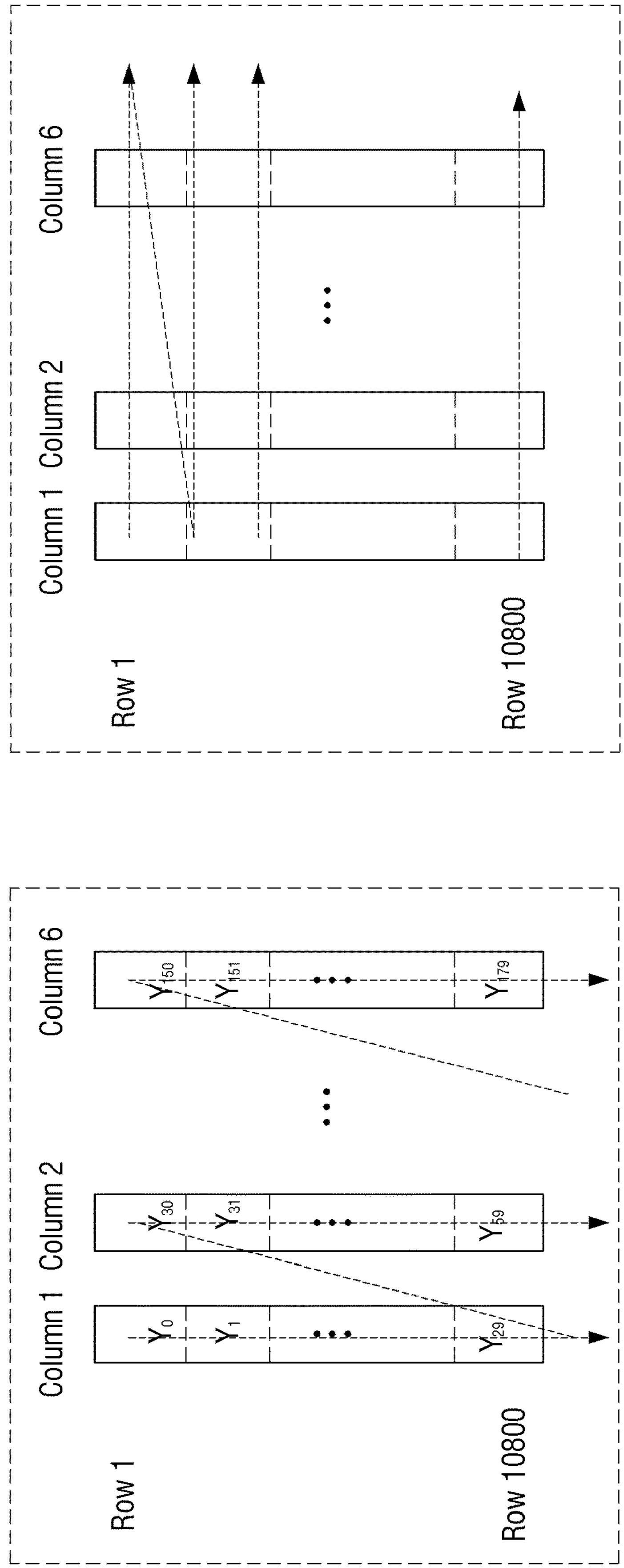

In this case, as shown in FIG. 32, the block interleaver 124 writes the bits included in each of the bit group $Y_0$, bit group $Y_1$, . . . , bit group $Y_{29}$ in the $1^{st}$ row to $10800^{th}$ row of the first column, writes the bits included in each of the bit group $Y_{30}$, the bit group $Y_{31}$, . . . , the bit group $Y_{59}$ in the $1^{st}$ row to $10800^{th}$ row of the second column, writes the bits included in each of the bit group $Y_{60}$, the bit group $Y_{61}$, . . . , the bit group $Y_{89}$ in the $1^{st}$ row to $10800^{th}$ row of the third column, writes the bits included in each of the bit group $Y_{90}$, the bit group $Y_{91}$, . . . , the bit group $Y_{119}$ in the $1^{st}$ row to $10800^{th}$ row of the fourth column, writes the bits included in each of the bit group $Y_{120}$, the bit group $Y_{121}$, . . . , the bit group $Y_{149}$ in the $1^{st}$ row to $10800^{th}$ row of the fifth column, and writes the bits included in each of the bit group $Y_{150}$, the bit group $Y_{151}$, . . . , the bit group $Y_{179}$ in the $1^{st}$ row to $10800^{th}$ row of the sixth column. In addition, the block interleaver 124 may read the bits written in each row of the two columns serially in the row direction.

As described above, when the number of bit groups constituting the LDPC codeword is an integer multiple of the number of columns of the block interleaver 124, the block interleaver 124 may interleave the plurality of bit groups in bit group wise, and accordingly, the bits belonging to the same bit group may be written in the same column.

As described above, the block interleaver 124 may interleave the plurality of bit groups of the LDPC codeword in the method described above with reference to FIGS. 31 and 32.

The modulator 130 maps the interleaved LDPC codeword onto a modulation symbol. Specifically, the modulator 130 may demultiplex the interleaved LDPC codeword, modulate the demultiplexed LDPC codeword, and map the LDPC codeword onto a constellation.

In this case, the modulator 130 may generate a modulation symbol using the bits included in each of a plurality of bit groups.

In other words, as described above, the bits included in different bit groups are written in each column of the block interleaver 124, and the block interleaver 124 reads the bits written in each column in the row direction. In this case, the modulator 130 generates a modulation symbol by mapping the bits read in each column onto each bit of the modulation symbol. Accordingly, each bit of the modulation symbol belongs to a different bit group.

For example, it is assumed that the modulation symbol consists of C number of bits. In this case, the bits which are read from each row of C number of columns of the block interleaver 124 may be mapped onto each bit of the modulation symbol and thus, each bit of the modulation symbol consisting of C number of bits belong to C number of different bit groups.

Hereinbelow, the above feature will be described in greater detail.

First, the modulator 130 demultiplexes the interleaved LDPC codeword. To achieve this, the modulator 130 may include a demultiplexer (not shown) to demultiplex the interleaved LDPC codeword.

The demultiplexer (not shown) demultiplexes the interleaved LDPC codeword. Specifically, the demultiplexer (not shown) performs serial-to-parallel conversion with respect to the interleaved LDPC codeword, and demultiplexes the interleaved LDPC codeword into a cell having a predetermined number of bits (or a data cell).

Figure 33:
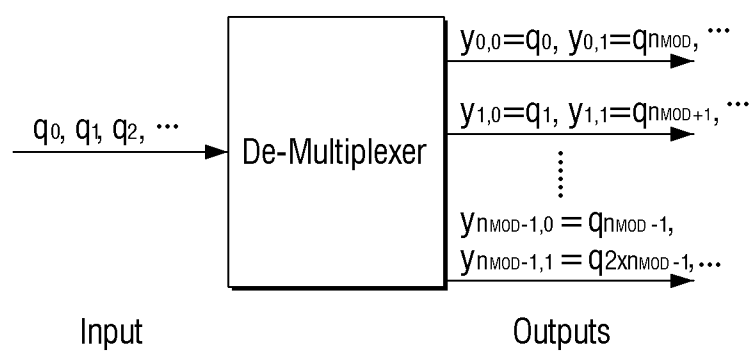
FIG. 33 is a view to illustrate an operation of a demultiplexer, according to an exemplary embodiment.

For example, as shown in FIG. 33, the demultiplexer (not shown) receives the LDPC codeword $Q=(q_0, q_1, q_2, \ldots)$ output from the interleaver 120, outputs the received LDPC codeword bits to a plurality of substreams serially, converts the input LDPC codeword bits into cells, and outputs the cells.

In this case, the bits having the same index in each of the plurality of substreams may constitute the same cell. Accordingly, the cells may be configured like $(y_{0,0}, y_{1,0}, \ldots, y_{\eta MOD-1,0})=(q_0, q_1, q_{\eta MOD-1})$, $(y_{0,1}, y_{1,1}, \ldots, y_{\eta MOD-1,1})=(q_{\eta MOD}, q_{\eta MOD+1}, \ldots, q_{2\times\eta MOD-1})$, . . . .

Herein, the number of substreams, $N_{substreams}$, may be equal to the number of bits constituting a modulation symbol, $\eta_{MOD}$. Accordingly, the number of bits constituting each cell may be equal to the number of bits constituting a modulation symbol (that is, a modulation order).

For example, when the modulation method is 16-QAM, the number of bits constituting the modulation symbol, $\eta_{MOD}$, is 4 and thus the number of substreams, $N_{substreams}$, is 4, and the cells may be configured like $(y_{0,0}, y_{1,0}, y_{2,0}, y_{3,0})=(q_0, q_0, q_2, q_3)$, $(y_{0,1}, y_{1,1}, y_{2,1}, y_{3,1})=(q_4, q_5, q_6, q_7)$, $(y_{0,2}, y_{1,2}, y_{2,2}, y_{3,2})=(q_8, q_9, q_{10}, q_{11})$, . . . .

In another example, when the modulation method is 64-QAM, the number of bits constituting the modulation symbol, $\eta_{MOD}$, is 6 and thus the number of substreams, $N_{substreams}$, is 6, and the cells may be configured like $(y_{0,0}, y_{1,0}, y_{2,0}, y_{3,0}, y_{4,0}, y_{5,0})=(q_0, q_1, q_2, q_3, q_4, q_5)$, $(y_{0,1}, y_{1,1}, y_{2,1}, y_{3,1}, y_{4,1}, y_{5,1})=(q_6, q_7, q_8, q_9, q_{10}, q_{11})$, $(y_{0,2}, y_{1,2}, y_{2,2}, y_{3,2}, y_{4,2}, y_{5,2})=(q_{12}, q_{13}, q_{14}, q_{15}, q_{16}, q_{17})$, . . . .

The modulator 130 may map the demultiplexed LDPC codeword onto modulation symbols.

Specifically, the modulator 130 may modulate bits (that is, cells) output from the demultiplexer (not shown) in various modulation methods such as Quadrature Phase Shift Keying (QPSK), 16-QAM, 64-QAM, 256-QAM, 1024-QAM, 4096-QAM, etc. For example, when the modulation method is QPSK, 16-QAM, 64-QAM, 256-QAM, 1024-QAM, and 4096-QAM, the number of bits constituting the modulation symbol, $\eta_{MOD}$ (that is, the modulation order), may be 2, 4, 6, 8, 10 and 12, respectively.

In this case, since each cell output from the demultiplexer (not shown) is formed of as many bits as the number of bits constituting the modulation symbol, the modulator 130 may generate the modulation symbol by mapping each cell output from the demultiplexer (not shown) onto a constellation point serially. Herein, the modulation symbol corresponds to a constellation point on the constellation.

However, the above-described demultiplexer (not shown) may be omitted according to circumstances. In this case, the modulator 130 may generate modulation symbols by grouping a predetermined number of bits from interleaved bits serially and mapping the predetermined number of bits onto constellation points. In this case, the modulator 130 may generate the modulation symbols by mapping $\eta_{MOD}$ number of bits onto the constellation points serially according to a modulation method.

The modulator 130 may modulate by mapping cells output from the demultiplexer (not shown) onto constellation points in a non-uniform constellation (NUC) method.

In the non-uniform constellation method, once a constellation point of the first quadrant is defined, constellation points in the other three quadrants may be determined as follows. For example, when a set of constellation points defined for the first quadrant is X, the set becomes −conj(X) in the case of the second quadrant, becomes conj(X) in the case of the third quadrant, and becomes −(X) in the case of the fourth quadrant.

That is, once the first quadrant is defined, the other quadrants may be expressed as follows:

1 Quarter (first quadrant)=X

2 Quarter (second quadrant)=−conj(X)

3 Quarter (third quadrant)=conj(X)

4 Quarter (fourth quadrant)=−X

Specifically, when the non-uniform M-QAM is used, M number of constellation points may be defined as $z=\{z_0, z_1, \ldots, z_{M-1}\}$. In this case, when the constellation points existing in the first quadrant are defined as $\{x_0, x_1, x_2, \ldots, x_{M/4-1}\}$, z may be defined as follows:

from $z_0$ to $z_{M/4}$=from $x_0$ to $x_{M/4}$ from $z_{M/4}$ to $z_{2\times M/4-1}$=−conj(from $x_0$ to $x_{M/4}$)

from $z_{2\times M/4}$ to $z_{3\times M/4-1}$=conj(from $x_0$ to $x_{M/4}$)

from $z_{3\times M/4}$ to $z_{4\times M/4-1}$=−(from $x_0$ to $x_{M/4}$)

Accordingly, the modulator 130 may map the bits $[y_0, \ldots, y_{m-1}]$ output from the demultiplexer (not shown) onto constellation points in the non-uniform constellation method by mapping the output bits onto $z_L$ having an index of $$L=\sum_{i=0}^{m-1}(y_1\times 2^{m-1}).$$

An example of the constellation defined according to the non-uniform constellation method may be expressed as in tables 26 to 30 presented below when the code rate is 5/15, 7/15, 9/15, 11/15, 13/15:

TABLE 26

| Input data cell y | Constellation point $z_s$ |
|---|---|
| (00) | $(1 + 1i)/\sqrt{2}$ |
| (01) | $(1 - 1i)/\sqrt{2}$ |
| (10) | $(-1 + 1i)/\sqrt{2}$ |
| (11) | $(-1 - 1i)/\sqrt{2}$ |

TABLE 27

| | Shape | | | | |
|---|---|---|---|---|---|
| w | NUC_16_6/15 | NUC_16_7/15 | NUC_16_8/15 | NUC_16_9/15 | NUC_16_10/15 |
| w0 | 0.4530 + 0.2663i | 1.2103 + 0.5026i | 0.4819 + 0.2575i | 0.4909 + 1.2007i | 0.2173 + 0.4189i |
| w1 | 0.2663 + 0.4530i | 0.5014 + 1.2103i | 0.2575 + 0.4819i | 1.2007 + 0.4909i | 0.6578 + 0.2571i |
| w2 | 1.2092 + 0.5115i | 0.4634 + 0.2624i | 1.2068 + 0.4951i | 0.2476 + 0.5065i | 0.4326 + 1.1445i |
| w3 | 0.5115 + 1.2092i | 0.2624 + 0.4627i | 0.4951 + 1.2068i | 0.5053 + 0.2476i | 1.2088 + 0.5659i |

| | Shape | | |
|---|---|---|---|
| w | NUC_16_11/15 | NUC_16_12/15 | NUC_16_13/15 |
| w0 | 0.9583 + 0.9547i | 0.2999 + 0.2999i | 0.9517 + 0.9511i |
| w1 | 0.9547 + 0.2909i | 0.9540 + 0.2999i | 0.9524 + 0.3061i |
| w2 | 0.2921 + 0.9583i | 0.2999 + 0.9540i | 0.3067 + 0.9524i |
| w3 | 0.2909 + 0.2927i | 0.9540 + 0.9540i | 0.3061 + 0.3067i |

TABLE 28

| x | Shape R64_6/15 | R64_7/15 | R64_8/15 | R64_9/15 | R64_10/15 |
|---|---|---|---|---|---|
| x0 | 0.4387 + 1.6023i | 0.3352 + 0.6028i | 1.4827 + 0.2920i | 0.3547 + 0.6149i | 1.4388 + 0.2878i |
| x1 | 1.6023 + 0.4387i | 0.2077 + 0.6584i | 1.2563 + 0.8411i | 0.1581 + 0.6842i | 1.2150 + 0.8133i |
| x2 | 0.8753 + 1.0881i | 0.1711 + 0.3028i | 1.0211 + 0.2174i | 0.1567 + 0.2749i | 1.0386 + 0.2219i |
| x3 | 1.0881 + 0.8753i | 0.1556 + 0.3035i | 0.8798 + 0.5702i | 0.1336 + 0.2700i | 0.8494 + 0.6145i |
| x4 | 0.2202 + 0.9238i | 0.6028 + 0.3345i | 0.2920 + 1.4827i | 0.6177 + 0.4030i | 0.2931 + 1.4656i |
| x5 | 0.2019 + 0.7818i | 0.6577 + 0.2084i | 0.8410 + 1.2563i | 0.7262 + 0.1756i | 0.8230 + 1.2278i |
| x6 | 0.3049 + 0.8454i | 0.3021 + 0.1711i | 0.2174 + 1.0211i | 0.3568 + 0.1756i | 0.2069 + 1.0649i |
| x7 | 0.2653 + 0.7540i | 0.3028 + 0.1556i | 0.5702 + 0.8798i | 0.3771 + 0.1336i | 0.5677 + 0.8971i |
| x8 | 0.7818 + 0.2019i | 0.5556 + 0.8922i | 0.3040 + 0.1475i | 0.5639 + 0.8864i | 0.4119 + 0.1177i |
| x9 | 0.9238 + 0.2202i | 0.2352 + 1.0190i | 0.3028 + 0.1691i | 0.1980 + 1.0277i | 0.3998 + 0.2516i |
| x10 | 0.7540 + 0.2653i | 0.8450 + 1.2619i | 0.6855 + 0.1871i | 0.8199 + 1.2515i | 0.7442 + 0.1559i |
| x11 | 0.8454 + 0.3049i | 0.2922 + 1.4894i | 0.6126 + 0.3563i | 0.2854 + 1.4691i | 0.5954 + 0.4328i |
| x12 | 0.2675 + 0.2479i | 0.8929 + 0.5549i | 0.1475 + 0.3040i | 0.8654 + 0.6058i | 0.1166 + 0.1678i |
| x13 | 0.2479 + 0.2675i | 1.0197 + 0.2359i | 0.1691 + 0.3028i | 1.0382 + 0.2142i | 0.1582 + 0.3325i |
| x14 | 0.2890 + 0.2701i | 1.2626 + 0.8457i | 0.1871 + 0.6855i | 1.2362 + 0.8416i | 0.1355 + 0.7408i |
| x15 | 0.2701 + 0.2890i | 1.4894 + 0.2922i | 0.3563 + 0.6126i | 1.4663 + 0.2973i | 0.3227 + 0.6200i |

| x | Shape R64_11/15 | R64_12/15 | R64_13/15 |
|---|---|---|---|
| x0 | 0.3317 + 0.6970i | 1.0854 + 0.5394i | 0.4108 + 0.7473i |
| x1 | 0.1386 + 0.8824i | 0.7353 + 0.4623i | 0.1343 + 0.5338i |
| x2 | 0.1323 + 0.4437i | 1.0474 + 0.1695i | 0.1570 + 0.9240i |
| x3 | 0.1015 + 0.1372i | 0.7243 + 0.1504i | 0.1230 + 0.1605i |
| x4 | 0.5682 + 0.4500i | 1.0693 + 0.9408i | 0.6285 + 0.4617i |
| x5 | 0.6739 + 0.1435i | 0.7092 + 0.8073i | 0.3648 + 0.3966i |
| x6 | 0.3597 + 0.3401i | 1.4261 + 0.2216i | 0.6907 + 0.1541i |
| x7 | 0.3660 + 0.1204i | 0.6106 + 1.1783i | 0.3994 + 0.1308i |
| x8 | 0.6004 + 0.8922i | 0.1392 + 0.4078i | 0.7268 + 0.8208i |
| x9 | 0.2120 + 1.2253i | 0.4262 + 0.4205i | 1.0463 + 0.9495i |
| x10 | 0.9594 + 1.0714i | 0.1407 + 0.1336i | 0.1866 + 1.2733i |
| x11 | 0.5829 + 1.3995i | 0.4265 + 0.1388i | 0.5507 + 1.1793i |
| x12 | 0.8439 + 0.5675i | 0.1388 + 0.7057i | 0.9283 + 0.5140i |
| x13 | 0.9769 + 0.1959i | 0.4197 + 0.7206i | 1.2648 + 0.5826i |
| x14 | 1.2239 + 0.6760i | 0.1682 + 1.0316i | 0.9976 + 0.1718i |
| x15 | 1.3653 + 0.2323i | 0.2287 + 1.3914i | 1.3412 + 0.1944i |

TABLE 29

| w | Shape NUC_64_6/15 | NUC_64_7/15 | NUC_64_8/15 | NUC_64_9/15 | NUC_64_10/15 |
|---|---|---|---|---|---|
| w | 0.4387 + 1.6023i | 0.3352 + 0.6028i | 1.4827 + 0.2920i | 0.3547 + 0.6149i | 1.4388 + 0.2878i |
| w1 | 1.6023 + 0.4387i | 0.2077 + 0.6584i | 1.2563 + 0.8411i | 0.1581 + 0.6842i | 1.2150 + 0.8133i |
| w2 | 0.8753 + 1.0881i | 0.1711 + 0.3028i | 1.0211 + 0.2174i | 0.1567 + 0.2749i | 1.0386 + 0.2219i |
| w3 | 1.0881 + 0.8753i | 0.1556 + 0.3035i | 0.8798 + 0.5702i | 0.1336 + 0.2700i | 0.8494 + 0.6145i |
| w4 | 0.2202 + 0.9238i | 0.6028 + 0.3345i | 0.2920 + 1.4827i | 0.6177 + 0.4030i | 0.2931 + 1.4656i |
| w5 | 0.2019 + 0.7818i | 0.6577 + 0.2084i | 0.8410 + 1.2563i | 0.7262 + 0.1756i | 0.8230 + 1.2278i |
| w6 | 0.3049 + 0.8454i | 0.3021 + 0.1711i | 0.2174 + 1.0211i | 0.3568 + 0.1756i | 0.2069 + 1.0649i |
| w7 | 0.2653 + 0.7540i | 0.3028 + 0.1556i | 0.5702 + 0.8798i | 0.3771 + 0.1336i | 0.5677 + 0.8971i |
| w8 | 0.7818 + 0.2019i | 0.5556 + 0.8922i | 0.3040 + 0.1475i | 0.5639 + 0.8864i | 0.4119 + 0.1177i |
| w9 | 0.9238 + 0.2202i | 0.2352 + 1.0190i | 0.3028 + 0.1691i | 0.1980 + 1.0277i | 0.3998 + 0.2516i |
| w10 | 0.7540 + 0.2653i | 0.8450 + 1.2619i | 0.6855 + 0.1871i | 0.8199 + 1.2515i | 0.7442 + 0.1559i |
| w11 | 0.8454 + 0.3049i | 0.2922 + 1.4894i | 0.6126 + 0.3563i | 0.2854 + 1.4691i | 0.5954 + 0.4328i |
| w12 | 0.2675 + 0.2479i | 0.8929 + 0.5549i | 0.1475 + 0.3040i | 0.8654 + 0.6058i | 0.1166 + 0.1678i |
| w13 | 0.2479 + 0.2675i | 1.0197 + 0.2359i | 0.1691 + 0.3028i | 1.0382 + 0.2141i | 0.1582 + 0.3325i |
| w14 | 0.2890 + 0.2701i | 1.2626 + 0.8457i | 0.1871 + 0.6855i | 1.2362 + 0.8416i | 0.1355 + 0.7408i |
| w15 | 0.2701 + 0.2890i | 1.4894 + 0.2922i | 0.3563 + 0.6126i | 1.4663 + 0.2973i | 0.3227 + 0.6200i |

| w | Shape NUC_64_11/15 | NUC_64_12/15 | NUC_64_13/15 |
|---|---|---|---|
| w0 | 0.3317 + 0.6970i | 1.0854 + 0.5394i | 0.8624 + 1.1715i |
| w1 | 0.1386 + 0.8824i | 0.7353 + 0.4623i | 1.1184 + 0.8462i |
| w2 | 0.1323 + 0.4437i | 1.0474 + 0.1695i | 0.2113 + 1.3843i |
| w3 | 0.1015 + 0.1372i | 0.7243 + 0.1504i | 0.7635 + 0.7707i |
| w4 | 0.5682 + 0.4500i | 1.0693 + 0.9408i | 1.1796 + 0.1661i |
| w5 | 0.6739 + 0.1435i | 0.7092 + 0.8073i | 1.0895 + 0.4882i |
| w6 | 0.3597 + 0.3401i | 1.4261 + 0.2216i | 0.8101 + 0.1492i |
| w7 | 0.3660 + 0.1204i | 0.6106 + 1.1783i | 0.7482 + 0.4477i |

TABLE 29-continued

| | | | |
|---|---|---|---|
| w8 | 0.6004 + 0.8922i | 0.1392 + 0.4078i | 0.1524 + 0.9943i |
| w9 | 0.2120 + 1.2253i | 0.4262 + 0.4205i | 0.1482 + 0.6877i |
| w10 | 0.9594 + 1.0714i | 0.1407 + 0.1336i | 0.4692 + 1.0853i |
| w11 | 0.5829 + 1.3995i | 0.4265 + 0.1388i | 0.4492 + 0.7353i |
| w12 | 0.8439 + 0.5675i | 0.1388 + 0.7057i | 0.1578 + 0.1319i |
| w13 | 0.9769 + 0.1959i | 0.4197 + 0.7206i | 0.1458 + 0.4025i |
| w14 | 1.2239 + 0.6760i | 0.1682 + 1.0316i | 0.4763 + 0.1407i |
| w15 | 1.3653 + 0.2323i | 0.2287 + 1.3914i | 0.4411 + 0.4267i |

TABLE 30

| | Shape | | | | |
|---|---|---|---|---|---|
| w | NUC_256_6/15 | NUC_256_7/15 | NUC_256_8/15 | NUC_256_9/15 | NUC_256_10/15 |
| w0 | 0.6800 + 1.6926i | 1.2905 + 1.3099i | 1.0804 + 1.3788i | 1.3231 + 1.1506i | 1.6097 + 0.1548i |
| w1 | 0.3911 + 1.3645i | 1.0504 + 0.9577i | 1.0487 + 0.9862i | 0.9851 + 1.2311i | 1.5549 + 0.4605i |
| w2 | 0.2191 + 1.7524i | 1.5329 + 0.8935i | 1.6464 + 0.7428i | 1.1439 + 0.8974i | 1.3226 + 0.1290i |
| w3 | 0.2274 + 1.4208i | 1.1577 + 0.8116i | 1.3245 + 0.9414i | 0.9343 + 0.9271i | 1.2772 + 0.3829i |
| w4 | 0.8678 + 1.2487i | 1.7881 + 0.2509i | 0.7198 + 1.2427i | 1.5398 + 0.7962i | 1.2753 + 1.0242i |
| w5 | 0.7275 + 1.1667i | 1.4275 + 0.1400i | 0.8106 + 1.0040i | 0.9092 + 0.5599i | 1.4434 + 0.7540i |
| w6 | 0.8747 + 1.0470i | 1.4784 + 0.5201i | 0.5595 + 1.0317i | 1.2222 + 0.6574i | 1.0491 + 0.8476i |
| w7 | 0.7930 + 1.0406i | 1.3408 + 0.4346i | 0.6118 + 0.9722i | 0.9579 + 0.6373i | 1.1861 + 0.6253i |
| w8 | 0.2098 + 0.9768i | 0.7837 + 0.5867i | 1.6768 + 0.2002i | 0.7748 + 1.5867i | 0.9326 + 0.0970i |
| w9 | 0.2241 + 1.0454i | 0.8250 + 0.6455i | 0.9997 + 0.6844i | 0.6876 + 1.2489i | 0.8962 + 0.2804i |
| w10 | 0.1858 + 0.9878i | 0.8256 + 0.5601i | 1.4212 + 0.4769i | 0.5992 + 0.9208i | 1.1044 + 0.1102i |
| w11 | 0.1901 + 1.0659i | 0.8777 + 0.6110i | 1.1479 + 0.6312i | 0.6796 + 0.9743i | 1.0648 + 0.3267i |
| w12 | 0.5547 + 0.8312i | 1.0080 + 0.1843i | 0.6079 + 0.6566i | 0.5836 + 0.5879i | 0.7325 + 0.6071i |
| w13 | 0.5479 + 0.8651i | 1.0759 + 0.1721i | 0.7284 + 0.6957i | 0.6915 + 0.5769i | 0.8260 + 0.4559i |
| w14 | 0.6073 + 0.8182i | 1.0056 + 0.2758i | 0.5724 + 0.7031i | 0.5858 + 0.7058i | 0.8744 + 0.7153i |
| w15 | 0.5955 + 0.8420i | 1.0662 + 0.2964i | 0.6302 + 0.7259i | 0.6868 + 0.6793i | 0.9882 + 0.5300i |
| w16 | 1.4070 + 0.1790i | 0.8334 + 1.5554i | 0.1457 + 1.4010i | 1.6118 + 0.1497i | 0.1646 + 1.6407i |
| w17 | 1.7227 + 0.2900i | 0.8165 + 1.1092i | 0.1866 + 1.7346i | 0.9511 + 0.1140i | 0.4867 + 1.5743i |
| w18 | 1.3246 + 0.2562i | 0.6092 + 1.2729i | 0.1174 + 1.1035i | 1.2970 + 0.1234i | 0.1363 + 1.3579i |
| w19 | 1.3636 + 0.3654i | 0.6728 + 1.1456i | 0.1095 + 1.0132i | 1.0266 + 0.1191i | 0.4023 + 1.3026i |
| w20 | 1.3708 + 1.2834i | 0.3061 + 1.7469i | 0.4357 + 1.3636i | 1.5831 + 0.4496i | 1.0542 + 1.2584i |
| w21 | 1.6701 + 0.8403i | 0.1327 + 1.4056i | 0.5853 + 1.6820i | 0.9328 + 0.3586i | 0.7875 + 1.4450i |
| w22 | 1.1614 + 0.7909i | 0.3522 + 1.3414i | 0.3439 + 1.0689i | 1.2796 + 0.3894i | 0.8687 + 1.0407i |
| w23 | 1.2241 + 0.7367i | 0.2273 + 1.3081i | 0.3234 + 0.9962i | 1.0188 + 0.3447i | 0.6502 + 1.1951i |
| w24 | 0.9769 + 0.1863i | 0.5007 + 0.8098i | 0.1092 + 0.6174i | 0.5940 + 0.1059i | 0.0982 + 0.9745i |
| w25 | 0.9452 + 0.2057i | 0.5528 + 0.8347i | 0.1074 + 0.6307i | 0.7215 + 0.1100i | 0.2842 + 0.9344i |
| w26 | 1.0100 + 0.2182i | 0.4843 + 0.8486i | 0.1109 + 0.6996i | 0.5863 + 0.1138i | 0.1142 + 1.1448i |
| w27 | 0.9795 + 0.2417i | 0.5304 + 0.8759i | 0.1076 + 0.7345i | 0.6909 + 0.1166i | 0.3385 + 1.0973i |
| w28 | 0.8241 + 0.4856i | 0.1715 + 0.9147i | 0.3291 + 0.6264i | 0.5843 + 0.3604i | 0.6062 + 0.7465i |
| w29 | 0.8232 + 0.4837i | 0.1540 + 0.9510i | 0.3126 + 0.6373i | 0.6970 + 0.3592i | 0.4607 + 0.8538i |
| w30 | 0.8799 + 0.5391i | 0.1964 + 0.9438i | 0.3392 + 0.6999i | 0.5808 + 0.3250i | 0.7263 + 0.8764i |
| w31 | 0.8796 + 0.5356i | 0.1788 + 0.9832i | 0.3202 + 0.7282i | 0.6678 + 0.3290i | 0.5450 + 1.0067i |
| w32 | 0.1376 + 0.3342i | 0.3752 + 0.1667i | 0.9652 + 0.1066i | 0.1406 + 1.6182i | 0.2655 + 0.0746i |
| w33 | 0.1383 + 0.3292i | 0.3734 + 0.1667i | 0.9075 + 0.1666i | 0.1272 + 1.2984i | 0.2664 + 0.0759i |
| w34 | 0.1363 + 0.3322i | 0.3758 + 0.1661i | 0.9724 + 0.1171i | 0.1211 + 0.9644i | 0.4571 + 0.0852i |
| w35 | 0.1370 + 0.3273i | 0.3746 + 0.1649i | 0.9186 + 0.1752i | 0.1220 + 1.0393i | 0.4516 + 0.1062i |
| w36 | 0.1655 + 0.3265i | 0.4013 + 0.1230i | 0.6342 + 0.1372i | 0.1124 + 0.6101i | 0.2559 + 0.1790i |
| w37 | 0.1656 + 0.3227i | 0.4001 + 0.1230i | 0.6550 + 0.1495i | 0.1177 + 0.6041i | 0.2586 + 0.1772i |
| w38 | 0.1634 + 0.3246i | 0.4037 + 0.1230i | 0.6290 + 0.1393i | 0.1136 + 0.7455i | 0.3592 + 0.2811i |
| w39 | 0.1636 + 0.3208i | 0.4019 + 0.1218i | 0.6494 + 0.1504i | 0.1185 + 0.7160i | 0.3728 + 0.2654i |
| w40 | 0.1779 + 0.6841i | 0.6025 + 0.3934i | 1.3127 + 0.1240i | 0.4324 + 1.5679i | 0.7706 + 0.0922i |
| w41 | 0.1828 + 0.6845i | 0.5946 + 0.3928i | 0.9572 + 0.4344i | 0.3984 + 1.2825i | 0.7407 + 0.2260i |
| w42 | 0.1745 + 0.6828i | 0.6116 + 0.3879i | 1.2403 + 0.2631i | 0.3766 + 0.9534i | 0.6180 + 0.0927i |
| w43 | 0.1793 + 0.6829i | 0.6019 + 0.3837i | 1.0254 + 0.4130i | 0.3668 + 1.0301i | 0.6019 + 0.1658i |
| w44 | 0.3547 + 0.6009i | 0.7377 + 0.1618i | 0.6096 + 0.4214i | 0.3667 + 0.5995i | 0.6007 + 0.4980i |
| w45 | 0.3593 + 0.6011i | 0.7298 + 0.1582i | 0.6773 + 0.4284i | 0.3328 + 0.5960i | 0.6673 + 0.3928i |
| w46 | 0.3576 + 0.5990i | 0.7274 + 0.1782i | 0.5995 + 0.4102i | 0.3687 + 0.7194i | 0.4786 + 0.3935i |
| w47 | 0.3624 + 0.5994i | 0.7165 + 0.1746i | 0.6531 + 0.4101i | 0.3373 + 0.6964i | 0.5176 + 0.3391i |
| w48 | 0.2697 + 0.1443i | 0.1509 + 0.2425i | 0.1250 + 0.1153i | 0.1065 + 0.1146i | 0.0757 + 0.1003i |
| w49 | 0.2704 + 0.1433i | 0.1503 + 0.2400i | 0.1252 + 0.1158i | 0.1145 + 0.1108i | 0.0753 + 0.1004i |
| w50 | 0.2644 + 0.1442i | 0.1515 + 0.2437i | 0.1245 + 0.1152i | 0.1053 + 0.1274i | 0.0777 + 0.4788i |
| w51 | 0.2650 + 0.1432i | 0.1503 + 0.2425i | 0.1247 + 0.1156i | 0.1134 + 0.1236i | 0.0867 + 0.4754i |
| w52 | 0.2763 + 0.1638i | 0.1285 + 0.2388i | 0.3768 + 0.1244i | 0.1111 + 0.3821i | 0.1023 + 0.2243i |
| w53 | 0.2768 + 0.1626i | 0.1279 + 0.2419i | 0.3707 + 0.1237i | 0.1186 + 0.3867i | 0.1010 + 0.2242i |
| w54 | 0.2715 + 0.1630i | 0.1279 + 0.2431i | 0.3779 + 0.1260i | 0.1080 + 0.3431i | 0.1950 + 0.3919i |
| w55 | 0.2719 + 0.1618i | 0.1279 + 0.2406i | 0.3717 + 0.1252i | 0.1177 + 0.3459i | 0.1881 + 0.3969i |
| w56 | 0.6488 + 0.1696i | 0.3394 + 0.5764i | 0.1161 + 0.3693i | 0.3644 + 0.1080i | 0.0930 + 0.8122i |
| w57 | 0.6462 + 0.1706i | 0.3364 + 0.5722i | 0.1157 + 0.3645i | 0.3262 + 0.1104i | 0.2215 + 0.7840i |
| w58 | 0.6456 + 0.1745i | 0.3328 + 0.5758i | 0.1176 + 0.3469i | 0.3681 + 0.1173i | 0.0937 + 0.6514i |
| w59 | 0.6431 + 0.1753i | 0.3303 + 0.5698i | 0.1171 + 0.3424i | 0.3289 + 0.1196i | 0.1540 + 0.6366i |
| w60 | 0.5854 + 0.3186i | 0.1491 + 0.6316i | 0.3530 + 0.3899i | 0.3665 + 0.3758i | 0.4810 + 0.6306i |
| w61 | 0.5862 + 0.3167i | 0.1461 + 0.6280i | 0.3422 + 0.3808i | 0.3310 + 0.3795i | 0.3856 + 0.7037i |

TABLE 30-continued

| | | | | | |
|---|---|---|---|---|---|
| w62 | 0.5864 + 0.3275i | 0.1509 + 0.6280i | 0.3614 + 0.3755i | 0.3672 + 0.3353i | 0.3527 + 0.5230i |
| w63 | 0.5873 + 0.3254i | 0.1473 + 0.6225i | 0.3509 + 0.3656i | 0.3336 + 0.3402i | 0.3100 + 0.5559i |

| | Shape | | |
|---|---|---|---|
| w | NUC_256_11/15 | NUC_256_12/15 | NUC_256_13/15 |
| w0 | 0.3105 + 0.3382i | 1.1014 + 1.1670i | 0.3556 + 0.3497i |
| w1 | 0.4342 + 0.3360i | 0.8557 + 1.2421i | 0.3579 + 0.4945i |
| w2 | 0.3149 + 0.4829i | 1.2957 + 0.8039i | 0.5049 + 0.3571i |
| w3 | 0.4400 + 0.4807i | 1.0881 + 0.8956i | 0.5056 + 0.5063i |
| w4 | 0.1811 + 0.3375i | 0.5795 + 1.2110i | 0.2123 + 0.3497i |
| w5 | 0.0633 + 0.3404i | 0.6637 + 1.4215i | 0.2116 + 0.4900i |
| w6 | 0.1818 + 0.4851i | 0.6930 + 1.0082i | 0.0713 + 0.3489i |
| w7 | 0.0633 + 0.4815i | 0.8849 + 0.9647i | 0.0690 + 0.4960i |
| w8 | 0.3084 + 0.1971i | 1.2063 + 0.5115i | 0.3527 + 0.2086i |
| w9 | 0.4356 + 0.1993i | 1.0059 + 0.4952i | 0.3497 + 0.0713i |
| w10 | 0.3098 + 0.0676i | 1.4171 + 0.5901i | 0.4960 + 0.2123i |
| w11 | 0.4342 + 0.0691i | 1.0466 + 0.6935i | 0.4974 + 0.0698i |
| w12 | 0.1775 + 0.1985i | 0.6639 + 0.6286i | 0.2086 + 0.2079i |
| w13 | 0.0640 + 0.1978i | 0.8353 + 0.5851i | 0.2094 + 0.0690i |
| w14 | 0.1775 + 0.0676i | 0.6879 + 0.8022i | 0.0676 + 0.2079i |
| w15 | 0.0647 + 0.0669i | 0.8634 + 0.7622i | 0.0698 + 0.0683i |
| w16 | 0.7455 + 0.3411i | 0.1213 + 1.4366i | 0.3586 + 0.7959i |
| w17 | 0.5811 + 0.3396i | 0.1077 + 1.2098i | 0.3571 + 0.6392i |
| w18 | 0.7556 + 0.4669i | 0.0651 + 0.9801i | 0.5034 + 0.8271i |
| w19 | 0.5862 + 0.4756i | 0.2009 + 1.0115i | 0.5063 + 0.6600i |
| w20 | 0.9556 + 0.3280i | 0.3764 + 1.4264i | 0.2146 + 0.7862i |
| w21 | 1.1767 + 0.3091i | 0.3237 + 1.2130i | 0.2109 + 0.6340i |
| w22 | 0.9673 + 0.4720i | 0.5205 + 0.9814i | 0.0713 + 0.8093i |
| w23 | 1.2051 + 0.5135i | 0.3615 + 1.0163i | 0.0698 + 0.6467i |
| w24 | 0.7367 + 0.2015i | 0.0715 + 0.6596i | 0.2799 + 1.0862i |
| w25 | 0.5811 + 0.2015i | 0.2116 + 0.6597i | 0.2806 + 1.2755i |
| w26 | 0.7316 + 0.0669i | 0.0729 + 0.8131i | 0.4328 + 0.9904i |
| w27 | 0.5782 + 0.0669i | 0.2158 + 0.8246i | 0.4551 + 1.1812i |
| w28 | 0.9062 + 0.1971i | 0.5036 + 0.6467i | 0.2309 + 0.9414i |
| w29 | 1.2829 + 0.1185i | 0.3526 + 0.6572i | 0.1077 + 1.3891i |
| w30 | 0.9156 + 0.0735i | 0.5185 + 0.8086i | 0.0772 + 0.9852i |
| w31 | 1.1011 + 0.0735i | 0.3593 + 0.8245i | 0.0802 + 1.1753i |
| w32 | 0.3244 + 0.8044i | 1.2545 + 0.1010i | 0.8301 + 0.3727i |
| w33 | 0.4589 + 0.8218i | 1.0676 + 0.0956i | 0.8256 + 0.5256i |
| w34 | 0.3207 + 0.6415i | 1.4782 + 0.1167i | 0.6593 + 0.3668i |
| w35 | 0.4509 + 0.6371i | 0.8981 + 0.0882i | 0.6623 + 0.5182i |
| w36 | 0.1920 + 0.8196i | 0.5518 + 0.0690i | 1.0186 + 0.3645i |
| w37 | 0.0633 + 0.8167i | 0.6903 + 0.0552i | 1.0001 + 0.5242i |
| w38 | 0.1811 + 0.6371i | 0.5742 + 0.1987i | 1.1857 + 0.2725i |
| w39 | 0.0640 + 0.6415i | 0.7374 + 0.1564i | 1.3928 + 0.3408i |
| w40 | 0.3331 + 1.0669i | 1.2378 + 0.3049i | 0.8011 + 0.2227i |
| w41 | 0.4655 + 1.0087i | 1.0518 + 0.3032i | 0.7981 + 0.0735i |
| w42 | 0.3433 + 1.2865i | 1.4584 + 0.3511i | 0.6459 + 0.2198i |
| w43 | 0.5004 + 1.5062i | 0.9107 + 0.2603i | 0.6430 + 0.0713i |
| w44 | 0.1971 + 1.0051i | 0.6321 + 0.4729i | 0.9681 + 0.2205i |
| w45 | 0.0735 + 1.0298i | 0.7880 + 0.4392i | 0.9615 + 0.0735i |
| w46 | 0.1498 + 1.5018i | 0.6045 + 0.3274i | 1.3327 + 0.1039i |
| w47 | 0.0865 + 1.2553i | 0.7629 + 0.2965i | 1.1359 + 0.0809i |
| w48 | 0.7811 + 0.8080i | 0.0596 + 0.0739i | 0.8382 + 0.8709i |
| w49 | 0.6167 + 0.8153i | 0.1767 + 0.0731i | 0.8145 + 0.6934i |
| w50 | 0.7636 + 0.6255i | 0.0612 + 0.2198i | 0.6645 + 0.8486i |
| w51 | 0.6000 + 0.6327i | 0.1815 + 0.2192i | 0.6600 + 0.6786i |
| w52 | 0.9898 + 0.7680i | 0.4218 + 0.0715i | 1.1612 + 0.6949i |
| w53 | 1.5855 + 0.1498i | 0.2978 + 0.0725i | 0.9785 + 0.6942i |
| w54 | 0.9476 + 0.6175i | 0.4337 + 0.2115i | 1.3698 + 0.6259i |
| w55 | 1.4625 + 0.4015i | 0.3057 + 0.2167i | 1.2183 + 0.4841i |
| w56 | 0.8276 + 1.0225i | 0.0667 + 0.5124i | 0.7989 + 1.0498i |
| w57 | 0.6313 + 1.0364i | 0.2008 + 0.5095i | 0.4395 + 1.4203i |
| w58 | 0.8815 + 1.2865i | 0.0625 + 0.3658i | 0.6118 + 1.0246i |
| w59 | 0.6342 + 1.2705i | 0.1899 + 0.3642i | 0.6303 + 1.2421i |
| w60 | 1.0422 + 0.9593i | 0.4818 + 0.4946i | 1.0550 + 0.8924i |
| w61 | 1.2749 + 0.8538i | 0.3380 + 0.5050i | 0.8612 + 1.2800i |
| w62 | 1.1556 + 1.1847i | 0.4571 + 0.3499i | 1.2696 + 0.8969i |
| w63 | 1.4771 + 0.6742i | 0.3216 + 0.3599i | 1.0342 + 1.1181i |

Table 26 indicates non-uniform QPSK, table 27 indicates non-uniform 16-QAM, Tables 28 and 29 indicate non-uniform 64-QAM, and table 30 indicates non-uniform 256-QAM.

Referring to these tables, the constellation point of the first quadrant may be defined with reference to tables 26 to 30, and the constellation points in the other three quadrants may be defined in the above-described method.

However, this is merely an example and the modulator 130 may map the output bits outputted from the demultiplexer (not shown) onto the constellation points in various methods.

The interleaving is performed in the above-described method for the following reasons.

Specifically, when the LDPC codeword bits are mapped onto the modulation symbol, the bits may have different reliability (that is, receiving performance or receiving probability) according to where the bits are mapped onto in the modulation symbol. The LDPC codeword bits may have different codeword characteristics according to the configuration of a parity check matrix. That is, the LDPC codeword bits may have different codeword characteristics according to the number of 1 existing in the column of the parity check matrix, that is, the column degree.

Accordingly, the interleaver 120 may interleave to map the LDPC codeword bits having a specific codeword characteristic onto specific bits in the modulation symbol by considering both the codeword characteristics of the LDPC codeword bits and the reliability of the bits constituting the modulation symbol.

For example, when the LDPC codeword formed of bit groups $X_0$ to $X_{179}$ is group-interleaved based on Equation 21 and Table 11, the group interleaver 122 may output the bit groups in the order of $X_{55}$, $X_{146}$, $X_{83}$, . . . , $X_{132}$, $X_{135}$.

In this case, when the modulation method is 16-QAM, the number of columns of the block interleaver 124 is four (4) and each column may be formed of 16200 rows.

Accordingly, from among the 180 groups constituting the LDPC codeword, 45 bit groups ($X_{55}$, $X_{146}$, $X_{83}$, $X_{52}$, $X_{62}$, $X_{176}$, $X_{160}$, $X_{68}$, $X_{53}$, $X_{56}$, $X_{81}$, $X_{97}$, $X_{79}$, $X_{113}$, $X_{163}$, $X_{61}$, $X_{58}$, $X_{69}$, $X_{133}$, $X_{108}$, $X_{66}$, $X_{71}$, $X_{86}$, $X_{144}$, $X_{57}$, $X_{67}$, $X_{116}$, $X_{59}$, $X_{70}$, $X_{156}$, $X_{172}$, $X_{65}$, $X_{149}$, $X_{155}$, $X_{82}$, $X_{138}$, $X_{136}$, $X_{141}$, $X_{111}$, $X_{96}$, $X_{170}$, $X_{90}$, $X_{140}$, $X_{64}$, $X_{159}$) may be inputted to the first column of the block interleaver 124, 45 bit groups ($X_{15}$, $X_{14}$, $X_{37}$, $X_{54}$, $X_{44}$, $X_{63}$, $X_{43}$, $X_{18}$, $X_{47}$, $X_7$, $X_{25}$, $X_{34}$, $X_{29}$, $X_{30}$, $X_{26}$, $X_{39}$, $X_{16}$, $X_{41}$, $X_{45}$, $X_{36}$, $X_0$, $X_{23}$, $X_{32}$, $X_{28}$, $X_{27}$, $X_{38}$, $X_{48}$, $X_{33}$, $X_{22}$, $X_{49}$, $X_{51}$, $X_{60}$, $X_{46}$, $X_{21}$, $X_4$, $X_3$, $X_{20}$, $X_{13}$, $X_{50}$, $X_{35}$, $X_{24}$, $X_{40}$, $X_{17}$, $X_{42}$, $X_6$) may be inputted to the second column of the block interleaver 124, 45 bit groups ($X_{112}$, $X_{93}$, $X_{127}$, $X_{101}$, $X_{94}$, $X_{115}$, $X_{105}$, $X_{31}$, $X_{19}$, $X_{177}$, $X_{74}$, $X_{10}$, $X_{145}$, $X_{162}$, $X_{102}$, $X_{120}$, $X_{126}$, $X_{95}$, $X_{73}$, $X_{152}$, $X_{129}$, $X_{174}$, $X_{125}$, $X_{72}$, $X_{128}$, $X_{78}$, $X_{171}$, $X_8$, $X_{142}$, $X_{178}$, $X_{154}$, $X_{85}$, $X_{107}$, $X_{75}$, $X_{12}$, $X_9$, $X_{151}$, $X_{77}$, $X_{117}$, $X_{109}$, $X_{80}$, $X_{106}$, $X_{134}$, $X_{98}$, $X_1$) may be inputted to the third column of the block interleaver 124, and 45 bit groups ($X_{122}$, $X_{173}$, $X_{161}$, $X_{150}$, $X_{110}$, $X_{175}$, $X_{166}$, $X_{131}$, $X_{119}$, $X_{103}$, $X_{139}$, $X_{148}$, $X_{157}$, $X_{114}$, $X_{147}$, $X_{87}$, $X_{158}$, $X_{121}$, $X_{164}$, $X_{104}$, $X_{89}$, $X_{179}$, $X_{123}$, $X_{118}$, $X_{99}$, $X_{88}$, $X_{11}$, $X_{92}$, $X_{165}$, $X_{84}$, $X_{168}$, $X_{124}$, $X_{169}$, $X_2$, $X_{130}$, $X_{167}$, $X_{153}$, $X_{137}$, $X_{143}$, $X_{91}$, $X_{100}$, $X_5$, $X_{76}$, $X_{132}$, $X_{135}$) may be inputted to the fourth column of the block interleaver 124.

In addition, the block interleaver 124 may output the bits inputted to the 1st row to the last row of each column serially, and the bits outputted from the block interleaver 124 may be inputted to the modulator 130 serially. In this case, the demultiplexer (not shown) may be omitted or the bits may be outputted serially without changing the order of bits inputted to the demultiplexer (not shown). Accordingly, the bits included in each of the bit groups $X_{55}$, $X_{15}$, $X_{112}$, and $X_{122}$ may constitute the modulation symbol.

When the modulation method is 64-QAM, the number of columns of the block interleaver 124 is six (6) and each column may be formed of 10800 rows.

Accordingly, from among the 180 groups constituting the LDPC codeword, 30 bit groups ($X_{55}$, $X_{146}$, $X_{83}$, $X_{52}$, $X_{62}$, $X_{176}$, $X_{160}$, $X_{68}$, $X_{53}$, $X_{56}$, $X_{81}$, $X_{97}$, $X_{79}$, $X_{113}$, $X_{163}$, $X_{61}$, $X_{58}$, $X_{69}$, $X_{133}$, $X_{108}$, $X_{66}$, $X_{71}$, $X_{86}$, $X_{144}$, $X_{57}$, $X_{67}$, $X_{116}$, $X_{59}$, $X_{70}$, $X_{156}$) may be inputted to the first column of the block interleaver 124, 30 bit groups ($X_{172}$, $X_{65}$, $X_{149}$, $X_{155}$, $X_{82}$, $X_{138}$, $X_{136}$, $X_{141}$, $X_{111}$, $X_{96}$, $X_{170}$, $X_{90}$, $X_{140}$, $X_{64}$, $X_{159}$, $X_{15}$, $X_{14}$, $X_{37}$, $X_{54}$, $X_{44}$, $X_{63}$, $X_{43}$, $X_{18}$, $X_{47}$, $X_7$, $X_{25}$, $X_{34}$, $X_{29}$, $X_{30}$, $X_{26}$) may be inputted to the second column of the block interleaver 124, 30 bit groups ($X_{39}$, $X_{16}$, $X_{41}$, $X_{45}$, $X_{36}$, $X_0$, $X_{23}$, $X_{32}$, $X_{28}$, $X_{27}$, $X_{38}$, $X_{48}$, $X_{33}$, $X_{22}$, $X_{49}$, $X_{51}$, $X_{60}$, $X_{46}$, $X_{21}$, $X_4$, $X_3$, $X_{20}$, $X_{13}$, $X_{50}$, $X_{35}$, $X_{24}$, $X_{40}$, $X_{17}$, $X_{42}$, $X_6$) may be inputted to the third column of the block interleaver 124, 30 bit groups ($X_{112}$, $X_{93}$, $X_{127}$, $X_{101}$, $X_{94}$, $X_{115}$, $X_{105}$, $X_{31}$, $X_{19}$, $X_{177}$, $X_{74}$, $X_{10}$, $X_{145}$, $X_{162}$, $X_{102}$, $X_{120}$, $X_{126}$, $X_{95}$, $X_{73}$, $X_{152}$, $X_{129}$, $X_{174}$, $X_{125}$, $X_{72}$, $X_{128}$, $X_{78}$, $X_{171}$, $X_8$, $X_{142}$, $X_{178}$) may be inputted to the fourth column of the block interleaver 124, 30 bit groups ($X_{154}$, $X_{85}$, $X_{107}$, $X_{75}$, $X_{12}$, $X_9$, $X_{151}$, $X_{77}$, $X_{117}$, $X_{109}$, $X_{80}$, $X_{106}$, $X_{134}$, $X_{98}$, $X_1$, $X_{122}$, $X_{173}$, $X_{161}$, $X_{150}$, $X_{110}$, $X_{175}$, $X_{166}$, $X_{131}$, $X_{119}$, $X_{103}$, $X_{139}$, $X_{148}$, $X_{157}$, $X_{114}$, $X_{147}$) may be inputted to the fifth column of the block interleaver 124, and 30 bit groups ($X_{87}$, $X_{158}$, $X_{121}$, $X_{164}$, $X_{104}$, $X_{89}$, $X_{179}$, $X_{123}$, $X_{118}$, $X_{99}$, $X_{88}$, $X_{11}$, $X_{92}$, $X_{165}$, $X_{84}$, $X_{168}$, $X_{124}$, $X_{169}$, $X_2$, $X_{130}$, $X_{167}$, $X_{153}$, $X_{137}$, $X_{143}$, $X_{91}$, $X_{100}$, $X_5$, $X_{76}$, $X_{132}$, $X_{135}$) may be inputted to the sixth column of the block interleaver 124.

In addition, the block interleaver 124 may output the bits inputted to the 1st row to the last row of each column serially, and the bits outputted from the block interleaver 124 may be inputted to the modulator 130 serially. In this case, the demultiplexer (not shown) may be omitted or the bits may be outputted serially without changing the order of bits inputted to the demultiplexer (not shown). Accordingly, the bits included in each of the bit groups $X_{55}$, $X_{172}$, $X_{39}$, $X_{112}$, $X_{154}$, and $X_{87}$ may constitute the modulation symbol.

As described above, since a specific bit is mapped onto a specific bit in a modulation symbol through interleaving, a receiver side can achieve high receiving performance and high decoding performance.

That is, when LDPC codeword bits of high decoding performance are mapped onto high reliability bits from among bits of each modulation symbol, the receiver side may show high decoding performance, but there is a problem that the LDPC codeword bits of the high decoding performance may not be received. In addition, when the LDPC codeword bits of high decoding performance are mapped onto low reliability bits from among the bits of the modulation symbol, initial receiving performance is excellent, and thus, overall performance is also excellent. However, when many bits showing poor decoding performance are received, error propagation may occur.

Accordingly, when LDPC codeword bits are mapped onto modulation symbols, an LDPC codeword bit having a specific codeword characteristic is mapped onto a specific bit of a modulation symbol by considering both codeword characteristics of the LDPC codeword bits and reliability of the bits of the modulation symbol, and is transmitted to the receiver side. Accordingly, the receiver side can achieve high receiving performance and decoding performance.

Hereinafter, a method for determining $\pi(j)$, which is a parameter used for group interleaving, according to various exemplary embodiments, will be explained.

According to an exemplary embodiment, when the length of the LDPC codeword is 64800, the size of the bit group is determined to be 360 and thus 180 bit groups exist. In addition, there may be 180! possible interleaving patterns (Herein, factorial means $A!=A\times(A-1)\times\ldots\times2\times1$) regarding an integer A.

In this case, since a reliability level between the bits constituting a modulation symbol may be the same according to a modulation order, many number of interleaving patterns may be regarded as the same interleaving operation when theoretical performance is considered. For example, when an MSB bit of the X-axis (or rear part-axis) and an MSB bit the Y-axis (or imaginary part-axis) of a certain modulation symbol have the same theoretical reliability, the same theoretical performance can be achieved regardless of the way how specific bits are interleaved to be mapped onto the two MSB bits.

However, such a theoretical prediction may become incorrect as a real channel environment is established. For example, in the case of the QPSK modulation method, two bits of a symbol in a part of a symmetric channel like an additive white Gaussian noise (AWGN) channel theoretically have the same reliability. Therefore, there should be no difference in the performance theoretically when any interleaving method is used. However, in a real channel environment, the performance may be different depending on the interleaving method. In the case of a well-known Rayleigh channel which is not a real channel, the performance of QPSK greatly depends on the interleaving method and thus the performance can be predicted somewhat only by the reliability between bits of a symbol according to a modulation method. However, there should be a limit to predicting the performance.

In addition, since code performance by interleaving may be greatly changed according to a channel which evaluates performance, channels should be always considered to drive an interleaving pattern. For example, a good interleaving pattern in the AWGN channel may be not good in the Rayleigh channel. If a channel environment where a given system is used is closer to the Rayleigh channel, an interleaving pattern which is better in the Rayleigh channel than in the AWGN channel may be selected.

As such, not only a specific channel environment but also various channel environments considered in a system should be considered in order to derive a good interleaving pattern. In addition, since there is a limit to predicting real performance only by theoretical performance prediction, the performance should be evaluated by directly conducting computation experiments and then the interleaving pattern should be finally determined.

However, since there are so many number of possible interleaving patterns to be applied (for example, 180!), reducing the number of interleaving patterns used to predict and test performance is an important factor in designing a high performance interleaver.

Therefore, the interleaver is designed through the following steps according to an exemplary embodiment.

1) Channels $C_1, C_2, \ldots, C_k$ to be considered by a system are determined.

2) A certain interleaver pattern is generated.

3) A theoretical performance value is predicted by applying the interleaver generated in step 2) to each of the channels determined in step 1). There are various methods for predicting a theoretical performance value, but a well-known noise threshold determining method like density evolution analysis is used according to an exemplary embodiment. The noise threshold recited herein refers to a value that can be expressed by a minimum necessary signal-to-noise ratio (SNR) capable of error-free transmission on the assumption that a cycle-free characteristic is satisfied when the length of a code is infinite and the code is expressed by the Tanner graph. The density evolution analysis may be implemented in various ways, but is not the subject matter of the inventive concept and thus a detailed description thereof is omitted.

4) When noise thresholds for the channels are expressed as $TH_1[i]$, $TH_2[i]$, . . . , $TH_k[i]$ for the i-th generated interleaver, a final determination threshold value may be defined as follows:

$$TH[i]=W_1\times TH_1[i]+W_2\times TH_2[i]+\ldots+W_k\times TH_k[i],$$

$$\text{where } W_1+W_2+\ldots+W_k=1,\ W_1,W_2,\ldots,W_k>0$$

Here, $W_1$, $W_2$, . . . , $W_k$ are adjusted according to importance of the channels. That is, $W_1$, $W_2$, . . . , $W_k$ are adjusted to a larger value in a more important channel and $W_1$, $W_2$, . . . , $W_k$ are adjusted to a smaller value in a less important channel (for example, if the weight values of AWGN and Rayleigh channels are $W_1$ and $W_2$, respectively, $W_1$ may be set to 0.25 and $W_2$ may be set to 0.75 when one of the channels is determined to be more important.).

5) B number of interleaver patterns are selected in an ascending order of TH[i] values from among the tested interleaver patterns and are directly tested by conducting performance computation experiments. An FER level for the test is determined as 10^−3 (for example, B=100).

6) D number of best interleaver patterns are selected from among the B number of interleaver patterns tested in step 5) (for example, D=5).

Figure 34:
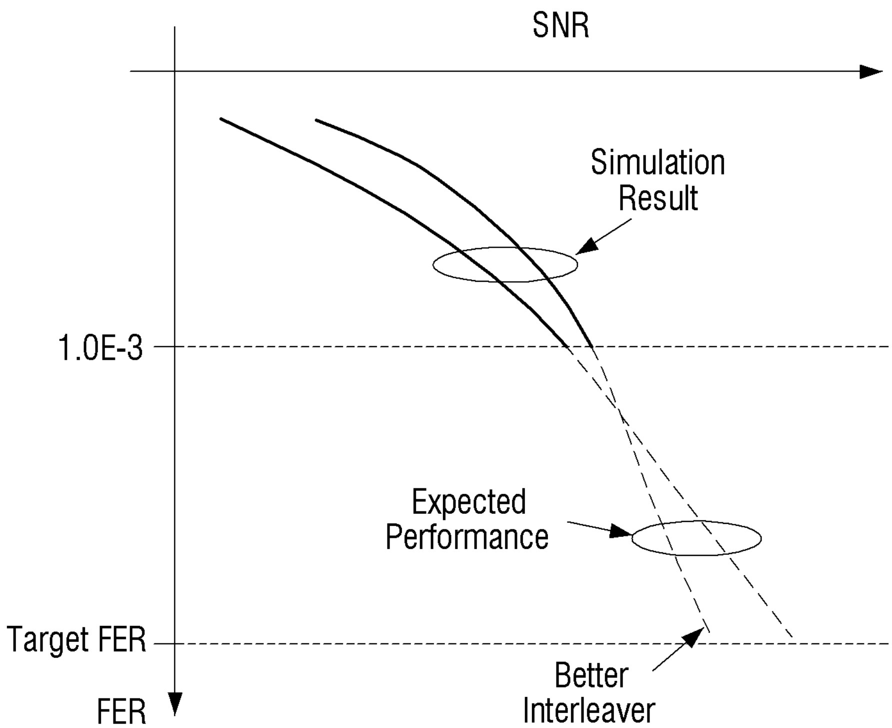
FIGS. 34 and 35 are views to illustrate a method for designing an interleaving pattern, according to exemplary embodiments.

In general, an interleaver pattern which has a great SNR gain in the area of FER=10^−3 may be selected as a good performance interleaver in step of 5). However, according to an exemplary embodiment, as shown in FIG. 34, performance of FER required in the system based on the result of real computation experiments for the area of FER=10^−3 may be predicted through extrapolation, and then an interleaver pattern having good performance in comparison with the expected performance in the FER required in the system may be determined as a good interleaver pattern. According to an exemplary embodiment, the extrapolation based on a linear function may be applied. However, various extrapolation methods may be applied. FIG. 34 illustrates an example of performance extrapolation predicted by the result of computation experiments.

7) The D number of interleaver patterns selected in step 6) are tested by conducting performance computation experiments in each channel. Herein, the FER level for testing is selected as FER required in the system (for example, FER=10^−6)

8) When an error floor is not observed after the computation experiments, an interleaving pattern having the greatest SNR gain is determined as a final interleaving pattern.

Figure 35:
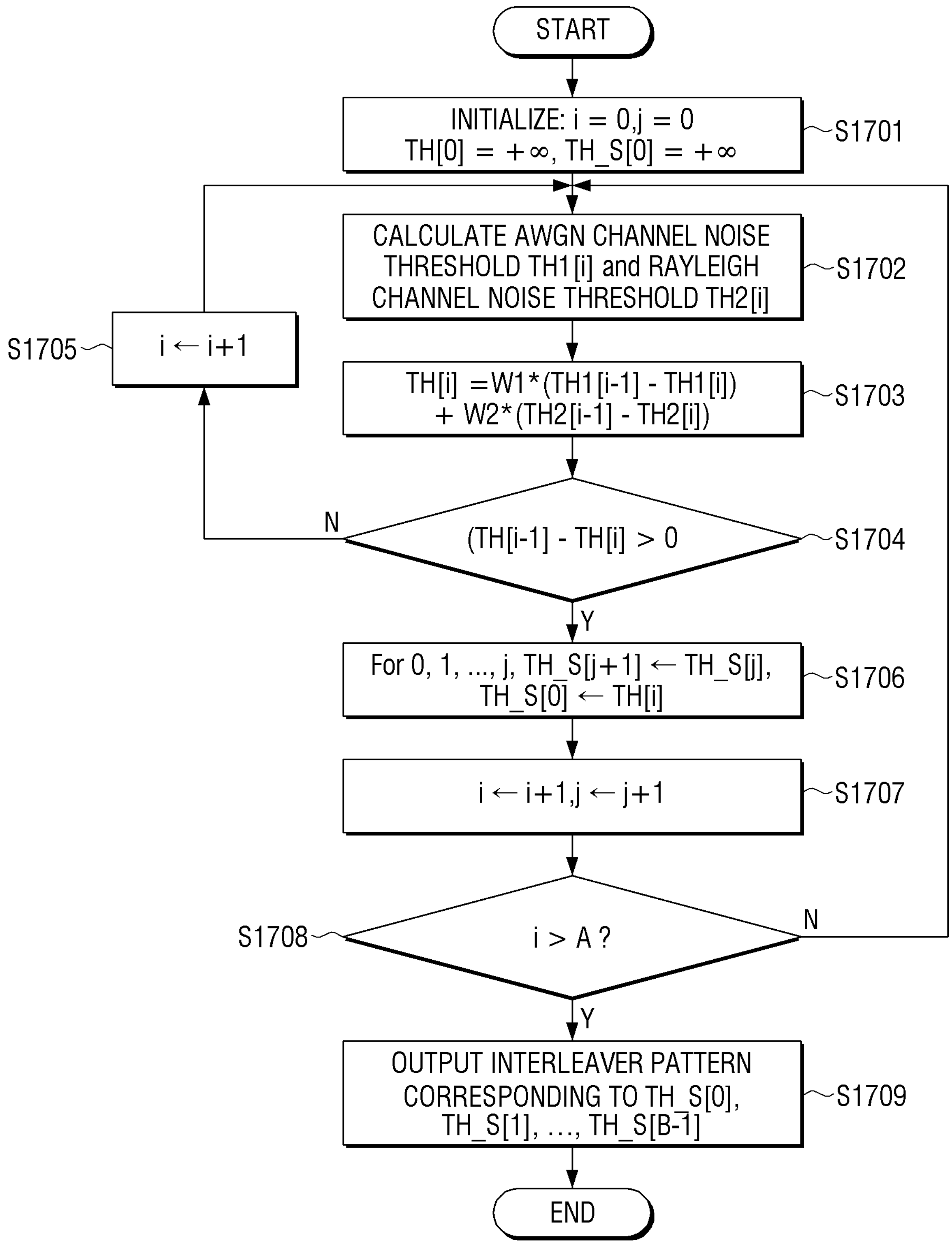

FIG. 35 is a view schematically showing a process of determining B number of interleaver patterns in the steps 2), 3), 4), and 5) of the above-described method for determining the interleaving pattern in the case of AWGN and Rayleigh channels for example.

Referring to FIG. 35, necessary variables i, j, and etc. are initialized in operation S1701, and a noise threshold for the AWGN channel TH1[i] and a noise threshold for the Rayleigh channel TH2[i] are calculated in operation S1702. Then, a final determination noise threshold TH[i] defined in step 4) is calculated in operation S1703, and is compared with a previously calculated final determination noise threshold TH[i−1] in operation S1704. When the final determination noise threshold TH[i] is smaller than the previously calculated final determination noise threshold TH[i−1], TH_S[i] is replaced with the TH[i] and is stored in operation S1706. Next, i, j values increase by 1 in operation S1707 and this process is repeated until the i value exceeds A which is pre-defined in operation S1708. In this case, A is the total number of interleaver patterns to be tested in steps 2), 3), 4), and 5) and A is typically determined to be greater than or equal to 10000. When all operations described above are completed, interleaver patterns corresponding to TH_S[0], TH_S[1], . . . , TH_S[B−1] which are stored in a descending order of final noise thresholds values in operation S1709.

Hereinbelow, the group interleaver design will be described in greater detail.

Meanwhile, as described above, in that each of bit groups constituting the LDPC codeword correspond to each column group of the parity check matrix, a degree of each column group has an effect on decoding performance of the LDPC codeword.

For example, that a degree of column groups is relatively high indicates that there are relatively larger number of parity check equations which are related to bit groups corresponding to column groups, the bit groups which correspond to column groups having a relatively high degree within a parity check matrix formed of a plurality of column groups may have a greater effect on decoding performance of the LDPC codeword rather than bit groups which correspond to column groups having a relatively low degree. In other words, if column groups having a relatively high degree are not mapped appropriately, the performance of the LDPC codeword will be substantially degraded.

Therefore, the group interleaver may be designed such that a bit group(s) having the highest degree, from among the bit groups constituting the LDPC codeword, is interleaved according to the π(j) and mapped to a specific bit of the modulation symbol (or transmission symbol), and the other bit groups not having the highest degree is randomly mapped to the modulation symbol. Under this condition, by observing actual BER/FER performance, the case where the performance of the LDPC codeword is substantially degraded may be avoided.

Hereinbelow, a case where the encoder 110 performs LDPC encoding by using the code rate 10/15 to generate an LDPC codeword having the length of 64800, and constitutes a modulation symbol by using the non-uniform 16-QAM (or 16-NUC) will be described in a greater detail.

In this case, the encoder 110 may perform LDPC encoding based on the parity check matrix comprising the information word submatrix defined by Table 7 and the parity submatrix having a dual diagonal configuration.

Accordingly, the parity check matrix is formed of 180 column groups, and from among the 180 column groups, 24 column groups have the degree of 14, 6 column groups have the degree of 9, 90 column groups have the degree of 3, and 60 column groups have the degree of 2.

Therefore, with respect to only 24 column groups of which the degree is 14, from among the 180 column groups, several π(j) for the 24 column groups may be generated to satisfy a predetermined condition in the group interleaver design, and π(j) for the other column groups may be remain as a blank. The bit groups which correspond to the other column groups may be set to be mapped randomly onto bits constituting the modulation symbol. Then, π(j) for 24 column groups having the most excellent performance is selected by observing actual BER/FER performance regarding a specific SNR value. By fixing a part of π(j), i.e. π(j) for 24 column groups selected as described above, substantial degradation of the performance of the LDPC codeword may be avoided.

TABLE 31

| | Order of bit groups to be block interleaved π(j) (0 ≤ j < 180) | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | | | | 19 | | 21 | | | | | 16 | |
| group-wise | | | | | | | | | | | 9 | |
| interleaver | | | | | | | | | | | | |
| input | | 8 | | 0 | | | | | | | | |
| | | | 7 | | | | | | | | | |
| | | | 5 | | 12 | | | | | | | |
| | 11 | | | | | | | | | | 13 | 15 |
| | | | | | | 1 | 14 | | | | | |

| | Order of bit groups to be block interleaved π(j) (0 ≤ j < 180) | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | | | | | | | | | | | |
| group-wise | | | | | | | | | | | |
| interleaver | | | 4 | | 6 | | 20 | | 3 | | |
| input | | | 2 | | | | | | | | 18 |
| | | | | | 10 | | | | | | |
| | | | | | | | | | | 22 | |
| | 17 | | | 23 | | | | | | | |

Meanwhile, Table 31 may be presented as below Table 31-1.

| Order of bit groups to be block interleaved π(j) (0 ≤ j < 180) | | | | | | | | | | | | | | |
|---|---|---|---|---|---|---|---|---|---|---|---|---|---|---|
| j-th block of group-wise interleaver output | 3 | 5 | 10 | 33 | 60 | 62 | 64 | 66 | 70 | 72 | 83 | 91 | 94 | 176 |
| π(j)-th block of group-wise interleaver input | 19 | 21 | 16 | 9 | 4 | 6 | 20 | 3 | 8 | 0 | 2 | 18 | 7 | 23 |

| Order of bit groups to be block interleaved π(j) (0 ≤ j < 180) | | | | | | | | | | |
|---|---|---|---|---|---|---|---|---|---|---|
| j-th block of group-wise interleaver output | 108 | 117 | 119 | 136 | 138 | 148 | 149 | 166 | 167 | 173 |
| π(j)-th block of group-wise interleaver input | 10 | 5 | 12 | 22 | 11 | 13 | 15 | 1 | 14 | 17 |

In case of Table 31, Equation 21 may be expressed as $Y_3=X_{\pi(3)}=X_{19}$, $Y_5=X_{\pi(5)}=X_{21}$, $Y_{10}=X_{\pi(10)}=X_{16}$, . . . , $Y_{167}=X_{\pi(167)}=X_{14}$, $Y_{173}=X_{\pi(173)}=X_{17}$, $Y_{176}=X_{\pi(176)}=X_{23}$.

That is, the group interleaver 122 may rearrange the order of the plurality of bit groups by changing the $19^{th}$ bit group to the $3^{rd}$ bit group, the 21st bit group to the $5^{th}$ bit group, the $16^{th}$ bit group to the $10^{th}$ bit group, . . . , the $14^{th}$ bit group to the $167^{th}$ bit group, the $17^{th}$ bit group to the $173^{th}$ bit group, and the $23^{th}$ bit group to the $176^{th}$ bit group, and by rearranging randomly the other bit groups.

In a case where some bit groups are already fixed, the aforementioned feature is applied in the same manner. In other words, bit groups which correspond to column groups having a relatively high degree from among the other bit groups which are not fixed may have a greater effect on decoding performance of the LDPC codeword than bit groups which correspond to column groups having a relatively low degree. That is, even in the case where degradation of the performance of the LDPC codeword is prevented by fixing the bit groups having the highest degree, the performance of the LDPC codeword may vary according to a method of mapping the other bit groups. Accordingly, a method of mapping bit groups having the next highest degree needs to be selected appropriately, to avoid the case where the performance is relatively poor.

Therefore, in a case where bit groups having the highest degree are already fixed, bit groups having the next highest degree, from among the bit groups constituting the LDPC codeword, may be interleaved according to the π(j) and mapped to a specific bit of a modulation symbol, and the other bit groups may be randomly mapped. Under this condition, by observing actual BER/FER performance, the case where the performance of the LDPC codeword is substantially degraded may be avoided.

Hereinbelow, a case where the encoder 110 performs LDPC encoding by using the code rate 10/15 to generate an LDPC codeword having the length of 64800, and constitutes a modulation symbol by using the non-uniform 16-QAM (or 16-NUC) will be described in a greater detail.

In this case, the encoder 110 may perform LDPC encoding based on the parity check matrix comprising the information word submatrix defined by Table 7 and the parity submatrix having a dual diagonal configuration.

Accordingly, the parity check matrix is formed of 180 column groups, and from among the 180 column groups, 24 column groups have the degree of 14, 6 column groups have the degree of 9, 90 column groups have the degree of 3, and 60 column groups have the degree of 2.

Therefore, in a case where 24 column groups of which the degree is 14 are already fixed as in Table 31, with respect to only 6 column groups of which the degree is 9, from among the other 156 column groups, several π(j) for the 6 column groups may be generated to satisfy a predetermined condition in a group interleaver design, and π(j) for the other column groups may be remain as a blank. The bit groups which correspond to the other column groups may be set to be mapped randomly onto bits constituting a modulation symbol. Then, π(j) for 6 column groups having the most excellent performance is selected by observing actual BER/FER performance regarding a specific SNR value. By fixing a part of π(j), i.e. π(j) for 6 column groups selected as described above, substantial degradation of the performance of the LDPC codeword may be avoided.

TABLE 32

| Order of bit groups to be block interleaved π(j) (0 ≤ j < 180) | | | | | | | | | | | | |
|---|---|---|---|---|---|---|---|---|---|---|---|---|
| j-th block of group-wise interleaver output | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |

TABLE 32-continued

| | | | | | | | | | | | | |
|---|---|---|---|---|---|---|---|---|---|---|---|---|
| π(j)-th block of | | | | 19 | | 21 | | | | | 16 | |
| group-wise | | | | | | | | | | | 9 | |
| interleaver | | | | | | | | | | | | |
| input | | 8 | | 0 | | | | | | | | |
| | | | 7 | | | | | | | | | |
| | | | 5 | | 12 | | | | | | | |
| | 11 | | | | | | | | | | 13 | 15 |
| | | | | | | 1 | 14 | | | | | |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | | | | | | | | | | | |
| group-wise | | | | | | | | | | | |
| interleaver | | | 4 | | 6 | | 20 | | 3 | | |
| input | | | 2 | | | | | | | | 18 |
| | | | | | 10 | | | | | | |
| | | | | | | | | | | 22 | |
| | 17 | | | 23 | | | | | | | |

TABLE 33

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | | | | 19 | 25 | 21 | | | | 29 | 16 | |
| group-wise | | 28 | | | 26 | | | | | | 9 | |
| interleaver | | | | | | | | | | | | |
| input | | 8 | | 0 | | | | | | | | |
| | | | 7 | | | | | | | | | |
| | | | 5 | | 12 | | | | | | | |
| | 11 | 27 | | | | | | | | | 13 | 15 |
| | | | | | | 1 | 14 | | | | | |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | | | | | | | | | | | |
| group-wise | | | | | | | | | | | |
| interleaver | | | 4 | | 6 | | 20 | | 3 | | |
| input | | | 2 | | | | | | | | 18 |
| | | | | | 10 | | | | | | |
| | | | | | | | | | | 22 | |
| | 17 | | | 23 | | | 24 | | | | |

Meanwhile, Table 33 may be presented as below Table 33-1.

| Order of bit groups to be block interleaved π(j) (0 ≤ j < 180) | | | | | | | | | | | | |
|---|---|---|---|---|---|---|---|---|---|---|---|---|
| j-th block of | 3 | 4 | 5 | 9 | 10 | 24 | 27 | 33 | 60 | 62 | 64 | 66 |
| group-wise | 148 | 149 | 166 | 167 | 173 | 176 | 179 | | | | | |
| interleaver | | | | | | | | | | | | |
| output | | | | | | | | | | | | |

-continued

| | | | | | | | | | | | | |
|---|---|---|---|---|---|---|---|---|---|---|---|---|
| π(j)-th block of group-wise interleaver input | 19 | 25 | 21 | 29 | 16 | 28 | 26 | 9 | 4 | 6 | 20 | 3 |
| | 13 | 15 | 1 | 14 | 17 | 23 | 24 | | | | | |

| Order of bit groups to be block interleaved π(j) (0 ≤ j < 180) | | | | | | | | | | | |
|---|---|---|---|---|---|---|---|---|---|---|---|
| j-th block of group-wise interleaver output | 70 | 72 | 83 | 91 | 94 | 108 | 117 | 119 | 136 | 138 | 139 |
| π(j)-th block of group-wise interleaver input | 8 | 0 | 2 | 18 | 7 | 10 | 5 | 12 | 22 | 11 | 27 |

In case of Table 33, Equation 21 may be expressed as $Y_3=X_{\pi(3)}=X_{19}$, $Y_4=X_{\pi(4)}=X_{25}$, $Y_5=X_{\pi(5)}=X_{21}$, . . . , $Y_{173}=X_{\pi(173)}=X_{17}$, $Y_{176}=X_{\pi(176)}=X_{23}$, $Y_{179}=X_{\pi(179)}=X_{24}$.

That is, the group interleaver 122 may rearrange the order of the plurality of bit groups by changing the $19^{th}$ bit group to the $3^{rd}$ bit group, the $25^{th}$ bit group to the $4^{th}$ bit group, the 21st bit group to the $5^{th}$ bit group, . . . , the $17^{th}$ bit group to the $173^{th}$ bit group, and the $23^{th}$ bit group to the $176^{th}$ bit group, the $24^{th}$ bit group to the $179^{th}$ bit group, and by rearranging randomly the other bit groups.

In a case where some bit groups among the plurality of bit groups constituting the LDPC codeword are already fixed, a bit group(s) having the highest degree among the other bit groups, may be interleaved according to the π(j) and mapped to a specific bit of a modulation symbol, and the other bit groups may be randomly mapped. Under this condition, by observing actual BER/FER performance, the case where the performance of the LDPC codeword is substantially degraded may be avoided.

Hereinbelow, a case where the encoder 110 performs LDPC encoding by using the code rate 10/15 to generate an LDPC codeword having the length of 64800, and constitutes a modulation symbol by using the non-uniform 16-QAM (or 16-NUC) will be described in a greater detail.

In this case, the encoder 110 may perform LDPC encoding based on the parity check matrix comprising the information word submatrix defined by Table 7 and the parity submatrix having a dual diagonal configuration.

Accordingly, the parity check matrix is formed of 180 column groups, and from among the 180 column groups, 24 column groups have the degree of 14, 6 column groups have the degree of 9, 90 column groups have the degree of 3, and 60 column groups have the degree of 2.

Therefore, a case where 24 column groups of which the degree is 14 and 6 column groups of which the degree is 9 are already fixed as in Table 33, with respect to only 90 column groups of which the degree is 3, from among the other 150 column groups, several π(j) for the 90 column groups may be generated to satisfy a predetermined condition in the first step of a group interleaver design, and π(j) for the other column groups may be remained as a blank. Bit groups which correspond to the other column groups may be set to be mapped randomly onto bits constituting a modulation symbol. Then, π(j) for 90 column groups having the most excellent performance is selected by observing actual BER/FER performance regarding a specific SNR value. By fixing a part of π(j), i.e. π(j) for 90 column groups selected as described above, substantial degradation of the performance of the LDPC codeword may be avoided.

TABLE 34

| Order of bit groups to be block interleaved π(j) (0 ≤ j < 180) | | | | | | | | | | | | |
|---|---|---|---|---|---|---|---|---|---|---|---|---|
| j-th block of group-wise interleaver output | 0 | 1 | 2 | 3 | 4 | 5 | 6 | 7 | 8 | 9 | 10 | 11 |
| | 23 | 24 | 25 | 26 | 27 | 28 | 29 | 30 | 31 | 32 | 33 | 34 |
| | 46 | 47 | 48 | 49 | 50 | 51 | 52 | 53 | 54 | 55 | 56 | 57 |
| | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of group-wise interleaver input | | | | 19 | 25 | 21 | | | | 29 | 16 | |
| | | 28 | | | 26 | | | | | | 9 | |
| | | | | | | | | | | | | |
| | | 8 | | 0 | | | | | | | | |
| | | | 7 | | | | | | | | | |
| | | | 5 | | 12 | | | | | | | |
| | 11 | 27 | | | | | | | | | 13 | 15 |
| | | | | | | 1 | 14 | | | | | |

| Order of bit groups to be block interleaved π(j) (0 ≤ j < 180) | | | | | | | | | | | |
|---|---|---|---|---|---|---|---|---|---|---|---|
| j-th block of group-wise interleaver output | 12 | 13 | 14 | 15 | 16 | 17 | 18 | 19 | 20 | 21 | 22 |
| | 35 | 36 | 37 | 38 | 39 | 40 | 41 | 42 | 43 | 44 | 45 |
| | 58 | 59 | 60 | 61 | 62 | 63 | 64 | 65 | 66 | 67 | 68 |
| | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |

TABLE 34-continued

| | | | | | | | | | | | |
|---|---|---|---|---|---|---|---|---|---|---|---|
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | | | | | | | | | | | |
| group-wise | | | | | | | | | | | |
| interleaver | | | 4 | | 6 | | 20 | | 3 | | |
| input | | | 2 | | | | | | | | 18 |
| | | | | | 10 | | | | | | |
| | | | | | | | | | | 22 | |
| | 17 | | | 23 | | | 24 | | | | |

TABLE 35

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 34 |
| interleaver | 46 | 47 | 48 | 49 | 50 | 51 | 52 | 53 | 54 | 55 | 56 | 57 |
| output | 69 | 70 | 71 | 72 | 73 | 74 | 75 | 76 | 77 | 78 | 79 | 80 |
| | 92 | 93 | 94 | 95 | 96 | 97 | 98 | 99 | 100 | 101 | 102 | 103 |
| | 115 | 116 | 117 | 118 | 119 | 120 | 121 | 122 | 123 | 124 | 125 | 126 |
| | 138 | 139 | 140 | 141 | 142 | 143 | 144 | 145 | 146 | 147 | 148 | 149 |
| | 161 | 162 | 163 | 164 | 165 | 166 | 167 | 168 | 169 | 170 | 171 | 172 |
| π(j)-th block of | 68 | 71 | 54 | 19 | 25 | 21 | 102 | 32 | 105 | 29 | 16 | 79 |
| group-wise | 57 | 28 | 76 | 31 | 26 | 96 | 65 | 119 | 114 | 109 | 9 | |
| interleaver | 38 | 77 | 115 | 56 | 87 | 113 | 100 | 75 | 72 | 60 | 47 | 92 |
| input | 104 | 8 | 34 | 0 | 84 | 111 | 35 | 30 | 64 | 55 | 80 | 40 |
| | 50 | 33 | 7 | | 51 | | 106 | | 88 | | 117 | |
| | 41 | | 5 | | 12 | 52 | 99 | | | 78 | | |
| | 11 | 27 | | | | | | | | | 13 | 15 |
| | | | | | | 1 | 14 | | | | | |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 35 | 36 | 37 | 38 | 39 | 40 | 41 | 42 | 43 | 44 | 45 |
| interleaver | 58 | 59 | 60 | 61 | 62 | 63 | 64 | 65 | 66 | 67 | 68 |
| output | 81 | 82 | 83 | 84 | 85 | 86 | 87 | 88 | 89 | 90 | 91 |
| | 104 | 105 | 106 | 107 | 108 | 109 | 110 | 111 | 112 | 113 | 114 |
| | 127 | 128 | 129 | 130 | 131 | 132 | 133 | 134 | 135 | 136 | 137 |
| | 150 | 151 | 152 | 153 | 154 | 155 | 156 | 157 | 158 | 159 | 160 |
| | 173 | 174 | 175 | 176 | 177 | 178 | 179 | | | | |
| π(j)-th block of | 53 | 82 | 107 | 91 | 67 | 94 | 85 | 48 | 83 | 58 | 42 |
| group-wise | 81 | 43 | 103 | 93 | 70 | 46 | 89 | 112 | 61 | 45 | 66 |
| interleaver | 36 | 98 | 4 | 59 | 6 | 44 | 20 | 86 | 3 | 73 | 95 |
| input | 97 | 101 | 2 | 69 | 63 | 74 | 62 | 118 | 110 | | 18 |
| | | | 116 | | 10 | 39 | | | 90 | 37 | |
| | | | | | | | | 108 | | 22 | 49 |
| | 17 | | | 23 | | | 24 | | | | |

Meanwhile, Table 35 may be presented as below Table 35-1.

| Order of bit groups to be block interleaved π(j) (0 ≤ j < 180) | | | | | | | | | | | | |
|---|---|---|---|---|---|---|---|---|---|---|---|---|
| j-th block of | 0 | 1 | 2 | 3 | 4 | 5 | 6 | 7 | 8 | 9 | 10 | 11 |
| group-wise | 23 | 24 | 25 | 26 | 27 | 28 | 29 | 30 | 31 | 32 | 33 | 35 |
| interleaver | 47 | 48 | 49 | 50 | 51 | 52 | 53 | 54 | 55 | 56 | 57 | 58 |
| output | 70 | 71 | 72 | 73 | 74 | 75 | 76 | 77 | 78 | 79 | 80 | 81 |
| | 94 | 96 | 98 | 100 | 102 | 106 | 108 | 109 | 112 | 113 | 115 | 117 |
| | 166 | 167 | 173 | 176 | 179 | | | | | | | |
| π(j)-th block of | 68 | 71 | 54 | 19 | 25 | 21 | 102 | 32 | 105 | 29 | 16 | 79 |
| group-wise | 57 | 28 | 76 | 31 | 26 | 96 | 65 | 119 | 114 | 109 | 9 | 81 |
| interleaver | 77 | 115 | 56 | 87 | 113 | 100 | 75 | 72 | 60 | 47 | 92 | 36 |
| input | 8 | 34 | 0 | 84 | 111 | 35 | 30 | 64 | 55 | 80 | 40 | 97 |
| | 7 | 51 | 106 | 88 | 117 | 116 | 10 | 39 | 90 | 37 | 41 | 5 |
| | 1 | 14 | 17 | 23 | 24 | | | | | | | |

| Order of bit groups to be block interleaved π(j) (0 ≤ j < 180) | | | | | | | | | | | |
|---|---|---|---|---|---|---|---|---|---|---|---|
| j-th block of | 12 | 13 | 14 | 15 | 16 | 17 | 18 | 19 | 20 | 21 | 22 |
| group-wise | 36 | 37 | 38 | 39 | 40 | 41 | 42 | 43 | 44 | 45 | 46 |
| interleaver | 59 | 60 | 61 | 62 | 63 | 64 | 65 | 66 | 67 | 68 | 69 |
| output | 82 | 83 | 84 | 85 | 86 | 87 | 88 | 89 | 91 | 92 | 93 |
| | 119 | 120 | 121 | 124 | 134 | 136 | 137 | 138 | 139 | 148 | 149 |

-continued

| | | | | | | | | | | | |
|---|---|---|---|---|---|---|---|---|---|---|---|
| π(j)-th block of | 53 | 82 | 107 | 91 | 67 | 94 | 85 | 48 | 83 | 58 | 42 |
| group-wise | 43 | 103 | 93 | 70 | 46 | 89 | 112 | 61 | 45 | 66 | 38 |
| interleaver | 98 | 4 | 59 | 6 | 44 | 20 | 86 | 3 | 73 | 95 | 104 |
| input | 101 | 2 | 69 | 63 | 74 | 62 | 118 | 110 | 18 | 50 | 33 |
| | 12 | 52 | 99 | 78 | 108 | 22 | 49 | 11 | 27 | 13 | 15 |

In case of Table 35, Equation 21 may be expressed as $Y_0=X_{\pi(0)}=X_{68}$, $Y_1=X_{\pi(1)}=X_{71}$, $Y_2=X_{\pi(2)}=X_{54}$, . . . , $Y_{173}=X_{\pi(173)}=X_{17}$, $Y_{176}=X_{\pi(176)}=X_{23}$, $Y_{179}=X_{\pi(179)}=X_{24}$.

That is, the group interleaver 122 may rearrange the order of the plurality of bit groups by changing the $68^{th}$ bit group to the $0^{th}$ bit group, the $71^{th}$ bit group to the $1^{st}$ bit group, the $54^{th}$ bit group to the $2^{nd}$ bit group, . . . , the $17^{th}$ bit group to the $173^{th}$ bit group, and the $23^{th}$ bit group to the $176^{th}$ bit group, the $24^{th}$ bit group to the $179^{th}$ bit group, and by rearranging randomly the other bit groups.

In the exemplary embodiments described above, the case of performing LDPC encoding based on the coding rate of 10/15 and the parity check matrix formed of the information word submatrix defined by Table 7 and the parity submatrix having a dual diagonal configuration is described, but this is merely exemplary, and even in a case of performing LDPC encoding based on different code rates and different parity check matrix, π(j) can be determined based on the aforementioned method.

Figure 36:
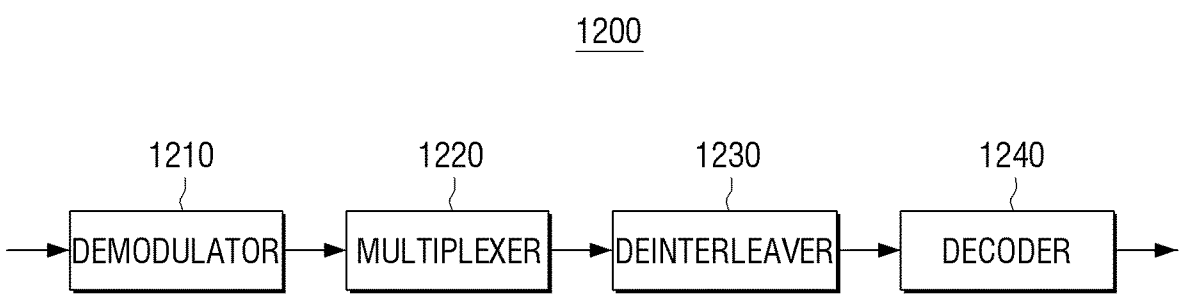
FIG. 36 is a block diagram to illustrate a configuration of a receiving apparatus according to an exemplary embodiment.

The transmitting apparatus 100 may transmit the signal mapped onto the constellation to a receiving apparatus (for example, 1200 of FIG. 36). For example, the transmitting apparatus 100 may map the signal mapped onto the constellation onto an Orthogonal Frequency Division Multiplexing (OFDM) frame using OFDM, and may transmit the signal to the receiving apparatus 1200 through an allocated channel.

FIG. 36 is a block diagram to illustrate a configuration of a receiving apparatus according to an exemplary embodiment. Referring to FIG. 36, the receiving apparatus 1200 includes a demodulator 1210, a multiplexer 1220, a deinterleaver 1230 and a decoder 1240.

The demodulator 1210 receives and demodulates a signal transmitted from the transmitting apparatus 100. Specifically, the demodulator 1210 generates a value corresponding to an LDPC codeword by demodulating the received signal, and outputs the value to the multiplexer 1220. In this case, the demodulator 1210 may use a demodulation method corresponding to a modulation method used in the transmitting apparatus 100. To do so, the transmitting apparatus 100 may transmit information regarding the modulation method to the receiving apparatus 1200, or the transmitting apparatus 100 may perform modulation using a pre-defined modulation method between the transmitting apparatus 100 and the receiving apparatus 1200.

The value corresponding to the LDPC codeword may be expressed as a channel value for the received signal. There are various methods for determining the channel value, and for example, a method for determining a Log Likelihood Ratio (LLR) value may be the method for determining the channel value.

The LLR value is a log value for a ratio of the probability that a bit transmitted from the transmitting apparatus 100 is 0 and the probability that the bit is 1. In addition, the LLR value may be a bit value which is determined by a hard decision, or may be a representative value which is determined according to a section to which the probability that the bit transmitted from the transmitting apparatus 100 is 0 or 1 belongs.

The multiplexer 1220 multiplexes the output value of the demodulator 1210 and outputs the value to the deinterleaver 1230.

Specifically, the multiplexer 1220 is an element corresponding to a demultiplexer (not shown) provided in the transmitting apparatus 100, and performs an operation corresponding to the demultiplexer (not shown). That is, the multiplexer 1220 performs an inverse operation of the operation of the demultiplexer (not shown), and performs cell-to-bit conversion with respect to the output value of the demodulator 1210 and outputs the LLR value in the unit of bit. However, when the demultiplexer (not shown) is omitted from the transmitting apparatus 100, the multiplexer 1220 may be omitted from the receiving apparatus 1200.

The information regarding whether the demultiplexing operation is performed or not may be provided by the transmitting apparatus 100, or may be pre-defined between the transmitting apparatus 100 and the receiving apparatus 1200.

The deinterleaver 1230 deinterleaves the output value of the multiplexer 1220 and outputs the values to the decoder 1240.

Specifically, the deinterleaver 1230 is an element corresponding to the interleaver 120 of the transmitting apparatus 100 and performs an operation corresponding to the interleaver 120. That is, the deinterleaver 1230 deinterleaves the LLR value by performing the interleaving operation of the interleaver 120 inversely.

Figure 37:
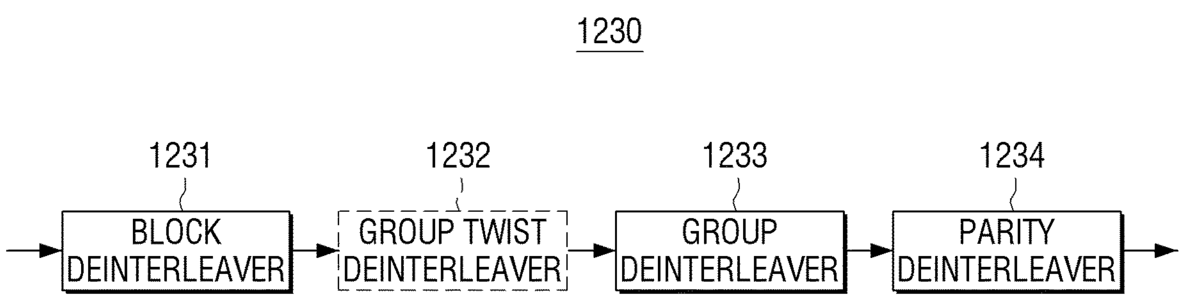
FIG. 37 is a block diagram to illustrate a configuration of a deinterleaver, according to an exemplary embodiment.

To do so, the deinterleaver 1230 may include a block deinterleaver 1231, a group twist deinterleaver 1232, a group deinterleaver 1233, and a parity deinterleaver 1234 as shown in FIG. 37.

The block deinterleaver 1231 deinterleaves the output of the multiplexer 1220 and outputs the value to the group twist deinterleaver 1232.

Specifically, the block deinterleaver 1231 is an element corresponding to the block interleaver 124 provided in the transmitting apparatus 100 and performs the interleaving operation of the block interleaver 124 inversely.

That is, the block deinterleaver 1231 deinterleaves by writing the LLR value output from the multiplexer 1220 in each row in the row direction and reading each column of the plurality of rows in which the LLR value is written in the column direction by using at least one row formed of the plurality of columns.

In this case, when the block interleaver 124 interleaves by dividing the column into two parts, the block deinterleaver 1231 may deinterleave by dividing the row into two parts.

In addition, when the block interleaver 124 writes and reads in and from the bit group that does not belong to the first part in the row direction, the block deinterleaver 1231 may deinterleave by writing and reading values corresponding to the group that does not belong to the first part in the row direction.

Figure 38:
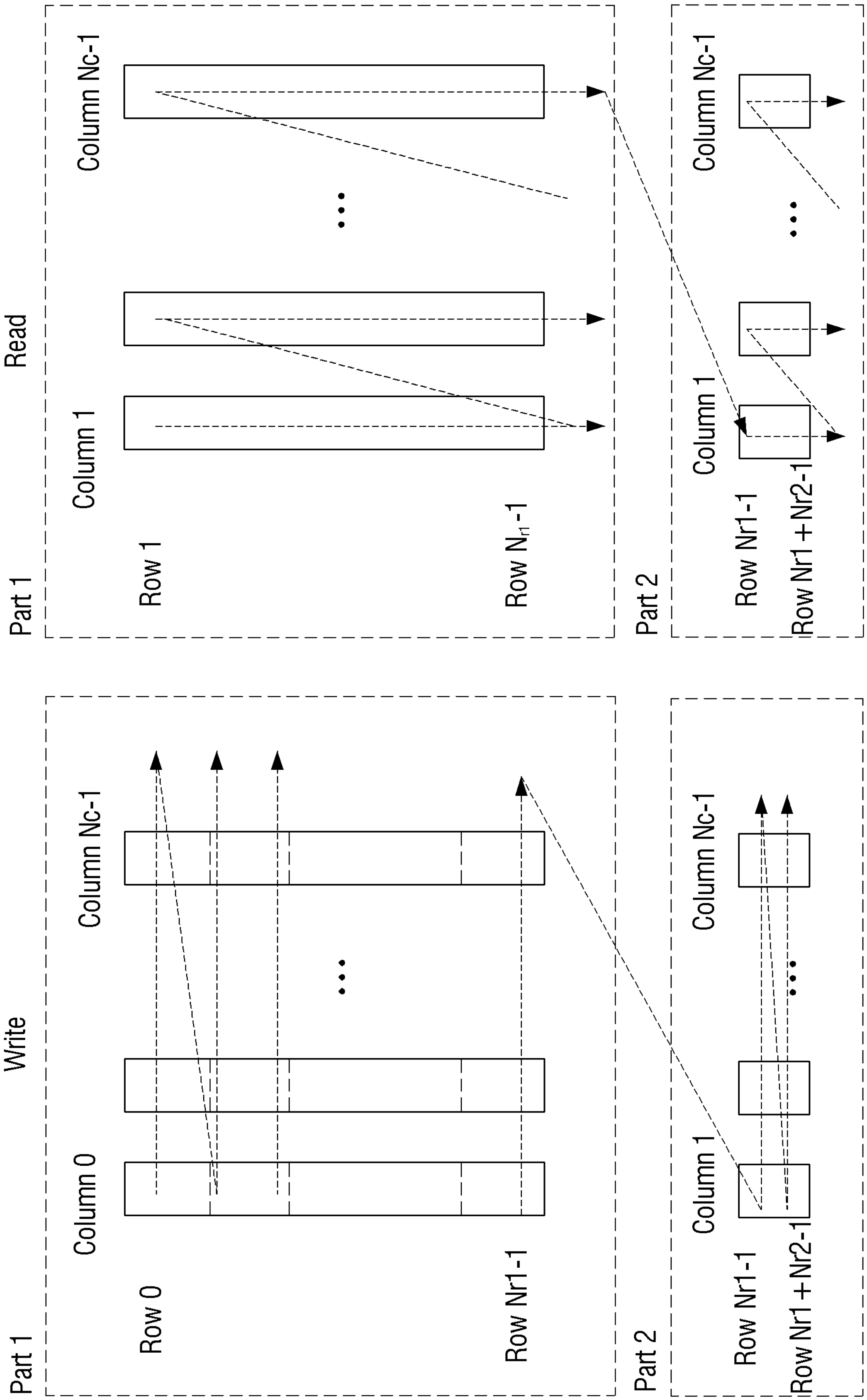
FIG. 38 is a view to illustrate a deinterleaving method of a block deinterleaver, according to an exemplary embodiment.

Hereinafter, the block deinterleaver 1231 will be explained with reference to FIG. 38. However, this is merely an example and the block deinterleaver 1231 may be implemented in other methods.

An input LLR $v_i$ ($0 \le i < N_{ldpc}$) is written in a $r_i$ row and a $c_i$ column of the block deinterleaver 1231. Herein, $c_i = (i \bmod N_c)$ and $$r_i = \left\lfloor \frac{i}{N_c} \right\rfloor,$$

On the other hand, an output LLR $q_i$($0 \le i < N_c \times N_{r1}$) is read from a $c_i$ column and a $r_i$ row of the first part of the block deinterleaver 1231. Herein, $$c_i = \left\lfloor \frac{i}{N_{r1}} \right\rfloor,$$

$r_i = (i \bmod N_{r1})$.

In addition, an output LLR $q_i$($N_c \times N_{r1} < i < N_{ldpc}$) is read from a $c_i$ column and a $r_i$ row of the second part. Herein, $$c_i = \left\lfloor \frac{(i - N_c \times N_{r1})}{N_{r2}} \right\rfloor,$$

$r_i = N_{r1} + \{(i - N_c \times N_r) \text{ mode } N_{r2}\}$.

The group twist deinterleaver 1232 deinterleaves the output value of the block deinterleaver 1231 and outputs the value to the group deinterleaver 1233.

Specifically, the group twist deinterleaver 1232 is an element corresponding to the group twist interleaver 123 provided in the transmitting apparatus 100, and may perform the interleaving operation of the group twist interleaver 123 inversely.

That is, the group twist deinterleaver 1232 may rearrange the LLR values of the same bit group by changing the order of the LLR values existing in the same bit group. When the group twist operation is not performed in the transmitting apparatus 100, the group twist deinterleaver 1232 may be omitted.

The group deinterleaver 1233 (or the group-wise deinterleaver) deinterleaves the output value of the group twist deinterleaver 1232 and outputs the value to the parity deinterleaver 1234.

Specifically, the group deinterleaver 1233 is an element corresponding to the group interleaver 122 provided in the transmitting apparatus 100 and may perform the interleaving operation of the group interleaver 122 inversely.

That is, the group deinterleaver 1233 may rearrange the order of the plurality of bit groups in bit group wise. In this case, the group deinterleaver 1233 may rearrange the order of the plurality of bit groups in bit group wise by applying the interleaving method of Tables 11 to 22 inversely according to a length of the LDPC codeword, a modulation method and a code rate.

The parity deinterleaver 1234 performs parity deinterleaving with respect to the output value of the group deinterleaver 1233 and outputs the value to the decoder 1240.

Specifically, the parity deinterleaver 1234 is an element corresponding to the parity interleaver 121 provided in the transmitting apparatus 100 and may perform the interleaving operation of the parity interleaver 121 inversely. That is, the parity deinterleaver 1234 may deinterleave the LLR values corresponding to the parity bits from among the LLR values output from the group deinterleaver 1233. In this case, the parity deinterleaver 1234 may deinterleave the LLR value corresponding to the parity bits inversely to the parity interleaving method of Equation 18.

However, the parity deinterleaver 1234 may be omitted depending on the decoding method and embodiment of the decoder 1240.

Although the deinterleaver 1230 of FIG. 36 includes three (3) or four (4) elements as shown in FIG. 37, operations of the elements may be performed by a single element. For example, when bits each of which belongs to each of bit groups $X_a$, $X_b$, $X_c$, $X_d$ constitute a single modulation symbol, the deinterleaver 1230 may deinterleave these bits to locations corresponding to their bit groups based on the received single modulation symbol.

For example, when the code rate is 6/15 and the modulation method is 16-QAM, the group deinterleaver 1233 may perform deinterleaving based on table 11.

In this case, bits each of which belongs to each of bit groups $X_{55}$, $X_{15}$, $X_{112}$, $X_{122}$ may constitute a single modulation symbol. Since one bit in each of the bit groups $X_{55}$, $X_{15}$, $X_{112}$, $X_{122}$ constitutes a single modulation symbol, the deinterleaver 1230 may map bits onto decoding initial values corresponding to the bit groups $X_{55}$, $X_{15}$, $X_{112}$, $X_{122}$ based on the received single modulation symbol.

The decoder 1240 may perform LDPC decoding by using the output value of the deinterleaver 1230. To achieve this, the decoder 1240 may include an LDPC decoder (not shown) to perform the LDPC decoding.

Specifically, the decoder 1240 is an element corresponding to the encoder 110 of the transmitting apparatus 100 and may correct an error by performing the LDPC decoding by using the LLR value output from the deinterleaver 1230.

For example, the decoder 1240 may perform the LDPC decoding in an iterative decoding method based on a sum-product algorithm. The sum-product algorithm is one example of a message passing algorithm, and the message passing algorithm refers to an algorithm which exchanges messages (e.g., LLR value) through an edge on a bipartite graph, calculates an output message from messages input to variable nodes or check nodes, and updates.

The decoder 1240 may use a parity check matrix when performing the LDPC decoding. In this case, the parity check matrix used in the decoding may have the same configuration as that of the parity check matrix used in the encoding of the encoder 110, and this has been described above with reference to FIGS. 20 to 22.

In addition, information on the parity check matrix and information on the code rate, etc. which are used in the LDPC decoding may be pre-stored in the receiving apparatus 1200 or may be provided by the transmitting apparatus 100.

Figure 39:
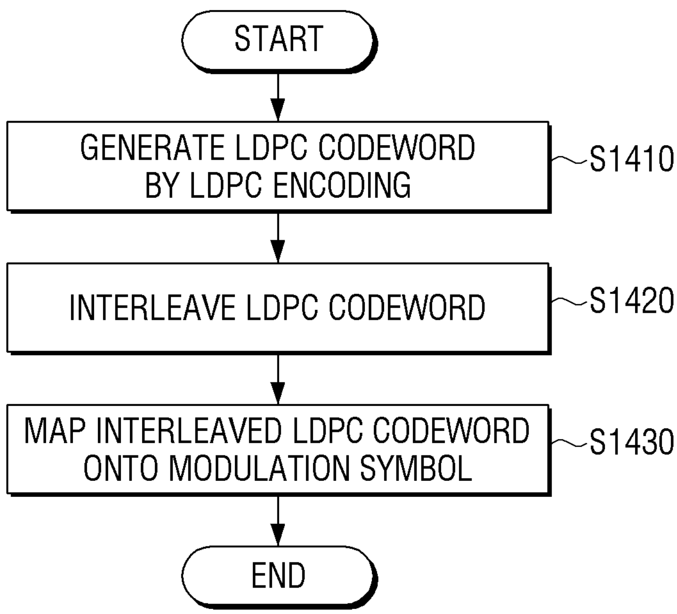
FIG. 39 is a flowchart to illustrate an interleaving method, according to an exemplary embodiment.

FIG. 39 is a flowchart to illustrate an interleaving method of a transmitting apparatus according to an exemplary embodiment.

First, an LDPC codeword is generated by LDPC encoding based on a parity check matrix (S1410), and the LDPC codeword is interleaved (S1420).

Then, the interleaved LDPC codeword is mapped onto a modulation symbol (S1430). In this case, a bit included in a predetermined bit group from among a plurality of bit groups constituting the LDPC codeword may be mapped onto a predetermined bit in the modulation symbol.

Each of the plurality of bit groups may be formed of M number of bits, and M may be a common divisor of $N_{ldpc}$ and $K_{ldpc}$ and may be determined to satisfy $Q_{ldpc}=(N_{ldpc}-K_{ldpc})/M$. Herein, $Q_{ldpc}$ is a cyclic shift parameter value regarding columns in a column group of an information word submatrix of the parity check matrix, $N_{ldpc}$ is a length of the LDPC codeword, and $K_{ldpc}$ is a length of information word bits of the LDPC codeword.

Operation S1420 may include interleaving parity bits of the LDPC codeword, dividing the parity-interleaved LDPC codeword by the plurality of bit groups and rearranging the order of the plurality of bit groups in bit group wise, and interleaving the plurality of bit groups the order of which is rearranged.

The order of the plurality of bit groups may be rearranged in bit group wise based on the above-described Equation 21 presented above.

As described above, π(j) in Equation 21 may be determined based on at least one of a length of the LDPC codeword, a modulation method, and a code rate.

For example, when the LDPC codeword has a length of 64800, the modulation method is 16-QAM, and the code rate is 6/15, π(j) may be defined as in table 11.

In addition, when the LDPC codeword has a length of 64800, the modulation method is 16-QAM, and the code rate is 10/15, π(j) may be defined as in table 14.

In addition, when the LDPC codeword has a length of 64800, the modulation method is 16-QAM, and the code rate is 12/15, π(j) may be defined as in table 15.

In addition, when the LDPC codeword has a length of 64800, the modulation method is 64-QAM, and the code rate is 6/15, π(j) may be defined as in table 17.

In addition, when the LDPC codeword has a length of 64800, the modulation method is 64-QAM, and the code rate is 8/15, π(j) may be defined as in table 18.

In addition, when the LDPC codeword has a length of 64800, the modulation method is 64-QAM, and the code rate is 12/15, π(j) may be defined as in table 21.

The interleaving the plurality of bit groups may include: writing the plurality of bit groups in each of a plurality of columns in bit group wise in a column direction, and reading each row of the plurality of columns in which the plurality of bit groups are written in bit group wise in a row direction.

In addition, the interleaving the plurality of bit groups may include: serially write, in the plurality of columns, at least some bit group which is writable in the plurality of columns in bit group wise from among the plurality of bit groups, and then dividing and writing the other bit groups in an area which remains after the at least some bit group is written in the plurality of columns in bit group wise.

Figure 40:
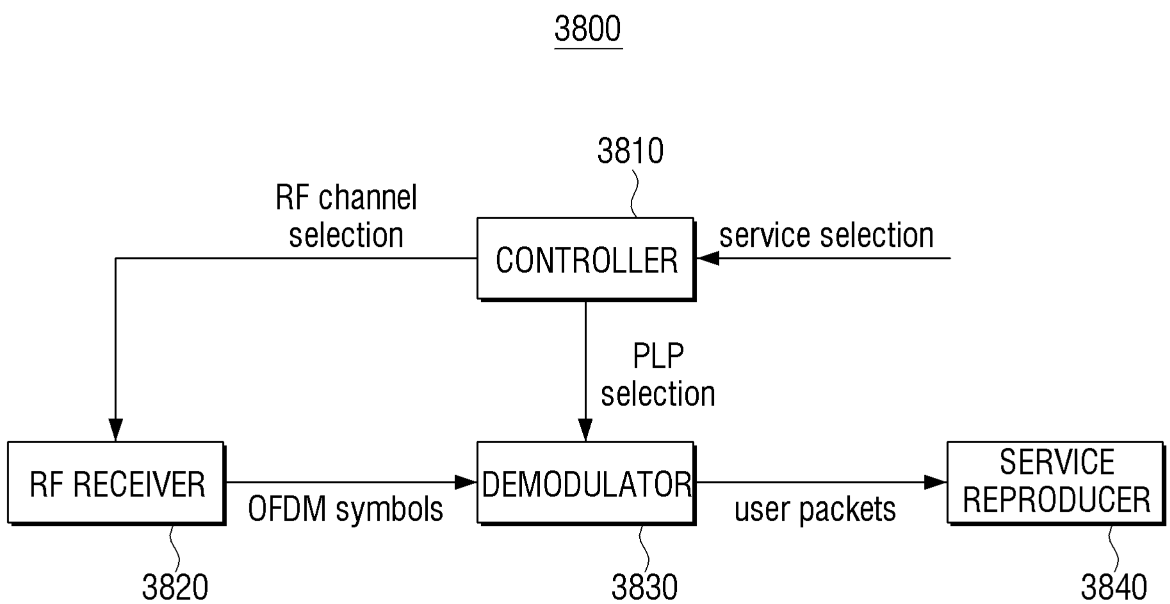
FIG. 40 is a block diagram illustrating a configuration of a receiving apparatus according to an exemplary embodiment.

FIG. 40 is a block diagram illustrating a configuration of a receiving apparatus according to an exemplary embodiment.

Referring to FIG. 40, a receiving apparatus 3800 may comprise a controller 3810, an RF receiver 3820, a demodulator 3830 and a service regenerator 3840.

The controller 3810 determines an RF channel and a PLP through which a selected service is transmitted. The RF channel may be identified by a center frequency and a bandwidth, and the PLP may be identified by its PLP ID. A specific service may be transmitted through at least one PLP included in at least one RF channel, for each component constituting the specific service. Hereinafter, for the sake of convenience of explanation, it is assumed that all of data needed to play back one service is transmitted as one PLP which is transmitted through one RF channel. In other words, a service has only one data obtaining path to reproduce the service, and the data obtaining path is identified by an RF channel and a PLP.

The RF receiver 3820 detects an RF signal from an RF channel selected by a controller 3810 and delivers OFDM symbols, which are extracted by performing signal processing on the RF signal, to the demodulator 3830. Herein, the signal processing may include synchronization, channel estimation, equalization, etc. Information required for the signal processing may be a value predetermined by the receiving apparatus 3810 and a transmitter according to use and implementation thereof and included in a predetermined OFDM symbol among the OFDM symbols and then transmitted to the receiving apparatus.

The demodulator 3830 performs signal processing on the OFDM symbols, extracts user packet and delivers the user packet to a service reproducer 3740, and the service reproducer 3840 uses the user packet to reproduce and then output a service selected by a user. Here, a format of the user packet may differ depending on a service implementation method and may be, for example, a TS packet or a IPv4 packet.

Figure 41:
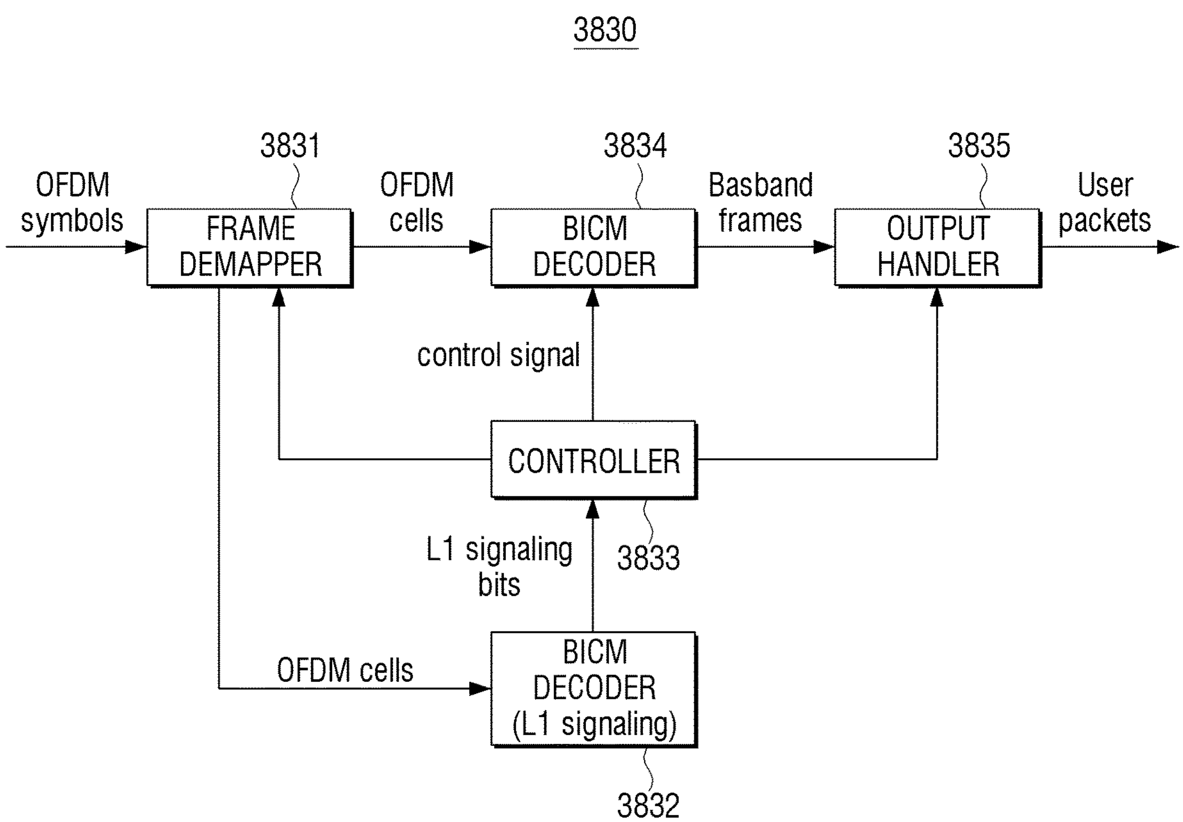
FIG. 41 is a block diagram illustrating a demodulator according to an exemplary embodiment.

FIG. 41 is a block diagram illustrating a demodulator according to an exemplary embodiment.

Referring to FIG. 41, a demodulator 3830 may include a frame demapper 3831, a BICM decoder 3832 for L1 signaling, a controller 3833, a BICM decoder 3834 and an output handler 3835.

The frame demapper 3831 selects a plurality of OFDM cells constituting an FEC block which belongs to a selected PLP in a frame including OFDM symbols, based on control information from the controller 3833, and provides the selected OFDM cells to the BICM decoder 3834. The frame demapper 3831 also selects a plurality of OFDM cells corresponding to at least one FEC block which includes L1 signaling, and delivers the selected OFDM cells to the BICM decoder 3832 for L1 signaling.

The BICM decoder for L1 signaling 3832 performs signal processing on an OFDM cell corresponding to an FEC block which includes L1 signaling, extracts L1 signaling bits and delivers the L signaling bits to the controller 3833. In this case, the signal processing may include an operation of extracting an LLR value for decoding an LDPC codeword and a process of using the extracted LLR value to decode the LDPC codeword.

The controller 3833 extracts an L1 signaling table from the L1 signaling bits and uses the L1 signaling table value to control operations of the frame demapper 3831, the BICM decoder 3834 and the output handler 3835. FIG. 41 illustrates that the BICM decoder 3832 for L1 signaling does not use control information of the controller 3833. However, when the L1 signaling has a layer structure similar to the layer structure of the above described L1 pre signaling and L1 post signaling, it is obvious that the BICM decoder 3832 for L1 signaling may be constituted by at least one BICM decoding block, and operation of this BICM decoding block and the frame demapper 3831 may be controlled by L1 signaling information of an upper layer.

The BICM decoder 3834 performs signal processing on the OFDM cells constituting FEC blocks which belong to a selected PLP to extract BBF (Baseband frame)s and delivers the BBFs to the output handler 3835. In this case, the signal processing may include an operation of extracting an LLR value for decoding an LDPC codeword and an operation of using the extracted LLR value to decode the LDPC codeword, which may be performed based on control information output from the controller 3833.

The output handler 3835 performs signal processing on a BBF, extracts a user packet and delivers the extracted user packet to a service reproducer 3840. In this case, the signal processing may be performed based on control information output from the controller 3833.

According to an exemplary embodiment, the output handler 3835 comprises a BBF handler (not shown) which extracts BBP (Baseband packet) from the BBF.

Figure 42:
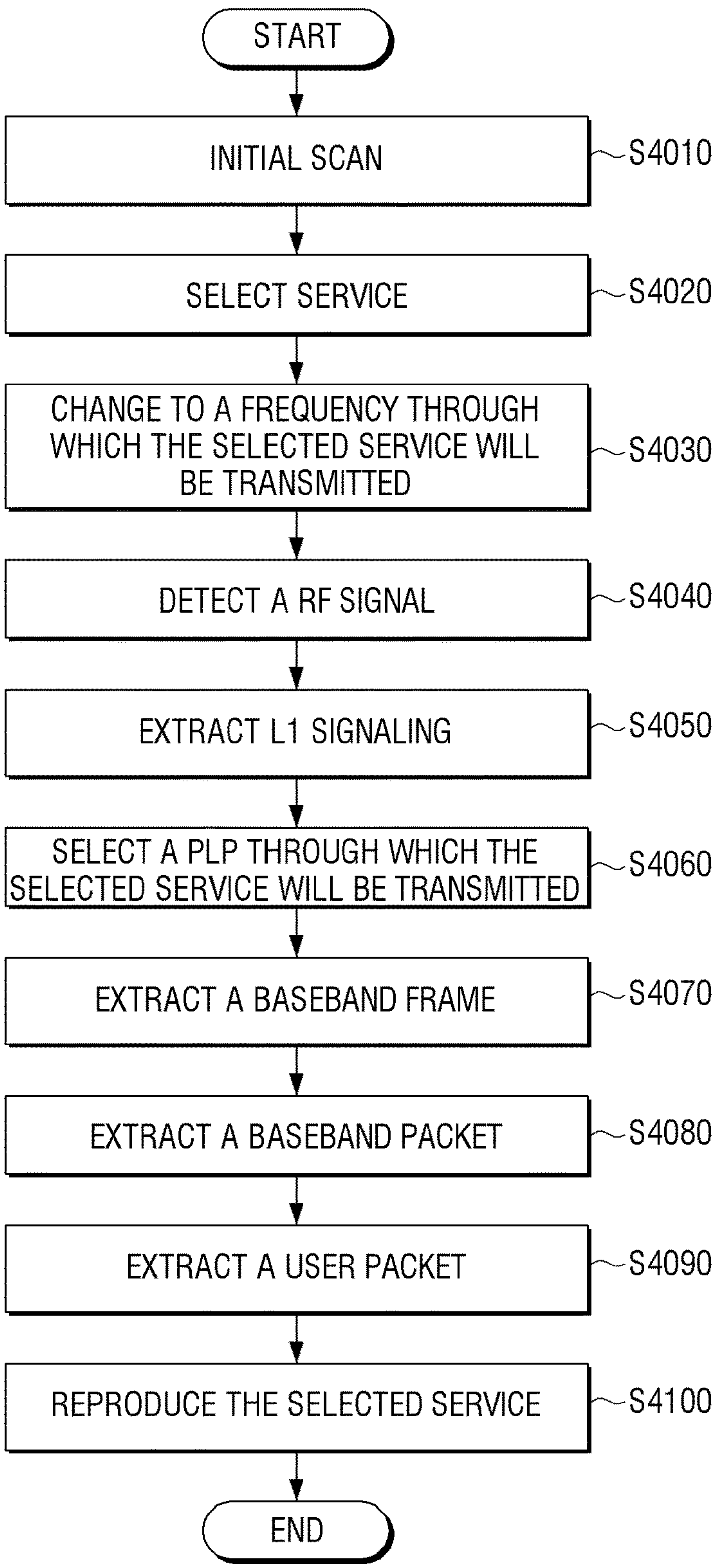
FIG. 42 is a flowchart provided to illustrate an operation of a receiving apparatus from a moment when a user selects a service until the selected service is reproduced, according to an exemplary embodiment.

FIG. 42 is a flowchart provided to illustrate an operation of a receiving apparatus from a moment when a user selects a service until the selected service is reproduced, according to an exemplary embodiment.

It is assumed that service information on all services selectable by a user are acquired at an initial scan (S4010) prior to the user's service selection (S4020). Service information may include information on a RF channel and a PLP which transmits data required to reproduce a specific service in a current receiving apparatus. As an example of the service information, program specific information/service information (PSI/SI) in an MPEG2-TS is available, and normally can be achieved through L2 signaling and an upper-layer signaling.

In the initial scan (S4010), comprehensive information on a payload type of PLPs which are transmitted to a specific frequency band. As an example, there may be information on whether every PLP transmitted to the frequency band includes a specific type of data.

When the user selects a service (S4020), the receiving apparatus transforms the selected service to a transmitting frequency and performs RF signaling detection (S4030). In the frequency transforming operation (S4020), the service information may be used.

When an RF signal is detected, the receiving apparatus performs an L1 signaling extracting operation from the detected RF signal (S4050). Then, the receiving apparatus selects a PLP transmitting the selected service, based on the extracted L1 signaling, (S4060) and extracts a BBF from the selected PLP (S4070). In S4060, the service information may be used.

The operation to extract a BBF (S4070) may include an operation of demapping the transmitted frame and selecting OFDM cells included in a PLP, an operation of extracting an LLR value for LDPC coding/decoding from an OFDM cell, and an operation of decoding the LDPC codeword using the extracted LLR value.

The receiving apparatus, using header information of an extracted BBF, extracts a BBP from the BBF (S4080). The receiving apparatus also uses header information of an extracted BBP to extract a user packet from the extracted BBP (S4090). The extracted user packet is used to reproduce the selected service (S4100). In the BBP extraction operation (S4080) and user packet extraction operation (S4090), L1 signaling information extracted in the L1 signaling extraction operation may be used.

According to an exemplary embodiment, the L1 signaling information includes information on types of a user packet transmitted through a corresponding PLP, and information on an operation used to encapsulate the user packet in a BBF. The foregoing information may be used in the user packet extraction operation (S1480). Specifically, this information may be used in an operation of extracting the user packet which is a reverse operation of encapsulation of the user packet in the BBF. In this case, process for extracting user packet from the BBP (restoring null TS packet and inserting TS sync byte) is same as above description.

A non-transitory computer readable medium, which stores a program for performing the interleaving methods according to various exemplary embodiments in sequence, may be provided.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), a memory card, and a read only memory (ROM), and may be provided.

At least one of the components, elements or units represented by a block as illustrated in FIGS. 18, 23, 33, 36 and 37 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the inventive concept, and many alternatives, modifications, and variations will be apparent to those skilled in the art.

What is claimed is:

1. A receiving method comprising:

receiving a signal from a transmitting apparatus;

demodulating the signal to generate values based on 16-quadrature amplitude modulation (QAM);

splitting the values into a plurality of groups;

deinterleaving the plurality of groups; and decoding values of the deinterleaved plurality of groups based on a low density parity check (LDPC) code, a code rate of the LDPC code being 10/15 and a code length of the LDPC code being 64800 bits, wherein the plurality of groups are deinterleaved based on a following equation:

$$Y_{\pi j}=X_{(j)} \text{ for } (0 \leq j < N_{group}),$$

where x, is a $j^{th}$ group among the plurality of groups, $Y_j$ is a $j^{th}$ group among the deinterleaved plurality of groups, $N_{group}$ is a number of the plurality of groups, and π(j) denotes a deinterleaving order for the deinterleaving, and wherein the π(j) is represented as follows:

| Order of the deinterleaving π(j) (0 ≤ j < 180) | | | | | | | | | | |
|---|---|---|---|---|---|---|---|---|---|---|
| j | 0 | 1 | 2 | 3 | 4 | 5 | 6 | 7 | 8 | 9 |
| | 10 | 11 | 12 | 13 | 14 | 15 | 16 | 17 | 18 | 19 |
| | 20 | 21 | 22 | 23 | 24 | 25 | 26 | 27 | 28 | 29 |
| | 30 | 31 | 32 | 33 | 34 | 35 | 36 | 37 | 38 | 39 |
| | 40 | 41 | 42 | 43 | 44 | 45 | 46 | 47 | 48 | 49 |
| | 50 | 51 | 52 | 53 | 54 | 55 | 56 | 57 | 58 | 59 |
| | 60 | 61 | 62 | 63 | 64 | 65 | 66 | 67 | 68 | 69 |
| | 70 | 71 | 72 | 73 | 74 | 75 | 76 | 77 | 78 | 79 |
| | 80 | 81 | 82 | 83 | 84 | 85 | 86 | 87 | 88 | 89 |
| | 90 | 91 | 92 | 93 | 94 | 95 | 96 | 97 | 98 | 99 |
| | 100 | 101 | 102 | 103 | 104 | 105 | 106 | 107 | 108 | 109 |
| | 110 | 111 | 112 | 113 | 114 | 115 | 116 | 117 | 118 | 119 |
| | 120 | 121 | 122 | 123 | 124 | 125 | 126 | 127 | 128 | 129 |
| | 130 | 131 | 132 | 133 | 134 | 135 | 136 | 137 | 138 | 139 |
| | 140 | 141 | 142 | 143 | 144 | 145 | 146 | 147 | 148 | 149 |
| | 150 | 151 | 152 | 153 | 154 | 155 | 156 | 157 | 158 | 159 |
| | 160 | 161 | 162 | 163 | 164 | 165 | 166 | 167 | 168 | 169 |
| | 170 | 171 | 172 | 173 | 174 | 175 | 176 | 177 | 178 | 179 |
| π(j) | 68 | 71 | 54 | 19 | 25 | 21 | 102 | 32 | 105 | 29 |
| | 16 | 79 | 53 | 82 | 107 | 91 | 67 | 94 | 85 | 48 |
| | 83 | 58 | 42 | 57 | 28 | 76 | 31 | 26 | 96 | 65 |
| | 119 | 114 | 109 | 9 | 125 | 81 | 43 | 103 | 93 | 70 |
| | 46 | 89 | 112 | 61 | 45 | 66 | 38 | 77 | 115 | 56 |
| | 87 | 113 | 100 | 75 | 72 | 60 | 47 | 92 | 36 | 98 |
| | 4 | 59 | 6 | 44 | 20 | 86 | 3 | 73 | 95 | 104 |
| | 8 | 34 | 0 | 84 | 111 | 35 | 30 | 64 | 55 | 80 |
| | 40 | 97 | 101 | 2 | 69 | 63 | 74 | 62 | 118 | 110 |
| | 159 | 18 | 50 | 33 | 7 | 175 | 51 | 131 | 106 | 134 |
| | 88 | 140 | 117 | 132 | 147 | 153 | 116 | 161 | 10 | 39 |
| | 126 | 136 | 90 | 37 | 174 | 41 | 158 | 5 | 120 | 12 |
| | 52 | 99 | 146 | 144 | 78 | 155 | 128 | 165 | 141 | 179 |
| | 150 | 157 | 171 | 143 | 108 | 170 | 22 | 49 | 11 | 27 |
| | 160 | 178 | 133 | 142 | 121 | 168 | 173 | 123 | 13 | 15 |
| | 154 | 127 | 139 | 151 | 163 | 172 | 138 | 176 | 145 | 129 |
| | 162 | 152 | 177 | 137 | 149 | 167 | 1 | 14 | 169 | 124 |
| | 148 | 164 | 130 | 17 | 156 | 122 | 23 | 166 | 135 | 24. |

2. The receiving method of claim 1, wherein the π(j) is determined based on at least one of the code length, a modulation method for demodulating and the code rate.

3. The receiving method of claim 1, further comprises:

deinterleaving one or more values among the deinterleaved plurality of groups, and wherein the decoding decodes the values of the deinterleaved plurality of groups comprising the deinterleaved one or more values.

4. A transmitting method comprising:

encoding input bits to generate parity bits based on a low density parity check (LDPC) code, a code rate of the LDPC code being 10/15 and a code length of the LDPC code being 64800 bits;

interleaving the parity bits;

splitting a codeword comprising the input bits and the interleaved parity bits into a plurality of bit groups;

interleaving the plurality of bit groups to provide an interleaved codeword;

generating modulation symbols by modulating the interleaved codeword based on 16-quadrature amplitude modulation (QAM); and transmitting a signal which is generated based on the modulation symbols, wherein the plurality of bit groups comprise 180 bit groups, wherein each of the plurality of bit groups comprises 360 bits, wherein the plurality of bit groups are interleaved based on a following equation:

$$Y_j = X_{\pi(j)} \text{ for } (0 \le j < N_{group}),$$

where $X_{\pi(j)}$ is a $\pi(j)^{th}$ bit group among the plurality of bit groups, $Y_j$ is a $j^{th}$ bit group among the interleaved plurality of bit groups, $N_{group}$ is a number of the plurality of bit groups, and π(j) denotes an interleaving order for the interleaving, and wherein the π(j) is represented as follows:

| Order of the deinterleaving π(j) (0 ≤ j < 180) | | | | | | | | | | |
|---|---|---|---|---|---|---|---|---|---|---|
| j | 0 | 1 | 2 | 3 | 4 | 5 | 6 | 7 | 8 | 9 |
| | 10 | 11 | 12 | 13 | 14 | 15 | 16 | 17 | 18 | 19 |
| | 20 | 21 | 22 | 23 | 24 | 25 | 26 | 27 | 28 | 29 |
| | 30 | 31 | 32 | 33 | 34 | 35 | 36 | 37 | 38 | 39 |
| | 40 | 41 | 42 | 43 | 44 | 45 | 46 | 47 | 48 | 49 |
| | 50 | 51 | 52 | 53 | 54 | 55 | 56 | 57 | 58 | 59 |
| | 60 | 61 | 62 | 63 | 64 | 65 | 66 | 67 | 68 | 69 |
| | 70 | 71 | 72 | 73 | 74 | 75 | 76 | 77 | 78 | 79 |
| | 80 | 81 | 82 | 83 | 84 | 85 | 86 | 87 | 88 | 89 |
| | 90 | 91 | 92 | 93 | 94 | 95 | 96 | 97 | 98 | 99 |
| | 100 | 101 | 102 | 103 | 104 | 105 | 106 | 107 | 108 | 109 |
| | 110 | 111 | 112 | 113 | 114 | 115 | 116 | 117 | 118 | 119 |
| | 120 | 121 | 122 | 123 | 124 | 125 | 126 | 127 | 128 | 129 |
| | 130 | 131 | 132 | 133 | 134 | 135 | 136 | 137 | 138 | 139 |
| | 140 | 141 | 142 | 143 | 144 | 145 | 146 | 147 | 148 | 149 |
| | 150 | 151 | 152 | 153 | 154 | 155 | 156 | 157 | 158 | 159 |
| | 160 | 161 | 162 | 163 | 164 | 165 | 166 | 167 | 168 | 169 |
| | 170 | 171 | 172 | 173 | 174 | 175 | 176 | 177 | 178 | 179 |
| π(j) | 68 | 71 | 54 | 19 | 25 | 21 | 102 | 32 | 105 | 29 |
| | 16 | 79 | 53 | 82 | 107 | 91 | 67 | 94 | 85 | 48 |
| | 83 | 58 | 42 | 57 | 28 | 76 | 31 | 26 | 96 | 65 |
| | 119 | 114 | 109 | 9 | 125 | 81 | 43 | 103 | 93 | 70 |
| | 46 | 89 | 112 | 61 | 45 | 66 | 38 | 77 | 115 | 56 |
| | 87 | 113 | 100 | 75 | 72 | 60 | 47 | 92 | 36 | 98 |
| | 4 | 59 | 6 | 44 | 20 | 86 | 3 | 73 | 95 | 104 |
| | 8 | 34 | 0 | 84 | 111 | 35 | 30 | 64 | 55 | 80 |
| | 40 | 97 | 101 | 2 | 69 | 63 | 74 | 62 | 118 | 110 |
| | 159 | 18 | 50 | 33 | 7 | 175 | 51 | 131 | 106 | 134 |
| | 88 | 140 | 117 | 132 | 147 | 153 | 116 | 161 | 10 | 39 |
| | 126 | 136 | 90 | 37 | 174 | 41 | 158 | 5 | 120 | 12 |
| | 52 | 99 | 146 | 144 | 78 | 155 | 128 | 165 | 141 | 179 |
| | 150 | 157 | 171 | 143 | 108 | 170 | 22 | 49 | 11 | 27 |
| | 160 | 178 | 133 | 142 | 121 | 168 | 173 | 123 | 13 | 15 |
| | 154 | 127 | 139 | 151 | 163 | 172 | 138 | 176 | 145 | 129 |
| | 162 | 152 | 177 | 137 | 149 | 167 | 1 | 14 | 169 | 124 |
| | 148 | 164 | 130 | 17 | 156 | 122 | 23 | 166 | 135 | 24. |

5. The transmitting method of claim 4, wherein the π(j) is determined based on at least one of the code length, a modulation method for the modulating and the code rate.

* * * * *